United States Patent
Sorrells et al.

(10) Patent No.: US 8,433,264 B2
(45) Date of Patent: *Apr. 30, 2013

(54) MULTIPLE INPUT SINGLE OUTPUT (MISO) AMPLIFIER HAVING MULTIPLE TRANSISTORS WHOSE OUTPUT VOLTAGES SUBSTANTIALLY EQUAL THE AMPLIFIER OUTPUT VOLTAGE

(75) Inventors: David F. Sorrells, Middleburg, FL (US); Gregory S. Rawlins, Heathrow, FL (US); Michael W. Rawlins, Lake Mary, FL (US)

(73) Assignee: ParkerVision, Inc., Jacksonville, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/599,359

(22) Filed: Nov. 15, 2006

(65) Prior Publication Data

US 2007/0060076 A1    Mar. 15, 2007

Related U.S. Application Data

(63) Continuation of application No. 11/256,172, filed on Oct. 24, 2005, now Pat. No. 7,184,723.

(60) Provisional application No. 60/620,972, filed on Oct. 22, 2004, provisional application No. 60/671,542, filed on Apr. 15, 2005, provisional application No. 60/671,536, filed on Apr. 15, 2005, provisional application No. 60/673,397, filed on Apr. 21, 2005, provisional application No. 60/706,003, filed on Aug. 8, 2005, provisional application No. 60/709,092, filed on Aug. 18, 2005, provisional application No. 60/717,244, filed on Sep. 16, 2005, provisional application No. 60/721,114, filed on Sep. 28, 2005.

(51) Int. Cl.
*H04B 1/04* (2006.01)

(52) U.S. Cl.
USPC .................................. 455/127.1; 455/127.3

(58) Field of Classification Search .... 455/127.1–127.5, 455/114.3; 330/10, 295, 296, 297, 96
See application file for complete search history.

(56) References Cited

U.S. PATENT DOCUMENTS 1,882,119 A   10/1932   Chireix
1,946,308 A    2/1934   Chireix (Continued)

FOREIGN PATENT DOCUMENTS

EP   0 011 464 A2   5/1980
EP   0 471 346 A1   8/1990

(Continued)

OTHER PUBLICATIONS

Notification of Transmittal of the International Search Report and Written Opinion, dated Aug. 15, 2008, for PCT Application No. PCT/US08/06360, 6 pages.

(Continued)

*Primary Examiner* — Lana N Le
(74) *Attorney, Agent, or Firm* — Sterne, Kessler, Goldstein & Fox PLLC

(57) ABSTRACT

Methods and systems for vector combining power amplification are disclosed herein. In one embodiment, a plurality of signals are individually amplified, then summed to form a desired time-varying complex envelope signal. Phase and/or frequency characteristics of one or more of the signals are controlled to provide the desired phase, frequency, and/or amplitude characteristics of the desired time-varying complex envelope signal. In another embodiment, a time-varying complex envelope signal is decomposed into a plurality of constant envelope constituent signals. The constituent signals are amplified equally or substantially equally, and then summed to construct an amplified version of the original time-varying envelope signal. Embodiments also perform frequency up-conversion.

18 Claims, 78 Drawing Sheets

U.S. PATENT DOCUMENTS

| | | |
|---|---|---|
| 2,116,667 A | 5/1938 | Chireix |
| 2,210,028 A | 8/1940 | Doherty |
| 2,220,201 A | 11/1940 | Bliss |
| 2,269,518 A | 1/1942 | Chireix et al. |
| 2,282,706 A | 5/1942 | Chireix et al. |
| 2,282,714 A | 5/1942 | Fagot |
| 2,294,800 A | 9/1942 | Price |
| 2,508,524 A | 5/1950 | Lang |
| 2,529,073 A | 11/1950 | Chireix |
| 2,555,039 A | 5/1951 | Bissonette |
| 2,591,749 A | 4/1952 | Villemagne |
| 2,670,404 A | 2/1954 | Chireix |
| 2,677,806 A | 5/1954 | Chireix |
| 2,714,634 A | 8/1955 | Hall |
| 2,734,100 A | 2/1956 | Kendall |
| 2,857,591 A | 10/1958 | Nagel |
| 2,890,280 A | 6/1959 | Feyzeau |
| 2,908,753 A | 10/1959 | Ernyei et al. |
| 2,938,945 A | 5/1960 | France |
| 2,963,933 A | 12/1960 | Bereskin |
| 2,964,622 A | 12/1960 | Fire |
| 2,968,697 A | 1/1961 | Rager, Jr. |
| 3,056,017 A | 9/1962 | Peras |
| 3,078,456 A | 2/1963 | Alpers |
| 3,121,198 A | 2/1964 | Potter |
| 3,154,782 A | 10/1964 | Kagawa et al. |
| 3,170,127 A | 2/1965 | Cramer |
| 3,176,060 A | 3/1965 | Bissonette et al. |
| 3,212,008 A | 10/1965 | Kahn |
| 3,219,862 A | 11/1965 | Kieffert |
| 3,263,019 A | 7/1966 | Hurvitz |
| 3,341,697 A | 9/1967 | Kaufman et al. |
| 3,413,570 A | 11/1968 | Bruene et al. |
| 3,418,595 A | 12/1968 | Loewenstern, Jr. |
| 3,436,686 A | 4/1969 | Vackar |
| 3,437,945 A | 4/1969 | Duncan |
| 3,458,816 A | 7/1969 | O'Brien |
| 3,493,718 A | 2/1970 | Kestner et al. |
| 3,513,352 A | 5/1970 | Souillard |
| 3,525,941 A | 8/1970 | Smith |
| 3,544,697 A | 12/1970 | Munch, Jr. |
| 3,651,429 A | 3/1972 | Ruthroff |
| 3,697,692 A | 10/1972 | Hafler |
| 3,716,730 A | 2/1973 | Cerny, Jr. |
| 3,777,275 A | 12/1973 | Cox |
| 3,789,314 A | 1/1974 | Beurrier |
| 3,815,040 A | 6/1974 | Seidel |
| 3,852,530 A | 12/1974 | Shen |
| 3,852,669 A | 12/1974 | Bowman et al. |
| 3,896,395 A | 7/1975 | Cox |
| 3,906,390 A | 9/1975 | Rollett |
| 3,909,742 A | 9/1975 | Cox et al. |
| 3,927,379 A | 12/1975 | Cox et al. |
| 3,936,819 A | 2/1976 | Angelle et al. |
| 3,991,343 A | 11/1976 | Delpy |
| 4,090,147 A | 5/1978 | Seidel |
| 4,095,196 A | 6/1978 | Seidel |
| 4,104,946 A | 8/1978 | Peterson |
| 4,178,557 A | 12/1979 | Henry |
| 4,229,715 A | 10/1980 | Henry |
| 4,301,490 A | 11/1981 | Nagel et al. |
| 4,346,354 A | 8/1982 | Hanna |
| 4,378,530 A | 3/1983 | Garde |
| 4,433,312 A | 2/1984 | Kahn |
| 4,439,744 A | 3/1984 | Kumar et al. |
| 4,441,080 A | 4/1984 | Saari |
| 4,446,440 A | 5/1984 | Bell |
| 4,485,357 A | 11/1984 | Voorman |
| 4,509,017 A | 4/1985 | Andren et al. |
| 4,580,111 A | 4/1986 | Swanson |
| 4,584,541 A | 4/1986 | Nossen |
| 4,605,902 A | 8/1986 | Harrington |
| 4,628,286 A | 12/1986 | Nossen |
| 4,682,119 A | 7/1987 | Michel |
| 4,682,149 A | 7/1987 | Larson |
| 4,686,448 A | 8/1987 | Jones et al. |
| 4,687,999 A | 8/1987 | Desperben et al. |
| 4,701,716 A | 10/1987 | Poole |
| 4,717,894 A | 1/1988 | Edwards et al. |
| 4,743,858 A | 5/1988 | Everard |
| 4,780,803 A | 10/1988 | Garcia-Santamaria |
| 4,816,783 A | 3/1989 | Leitch |
| 4,817,116 A | 3/1989 | Akaiwa et al. |
| 4,873,492 A | 10/1989 | Myer |
| 4,951,303 A | 8/1990 | Larson |
| 4,974,236 A | 11/1990 | Gurcan et al. |
| 4,995,055 A | 2/1991 | Weinberger et al. |
| 5,005,419 A | 4/1991 | O'Donnell et al. |
| 5,012,200 A | 4/1991 | Meinzer |
| 5,017,888 A | 5/1991 | Meinzer |
| 5,077,539 A | 12/1991 | Howatt |
| 5,081,673 A | 1/1992 | Engelke et al. |
| 5,093,636 A | 3/1992 | Higgins, Jr. et al. |
| 5,115,203 A | 5/1992 | Krett et al. |
| 5,124,665 A | 6/1992 | McGann |
| 5,164,678 A | 11/1992 | Puri et al. |
| 5,214,670 A | 5/1993 | Ballatore |
| 5,229,735 A | 7/1993 | Quan |
| 5,239,275 A | 8/1993 | Leitch |
| 5,239,686 A | 8/1993 | Downey |
| 5,264,807 A | 11/1993 | Okubo et al. |
| 5,287,069 A | 2/1994 | Okubo et al. |
| 5,302,914 A | 4/1994 | Arntz et al. |
| 5,304,943 A | 4/1994 | Koontz |
| 5,307,069 A | 4/1994 | Evans |
| 5,345,189 A | 9/1994 | Hornak et al. |
| 5,351,288 A | 9/1994 | Engelke et al. |
| 5,365,187 A | 11/1994 | Hornak et al. |
| 5,365,190 A | 11/1994 | Yu et al. |
| 5,404,114 A | 4/1995 | Sager |
| 5,410,280 A | 4/1995 | Linguet et al. |
| 5,420,541 A | 5/1995 | Upton et al. |
| 5,426,641 A | 6/1995 | Afrashteh et al. |
| 5,432,473 A | 7/1995 | Mattila et al. |
| 5,438,591 A | 8/1995 | Oie et al. |
| 5,485,120 A | 1/1996 | Anvari |
| 5,490,172 A | 2/1996 | Komara |
| 5,495,500 A | 2/1996 | Jovanovich et al. |
| 5,508,657 A | 4/1996 | Behan |
| 5,515,068 A | 5/1996 | Uragami et al. |
| 5,530,722 A | 6/1996 | Dent |
| 5,541,554 A | 7/1996 | Stengel et al. |
| 5,554,865 A | 9/1996 | Larson |
| 5,559,471 A | 9/1996 | Black |
| 5,568,088 A | 10/1996 | Dent et al. |
| 5,574,967 A | 11/1996 | Dent et al. |
| 5,574,992 A | 11/1996 | Cygan et al. |
| 5,612,651 A | 3/1997 | Chethik |
| 5,621,351 A | 4/1997 | Puri et al. |
| 5,631,604 A | 5/1997 | Dent et al. |
| RE35,536 E | 6/1997 | Irissou et al. |
| 5,638,024 A | 6/1997 | Dent et al. |
| 5,694,433 A | 12/1997 | Dent |
| 5,697,074 A | 12/1997 | Makikallio et al. |
| 5,710,520 A | 1/1998 | Frey |
| 5,719,527 A | 2/1998 | Bateman et al. |
| 5,724,005 A | 3/1998 | Chen et al. |
| 5,739,723 A | 4/1998 | Sigmon et al. |
| 5,757,229 A | 5/1998 | Mitzlaff |
| 5,764,704 A | 6/1998 | Shenoi |
| 5,767,750 A | 6/1998 | Yamaji |
| 5,770,971 A | 6/1998 | McNicol |
| 5,784,689 A | 7/1998 | Kobayashi |
| 5,786,727 A | 7/1998 | Sigmon |
| 5,792,956 A | 8/1998 | Li |
| 5,805,640 A | 9/1998 | O'Dea et al. |
| 5,815,531 A | 9/1998 | Dent |
| 5,835,128 A | 11/1998 | Macdonald et al. |
| 5,854,571 A | 12/1998 | Pinckley et al. |
| 5,862,460 A | 1/1999 | Rich |
| 5,872,481 A | 2/1999 | Sevic et al. |
| 5,877,643 A | 3/1999 | Drogi |
| 5,880,633 A | 3/1999 | Leizerovich et al. |
| 5,886,573 A | 3/1999 | Kolanek |
| 5,886,575 A | 3/1999 | Long |
| 5,890,051 A | 3/1999 | Schlang et al. |
| 5,892,394 A | 4/1999 | Wu |

| Patent | Kind | Date | Inventor |
|---|---|---|---|
| 5,892,395 | A | 4/1999 | Stengel et al. |
| 5,901,346 | A | 5/1999 | Stengel et al. |
| 5,903,854 | A | 5/1999 | Abe et al. |
| 5,933,766 | A | 8/1999 | Dent |
| 5,949,283 | A | 9/1999 | Proctor et al. |
| 5,952,947 | A | 9/1999 | Nussbaum et al. |
| 5,956,097 | A | 9/1999 | Nguyen et al. |
| 5,963,091 | A | 10/1999 | Chen et al. |
| 5,973,559 | A | 10/1999 | Alberty |
| 5,973,568 | A | 10/1999 | Shapiro et al. |
| 5,974,041 | A | 10/1999 | Kornfeld et al. |
| 5,990,734 | A | 11/1999 | Wright et al. |
| 5,990,738 | A | 11/1999 | Wright et al. |
| 5,999,046 | A | 12/1999 | Kotzamanis |
| 6,011,830 | A | 1/2000 | Sasin et al. |
| 6,026,286 | A | 2/2000 | Long |
| 6,028,485 | A | 2/2000 | Sigmon et al. |
| 6,043,707 | A | 3/2000 | Budnik |
| 6,054,894 | A | 4/2000 | Wright et al. |
| 6,054,896 | A | 4/2000 | Wright et al. |
| 6,057,798 | A | 5/2000 | Burrier et al. |
| 6,069,525 | A | 5/2000 | Sevic et al. |
| 6,085,074 | A | 7/2000 | Cygan |
| 6,097,252 | A | 8/2000 | Sigmon et al. |
| 6,111,461 | A | 8/2000 | Matsuno |
| 6,111,462 | A | 8/2000 | Mucenieks et al. |
| 6,125,266 | A | 9/2000 | Matero et al. |
| 6,130,910 | A | 10/2000 | Anderson et al. |
| 6,130,916 | A | 10/2000 | Thomson |
| 6,133,788 | A | 10/2000 | Dent |
| 6,133,789 | A | 10/2000 | Braithwaite |
| 6,137,355 | A | 10/2000 | Sevic et al. |
| 6,147,553 | A | 11/2000 | Kolanek |
| 6,154,093 | A | 11/2000 | Chen et al. |
| 6,157,253 | A | 12/2000 | Sigmon et al. |
| 6,169,455 | B1 | 1/2001 | Yamaguchi |
| 6,175,747 | B1 | 1/2001 | Tanishima et al. |
| 6,181,199 | B1 | 1/2001 | Camp, Jr. et al. |
| 6,188,277 | B1 | 2/2001 | Borodulin et al. |
| 6,198,416 | B1 | 3/2001 | Velazquez |
| 6,201,452 | B1 | 3/2001 | Dent et al. |
| 6,204,735 | B1 | 3/2001 | Cairns |
| 6,215,354 | B1 | 4/2001 | Kolanek et al. |
| 6,232,838 | B1 | 5/2001 | Sugimoto |
| 6,236,688 | B1 | 5/2001 | Ohta et al. |
| 6,242,975 | B1 | 6/2001 | Eidson et al. |
| 6,246,286 | B1 | 6/2001 | Persson |
| 6,246,599 | B1 | 6/2001 | Jang et al. |
| 6,252,461 | B1 | 6/2001 | Raab |
| 6,256,482 | B1 | 7/2001 | Raab |
| 6,259,320 | B1 | 7/2001 | Valk et al. |
| 6,285,251 | B1 | 9/2001 | Dent et al. |
| 6,292,054 | B1 | 9/2001 | Ma et al. |
| 6,300,828 | B1 | 10/2001 | McInnis |
| 6,304,545 | B1 | 10/2001 | Armbruster et al. |
| 6,307,894 | B2 | 10/2001 | Eidson et al. |
| 6,311,046 | B1 | 10/2001 | Dent |
| 6,313,703 | B1 | 11/2001 | Wright et al. |
| 6,337,599 | B2 | 1/2002 | Lee |
| 6,342,812 | B1 | 1/2002 | Abdollahian et al. |
| 6,349,216 | B1 | 2/2002 | Alberth, Jr. et al. |
| 6,359,506 | B1 | 3/2002 | Camp, Jr. et al. |
| 6,359,508 | B1 | 3/2002 | Mucenieks |
| 6,359,513 | B1 | 3/2002 | Kuo et al. |
| 6,366,177 | B1 | 4/2002 | McCune et al. |
| 6,369,651 | B1 | 4/2002 | Dent |
| 6,373,901 | B1 | 4/2002 | O'Dea et al. |
| 6,373,902 | B1 | 4/2002 | Park et al. |
| 6,374,092 | B1 | 4/2002 | Leizerovich et al. |
| 6,380,802 | B1 | 4/2002 | Pehlke et al. |
| 6,384,680 | B1 | 5/2002 | Takei et al. |
| 6,384,681 | B1 | 5/2002 | Bonds |
| 6,385,439 | B1 | 5/2002 | Hellberg |
| 6,388,513 | B1 | 5/2002 | Wright et al. |
| 6,392,483 | B2 | 5/2002 | Suzuki et al. |
| 6,396,341 | B1 | 5/2002 | Pehlke |
| 6,396,347 | B1 | 5/2002 | Lie et al. |
| 6,404,823 | B1 | 6/2002 | Grange et al. |
| 6,407,635 | B2 | 6/2002 | Mucenieks et al. |
| 6,411,655 | B1 | 6/2002 | Holden et al. |
| 6,421,389 | B1 | 7/2002 | Jett et al. |
| 6,424,216 | B2 | 7/2002 | Mu et al. |
| 6,434,122 | B2 | 8/2002 | Barabash et al. |
| 6,437,644 | B1 | 8/2002 | Kenington |
| 6,449,465 | B1 | 9/2002 | Gailus et al. |
| 6,452,446 | B1 | 9/2002 | Eisenberg et al. |
| 6,459,334 | B2 | 10/2002 | Wright et al. |
| 6,459,337 | B1 | 10/2002 | Goren et al. |
| 6,462,617 | B1 | 10/2002 | Kim |
| 6,469,581 | B1 | 10/2002 | Kobayashi |
| 6,470,431 | B2 | 10/2002 | Nicosia et al. |
| 6,472,934 | B1 | 10/2002 | Pehlke |
| 6,472,937 | B1 | 10/2002 | Gerard et al. |
| 6,476,670 | B1 | 11/2002 | Wright et al. |
| 6,496,062 | B1 | 12/2002 | Nitz et al. |
| 6,501,331 | B2 | 12/2002 | Adar |
| 6,504,428 | B2 | 1/2003 | Cova et al. |
| 6,504,447 | B1 | 1/2003 | Laney et al. |
| 6,507,731 | B1 | 1/2003 | Hasegawa |
| 6,510,309 | B1 | 1/2003 | Thompson et al. |
| 6,510,310 | B1 | 1/2003 | Muralidharan |
| 6,522,194 | B1 | 2/2003 | Pehlke |
| 6,522,198 | B2 | 2/2003 | Ahn |
| 6,522,201 | B1 | 2/2003 | Hsiao et al. |
| 6,525,605 | B2 | 2/2003 | Hu et al. |
| 6,529,773 | B1 | 3/2003 | Dewan |
| 6,531,935 | B1 | 3/2003 | Russat et al. |
| 6,535,060 | B2 | 3/2003 | Goren et al. |
| 6,538,509 | B2 | 3/2003 | Ren |
| 6,538,793 | B2 | 3/2003 | Rosenberg et al. |
| 6,545,535 | B2 | 4/2003 | Andre |
| 6,552,634 | B1 | 4/2003 | Raab |
| 6,566,944 | B1 | 5/2003 | Pehlke et al. |
| 6,577,199 | B2 | 6/2003 | Dent |
| 6,577,691 | B2 | 6/2003 | Richards et al. |
| 6,583,679 | B1 | 6/2003 | Cox et al. |
| 6,583,739 | B1 | 6/2003 | Kenington |
| 6,586,995 | B1 | 7/2003 | Tachibana |
| 6,587,010 | B2 | 7/2003 | Wagh et al. |
| 6,587,511 | B2 | 7/2003 | Barak et al. |
| 6,587,514 | B1 | 7/2003 | Wright et al. |
| 6,587,913 | B2 | 7/2003 | Campanale et al. |
| 6,593,806 | B1 | 7/2003 | Melanson |
| 6,600,368 | B2 | 7/2003 | Kim |
| 6,603,352 | B2 * | 8/2003 | Wight ............................. 330/251 |
| 6,606,483 | B1 | 8/2003 | Baker et al. |
| 6,614,854 | B1 | 9/2003 | Chow et al. |
| 6,622,198 | B2 | 9/2003 | Jones, Jr. |
| 6,624,694 | B2 | 9/2003 | Ma et al. |
| 6,633,200 | B2 | 10/2003 | Kolanek |
| 6,636,112 | B1 | 10/2003 | McCune |
| 6,637,030 | B1 | 10/2003 | Klein |
| 6,646,505 | B2 | 11/2003 | Anderson et al. |
| 6,647,073 | B2 | 11/2003 | Tapio |
| 6,653,896 | B2 | 11/2003 | Sevic et al. |
| 6,672,167 | B2 | 1/2004 | Buell et al. |
| 6,674,326 | B1 | 1/2004 | Hiramoto et al. |
| 6,678,041 | B2 | 1/2004 | Kimura et al. |
| 6,681,101 | B1 | 1/2004 | Eidson et al. |
| 6,683,918 | B2 | 1/2004 | Jackson et al. |
| 6,690,233 | B2 | 2/2004 | Sander |
| 6,697,436 | B1 | 2/2004 | Wright et al. |
| 6,697,603 | B1 | 2/2004 | Lovinggood et al. |
| 6,700,440 | B2 | 3/2004 | Hareyama |
| 6,700,441 | B1 | 3/2004 | Zhang et al. |
| 6,700,453 | B2 | 3/2004 | Heiskala et al. |
| 6,701,419 | B2 | 3/2004 | Tomaiuolo et al. |
| 6,707,338 | B2 | 3/2004 | Kenington et al. |
| 6,714,776 | B1 | 3/2004 | Birleson |
| 6,724,252 | B2 | 4/2004 | Ngo et al. |
| 6,735,424 | B1 | 5/2004 | Larson et al. |
| 6,737,914 | B2 | 5/2004 | Gu |
| 6,737,916 | B2 | 5/2004 | Luu |
| 6,741,840 | B2 | 5/2004 | Nagode et al. |
| 6,741,867 | B1 | 5/2004 | Tetsuya |
| 6,750,707 | B2 | 6/2004 | Takei et al. |
| 6,751,265 | B1 | 6/2004 | Schell et al. |
| 6,765,519 | B2 | 7/2004 | Karlquist |

| | | |
|---|---|---|
| 6,781,534 B2 | 8/2004 | Karlquist |
| 6,784,732 B2 | 8/2004 | Hajimiri et al. |
| 6,784,837 B2 | 8/2004 | Revankar et al. |
| 6,785,342 B1 | 8/2004 | Isaksen et al. |
| 6,791,408 B2 | 9/2004 | Goren et al. |
| 6,791,410 B2 | 9/2004 | Kim et al. |
| 6,794,934 B2 | 9/2004 | Betti-Berutto et al. |
| 6,794,938 B2 | 9/2004 | Weldon |
| 6,798,843 B1 | 9/2004 | Wright et al. |
| 6,801,086 B1 | 10/2004 | Chandrasekaran |
| 6,801,567 B1 | 10/2004 | Schmidl et al. |
| 6,806,767 B2 | 10/2004 | Dow |
| 6,806,789 B2 | 10/2004 | Bawell et al. |
| 6,819,171 B2 | 11/2004 | Kenington |
| 6,819,176 B1 | 11/2004 | Lee |
| 6,819,720 B1 | 11/2004 | Willetts |
| 6,825,719 B1 | 11/2004 | Barak et al. |
| 6,829,471 B2 | 12/2004 | White et al. |
| 6,831,491 B2 | 12/2004 | Karlquist |
| 6,834,183 B2 | 12/2004 | Black et al. |
| 6,836,183 B2 | 12/2004 | Wight |
| 6,838,942 B1 | 1/2005 | Somerville et al. |
| 6,842,070 B2 | 1/2005 | Nilsson |
| 6,847,266 B2 | 1/2005 | Laney et al. |
| 6,853,244 B2 | 2/2005 | Robinson et al. |
| 6,853,247 B2 | 2/2005 | Weldon |
| 6,853,248 B2 | 2/2005 | Weldon |
| 6,859,098 B2 | 2/2005 | Husseini |
| 6,864,742 B2 | 3/2005 | Kobayashi |
| 6,867,647 B2 | 3/2005 | Wouters |
| 6,873,211 B1 | 3/2005 | Thompson et al. |
| 6,879,209 B2 | 4/2005 | Grundlingh |
| 6,882,217 B1 | 4/2005 | Mueller |
| 6,882,711 B1 | 4/2005 | Nicol |
| 6,882,829 B2 | 4/2005 | Mostov et al. |
| 6,889,034 B1 | 5/2005 | Dent |
| 6,891,432 B2 | 5/2005 | Nagle et al. |
| 6,900,694 B2 | 5/2005 | Suzuki et al. |
| 6,906,585 B2 | 6/2005 | Weldon |
| 6,914,487 B1 | 7/2005 | Doyle et al. |
| 6,917,244 B2 | 7/2005 | Rosnell et al. |
| 6,917,389 B2 | 7/2005 | Lee |
| 6,924,699 B2 | 8/2005 | Ahmed |
| 6,928,272 B2 | 8/2005 | Doi |
| 6,930,547 B2 | 8/2005 | Chandrasekaran et al. |
| 6,937,096 B2 | 8/2005 | Wight et al. |
| 6,937,102 B2 | 8/2005 | Lopez et al. |
| 6,940,349 B2 | 9/2005 | Hellberg |
| 6,943,624 B2 | 9/2005 | Ohnishi et al. |
| 6,947,713 B2 | 9/2005 | Checoury et al. |
| 6,960,956 B2 | 11/2005 | Pehlke et al. |
| 6,970,040 B1 | 11/2005 | Dening |
| 6,975,177 B2 | 12/2005 | Varis et al. |
| 6,980,780 B2 | 12/2005 | Chen et al. |
| 6,987,954 B2 | 1/2006 | Nielsen |
| 6,990,323 B2 | 1/2006 | Prikhodko et al. |
| 6,993,301 B1 | 1/2006 | Kenington et al. |
| 7,010,276 B2* | 3/2006 | Sander et al. ................. 455/108 |
| 7,015,752 B2 | 3/2006 | Saed |
| 7,023,272 B2 | 4/2006 | Hung et al. |
| 7,026,871 B2 | 4/2006 | Saèd |
| 7,030,714 B2 | 4/2006 | Korol |
| 7,031,382 B2 | 4/2006 | Hessel et al. |
| 7,034,613 B2 | 4/2006 | Saèd |
| 7,035,607 B2 | 4/2006 | Lim et al. |
| 7,042,283 B2 | 5/2006 | Suzuki et al. |
| 7,042,286 B2 | 5/2006 | Meade et al. |
| 7,043,208 B2 | 5/2006 | Nigra |
| 7,043,213 B2 | 5/2006 | Robinson et al. |
| 7,054,296 B1 | 5/2006 | Sorrells et al. |
| 7,054,597 B2 | 5/2006 | Rosnell |
| 7,057,461 B1 | 6/2006 | Canilao et al. |
| 7,064,607 B2 | 6/2006 | Maclean et al. |
| 7,068,099 B2 | 6/2006 | Versteegen |
| 7,068,101 B2 | 6/2006 | Saèd et al. |
| 7,068,103 B2* | 6/2006 | Lind ............................ 330/251 |
| 7,071,774 B2 | 7/2006 | Hellberg |
| 7,071,777 B2 | 7/2006 | McBeath et al. |
| 7,078,976 B2 | 7/2006 | Blednov |
| 7,081,795 B2 | 7/2006 | Matsuura et al. |
| 7,084,702 B1 | 8/2006 | Ichitsubo et al. |
| 7,088,970 B2 | 8/2006 | Williams |
| 7,091,775 B2 | 8/2006 | Ichitsubo et al. |
| 7,091,777 B2 | 8/2006 | Lynch |
| 7,092,675 B2 | 8/2006 | Lim et al. |
| 7,092,676 B2 | 8/2006 | Abdelgany et al. |
| 7,099,382 B2 | 8/2006 | Aronson et al. |
| 7,103,328 B2 | 9/2006 | Zelley |
| 7,139,535 B2 | 11/2006 | Zschunke |
| 7,145,397 B2 | 12/2006 | Yamamoto et al. |
| 7,177,418 B2* | 2/2007 | Maclean et al. ............... 330/297 |
| 7,184,723 B2 | 2/2007 | Sorrells et al. |
| 7,193,459 B1 | 3/2007 | Epperson et al. |
| 7,197,284 B2 | 3/2007 | Brandt et al. |
| 7,200,369 B2 | 4/2007 | Kim et al. |
| 7,242,245 B2 | 7/2007 | Burns et al. |
| 7,260,368 B1 | 8/2007 | Blumer |
| 7,260,369 B2 | 8/2007 | Feher |
| 7,292,189 B2 | 11/2007 | Orr et al. |
| 7,327,803 B2 | 2/2008 | Sorrells et al. |
| 7,345,534 B2 | 3/2008 | Grebennikov |
| 7,349,673 B2 | 3/2008 | Moloudi et al. |
| 7,355,470 B2 | 4/2008 | Sorrells et al. |
| 7,378,902 B2 | 5/2008 | Sorrells et al. |
| 7,403,579 B2 | 7/2008 | Jaffe et al. |
| 7,414,469 B2 | 8/2008 | Sorrells et al. |
| 7,421,036 B2 | 9/2008 | Sorrells et al. |
| 7,423,477 B2 | 9/2008 | Sorrells et al. |
| 7,428,230 B2 | 9/2008 | Park |
| 7,440,733 B2 | 10/2008 | Maslennikov et al. |
| 7,459,893 B2 | 12/2008 | Jacobs |
| 7,460,612 B2 | 12/2008 | Eliezer et al. |
| 7,466,760 B2 | 12/2008 | Sorrells et al. |
| 7,474,695 B2 | 1/2009 | Liu et al. |
| 7,486,894 B2 | 2/2009 | Aronson et al. |
| 7,502,599 B2 | 3/2009 | Ben-Ayun et al. |
| 7,509,102 B2 | 3/2009 | Rofougaran et al. |
| 7,526,261 B2* | 4/2009 | Sorrells et al. ............. 455/127.3 |
| 7,620,129 B2 | 11/2009 | Sorrells et al. |
| 7,639,072 B2 | 12/2009 | Sorrells et al. |
| 7,647,030 B2 | 1/2010 | Sorrells et al. |
| 7,672,648 B1 | 3/2010 | Groe et al. |
| 7,672,650 B2 | 3/2010 | Sorrells et al. |
| 7,738,853 B2 | 6/2010 | Eddy et al. |
| 7,750,733 B2 | 7/2010 | Sorrells et al. |
| RE41,582 E | 8/2010 | Larson et al. |
| 7,835,709 B2 | 11/2010 | Sorrells et al. |
| 7,844,235 B2 | 11/2010 | Sorrells et al. |
| 7,885,682 B2 | 2/2011 | Sorrells et al. |
| 7,911,272 B2 | 3/2011 | Sorrells et al. |
| 7,929,989 B2 | 4/2011 | Sorrells et al. |
| 7,932,776 B2 | 4/2011 | Sorrells et al. |
| 7,937,106 B2 | 5/2011 | Sorrells et al. |
| 7,945,224 B2 | 5/2011 | Sorrells et al. |
| 7,949,365 B2 | 5/2011 | Sorrells et al. |
| 7,978,390 B2 | 7/2011 | Kikuchi |
| 8,013,675 B2 | 9/2011 | Rawlins et al. |
| 8,026,764 B2 | 9/2011 | Sorrells et al. |
| 8,031,804 B2 | 10/2011 | Sorrells et al. |
| 8,036,306 B2 | 10/2011 | Sorrells et al. |
| 8,050,353 B2 | 11/2011 | Sorrells et al. |
| 8,059,749 B2 | 11/2011 | Sorrells et al. |
| 8,233,858 B2 | 7/2012 | Sorrells et al. |
| 8,280,321 B2 | 10/2012 | Sorrells et al. |
| 8,315,336 B2 | 11/2012 | Sorrells et al. |
| 8,334,722 B2 | 12/2012 | Sorrells et al. |
| 2001/0001008 A1 | 5/2001 | Dent |
| 2001/0004373 A1 | 6/2001 | Hirata |
| 2001/0006354 A1 | 7/2001 | Lee |
| 2001/0006359 A1 | 7/2001 | Suzuki et al. |
| 2001/0030581 A1 | 10/2001 | Dent |
| 2001/0052816 A1 | 12/2001 | Ahn |
| 2002/0008577 A1 | 1/2002 | Cova et al. |
| 2002/0027958 A1 | 3/2002 | Kolanek |
| 2002/0042253 A1 | 4/2002 | Dartois |
| 2002/0047745 A1 | 4/2002 | Kolanek |
| 2002/0053973 A1 | 5/2002 | Ward, Jr. |
| 2002/0058486 A1 | 5/2002 | Persson |

| | | | | | | |
|---|---|---|---|---|---|---|
| 2002/0071497 A1 | 6/2002 | Bengtsson et al. | 2004/0184559 A1 | 9/2004 | Ballantyne | |
| 2002/0079962 A1 | 6/2002 | Sander | 2004/0185805 A1* | 9/2004 | Kim et al. | 455/114.3 |
| 2002/0084845 A1 | 7/2002 | Eisenberg et al. | 2004/0189380 A1 | 9/2004 | Myer et al. | |
| 2002/0094034 A1 | 7/2002 | Moriyama | 2004/0189381 A1 | 9/2004 | Louis | |
| 2002/0101907 A1 | 8/2002 | Dent et al. | 2004/0196899 A1 | 10/2004 | Zhou et al. | |
| 2002/0105378 A1 | 8/2002 | Tapio | 2004/0198263 A1 | 10/2004 | Ode et al. | |
| 2002/0105384 A1 | 8/2002 | Dent | 2004/0222851 A1 | 11/2004 | Weldon | |
| 2002/0125947 A1 | 9/2002 | Ren | 2004/0227570 A1 | 11/2004 | Jackson et al. | |
| 2002/0126769 A1 | 9/2002 | Jett et al. | 2004/0233599 A1 | 11/2004 | Busking | |
| 2002/0127986 A1 | 9/2002 | White et al. | 2004/0246060 A1 | 12/2004 | Varis et al. | |
| 2002/0130716 A1 | 9/2002 | Larson et al. | 2004/0251962 A1 | 12/2004 | Rosnell et al. | |
| 2002/0130727 A1 | 9/2002 | Nagasaka | 2004/0263242 A1 | 12/2004 | Hellberg | |
| 2002/0130729 A1 | 9/2002 | Larson et al. | 2004/0263245 A1 | 12/2004 | Winter et al. | |
| 2002/0136275 A1 | 9/2002 | Wight | 2004/0263246 A1 | 12/2004 | Robinson et al. | |
| 2002/0136325 A1 | 9/2002 | Pehlke et al. | 2004/0266059 A1 | 12/2004 | Wight et al. | |
| 2002/0146996 A1 | 10/2002 | Bachman, II et al. | 2004/0266365 A1 | 12/2004 | Hasson et al. | |
| 2002/0153950 A1 | 10/2002 | Kusunoki et al. | 2004/0266368 A1 | 12/2004 | Rosnell | |
| 2002/0159532 A1 | 10/2002 | Wight | 2004/0266374 A1 | 12/2004 | Saed et al. | |
| 2002/0164965 A1 | 11/2002 | Chominski et al. | 2005/0001674 A1 | 1/2005 | Saed et al. | |
| 2002/0168025 A1 | 11/2002 | Schwent et al. | 2005/0001675 A1 | 1/2005 | Saed | |
| 2002/0171478 A1 | 11/2002 | Wouters | 2005/0001676 A1 | 1/2005 | Saed | |
| 2002/0171485 A1 | 11/2002 | Cova | 2005/0001677 A1 | 1/2005 | Saed | |
| 2002/0180547 A1 | 12/2002 | Staszewski et al. | 2005/0001678 A1 | 1/2005 | Saed | |
| 2002/0183021 A1 | 12/2002 | Brandt | 2005/0001679 A1 | 1/2005 | Saed | |
| 2002/0186079 A1 | 12/2002 | Kobayashi | 2005/0002470 A1 | 1/2005 | Saed et al. | |
| 2002/0191638 A1 | 12/2002 | Wang et al. | 2005/0003770 A1* | 1/2005 | Saed | 455/114.3 |
| 2002/0196864 A1 | 12/2002 | Booth et al. | 2005/0007194 A1 | 1/2005 | Grundlingh | |
| 2003/0006845 A1 | 1/2003 | Lopez et al. | 2005/0012547 A1 | 1/2005 | Kwon et al. | |
| 2003/0031268 A1 | 2/2003 | Wight | 2005/0018787 A1 | 1/2005 | Saed | |
| 2003/0041667 A1 | 3/2003 | White | 2005/0024262 A1 | 2/2005 | Cantrell et al. | |
| 2003/0083026 A1 | 5/2003 | Liu | 2005/0025181 A1 | 2/2005 | Nazari | |
| 2003/0087625 A1 | 5/2003 | Conti | 2005/0047038 A1 | 3/2005 | Nakajima et al. | |
| 2003/0098753 A1 | 5/2003 | Wagh et al. | 2005/0058059 A1 | 3/2005 | Amer | |
| 2003/0102910 A1 | 6/2003 | Sevic et al. | 2005/0058193 A1 | 3/2005 | Saed | |
| 2003/0102914 A1 | 6/2003 | Kenington et al. | 2005/0058209 A1 | 3/2005 | Magrath | |
| 2003/0107435 A1 | 6/2003 | Gu | 2005/0058227 A1 | 3/2005 | Birkett et al. | |
| 2003/0114124 A1 | 6/2003 | Higuchi | 2005/0058228 A1 | 3/2005 | Birkett | |
| 2003/0118121 A1 | 6/2003 | Makinen | 2005/0073360 A1 | 4/2005 | Johnson et al. | |
| 2003/0119526 A1 | 6/2003 | Edge | 2005/0073374 A1 | 4/2005 | Korol | |
| 2003/0123566 A1 | 7/2003 | Hasson | 2005/0088226 A1 | 4/2005 | Robinson et al. | |
| 2003/0125065 A1 | 7/2003 | Barak et al. | 2005/0110590 A1 | 5/2005 | Korol | |
| 2003/0132800 A1 | 7/2003 | Kenington | 2005/0111574 A1 | 5/2005 | Muller et al. | |
| 2003/0179041 A1 | 9/2003 | Weldon | 2005/0118973 A1 | 6/2005 | Khlat | |
| 2003/0190895 A1 | 10/2003 | Mostov et al. | 2005/0129140 A1 | 6/2005 | Robinson | |
| 2003/0201835 A1 | 10/2003 | Dening et al. | 2005/0129141 A1 | 6/2005 | Lee | |
| 2003/0210096 A1 | 11/2003 | Pengelly et al. | 2005/0136864 A1 | 6/2005 | Zipper | |
| 2003/0210746 A1 | 11/2003 | Asbeck et al. | 2005/0181746 A1* | 8/2005 | Wight | 455/91 |
| 2003/0219067 A1 | 11/2003 | Birkett et al. | 2005/0191976 A1 | 9/2005 | Shakeshaft et al. | |
| 2003/0220086 A1 | 11/2003 | Birkett | 2005/0195031 A1 | 9/2005 | Grundlingh | |
| 2003/0228856 A1 | 12/2003 | Orihashi et al. | 2005/0201483 A1 | 9/2005 | Coersmeier | |
| 2003/0231057 A1 | 12/2003 | Hiramoto et al. | 2005/0215206 A1 | 9/2005 | Granstrom et al. | |
| 2004/0008081 A1 | 1/2004 | Friedel et al. | 2005/0227646 A1 | 10/2005 | Yamazaki et al. | |
| 2004/0021517 A1 | 2/2004 | Irvine et al. | 2005/0242879 A1 | 11/2005 | Muller | |
| 2004/0025104 A1 | 2/2004 | Amer | 2005/0253745 A1 | 11/2005 | Song et al. | |
| 2004/0027198 A1 | 2/2004 | Chandrasekaran et al. | 2005/0260956 A1 | 11/2005 | Loraine et al. | |
| 2004/0037363 A1 | 2/2004 | Norsworthy et al. | 2006/0006946 A1 | 1/2006 | Burns et al. | |
| 2004/0046524 A1 | 3/2004 | Zschunke | 2006/0017500 A1 | 1/2006 | Hellberg | |
| 2004/0056723 A1 | 3/2004 | Gotou | 2006/0035618 A1 | 2/2006 | Pleasant | |
| 2004/0062397 A1 | 4/2004 | Amer | 2006/0052124 A1 | 3/2006 | Pottenger et al. | |
| 2004/0075492 A1 | 4/2004 | Wight | 2006/0055458 A1 | 3/2006 | Shiikuma et al. | |
| 2004/0076238 A1 | 4/2004 | Parker et al. | 2006/0066396 A1 | 3/2006 | Brandt | |
| 2004/0085134 A1 | 5/2004 | Griffith et al. | 2006/0088081 A1 | 4/2006 | Withington et al. | |
| 2004/0092281 A1 | 5/2004 | Burchfiel | 2006/0160502 A1 | 7/2006 | Kintis | |
| 2004/0095192 A1 | 5/2004 | Krvavac | 2006/0220625 A1 | 10/2006 | Chapuis | |
| 2004/0101065 A1 | 5/2004 | Hagh et al. | 2006/0238245 A1 | 10/2006 | Carichner et al. | |
| 2004/0108896 A1 | 6/2004 | Midtgaard | 2006/0264190 A1 | 11/2006 | Aleiner | |
| 2004/0113698 A1 | 6/2004 | Kim et al. | 2006/0291589 A1 | 12/2006 | Eliezer et al. | |
| 2004/0119514 A1 | 6/2004 | Karlquist | 2006/0292999 A1 | 12/2006 | Sorrells et al. | |
| 2004/0119622 A1 | 6/2004 | Karlquist | 2006/0293000 A1 | 12/2006 | Sorrells et al. | |
| 2004/0119624 A1 | 6/2004 | Karlquist | 2007/0021080 A1 | 1/2007 | Kuriyama et al. | |
| 2004/0125006 A1 | 7/2004 | Tani et al. | 2007/0030063 A1 | 2/2007 | Izumi et al. | |
| 2004/0135630 A1 | 7/2004 | Hellberg | 2007/0071114 A1 | 3/2007 | Sanderford et al. | |
| 2004/0142667 A1 | 7/2004 | Lochhead et al. | 2007/0076814 A1 | 4/2007 | Ikeda et al. | |
| 2004/0146116 A1 | 7/2004 | Kang et al. | 2007/0082630 A1 | 4/2007 | Aridas et al. | |
| 2004/0166813 A1 | 8/2004 | Mann et al. | 2007/0087708 A1 | 4/2007 | Sorrells et al. | |
| 2004/0169559 A1 | 9/2004 | Weldon | 2007/0087709 A1 | 4/2007 | Sorrells et al. | |
| 2004/0172583 A1 | 9/2004 | Amer | 2007/0090874 A1 | 4/2007 | Sorrells et al. | |
| 2004/0174213 A1 | 9/2004 | Thompson | 2007/0096806 A1 | 5/2007 | Sorrells et al. | |
| 2004/0181745 A1 | 9/2004 | Amer | 2007/0111686 A1 | 5/2007 | Lee | |

| | | | |
|---|---|---|---|
| 2007/0127563 A1 | 6/2007 | Wu et al. |
| 2007/0155344 A1 | 7/2007 | Wiessner et al. |
| 2007/0184790 A1 | 8/2007 | Gilberton et al. |
| 2007/0190952 A1 | 8/2007 | Waheed et al. |
| 2007/0218852 A1 | 9/2007 | Huynh |
| 2007/0247217 A1 | 10/2007 | Sorrells et al. |
| 2007/0247220 A1 | 10/2007 | Sorrells et al. |
| 2007/0247221 A1 | 10/2007 | Sorrells et al. |
| 2007/0248156 A1 | 10/2007 | Sorrells et al. |
| 2007/0248185 A1 | 10/2007 | Sorrells et al. |
| 2007/0248186 A1 | 10/2007 | Sorrells et al. |
| 2007/0249299 A1 | 10/2007 | Sorrells et al. |
| 2007/0249300 A1 | 10/2007 | Sorrells et al. |
| 2007/0249301 A1 | 10/2007 | Sorrells et al. |
| 2007/0249302 A1 | 10/2007 | Sorrells et al. |
| 2007/0249304 A1 | 10/2007 | Snelgrove et al. |
| 2007/0291668 A1 | 12/2007 | Duan |
| 2008/0072025 A1 | 3/2008 | Staszewski et al. |
| 2008/0089252 A1 | 4/2008 | Choi |
| 2008/0133982 A1 | 6/2008 | Rawlins et al. |
| 2008/0225929 A1 | 9/2008 | Proctor et al. |
| 2008/0225935 A1 | 9/2008 | Reddy |
| 2008/0259846 A1 | 10/2008 | Gonikberg et al. |
| 2008/0272841 A1 | 11/2008 | Sorrells et al. |
| 2008/0299913 A1 | 12/2008 | Han et al. |
| 2008/0311860 A1 | 12/2008 | Tanaka et al. |
| 2009/0004981 A1 | 1/2009 | Eliezer et al. |
| 2009/0070568 A1 | 3/2009 | Shi et al. |
| 2009/0091384 A1 | 4/2009 | Sorrells et al. |
| 2009/0134947 A1 | 5/2009 | Tarng |
| 2009/0201084 A1 | 8/2009 | See et al. |
| 2009/0227214 A1 | 9/2009 | Georgantas et al. |
| 2009/0238249 A1 | 9/2009 | Van Waasen et al. |
| 2009/0262861 A1 | 10/2009 | Nielsen |
| 2009/0262877 A1 | 10/2009 | Shi et al. |

FOREIGN PATENT DOCUMENTS

| | | |
|---|---|---|
| EP | 0 630 104 A2 | 12/1994 |
| EP | 0 708 546 A2 | 4/1996 |
| EP | 0 471 346 B1 | 11/1996 |
| EP | 0 639 307 B1 | 12/1997 |
| EP | 0 821 304 A1 | 1/1998 |
| EP | 0 725 478 B1 | 8/1998 |
| EP | 0 892 529 A2 | 1/1999 |
| EP | 0 897 213 A1 | 2/1999 |
| EP | 0 598 585 B1 | 3/1999 |
| EP | 0 630 104 B1 | 8/2000 |
| EP | 0 821 304 B1 | 2/2002 |
| EP | 1 068 666 B1 | 5/2003 |
| EP | 1 381 154 A1 | 1/2004 |
| EP | 0 897 213 B1 | 3/2004 |
| EP | 1 487 100 A1 | 12/2004 |
| EP | 1 332 550 B1 | 3/2005 |
| EP | 1 142 250 B1 | 4/2005 |
| EP | 1 521 359 A1 | 4/2005 |
| EP | 1 583 228 A2 | 10/2005 |
| GB | 2159374 A | 11/1985 |
| GB | 2 267 402 | 12/1993 |
| JP | 54-022749 A | 2/1979 |
| JP | 60-63517 A | 4/1985 |
| JP | 1-284106 A | 11/1989 |
| JP | 2-87708 A | 3/1990 |
| JP | 3-232307 A | 10/1991 |
| JP | 4-095409 A | 3/1992 |
| JP | 4-104604 A | 4/1992 |
| JP | 5-22046 A | 1/1993 |
| JP | 5-037263 A | 2/1993 |
| JP | 6-338728 A | 12/1994 |
| JP | 9-018536 A | 1/1997 |
| JP | 9-074320 A | 3/1997 |
| JP | 10-70451 A | 3/1998 |
| JP | 2000-209291 A | 7/2000 |
| JP | 2000-244261 A | 9/2000 |
| JP | 2001-136057 A | 5/2001 |
| JP | 2001-217659 A | 8/2001 |
| JP | 2001-308650 A | 11/2001 |
| JP | 2002-543729 A | 12/2002 |
| JP | 2003-298357 A | 10/2003 |
| JP | 2004-260707 A | 9/2004 |
| JP | 2005-101940 A | 4/2005 |
| JP | 2005-151543 A | 6/2005 |
| RO | 102824 | 11/1991 |
| RO | 100466 | 8/1992 |
| SU | 1322183 A1 | 7/1987 |
| WO | WO 94/21035 | 9/1994 |
| WO | WO 96/10310 | 4/1996 |
| WO | WO 96/19063 | 6/1996 |
| WO | WO 97/41642 | 11/1997 |
| WO | WO 97/48219 | 12/1997 |
| WO | WO 99/23755 | 5/1999 |
| WO | WO 99/52206 | 10/1999 |
| WO | WO 00/41371 | 7/2000 |
| WO | WO 00/67370 | 11/2000 |
| WO | WO 01/03292 | 1/2001 |
| WO | WO 01/45205 | 6/2001 |
| WO | WO 01/91282 | 11/2001 |
| WO | WO 02/39577 | 5/2002 |
| WO | WO 02/082633 | 10/2002 |
| WO | WO 03/047093 | 6/2003 |
| WO | WO 03/061115 | 7/2003 |
| WO | WO 2004/023647 | 3/2004 |
| WO | WO 2004/036736 | 4/2004 |
| WO | WO 2004/057755 | 7/2004 |
| WO | WO 2005/031966 | 4/2005 |
| WO | WO 2005/036732 | 4/2005 |
| WO | WO 2005/055413 | 6/2005 |

OTHER PUBLICATIONS

Notification of Transmittal of the International Search Report and Written Opinion, dated Sep. 3, 2008, for PCT Application No. PCT/US2008/008118, 6 pages.

Notification of Transmittal of the International Search Report and Written Opinion, dated Sep. 8, 2008, for PCT Application No. PCT/US2008/007623, 6 pages.

Silverman, L. and Del Plato, C., "Vector Modulator Enhances Feedforward Cancellation," *Microwaves & RF*, pp. 1-4 (Mar. 1998).

Notification of Transmittal of the International Search Report and Written Opinion, dated Jul. 7, 2009, for PCT Application No. PCT/US09/03212, 6 pages.

English Abstract for Japanese Patent Publication No. JP 2000-244261 A, published Sep. 8, 2000, downloaded from http://worldwide.espacenet.com, 1 page.

English Abstract for Japanese Patent Publication No. JP 2001-217659 A, published Aug. 10, 2001, downloaded from http://worldwide.espacenet.com, 1 page.

English Abstract for Japanese Patent Publication No. JP 2001-308650 A, published Nov. 2, 2001, downloaded from http://worldwide.espacenet.com, 1 page.

English Abstract for Japanese Patent Publication No. JP 22-543T29 A, published Dec. 17, 2002, downloaded from http://worldwide.espacenet.com, 1 page.

*Complaint*, filed Dec. 28, 2011, in the United States District Court, District of New Jersey, *Maxtak Capital Advisors LLC et al. v. ParkerVision, Inc. et al.*, Case No. 2:11-cv-07549-CCC-JAD, 63 pages.

Sorrells et al., U.S. Appl. No. 12/687,811, filed Jan. 14, 2010.

Jang, M. et al., "Linearity Improvement of Power Amplifier Using Modulation of Low Frequency IMD Signals," *Asia-Pacific Microwave Conference Proceedings*, vol. 2, pp. 1156-1159, Dec. 4-7, 2005.

Woo, W. et al., "A Hybrid Digital/RF Envelope Predistortion Linearization System for Power Amplifiers," *IEEE Transactions on Microwave Theory and Techniques*, vol. 53, No. 1, pp. 229-237, Jan. 2005.

Notification of Transmittal of the International Search Report and Written Opinion, dated Apr. 27, 2010, for PCT Application No. PCT/US2009/057306, 11 pages.

English Abstract for Japanese Patent Publication No. JP 2005-151543 A, published Jun. 9, 2005, downloaded from http://v3.espacenet.com, 1 page.

English Abstract for Japanese Patent Publication No. JP 1-284106 A, published Nov. 15, 1989, downloaded from http://v3.espacenet.com, 1 page.

English Abstract for Japanese Patent Publication No. JP 4-095409 A, published Mar. 27, 1992, downloaded from http://v3.espacenet.com, 1 page.

English Abstract for Japanese Patent Publication No. JP 4-104604 A, published Apr. 7, 1992, downloaded from http://v3.espacenet.com, 1 page.

English Abstract for Japanese Patent Publication No. JP 9-018536 A, published Jan. 17, 1997, downloaded from http://v3.espacenet.com, 1 page.

English Abstract for Japanese Patent Publication No. JP 9-074320 A, published Mar. 18, 1997, downloaded from http://v3.espacenet.com, 1 page.

English Abstract for Japanese Patent Publication No. JP 2000-209291 A, published Jul. 28, 2000, downloaded from http://v3.espacenet.com, 1 page.

English Abstract for Japanese Patent Publication No. JP 2003-298357 A, published Oct. 17, 2003, downloaded from http://v3.espacenet.com, 1 page.

Notification of Transmittal of the International Search Report and Written Opinion, dated Mar. 4, 2008, for PCT Application No. PCT/US07/06197, 8 pages.

English Abstract for Japanese Patent Publication No. JP 5-037263 A, published Feb. 12, 1993, downloaded from http://worldwide.espacenet.com, 1 page.

Publication No. JP 2005-101940 A, published Apr. 14, 2005, http://worldwide.espacenet.com, 1 page.

"Ampliphase AM transmission system," *ABU Technical Review*, No. 33, p. 10-18 (Jul. 1974).

"Designing an SSB Outphaser," *Electronics World*, pp. 306-310 (Apr. 1996).

"New 50 KW Ampliphase AM Transmitter," *RCA in Broadcast News*, No. 111, pp. 36-39 (Jun. 1961).

*The Ampliphase Page: Ampliphase—A quick description . . .* , Reproduction of text from http://rossrevenge.co.uk/tx/ampli.htm, 13 pages (visited Jan. 18, 2006).

Ajluni, C., "Chip Set Withstands WLAN's Future Blows," at http://www.wsdmag.com/Articles/Print.cfm'?ArticleID=6792 5 pages (Oct. 2003).

Ampen-Darko, S. and Al-Raweshidy, H.S., "Gain/phase imbalance cancellation technique in LINC transmitters," *Electronics Letters*, vol. 34, No. 22, pp. 2093-2094 (Oct. 29, 1988).

Ampen-Darko, S.O. and Al-Raweshidy, H.S., "A Novel Technique for Gain/Phase Cancellation in LINC Transmitters," *IEEE VTS—50th Vehicular Technology Conference*, Amsterdam, pp. 2034-2038 (Sep. 19-22, 1999).

Ariyavisitakul, S. and Lie, T.P., "Characterizing the Effects of Nonlinear Amplifiers on Linear Modulation for Digital Portable Radio Communications," *IEEE Transactions on Vehicular Technology*, vol. 39, No. 4, pp. 383-389 (Nov. 1990).

*ARMMS—The RF and Microwave Society—Last Meeting*, at http://www.armms.org/last.html, 4 pages (printed Apr. 14, 2005).

Asheck, P.M. et al., "Power Amplifier Approaches for High Efficiency and Linearity," in Itoh, T. et al. (cds.), *RF Technologies for Low Power Wireless Communications*, ISBN No. 0-471-38267-1, pp. 189-227 (2001).

Asbeck, P.M. et al., "Synergistic Design of DSP and Power Amplifiers for Wireless Communications," *IEEE Transactions on Microwave Theory and Techniques*, vol. 49, No. 11, pp. 2163-2169 (Nov. 2001).

Banelli, P., "Error Sensitivity in Adaptive Predistortion Systems," *Global Telecommunications Conference—Globecom '99*, pp. 883-888 (1999).

Bateman, A., et al., "The Application of Digital Signal Processing to Transmitter Linearisation," *EUROCON 88: 8th European Conference on Electrotechnics*, pp. 64-67 (Jun. 13-17, 1988).

Bespalov, V.B. and Aslamazyan, A.S., "Broadband Strip-Line SHF Ampliphasemeter," *Measurement Techniques* (Translated from Russian), vol. 25, No. 8, pp. 712-715 (Aug. 1982).

Birafane, A. and Kouki, A., "An Analytical Approach to LINC Power Combining Efficiency Estimation and Optimization," *33rd European Microwave Conference*—Munich, pp. 1227-1229 (2003).

Birafane, A. and Kouki, A., "Distortion Free LINC Amplifier with Chireix-Outphasing Combiner Using Phase-Only Predistortion," *34th European Microwave Conference*—Amsterdam, pp. 1069-1072 (2004).

Birafane, A. and Kouki, A., "On the Linearity and Efficiency of Outphasing Microwave Amplifiers," *IEEE Transactions on Microwave Theory and Techniques*, vol. 52, No. 7, pp. 1702-1708 (Jul. 2004).

Birafane, A. and Kouki, A., "Sources of Linearity Degradation in LINC Transmitters for Hybrid and Outphasing Combiners," *Canadian Conference on Electrical and Computer Engineering—Niagara Falls*, pp. 547-550 (May 2004).

Birafane, A. and Kouki, A.B., "Phase-Only Predistortion for LINC Amplifiers With Chireix-Outphasing Combiners," *IEEE Transactions on Microwave Theory and Techniques*, vol. 53, No. 6, pp. 2240-2250 (Jun. 2005).

Breed, G., "Intermodulation Distortion Performance and Measurement Issues," *High Frequency Electronics*, p. 56(2) (May 2003).

Bruckmann, H., "Modulation Arrangements and Operating Costs of Broadcasting and Radio-Telephony Transmitters," *Telegraphen-Fernsprech-Funk-und Fernsehtechnik*, vol. 24, pp. 83-91 (Apr. 1935).

Burrill, J., "Transmitting AM," *Electronics World + Wireless World*, pp. 58-60 (Jan. 1995).

Casadevall, F. and Olmos, J.J., "On the Behavior of the LINC Transmitter," *40th IEEE Vehicular Technology Conference*, pp. 29-34 (May 6-9, 1990).

Casadevall, F.J. and Valdovinos, A., "Performance Analysis of QAM Modulations Applied to the LINC Transmitter," *IEEE Transactions on Vehicular Technology*, vol. 42, No. 4, pp. 399-406 (Nov. 1993).

Casadevall, F.J., "The LINC Transmitter", *RF Design*, pp. 41-48 (Feb. 1990).

Cha, J. et al., "Highly Efficient Power Amplifier for CDMA Base Stations Using Doherty Configuration," *IEEE MTT-S International Microwave Symposium Digest*, pp. 533-536 (2004).

Chan, K.Y. et al., "Analysis and Realisation of the LINC Transmitter using the Combined Analogue Locked Loop Universal Modulator (CALLUM)," *IEEE 44th Vehicular Technology Conference*, vol. 1, pp. 484-488 (Jun. 8-10, 1994).

Chen, J.-T. et al., "The Optimal RLS Parameter Tracking Algorithm for a Power Amplifier Feedforward Linearizer," *IEEE Transactions on Circuits and Systems—II: Analog and Digital Signal Processing*, vol. 46, No. 4, pp. 464-468 (Apr. 1999).

Chireix, H., "High Power Outphasing Modulation" *Proceedings of the Institute of Radio Engineers*, vol. 23, No. 11, pp. 1370-1392 (Nov. 1935).

Choi, L.U., *Multi-user MISO and MIMO Transmit Signal Processing for Wireless Communication*, PhD Thesis submitted to the Hong Kong University of Science and Technology, 191 pages, Mar. 2003.

Clark, G., "A Comparison of AM Techniques," *ABU Technical Review*, No. 44, p. 33-42, (May 1976).

Clark, G., "A Comparison of Current Broadcast Amplitude Modulation Techniques", *IEEE Transactions on Broadcasting*, vol. BC-21, No. 2, pp. 25-31 (Jun. 1975).

Clifton, J.C. at al., "Novel Multimode J-pHEMT Front-End Architecture With Power-Control Scheme for Maximum Efficiency," *IEEE Transactions on Microwave Theory and Techniques*, vol. 53, No. 6, pp. 2251-2258 (Jun. 2005).

Colantonio, P., "High Linearity and Efficiency Microwave PAs," *12th GAAS Symposium*—Amsterdam, pp. 183-186 (2004).

*Computational Science Research Center Colloquium—Time Reversal Bases Communications in Complex Environments*, Friday, Apr. 9, 2004, 2 pages, printed Jul. 14, 2006 from http://www.sdsunivers.info/info_content_event.asp?id=15044.

Conradi, C.P. et al., "Evaluation of a Lossless Combiner in a LINC Transmitter," *Proceedings of the 1999 IEEE Canadian Conference on Electrical Computer Engineering*, pp. 105-110 (May 9-12, 1999).

Couch, L. and Walker, J.L., "A VHF LINC Amplifier," *Proceedings of IEEE Southeastcon*, pp. 122-125 (1982).

*Course #08: Advanced RF Power Amplifier Techniques for Modern Wireless and Microwave Systems*, from http://www.cei.se/008.htm, 6 pages (printed Apr. 14, 2005).

*Course #114: Advanced RF Power Amplifier Techniques*, from http://www.bessercourse.com/outlinesOnly.asp?CTID=114, 3 pages (printed Jun. 22, 2005).

Cox, "Component Signal Separation and Recombination for Linear Amplification with Nonlinear Components," *IEEE Transactions on Communications*, vol. COM-23, No. 11, pp. 1281-1287 (Nov. 1975).

Cox, D.C. and Leck, R.P., "A VHF Implementation of a LINC Amplifier," *IEEE Transactions on Communications*, pp. 1018-1022 (Sep. 1976).

Cox, D.C., "Linear Amplification with Nonlinear Components," *IEEE Transactions on Communications*, vol. COM-22, pp. 1942-1945 (Dec. 1974).

Cripps, S.C., *Advanced Techniques in RF Power Amplifier Design*, Section 2—"Doherty and Chireix," pp. 33-72, Artech House (2002).

Cripps, Steve C., *PA Linearisation in RFICs . . . ignoring the obvious?*, available at http://www.cei.se/pa_milan.ppt Hywave Associates, 24 pages (Created Aug. 2, 2001).

Cripps, Steve C., *RF Power Amplifiers for Wireless Communications*, Artech House, ISBN No. 0890069891, pp. 240-250 (Apr. 1999).

Deltimple, N. et al., "A Reconfigurable RF Power Amplifier Biasing Scheme", *Proceedings of the 2nd Annual IEEE Northeast Workshop on Circuits and Systems (NEWCAS2004)*, pp. 365-368, (Jun. 20-23, 2004).

Dinis, R. et al., "Performance Trade-Offs with Quasi-Linearly Amplified OFDM Through a Two-Branch Combining Technique," *IEEE 46$^{th}$ Vehicular Technology Conference*, pp. 899-903 (Apr. 28-May 1, 1996).

Effinger, F. et al., "Calibratable Adaptive Antenna Combiner at 5.2 GHz with High Yield for Laptop Interface Card," *IEEE Transactions on Microwave Theory and Techniques*, vol. 48, No. 12, pp. 2714-2720 (Dec. 2000).

Faust, H.H. et al., "A Spectrally Clean Transmitting System for Solid-State Phased-Array Radars," *Proceedings of the 2004 IEEE Radar Conference*, pp. 140-144 (Apr. 26-Apr. 29, 2004).

Fisher, S.T., "A New Method of Amplifying with High Efficiency a Carrier Wave Modulated in Amplitude by a Voice Wave," *Proceedings of the Institute of Radio Engineers*, vol. 34, pp. 3-13P (Jan. 1946).

García, P. et al., "An Adaptive Digital Method of Imbalances Cancellation in LINC Transmitters," *IEEE Transactions on Vehicular Technology*, vol. 54, No. 3, pp. 879-888 (May 2005).

Gaudernack, L.F., "A Phase-Opposition System of Amplitude Modulation," *6IRE Proceedings*, vol. 26, No. 8, pp. 983-1008 (Aug. 1938).

Gentzler, C.G. and Leong, S.K., "Broadband VHF/UHF Amplifier Design Using Coaxial Transformers," *High Frequency Electronics*, pp. 42, 44, 46, 48, 50, and 51 (May 2003).

Gerhard, W. and Knöchel, R., "Digital Component Separator for future W-CDMA-LINC Transmitters implemented on an FPGA," *Advances in Radio Science*, 3, pp. 239-246 (2005).

Gründlingh, J. et al., "A High Efficiency Chireix Out-phasing Power Amplifier for 5GHz WLAN Applications," *IEEE MTT-S International Microwave Symposium Digest*, vol. 3, pp. 1535-1538 (2004).

Hakala, I. et al., "A 2.14-GHz Chireix Outphasing Transmitter," *IEEE Transactions on Microwave Theory and Techniques*, vol. 53, No. 6, pp. 2129-2138 (Jun. 2005).

Hakala, I. et al., "Chireix Power Combining with Saturated Class-B Power Amplifiers," *Conference Proceedings, 34$^{th}$ European Microwave Conference*, pp. 379-382 (2004).

Hamedi-Hagh, S. and Salama, A.T., "CMOS Wireless Phase-Shifted Transmitter," *IEEE Journal of Solid-State Circuits*, vol. 39, No. 8, pp. 1241-1252 (Aug. 2004).

Hammond, R. and Henry, J., "High Power Vector Summation Switching Power Amplifier Development," *IEEE Power Electronics Specialists Conference (PESC)*, pp. 267-272 (Jun. 29 -Jul. 3, 1981).

Heiden, D., "Principle of a phase constant and low distortion amplitude modulation system for transistor transmitters," *Nachrichtentechnische Zeitschrift*, vol. 23, No. 12, pp. 608-612 (Dec. 1970).

Hetzel, S.A. et al., "LINC Transmitter," *Electronics Letters*, vol. 27, No. 10, pp. 844-846 (May 9, 1991).

Internet Postings at *"Class E-Am Forum" :: View topic—What exactly is class D?*, at http://classe.monkeypuppet.com/viewtopic.php?t=220 6 pages (Dec. 14-17, 2003).

Iwamoto, M. et al., "An Extended Doherty Amplifier with High Efficiency Over a Wide Power Range," *IEEE Transactions on Microwave Theory and Techniques*, vol. 49, No. 12, pp. 2472-2479 (Dec. 2001).

Jeong, Y.-C., *Linearizing Principles on High Power Amplifier*, Chonbuk National University School of Electronics & Information Engineering, 41 pages (Oct. 26, 2004).

Kam, P., Re: [*amsat-bb*] *AO-40 Satellite RF Architecture Question*, at http://www.uk/amsat.org/ListArchives/amsat-bb/2002/msg01409.html, 2 pages (Feb. 25, 2002).

Katz, A., *Linearization: Reducing Distortion in Power Amplifiers*, The College of New Jersey, 52 pages (Apr. 16, 2004).

Kaunisto, R., "A Vector-Locked Loop for Power Amplifier Linearization," *IEEE MTT-S International Microwave Symposium Digest*, 4 pages. (Jun. 6-11, 2004).

Kelly, W.M. et al., "Vector Modulator, Output Amplifier, and Multiplier Chain Assemblies for a Vector Signal Generator," *Hewlett-Packard Journal*, vol. 38, No. 11, pp. 48-52 (Dec. 1987).

Kenington, P.B. et al., "Broadband Linearisation of High-Efficiency Power Amplifiers," *Proceedings of the Third International Mobile Satellite Conference*, pp. 59-64 (1993).

Kim, I. et al., "The linearity and efficiency enhancement using 3-way Doherty amplifier with uneven power drive," *International Technical Conference on Circuits/Systems, Computers and Communications*, Jeju, Korea, pp. 369-370 (Jul. 2005).

Kim, J. et al., "Optimum Operation of Asymmetrical-Cells-Based Linear Doherty Power Amplifiers—Uneven Power Drive and Power Matching," *IEEE Transactions on Microwave Theory and Techniques*, vol. 53, No. 5, pp. 1802-1809 (May 2005).

Kosugi, H. et al., "A High-Efficiency Linear Power Amplifier Using an Envelope Feedback Method," *Electronics and Communications in Japan*, Part 2, vol. 77, No. 3, pp. 50-57 (1994).

Kurzrok, R., "Simple Lab-Built Test Accessories for RF, IF, Baseband and Audio," *High Frequency Electronics*, pp. 60 and 62-64 (May 2003).

Langridge, R. et al., "A Power Re-Use Technique for Improved Efficiency of Outphasing Microwave Power Amplifiers," *IEEE Transactions on Microwave Theory and Techniques*, vol. 47, No. 8, pp. 1467-1470 (Aug. 1999).

Li, C. et al., "Optimal IDM-MISO Transmit Strategy with Partial CSI at Transmitter," 6 pages, downloaded Jun. 2006 from http://www288.pair.com/ciss/ciss/numbered/36.pdf.

Love, D.J. et al, "Grassmannian Beamforming for Multiple-Input Multiple-Output Wireless Systems," pp. 1-29, downloaded Jun. 2006 from http://www.math.ucdavis.edu/~strohmer/papers/2003/grassbeam.ps.gz, Jun. 3, 2003.

Lyles, J.T.M., [*Amps*] *Amplifuzz* [*TSPA*], at http://lists.contesting.com/pipermail/amps/2005-January/042303.html, 2 pages (Jan. 28, 2005).

*Manuals and Schematics*, at http://www.lks.net/~radio/Pages/manuals.htm, 8 pages (last update Aug. 23, 2005).

Masse, D., "Advanced Techniques in RF Power Amplifier Design," *Microwave Journal (International Edition)*, vol. 45, Issue 9, p. 216 (Sep. 2002).

Masse, D., "Design of Linear RF Outphasing Power Amplifiers," *Microwave Journal (International Edition)*, vol. 47, Issue 7, p. 152 (Jul. 2004).

McCune, E., "High-Efficiency, Multi-Mode Multi-Band Terminal Power Amplifiers," *IEEE Microwave Magazine*, vol. 6, No. 1, pp. 44-55 (Mar. 2005).

McPherson, D.S. et al., "A 28 GHz HBT Vector Modulator and Its Application to an LMCS Feedforward Power Amplifier," *28$^{th}$ European Microwave Conference—Amsterdam*, vol. 1, pp. 523-528 (1998).

*Mead Education: Information Registration: RF Transceivers and Power Amplifiers*, at http://www.mead.ch/htm/ch/bios_texte/RF-PA_05_text.html, 3 pages (printed Sep. 1, 2005).

Morals, D.H. and Feher, K., "NLA-QAM: A Method for Generating High-Power QAM Signals Through Nonlinear Amplification," *IEEE Transactions on Communications*, vol. COM-30, No. 3, pp. 517-522 (Mar. 1982).

Moustakas, A.L. and Simon, S.H., "Optimizing multiple-input single-output (MISO) communication systems with general Gaussian channels; nontrivial covariance and nonzero mean," *IEEE Trans. on Information Theory*, vol. 49, Issue 10, pp. 2770-2780, Oct. 2003.

Musson, D.R., "Ampliphase . . . for Economical Super-Power AM Transmitters", *Broadcast News*, vol. No. 119, pp. 24-29 (Feb. 1964).

Norris, G.B. et al., "A Fully Monolithic 4-18 GHZ Digital Vector Modulator," *IEEE MTT-S International Microwave Symposium Diges*, pp. 789-792 (1990).

Olson, S.A. and Stengel, R.E., "LINC Imbalance Correction using Baseband Preconditioning," *Proceedings IEEE Radio Wireless Conference*, pp. 179-182 (Aug. 1-4, 1999).

Pereyra, L. A., "Modulation techniques for radiodiffusion transmitters," *Revista Telegrafica Electronica*, vol. 67, No. 801, pp. 1132-1138 and 1148 (Oct. 1979).

Pigeon, M., "A CBC Engineering Report: Montreal Antenna Replacement Project," *Broadcast Technology*, vol. 15, No. 4, pp. 25-27 (Jan. 1990).

Poitau, G. et al., "Experimental Characterization of LINC Outphasing Combiners' Efficiency and Linearity," *Proceedings IEEE Radio and Wireless Conference*, pp. 87-90 (2004).

Price, T.H., "The Circuit Development of the Ampliphase Broadcasting Transmitter," *The Proceedings of the Institution of Electrical Engineers*, vol. 101, pp. 391-399 (1954).

Qiu, R.C. et al., "Time Reversal with MISO for Ultra-Wideband Communications: Experimental Results (*invited paper*)," 4 pages, downloaded Jun. 2006 from http://iweb.tntech.edu/rqiu/paper/conference/RWS06Qiu_TH2B1.pdf.

Raab, F.H. et al., "Power Amplifiers and Transmitters for RF and Microwave," *IEEE Transactions on Microwave Theory and Techniques*, vol. 50, No. 3, pp. 814-826 (Mar. 2002).

Raab, F.H. et al., "RF and Microwave Power Amplifier and Transmitter Technologies—Part 1," *High Frequency Electronics*, pp. 22, 24, 26, 28, 29, 30, 32, 34, and 36 (May 2003).

Raab, F.H. et al., "RF and Microwave Power Amplifier and Transmitter Technologies—Part 3," *High Frequency Electronics*, pp. 34, 36, 38, 40, 42-44, 46, and 48 (2003).

Raab, F.H. et al., "RF and Microwave Power Amplifier and Transmitter Technologies—Part 5," *High Frequency Electronics*, pp. 46, 48-50, 52, and 54 (2004).

Raab, F.H., "Efficiency of Doherty RF-Power Amplifier Systems," *IEEE Transactions on Broadcasting*, vol. BC-33, No. 3, pp. 77-83 (Sep. 1987).

Raab, F.H., "Efficiency of Outphasing RF Power-Amplifier Systems," *IEEE Transactions on Communications*, vol. COM-33, No. 10, pp. 1094-1099 (Oct. 1985).

Rabjolm, G. and Wight, J., "Improving Efficiency, Output Power with 802.11a Out-Phasing PAs," at http://www.us.design-reuse.com/articles/article6937.html, 8 pages (Jan. 9, 2004).

Rustako, A.J. and Yeh, Y.S., "A Wide-Band Phase-Feedback Inverse-Sine Phase Modulator with Application Toward a LINC Amplifier," *IEEE Transactions on Communications*, vol. COM-24, No. 10, pp. 1139-1143 (Oct. 1976).

Saleh, A.A.M. and Cox, D.C., "Improving the Power-Added Efficiency of FET Amplifiers Operating with Varying-Envelope Signals," *IEEE Transactions on Microwave Theory and Techniques*, vol. 31, No. 1, pp. 51-56 (Jan. 1983).

Saraga, W., "A new version of the out-phasing (quadrature-modulation) method for frequency translation (SSB generation and detection)," *Transmission Aspects of Communications Networks*, pp. 131-134 (1964).

Shi, B. and Sundström, L., "A 200-MHz If BiCMOS Signal Component Separator for Linear LINC Transmitters," *IEEE Journal of Solid-State Circuits*, vol. 35, No. 7, pp. 987-993 (Jul. 2000).

Shi, B. and Sundström, L., "A Voltage-Translinear Based CMOS Signal Component Separator Chip for Linear LINC Transmitters," *Analog Integrated Circuits and Signal Processing*, 30, pp. 31-39 (2002).

Shi, B. and Sundström, L., "Investigation of a Highly Efficient LINC Amplifier Topology," *Proceedings IEEE 45th Vehicular Technology Conference*, vol. 2, pp. 1215-1219 (Oct. 7-11, 2001).

Shin, B. et al., "Linear Power Amplifier based on 3-Way Doherty Amplifier with Predistorter," *IEEE MTT-S International Microwave Symposium Digest*, pp. 2027-2030 (2004).

Simon, M. and Weigel, R., "A Low Noise Vector Modulator with integrated Basebandfilter in 120 nm CMOS Technology," 2003 *IEEE Radio Frequency Integrated Circuits Symposium*, pp. 409-412 (2003).

Skarbek, I. "New High-Efficiency 5-KW AM Transmitter 'Unique Class C Amplifier Operates with 90% Efficiency'," *RCE Broadcast News # 107*, pp. 8-13 (Mar. 1960).

Sokal, N. O., "RF Power Amplifiers, Classes A though S—How they Operate, and When to Use Each," *Electronics Industries Forum of New England, Professional Program Proceedings*, Boston, MA, pp. 179-252 (1997).

Staudinger, J. et al, "High Efficiency CDMA RF Power Amplifier Using Dynamic Envelope Tracking Technique," *IEEE MTT-S International Microwave Symposium Digest*, vol. 2, pp. 873-876 (Jun. 11-16, 2000).

Stengel, B. and Eisenstadt, W.R., "LINC Power Amplifier Combiner Method Efficiency Optimization," *IEEE Transactions on Vehicular Technology*, vol. 49, No. 1, pp. 229-234 (Jan. 2000).

Sundström, L. "Spectral Sensitivity of LINC Transmitters to Quadrature Modulator Misalignments," *IEEE Transactions on Vehicular Technology*, vol. 49, No. 4, pp. 1474-1487 (Jul. 2000).

Sandström, L., "Automatic adjustment of gain and phase imbalances in LINC transmitters," *Electronics Letters*, vol. 31, No. 3, pp. 155-156 (Feb. 2, 1995).

Sundström, L., "Effect of modulation scheme on LINC transmitter power efficiency," *Electronics Letters*, vol. 30, No. 20, pp. 1643-1645 (Sep. 29, 1994).

Sundström, L., "Effects of reconstruction filters and sampling rate for a digital signal component separator on LINC transmitter performance," *Electronics Letters*, vol. 31, No. 14, pp. 1124-1125 (Jul. 6, 1995).

Sundström, L., "The Effect of Quantization in a Digital Signal Component Separator for Linc Transmitters," *IEEE Transactions on Vehicular Technology*, vol. 45, No. 2, pp. 346-352 (May 1996).

Sundström, L., *Digital RF Power Amplifier Linearisers Analysis and Design*, Department of Applied Electronics, Lund University, pp. i-x and 1-64 (1995).

Tan, J. S. and Gardner, P., "A LINC Demonstrator Based on Switchable Phase Shifters," *Microwave and Optical Technology Letters*, vol. 35, No. 4, pp. 262-264 (Nov. 20, 2002).

Tchamov, N. T., *Power Amplifiers*, Tampere University of Technology, Institute of Communications Engineering, RF-ASIC Laboratory, 26 pages (May 17, 2004).

*TDP: RCA BHF-100A*, at http://www.transmitter.be/rca-bhf100a.html 8 pages (printed Jun. 15, 2005).

*The Ampliphase Ancestry*, at http://www.rossrevenge.co.uk/tx/ancest.htm, 8 pages, (latest update Aug. 2002).

Tomisato, S. et al., "Phase Error Free LINC Modulator," *Electronics Letters*, vol. 25, No. 9, pp. 576-577 (Apr. 27, 1989).

Ullah, I., "Exciter Modulator for an Ampliphase Type Broadcast Transmitter," *ABU Technical Review*, No. 62, pp. 21-27 (May 1979).

Ullah, I., "Output Circuit of an Ampliphase Broadcast Transmitter," *ABU Technical Review*, No. 63, pp. 17-24 (Jul. 1979).

Vasyukov, V.V. et al., "The Effect of Channel Phase Asynunetry on Nonlinear Distortions in Modulation by Dephasing," *Radioelectronics and Communications Systems*, vol. 28, No. 4, pp. 86-87 (1985).

Venkataramani, M., *Efficiency Improvement of WCDMA Base Station Transmitters using Class-F power amplifiers*, Thesis, Virginia Polytechnic Institute, Blacksburg, Virginia, pp. i-xi and 1-55 (Feb. 13, 2004).

Virmani, B.D., "Phase-to-amplitude modulation," *Wireless World*, vol. 61, No. 4, pp. 183-187 (Apr. 1955).

Wang, F. et at, "Envelope Tracking Power Amplifier with Pre-Distortion Linearization for WLAN 802.11g," *2004 IEEE MTT-S International Microwave Symposium Digest*, vol. 3, pp. 1543-1546 (Jun. 6-11, 2004).

Whitaker, Jerry C., *Power Vacuum Tubes Handbook* (*Electronics Handbook Series*), CRC Publishing, ISBN No. 0849313457, pp. 236-238 (May 1999).

Wight, J., "Computational microwave circuits arrive," at http://www.eetimes.com/showArticle.jhtml?articleID-18900752, EE Times, 3 pages (Apr. 12, 2004).

Woo, Y.Y. et al., "SDR Transmitter Based on LINC Amplifier with Bias Control," *IEEE MTT-S International Microwave Symposium Digest*, pp. 1703-1706 (2003).

Ya, S. et al., "A C-Band Monolithic Vector Modulator," *Research & Progress of SSE*, vol. 14, No. 4, pp. 302-306 (Nov. 1994).

Yang, Y. et al., "A Fully Matched *N*-Way Doherty Amplifier With Optimized Linearity," *IEEE Transactions on Microwave Theory and Techniques*, vol. 51, No. 3. pp. 986-993 (Mar. 2003).

Yang, Y. et al., "A Microwave Doherty Amplifier Employing Envelope Tracking Technique for High Efficiency and Linearity," *IEEE Microwave and Wireless Components Letters*, vol. 13, No. 9, pp. 370-372 (Sep. 2003).

Yang, Y. et al, "Experimental Investigation on Efficiency and Linearity of Microwave Doherty Amplifier," IEEE, 4 pages (2001).

Yang, Y. et al., "Optimum Design for Linearity and Efficiency of a Microwave Doherty Amplifier Using a New Load Matching Technique," *Microwave Journal*, 8 pages (Dec. 1, 2001).

Yankin, V. A., "Effect of quantization, amplifier noise and the parameters of the calibration elements on the accuracy of measurement using a six-port microwave ampliphasemeter," *Radioelectronics and Communication Systems*, vol. 32, No. 8, pp. 110-112 (1989).

Yao, J. and Long, S.I., "High Efficiency Switching-Mode Amplifier for Mobile and Base Station Applications," Final Report 2002-2003 for MICRO Project 02-044, 4 pages.

Yao, J. et al., "High Efficiency Switch Mode Amplifiers for Mobile and Base Station Applications," Final Report 2000-2001 for MICRO Project 00-061, 4 pages (2000-2001).

Yi, J. et a., "Effect of efficiency optimization on linearity of LINC amplifiers with CDMA signal," *IEEE MMT-S International Microwave Symposium Digest*, vol. 2, pp. 1359-1362 (May 2001).

Zhang X., *An Improved Outphasing Power Amplifier System for Wireless Communications*, Dissertation, University of California, San Diego, pp. i-xvii and 1-201 (2001).

Zhang, X. and Larson, L.E., "Gain and Phase Error-Free LINC Transmitter," *IEEE Transactions on Vehicular Technology*, vol. 49, No. 5, pp. 1986-1994 (Sep. 2000).

Zhang, X. et al. "Gain/Phase Imbalance-Minimization Techniques for LINC Transmitters," *IEEE Transactions on Microwave Theory and Techniques*, vol. 49, No. 12, pp. 2507-2516 (Dec. 2001).

Zhang, X. et al., "A Gain/Phase Imbalance Minimization Technique for LINC Transmitter," *IEEE MTT-S International Microwave Symposium Digest*, pp. 801-804 (2001).

Zhang, X. et al., "Analysis of Power Recycling Techniques for RF and Microwave Outphasing Power Amplifiers," *IEEE Transactions on Circuits and Systems II: Analog and Digital Signal Processing*, vol. 49, No. 5, p. 312-320 (May 2002).

Zhang, X. et al., "Calibration scheme for LINC transmitter," *Electronics Letters*, vol. 37, No. 5, pp. 317-318 (Mar. 1, 2001).

Zhang, X. et al., *Design of Linear RF Outphasing Power Amplifiers*, entire book, Artech House, ISBN No. 1-58053-374-4 (2003).

Zhong, S.S. and Cui, J.H., "A New Dual Polarized Aperture-Coupled Printer Array for SAR Applications," *Journal of Shanghai University (English Edition)*, vol. 5, No. 4, pp. 295-298 (Dec. 2001).

English Abstract for European Patent Publication No. EP 0 639 307 B1, downloaded from http://vs.espacenet.com, 1 page, 1997.

English Abstract for European Patent Publication No. EP 0 708 546 A2, downloaded from http://vs.espacenet.com, 1 page, 1996.

English Abstract for European Patent Publication No. EP 0 892 529 A2, downloaded from http://vs.espacenet.com, 1 page, 1999.

English Abstract for Japanese Patent Publication No. JP 60-63517 A, downloaded from http://vs.espacenet.com, 1 page, 1985.

English Abstract for Japanese Patent Publication No. JP 2-87702 A, downloaded from http://vs.espacenet.com, 1 page, 1990.

English Abstract for Japanese Patent Publication No. JP 3-232307 A, downloaded from http://vs.espacenet.com, 1 page, 1991.

English Abstract for Japanese Patent Publication No. JP 5-22046 A, downloaded from http://vs.espacenet.com, 1 page, 1993.

English Abstract for Japanese Patent Publication No. JP 6-338728 A, downloaded from http://vs.espacenet.com, 1 page, 1994.

English Abstract for Japanese Patent Publication No. JP 10-70451 A, downloaded from http://vs.espacenet.com, 1 page, 1998.

English Abstract for Japanese Patent Publication No. JP 2001-136057 A, downloaded from http://vs.espacenet.com, 1 page, 2001.

English Abstract for Japanese Patent Publication No. JP 2004-260707 A, downloaded from http://vs.espacenet.com, 1 page, 2004.

English Translation for Romanian Patent Publication No. RO 100466, obtained from Transperfect Translations, 4 pages, 1992.

English Abstract for Romanian Patent Publication No. RO 102824, downloaded from http://vs.espacenet.com, 1 page, 1991.

English Translation for Russian Patent Publication No. SU 1322183 A1, obtained from Transperfect Translations, 2 pages, 1987.

* cited by examiner

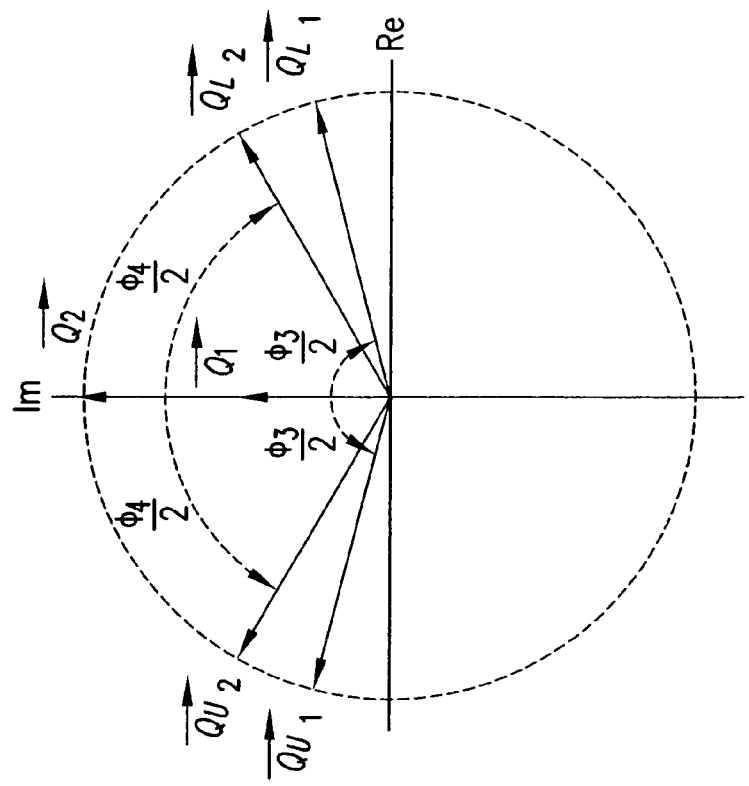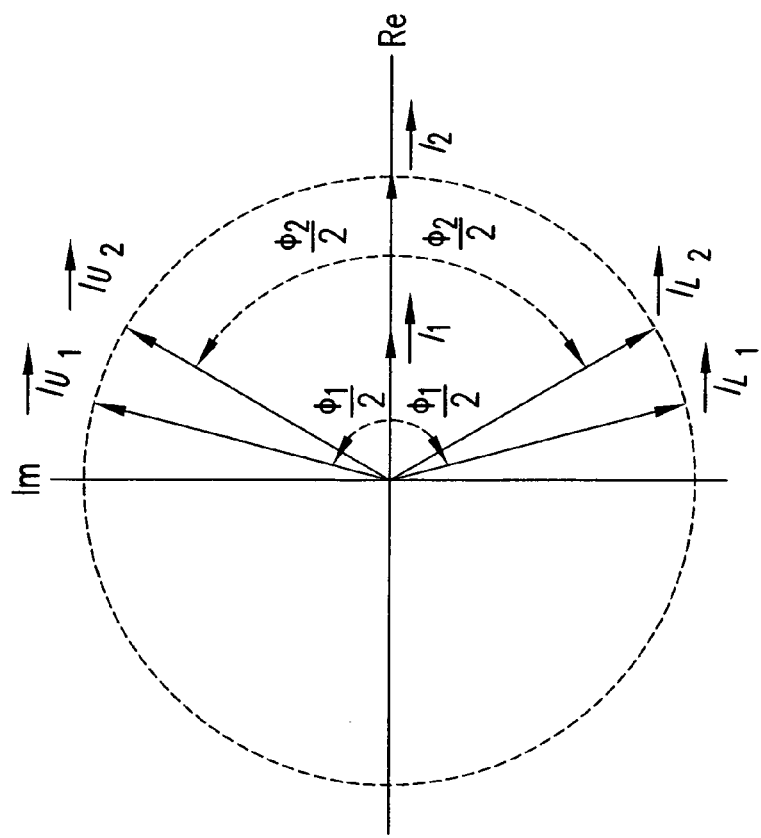
FIG.4

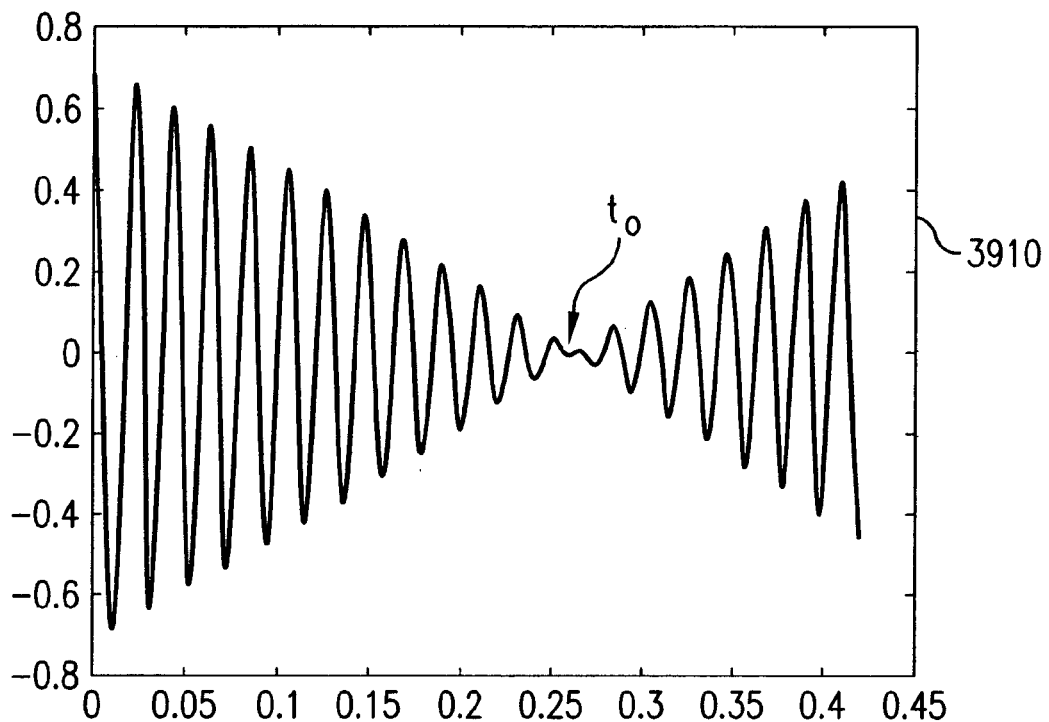
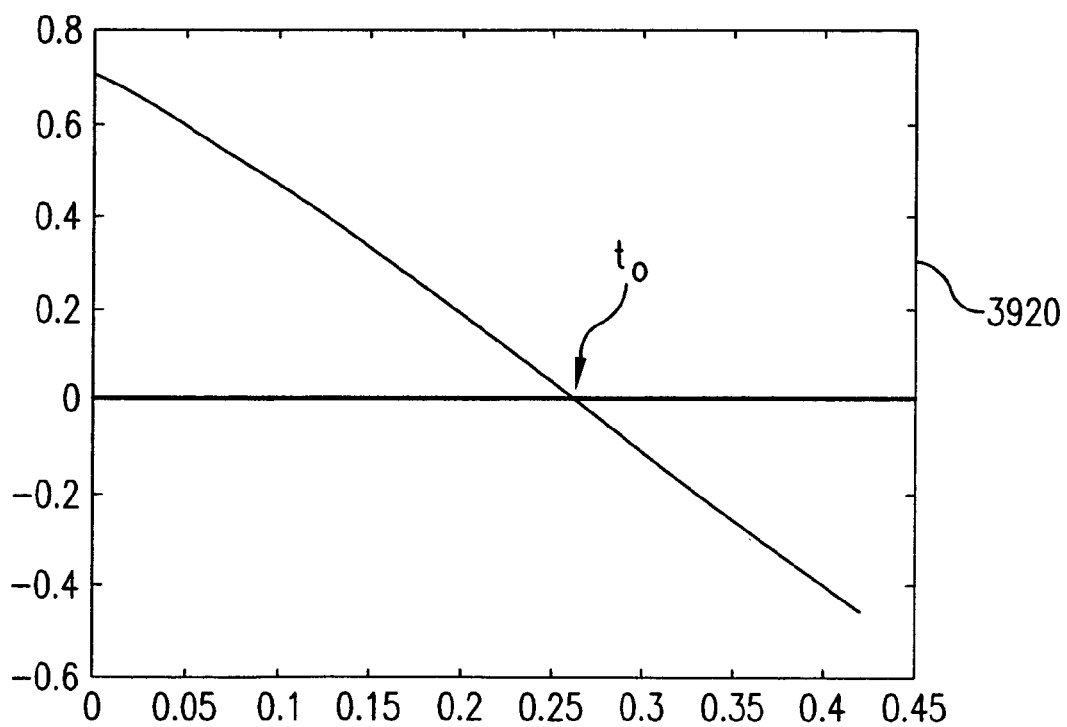
FIG.39

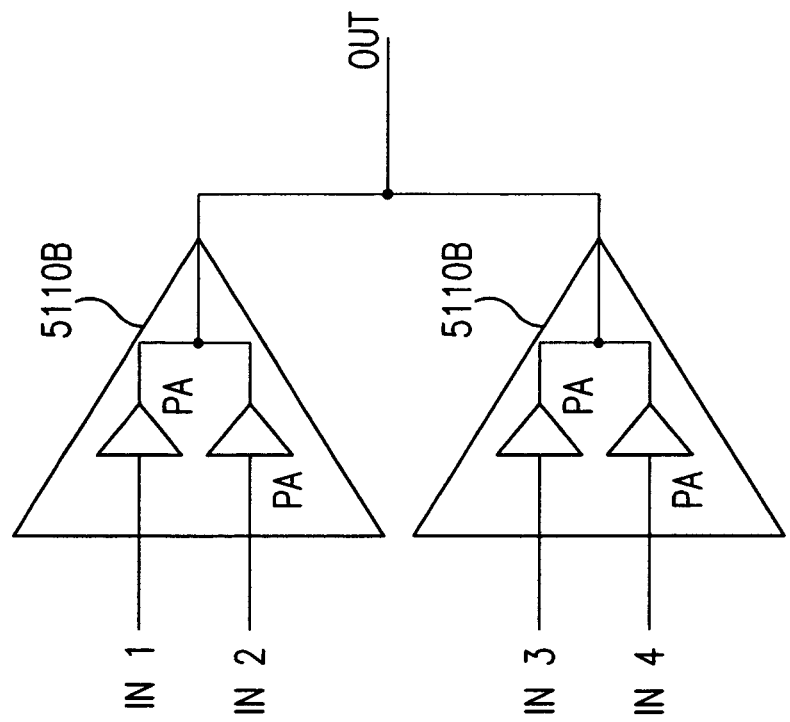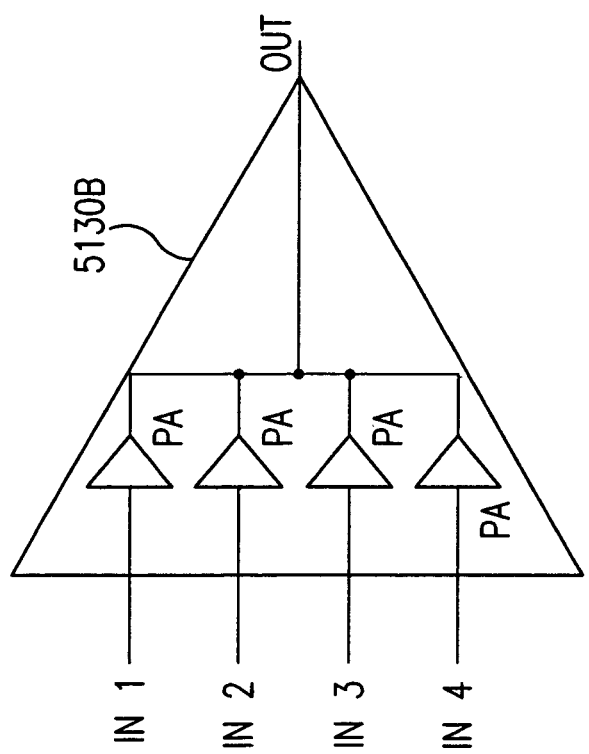
FIG.51C

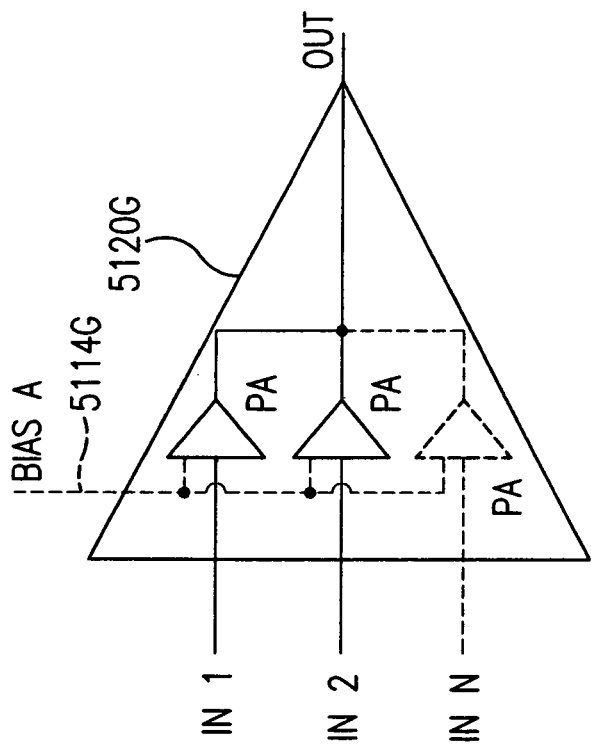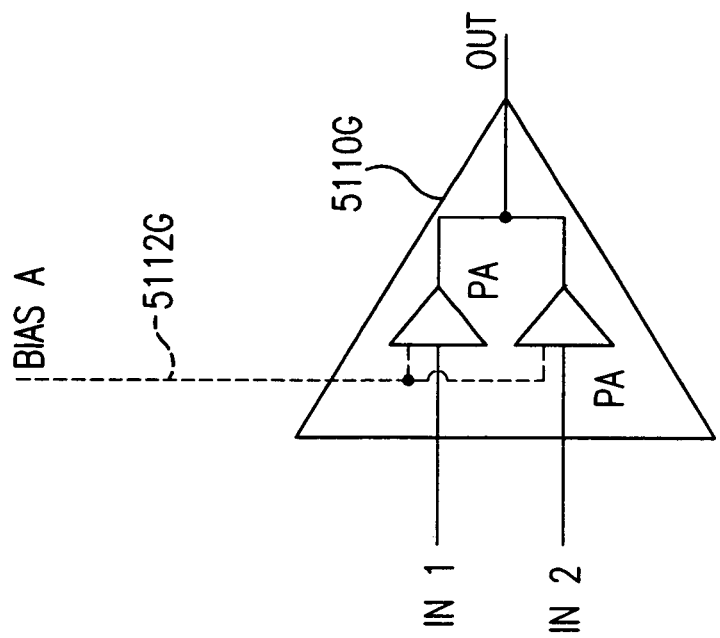
FIG.51G

2 INPUT MULTIPLE INPUT/SINGLE OUTPUT AMPLIFIER WITH OPTIONAL DRIVER AND PRE-DRIVER

MULTIPLE INPUT SINGLE OUTPUT (MISO) AMPLIFIER HAVING MULTIPLE TRANSISTORS WHOSE OUTPUT VOLTAGES SUBSTANTIALLY EQUAL THE AMPLIFIER OUTPUT VOLTAGE

CROSS-REFERENCE TO RELATED APPLICATIONS

The present application claims the benefit of U.S. Provisional Patent Application No. 60/620,972 filed on Oct. 22, 2004, U.S. Provisional Patent Application No. 60/671,542 filed on Apr. 15, 2005, U.S. Provisional Patent Application No. 60/671,536 filed on Apr. 15, 2005, U.S. Provisional Patent Application No. 60/673,397 filed on Apr. 21, 2005, U.S. Provisional Patent Application No. 60/706,003 filed on Aug. 8, 2005, U.S. Provisional Patent Application No. 60/709,092 filed on Aug. 18, 2005, U.S. Provisional Patent Application No. 60/717,244 filed on Sep. 16, 2005, and U.S. Provisional Patent Application No. 60/721,114 filed on Sep. 28, 2005, all of which are incorporated herein by reference.

BACKGROUND OF THE INVENTION

1. Field of the Invention

The present invention related generally to modulation and on-frequency power amplification. More particularly, the invention relates to methods and systems for vector combining power amplification.

2. Background Art

In power amplifiers, a complex tradeoff typically exists between linearity and power efficiency.

Linearity is determined by a power amplifier's operating range on a characteristic curve that relates its input to output variables—the more linear the operating range the more linear the power amplifier is said to be. Linearity is a desired characteristic of a power amplifier. In one aspect, for example, it is desired that a power amplifier uniformly amplifies signals of varying amplitude, and/or phase and/or frequency. Accordingly, linearity is an important determiner of the output signal quality of a power amplifier.

Power efficiency can be calculated using the relationship of the total power delivered to a load divided by the total power supplied to the amplifier. For an ideal amplifier, power efficiency is 100%. Typically, power amplifiers are divided into classes which determine the amplifier's maximum theoretical power efficiency. Power efficiency is clearly a desired characteristic of a power amplifier—particularly, in wireless communication systems where power consumption is significantly dominated by the power amplifier.

Unfortunately, the traditional tradeoff between linearity and efficiency in power amplifiers is such that the more linear a power amplifier is the less power efficient it is. For example, the most linear amplifier is biased for class A operation, which is the least efficient class of amplifiers. On the other hand, higher class amplifiers such as class B, C, D, E, etc, are more power efficient, but are considerably non-linear which can result in spectrally distorted output signals.

The tradeoff described above is further accentuated by typical wireless communication signals. Wireless communication signals, such as OFDM, CDMA, and W-CDMA for example, are generally characterized by their peak-to-average power ratios. The larger the signal's peak to average ratio the more non-linear distortion will be produced when non-linear amplifiers are employed.

Outphasing amplification techniques have been proposed for RF amplifier designs. In several aspects, however, existing outphasing techniques are deficient in satisfying complex signal amplification requirements, particularly as defined by wireless communication standards, for example.

In one aspect, existing outphasing techniques employ an isolating and/or a combining element when combining constant envelope constituents of a desired output signal. For example, it is commonly the case that a power combiner is used to combine the constituent signals. This combining approach, however, typically results in a degradation of output signal power due to insertion loss and limited bandwidth, and, correspondingly, a decrease in power efficiency.

In another aspect, the typically large size of combining elements precludes having them in monolithic amplifier designs.

What is needed therefore are power amplification methods and systems that solve the deficiencies of existing power amplifying techniques while maximizing power efficiency and minimizing non-linear distortion. Further, power amplification methods and systems that can be implemented without the limitations of traditional power combining circuitry and techniques are needed.

BRIEF SUMMARY OF THE INVENTION

Embodiments for vector combining power amplification are disclosed herein.

In one embodiment, a plurality of substantially constant envelope signals are individually amplified, then combined to form a desired time-varying complex envelope signal. Phase and/or frequency characteristics of one or more of the signals are controlled to provide the desired phase, frequency, and/or amplitude characteristics of the desired time-varying complex envelope signal.

In another embodiment, a time-varying complex envelope signal is decomposed into a plurality of substantially constant envelope constituent signals. The constituent signals are amplified, and then re-combined to construct an amplified version of the original time-varying envelope signal.

Embodiments of the invention can be practiced with modulated carrier signals and with baseband information and clock signals. Embodiments of the invention also achieve frequency up-conversion. Accordingly, embodiments of the invention represent integrated solutions for frequency up-conversion, amplification, and modulation.

Embodiments of the invention can be implemented with analog and/or digital controls. The invention can be implemented with analog components or with a combination of analog components and digital components. In the latter embodiment, digital signal processing can be implemented in an existing baseband processor for added cost savings.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure and methods particularly pointed out in the written description and claims hereof as well as the appended drawings.

It is to be understood that both the foregoing summary and the following detailed description are exemplary and explanatory and are intended to provide further explanation of embodiments of the invention as claimed.

BRIEF DESCRIPTION OF THE FIGURES

Embodiments of the present invention will be described with reference to the accompanying drawings, wherein generally like reference numbers indicate identical or functionally similar elements. Also, generally, the leftmost digit(s) of the reference numbers identify the drawings in which the associated elements are first introduced.

FIG. 4 is a phasor diagram that illustrates a Cartesian 4-Branch Vector Power Amplification (VPA) method of an embodiment of the present invention.

FIG. 39 illustrates an example time-varying complex envelope PA output signal and a corresponding envelop signal.

FIGS. 51A-I illustrate exemplary multiple-input single-output (MISO) output stage embodiments.

The present invention will be described with reference to the accompanying drawings. The drawing in which an element first appears is typically indicated by the leftmost digit(s) in the corresponding reference number.

DETAILED DESCRIPTION OF THE INVENTION

Figure 1:
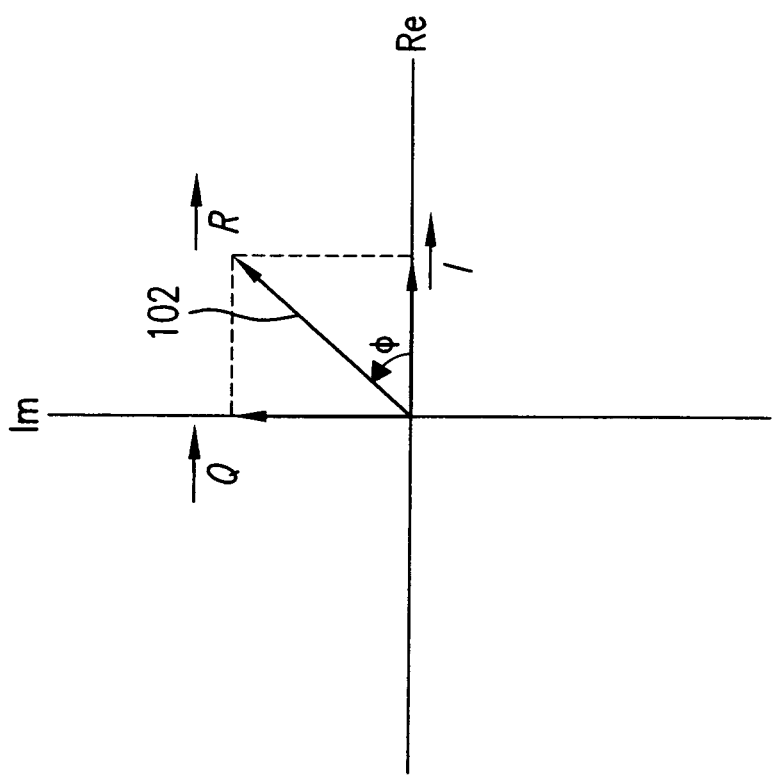
FIG. 1 illustrates a phasor representation of a signal.

Table of Contents
1. Introduction
  1.1. Example Generation of Time-Varying Complex Envelope Input Signals
  1.2. Example Generation of Time-Varying Complex Envelope Signals from Constant Envelope Signals
  1.3. Vector Power Amplification Overview
2. General Mathematical Overview
  2.1. Phasor Signal Representation
  2.2. Time-Varying Complex Envelope Signals
  2.3. Constant Envelope Decomposition of Time-Varying Envelope Signals
3. Vector Power Amplification (VPA) Methods and Systems
  3.1. Cartesian 4-Branch Vector Power Amplifier
  3.2. Cartesian-Polar-Cartesian-Polar (CPCP) 2-Branch Vector Power Amplifier
  3.3. Direct Cartesian 2-Branch Vector Power Amplifier
  3.4. I and Q Data to Vector Modulator Transfer Functions
    3.4.1. Cartesian 4-Branch VPA Transfer Function
    3.4.2. CPCP 2-Branch VPA Transfer Function
    3.4.3. Direct Cartesian 2-Branch VPA Transfer Function
    3.4.4. Magnitude to Phase Shift Transform
      3.4.4.1. Magnitude to Phase Shift Transform for Sinusoidal Signals
      3.4.4.2. Magnitude to Phase Shift Transform for Square Wave Signals
    3.4.5. Waveform Distortion Compensation
  3.5. Output Stage
    3.5.1. Output Stage Embodiments
    3.5.2. Output Stage Current Shaping
    3.5.3. Output Stage Protection
  3.6. Harmonic Control
  3.7. Power Control
  3.8. Exemplary Vector Power Amplifier Embodiment
4. Summary
5. Conclusions

1. INTRODUCTION

Methods, apparatuses and systems for vector combining power amplification are disclosed herein.

Vector combining power amplification is an approach for optimizing linearity and power efficiency simultaneously. Generally speaking, and referring to flowchart 502 in FIG. 50, in step 504 a time-varying complex envelope input signal, with varying amplitude and phase, is decomposed into constant envelope constituent signals. In step 506, the constant envelope constituent signals are amplified, and then in step 508 summed to generate an amplified version of the input complex envelope signal. Since substantially constant envelope signals may be amplified with minimal concern for non-linear distortion, the result of summing the constant envelope signals suffers minimal non-linear distortion while providing optimum efficiency.

Accordingly, vector combining power amplification allows for non-linear power amplifiers to be used to efficiently amplify complex signals whilst maintaining minimal non-linear distortion levels.

For purposes of convenience, and not limitation, methods and systems of the present invention are sometimes referred to herein as vector power amplification (VPA) methods and systems.

A high-level description of VPA methods and systems according to embodiments of the present invention is now provided. For the purpose of clarity, certain terms are first defined below. The definitions described in this section are provided for convenience purposes only, and are not limiting. The meaning of these terms will be apparent to persons skilled in the art(s) based on the entirety of the teachings provided herein. These terms may be discussed throughout the specification with additional detail.

The term signal envelope, when used herein, refers to an amplitude boundary within which a signal is contained as it fluctuates in the time domain. Quadrature-modulated signals can be described by $$r(t) = i(t) \cdot \cos(\omega c \cdot t) + q(t) \cdot \sin(\omega c \cdot t)$$

where i(t) and q(t) represent in-phase and quadrature signals with the signal envelope e(t), being equal to $e(t) = \sqrt{i(t)^2 + q(t)^2}$ and the phase angle associated with r(t) is related to arctan (q(t)/i(t)).

The term constant envelope signal, when used herein, refers to in-phase and quadrature signals where $e(t) = \sqrt{i(t)^2 + q(t)^2}$, with e(t) having a relatively or substantially constant value.

The term time-varying envelope signal, when used herein, refers to a signal having a time-varying signal envelope. A time-varying envelope signal can be described in terms of in-phase and quadrature signals as $e(t)=\sqrt{i(t)^2+q(t)^2}$, with e(t) having a time-varying value.

The term phase shifting, when used herein, refers to delaying or advancing the phase component of a time-varying or constant envelope signal relative to a reference phase.

1.1) Example Generation of Complex Envelope Time-Varying Input Signals

Figure 1A:
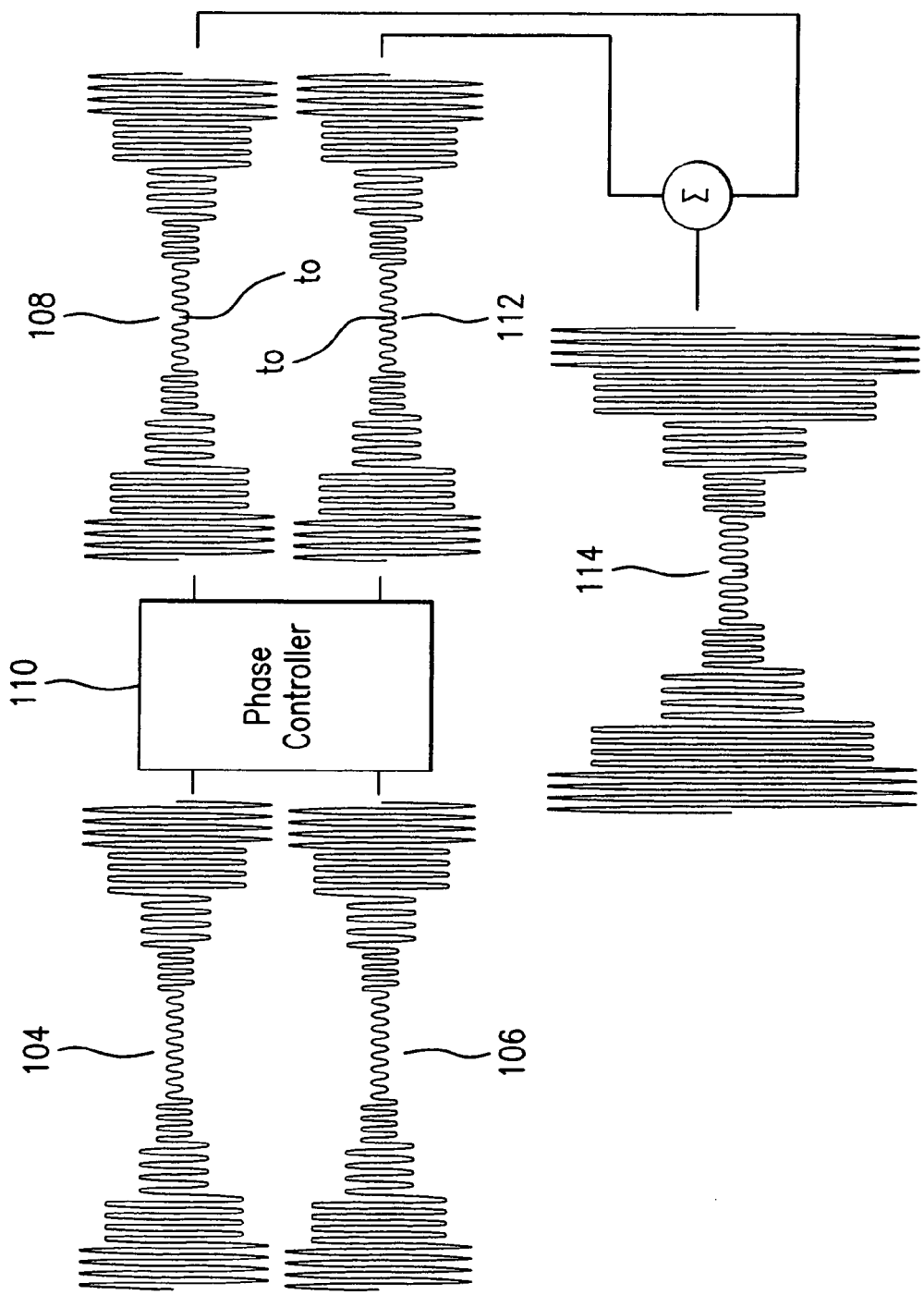
FIG. 1A is an example that illustrates the generation of an exemplary time-varying complex envelope signal.
Figure 1B:
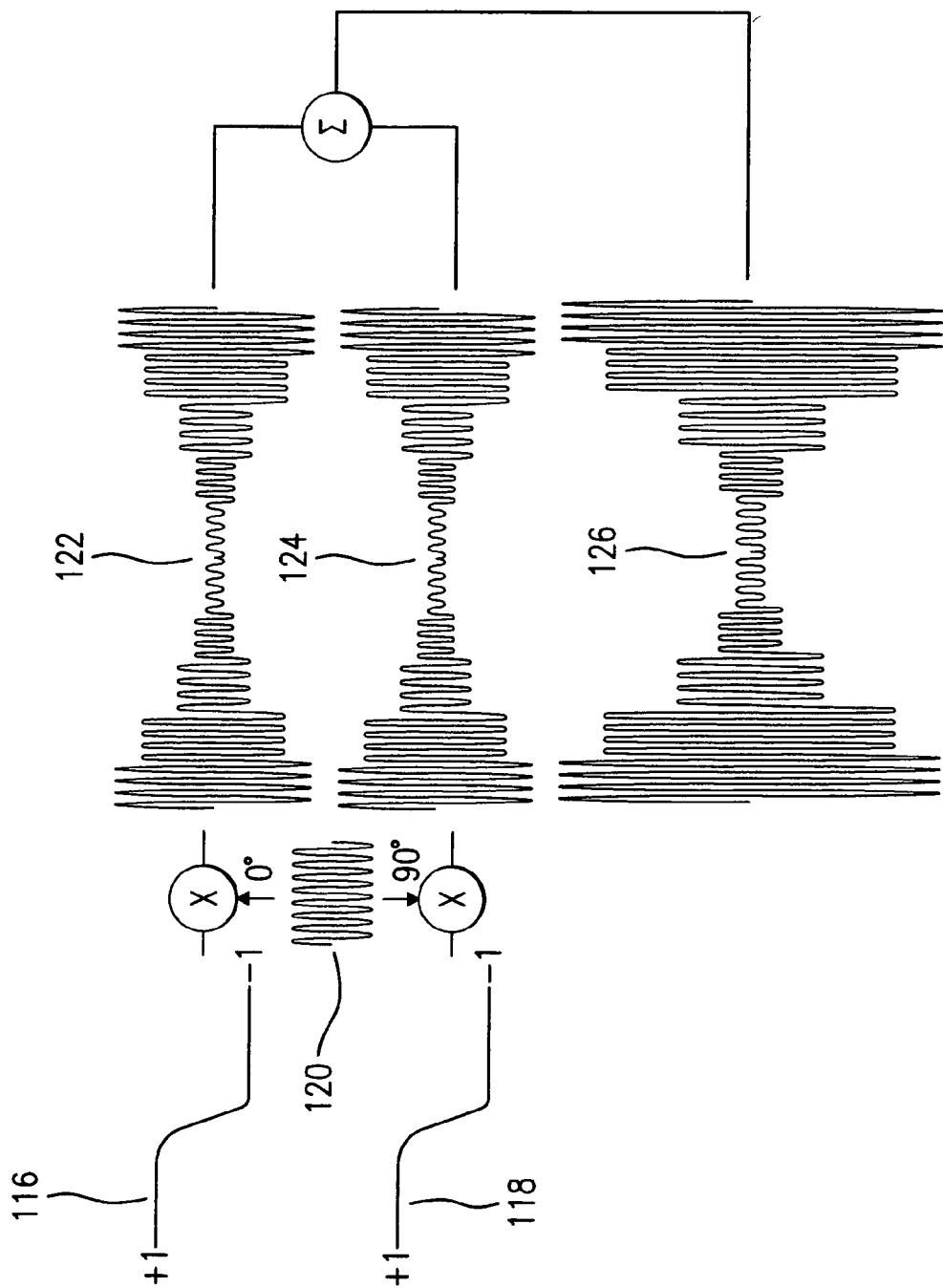
FIG. 1B is another example that illustrates the generation of an exemplary time-varying complex envelope signal.

FIGS. 1A and 1B are examples that illustrate the generation of time-varying envelope and phase complex input signals. In FIG. 1A, time-varying envelope carrier signals 104 and 106 are input into phase controller 110. Phase controller 110 manipulates the phase components of signals 104 and 106. In other words, phase controller 110 may phase shift signals 104 and 106. Resulting signals 108 and 112, accordingly, may be phased shifted relative to signals 104 and 106. In the example of FIG. 1A, phase controller 110 causes a phase reversal (180 degree phase shift) in signals 104 and 106 at time instant $t_o$, as can be seen from signals 108 and 112. Signals 108 and 112 represent time-varying complex carrier signals. Signals 108 and 112 have both time-varying envelopes and phase components. When summed, signals 108 and 112 result in signal 114. Signal 114 also represents a time-varying complex signal. Signal 114 may be an example input signal into VPA embodiments of the present invention (for example, an example input into step 504 of FIG. 50).

Time-varying complex signals may also be generated as illustrated in FIG. 1B. In FIG. 1B, signals 116 and 118 represent baseband signals. For example, signals 116 and 118 may be in-phase (I) and quadrature (Q) baseband components of a signal. In the example of FIG. 1B, signals 116 and 118 undergo a zero crossing as they transition from +1 to −1. Signals 116 and 118 are multiplied by signal 120 or signal 120 phase shifted by 90 degrees. Signal 116 is multiplied by a 0 degree shifted version of signal 120. Signal 118 is multiplied by a 90 degree shifted version of signal 120. Resulting signals 122 and 124 represent time-varying complex carrier signals. Note that signals 122 and 124 have envelopes that vary according to the time-varying amplitudes of signals 116 and 118. Further, signals 122 and 124 both undergo phase reversals at the zero crossings of signals 116 and 118. Signals 122 and 124 are summed to result in signal 126. Signal 126 represents a time-varying complex signal. Signal 126 may represent an example input signal into VPA embodiments of the present invention. Additionally, signals 116 and 118 may represent example input signals into VPA embodiments of the present invention.

Figure 1C:
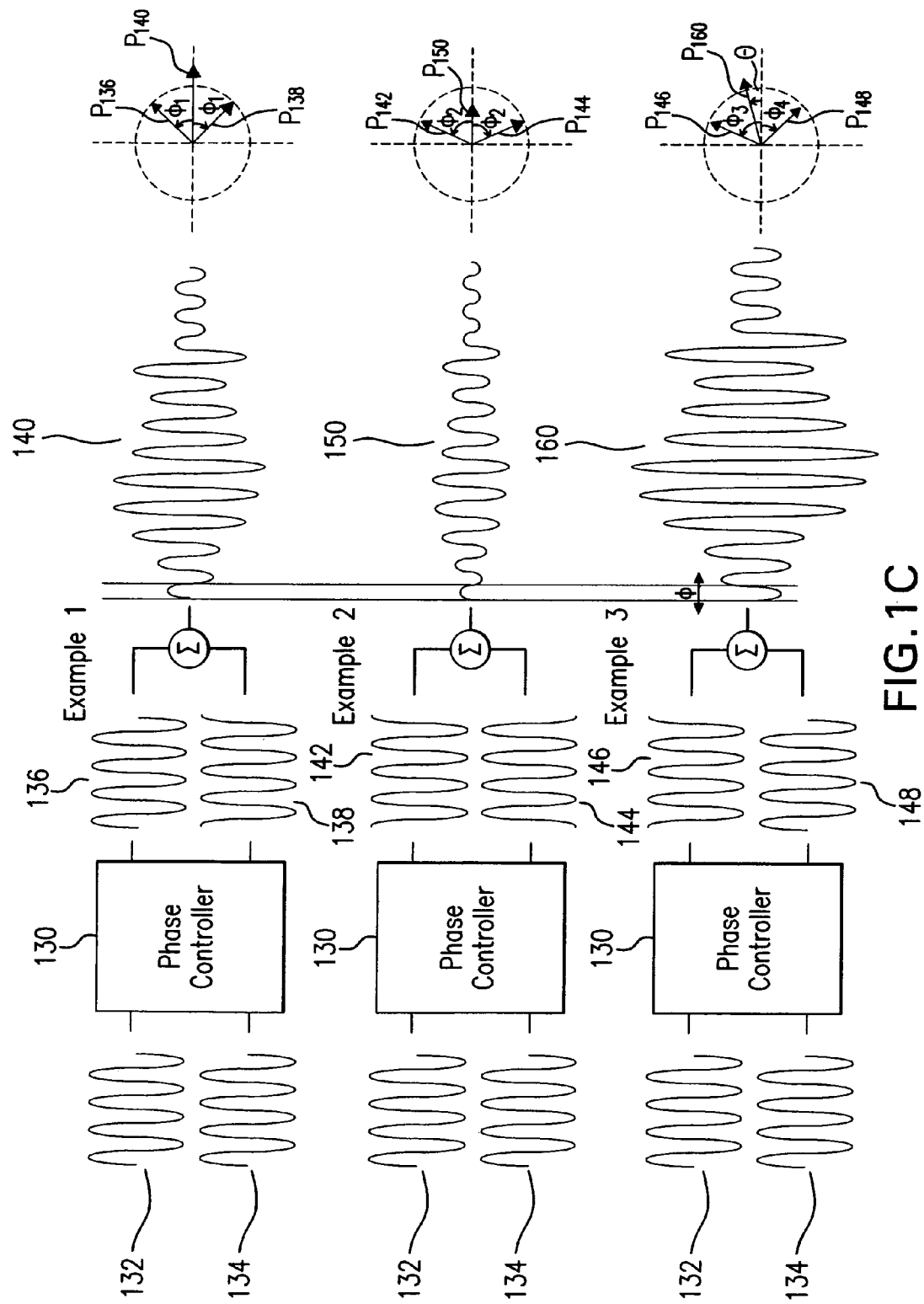
FIG. 1C is an example that illustrates the generation of an exemplary time-varying complex envelope signal from the sum of two or more constant envelope signals.
Figure 50:
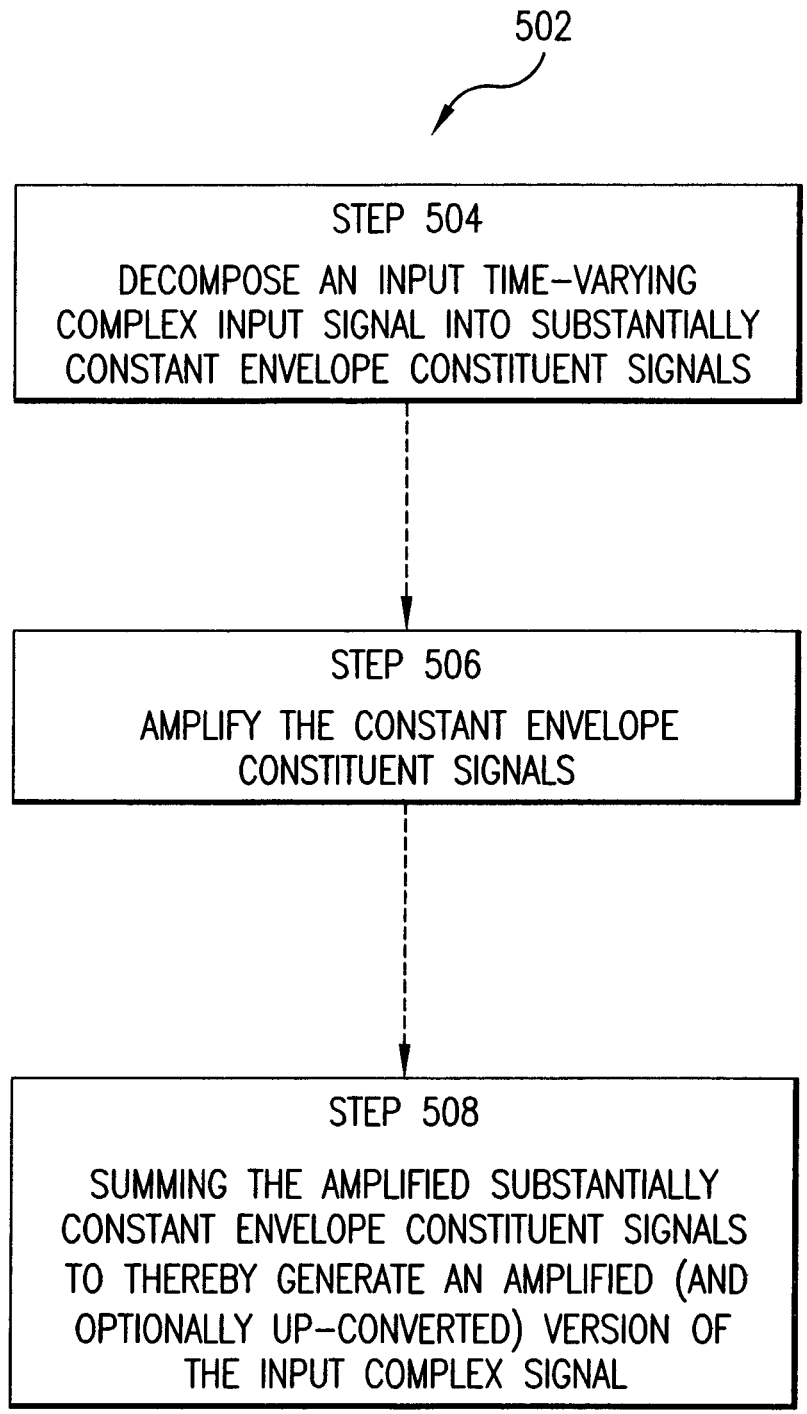
FIG. 50 is a process flowchart for power amplification according to an embodiment of the present invention.

1.2) Example Generation of Time-Varying Complex Envelope Signals from Constant Envelope Signals The description in this section generally relates to the operation of step 508 in FIG. 50. FIG. 1C illustrates three examples for the generation of time-varying complex signals from the sum of two or more substantially constant envelope signals. A person skilled in the art will appreciate, however, based on the teachings provided herein that the concepts illustrated in the examples of FIG. 1C can be similarly extended to the case of more than two constant envelope signals.

In example 1 of FIG. 1C, constant envelope signals 132 and 134 are input into phase controller 130. Phase controller 130 manipulates phase components of signals 132 and 134 to generate signals 136 and 138, respectively. Signals 136 and 138 represent substantially constant envelope signals, and are summed to generate signal 140. The phasor representation in FIG. 1C, associated with example 1 illustrates signals 136 and 138 as phasors $P_{136}$ and $P_{138}$, respectively. Signal 140 is illustrated as phasor $P_{140}$. In example 1, $P_{136}$ and $P_{138}$ are symmetrically phase shifted by an angle $\phi_1$ relative to a reference signal assumed to be aligned with the real axis of the phasor representation. Correspondingly, time domain signals 136 and 138 are phase shifted in equal amounts but opposite directions relative to the reference signal. Accordingly, $P_{140}$, which is the sum of $P_{136}$ and $P_{138}$, is in-phase with the reference signal.

In example 2 of FIG. 1C, substantially constant envelope signals 132 and 134 are input into phase controller 130. Phase controller 130 manipulates phase components of signals 132 and 134 to generate signals 142 and 144, respectively. Signals 142 and 144 are substantially constant envelope signals, and are summed to generate signal 150. The phasor representation associated with example 2 illustrates signals 142 and 144 as phasors $P_{142}$ and $P_{144}$, respectively. Signal 150 is illustrated as phasor $P_{150}$. In example 2, $P_{142}$ and $P_{144}$ are symmetrically phase shifted relative to a reference signal. Accordingly, similar to $P_{140}$, $P_{150}$ is also in-phase with the reference signal. $P_{142}$ and $P_{144}$, however, are phase shifted by an angle whereby $\phi_2 \neq \phi_1$ relative to the reference signal. $P_{150}$, as a result, has a different magnitude than $P_{140}$ of example 1. In the time domain representation, it is noted that signals 140 and 150 are in-phase but have different amplitudes relative to each other.

In example 3 of FIG. 1C, substantially constant envelope signals 132 and 134 are input into phase controller 130. Phase controller 130 manipulates phase components of signals 132 and 134 to generate signals 146 and 148, respectively. Signals 146 and 148 are substantially constant envelope signals, and are summed to generate signal 160. The phasor representation associated with example 3 illustrates signals 146 and 148 as phasors $P_{146}$ and $P_{148}$, respectively. Signal 160 is illustrated as phasor $P_{160}$. In example 3, $P_{146}$ is phased shifted by an angle $\phi_3$ relative to the reference signal. $P_{148}$ is phase shifted by an angle $\phi_4$ relative to the reference signal. $\phi_3$ and $\phi_4$ may or may not be equal. Accordingly, $P_{160}$, which is the sum of $P_{146}$ and $P_{148}$, is no longer in-phase with the reference signal. $P_{160}$ is phased shifted by an angle $\Theta$ relative to the reference signal. Similarly, $P_{160}$ is phase shifted by $\Theta$ relative to $P_{140}$ and $P_{150}$ of examples 1 and 2. $P_{160}$ may also vary in amplitude relative to $P_{140}$ as illustrated in example 3.

In summary, the examples of FIG. 1C demonstrate that a time-varying amplitude signal can be obtained by the sum of two or more substantially constant envelope signals (Example 1). Further, the time-varying signal can have amplitude changes but no phase changes imparted thereon by equally shifting in opposite directions the two or more substantially constant envelope signals (Example 2). Equally shifting in the same direction the two or more constant envelope constituents of the signal, phase changes but no amplitude changes can be imparted on the time-varying signal. Any time-varying amplitude and phase signal can be generated using two or more substantially constant envelope signals (Example 3).

It is noted that signals in the examples of FIG. 1C are shown as sinusoidal waveforms for purpose of illustration only. A person skilled in the art will appreciate based on the teachings herein that other types of waveforms may also have been used. It should also be noted that the examples of FIG. 1C are provided herein for the purpose of illustration only, and may or may not correspond to a particular embodiment of the present invention.

1.3) Vector Power Amplification Overview

Figure 1D:
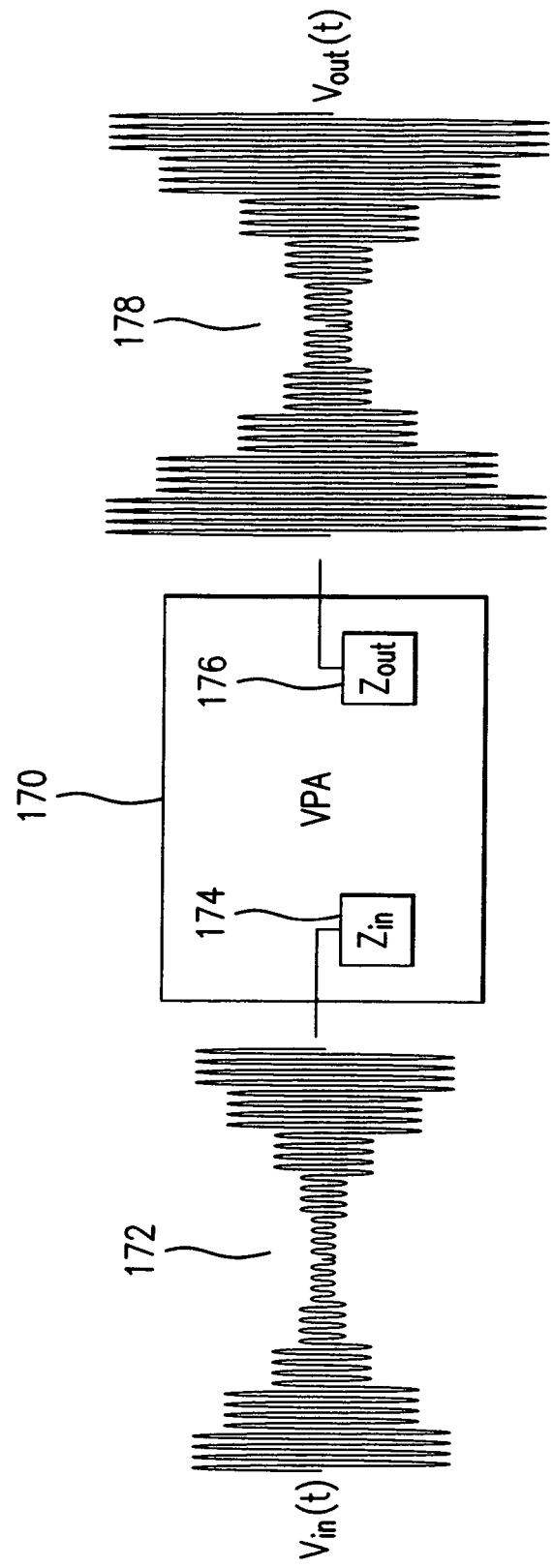
FIG. 1D illustrates the power amplification of an example time-varying complex envelope signal according to an embodiment of the present invention.

A high-level overview of vector power amplification is now provided. FIG. 1D illustrates the power amplification of an exemplary time-varying complex input signal 172. Signals 114 and 126 as illustrated in FIGS. 1A and 1B may be examples of signal 172. Further, signal 172 may be generated by or comprised of two or more constituent signals such as 104 and 106 (FIG. 1A), 108 and 112 (FIG. 1A), 116 and 118 (FIG. 1B), and 122 and 124 (FIG. 1B).

In the example of FIG. 1D, VPA 170 represents a VPA system embodiment according to the present invention. VPA 170 amplifies signal 172 to generate amplified output signal 178. Output signal 178 is amplified efficiently with minimal distortion.

In the example of FIG. 1D, signals 172 and 178 represent voltage signals $V_{in}(t)$ and $V_{olt}(t)$, respectively. At any time instant, in the example of FIG. 1D, $V_{in}(t)$ and $V_{olt}(t)$ are related such that $V_{olt}(t)=Kev_{in}(tat')$, where K is a scale factor and t' represents a time delay that may be present in the VPA system. For power implication, $$\frac{V_{out}^2(t)}{Z_{out}} > \frac{V_{in}^2(t)}{Z_{in}},$$

where output signal 178 is a power amplified version of input signal 172.

Figure 1E:
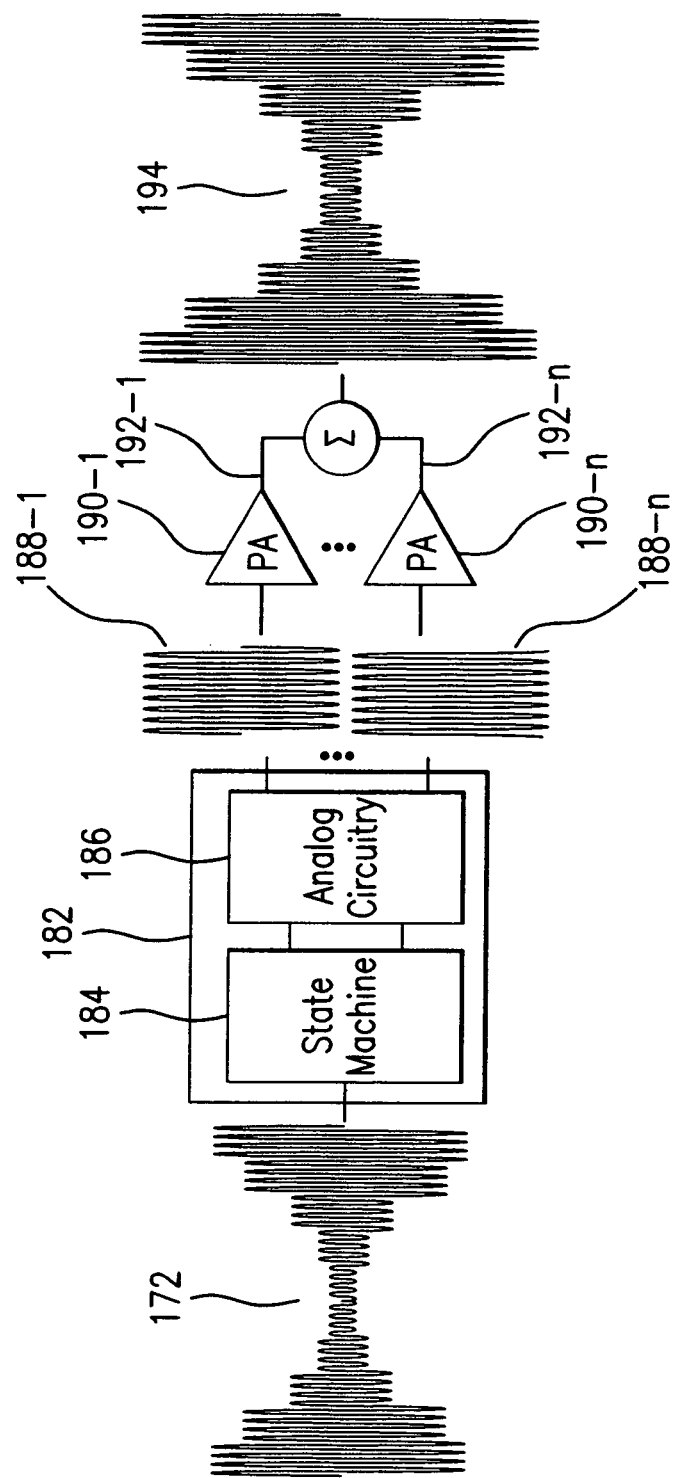
FIG. 1E is a block diagram that illustrates a vector power amplification embodiment of the present invention.

Linear (or substantially linear) power amplification of time-varying complex signals, as illustrated in FIG. 1D, is achieved according to embodiments of the present as shown in FIG. 1E.

FIG. 1E is an example block diagram that conceptually illustrates a vector power amplification embodiment according to embodiments of the present invention. In FIG. 1E, input signal 172 represents a time-varying complex signal. For example, input signal 172 may be generated as illustrated in FIGS. 1A and 1B. In embodiments signal 172 may be a digital or an analog signal. Further, signal 172 may be a baseband or a carrier-based signal.

Referring to FIG. 1E, according to embodiments of the present invention, input signal 172 or equivalents thereof are input into VPA 182. In the embodiment of FIG. 1E, VPA 182 includes a state machine 184 and analog circuitry 186. State machine 184 may include digital and/or analog components. Analog circuitry 186 includes analog components. VPA 182 processes input signal 172 to generate two or more signals 188-$\{1, \ldots, n\}$, as illustrated in FIG. 1E. As described with respect to signals 136, 138, 142, 144, and 146, 148, in FIG. 1C, signals 188-$\{1, \ldots, n\}$ may or may not be phase shifted relative to each other over different periods of time. Further, VPA 182 generates signals 188-$\{1, \ldots, n\}$ such that a sum of signals 188-$\{1, \ldots, n\}$ results in signal 194 which, in certain embodiments, can be an amplified version of signal 172.

Still referring to FIG. 1E, signals 188-$\{1, \ldots, n\}$ are substantially constant envelope signals. Accordingly, the description in the prior paragraph corresponds to step 504 in FIG. 50.

In the example of FIG. 1E, generally corresponding to step 506 in FIG. 50, constant envelope signals 188-$\{1, \ldots, n\}$ are each independently amplified by a corresponding power amplifier (PA) 190-$\{1, \ldots, n\}$ to generate amplified signals 192-$\{1, \ldots, n\}$. In embodiments, PAs 190-$\{1, \ldots, n\}$ amplify substantially equally respective constant envelope signals 188-$\{1, \ldots, n\}$. Amplified signals 192-$\{1, \ldots, n\}$ are substantially constant envelope signals, and in step 508 are summed to generate output signal 194. Note that output signal 194 can be a linearly (or substantially linearly) amplified version of input signal 172. Output signal 194 may also be a frequency-upconverted version of input signal 172, as described herein.

2. GENERAL MATHEMATICAL OVERVIEW 2.1) Phasor Signal Representation

FIG. 1 illustrates a phasor representation $\vec{R}$ 102 of a signal r(t). A phasor representation of a signal is explicitly representative of the magnitude of the signal's envelope and of the signal's phase shift relative to a reference signal. In this document, for purposes of convenience, and not limitation, the reference signal is defined as being aligned with the real (Re) axis of the orthogonal space of the phasor representation. The invention is not, however, limited to this embodiment. The frequency information of the signal is implicit in the representation, and is given by the frequency of the reference signal. For example, referring to FIG. 1, and assuming that the real axis corresponds to a $\cos(\omega t)$ reference signal, phasor $\vec{R}$ would translate to the function $r(t)=R(t)\cos(\omega t+\phi(t))$, where R is the magnitude of $\vec{R}$.

Still referring to FIG. 1, it is noted that phasor $\vec{R}$ can be decomposed into a real part phasor $\vec{I}$ and an imaginary part phasor $\vec{Q}$. $\vec{I}$ and $\vec{Q}$ are said to be the in-phase and quadrature phasor components of $\vec{R}$ with respect to the reference signal. It is further noted that the signals that correspond to $\vec{I}$ and $\vec{Q}$ are related to r(t) as $I(t)=R(t)\cdot\cos(\phi(t))$ and $Q(t)=R(t)\cdot\sin(\phi(t))$, respectively. In the time domain, signal r(t) can also be written in terms of its in-phase and quadrature components as follows:

$$r(t)=I(t)\cdot\cos(\omega t)+Q(t)\cdot\sin(\omega t)=R(t)\cdot\cos(\phi(t))\cdot\cos(\omega t)+R(t)\cdot\sin(\phi(t))\cdot\sin(\omega t) \quad (1)$$

Note that, in the example of FIG. 1, R(t) is illustrated at a particular instant of time.

2.2) Time-Varying Complex Envelope Signals

Figure 2:
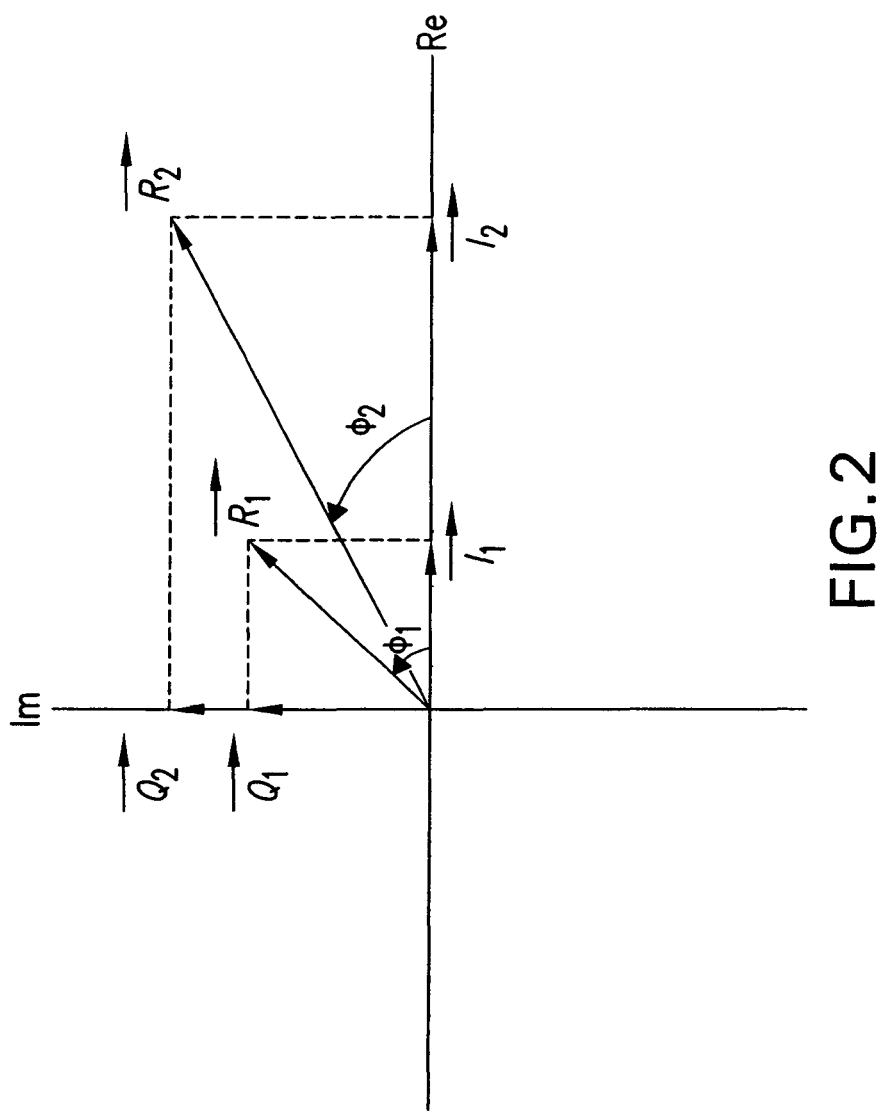
FIG. 2 illustrates a phasor representation of a time-varying complex envelope signal.

FIG. 2 illustrates a phasor representation of a signal r(t) at two different instants of time t1 and t2. It is noted that the magnitude of the phasor, which represents the magnitude of the signal's envelope, as well as its relative phase shift both vary from time t1 to time t2. In FIG. 2, this is illustrated by the varying magnitude of phasors $\vec{R_1}$ and $\vec{R_2}$ and their corresponding phase shift angles $\phi_1$ and $\phi_2$. Signal r(t), accordingly, is a time-varying complex envelope signal.

It is further noted, from FIG. 2, that the real and imaginary phasor components of signal r(t) are also time-varying in amplitude. Accordingly, their corresponding time domain signals also have time-varying envelopes.

Figure 3A:
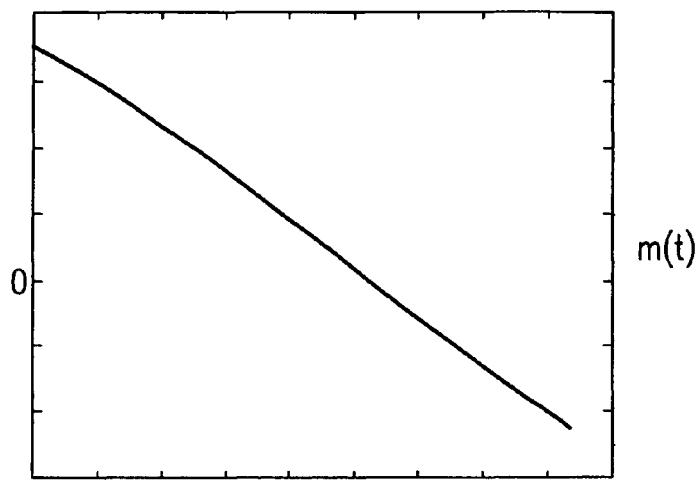
FIGS. 3A-3C illustrate an example modulation to generate a time-varying complex envelope signal.
Figure 3B:
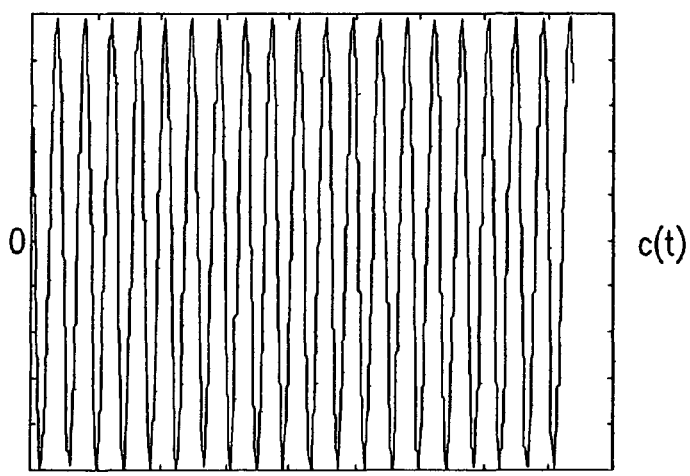
Figure 3C:
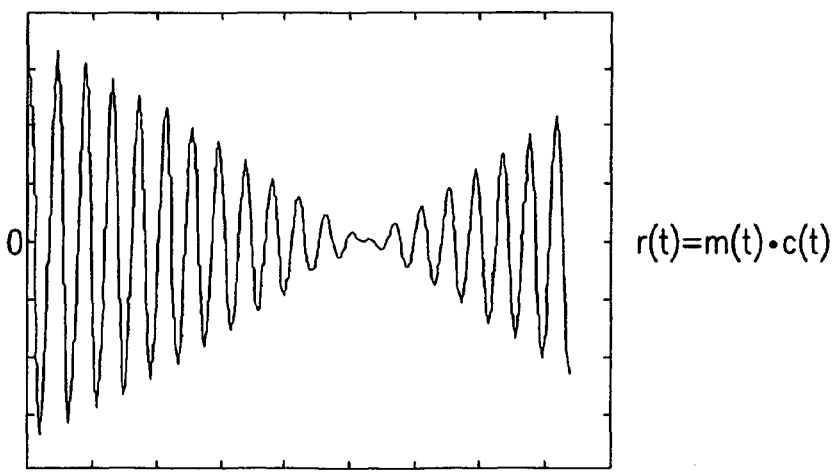

FIGS. 3A-3C illustrate an example modulation to generate a time-varying complex envelope signal. FIG. 3A illustrates a view of a signal m(t). FIG. 3B illustrates a view of a portion of a carrier signal c(t). FIG. 3C illustrates a signal r(t) that results from the multiplication of signals m(t) and c(t).

In the example of FIG. 3A, signal m(t) is a time-varying magnitude signal. m(t) further undergoes a zero crossing. Carrier signal c(t), in the example of FIG. 3B, oscillates at some carrier frequency, typically higher than that of signal m(t).

From FIG. 3C, it can be noted that the resulting signal r(t) has a time-varying envelope. Further, it is noted, from FIG. 3C, that r(t) undergoes a reversal in phase at the moment when the modulating signal m(t) crosses zero. Having both non-constant envelope and phase, r(t) is said to be a time-varying complex envelope signal.

2.3) Constant Envelope Decomposition of Time-Varying Envelope Signals

Any phasor of time-varying magnitude and phase can be obtained by the sum of two or more constant magnitude phasors having appropriately specified phase shifts relative to a reference phasor.

Figure 3D:
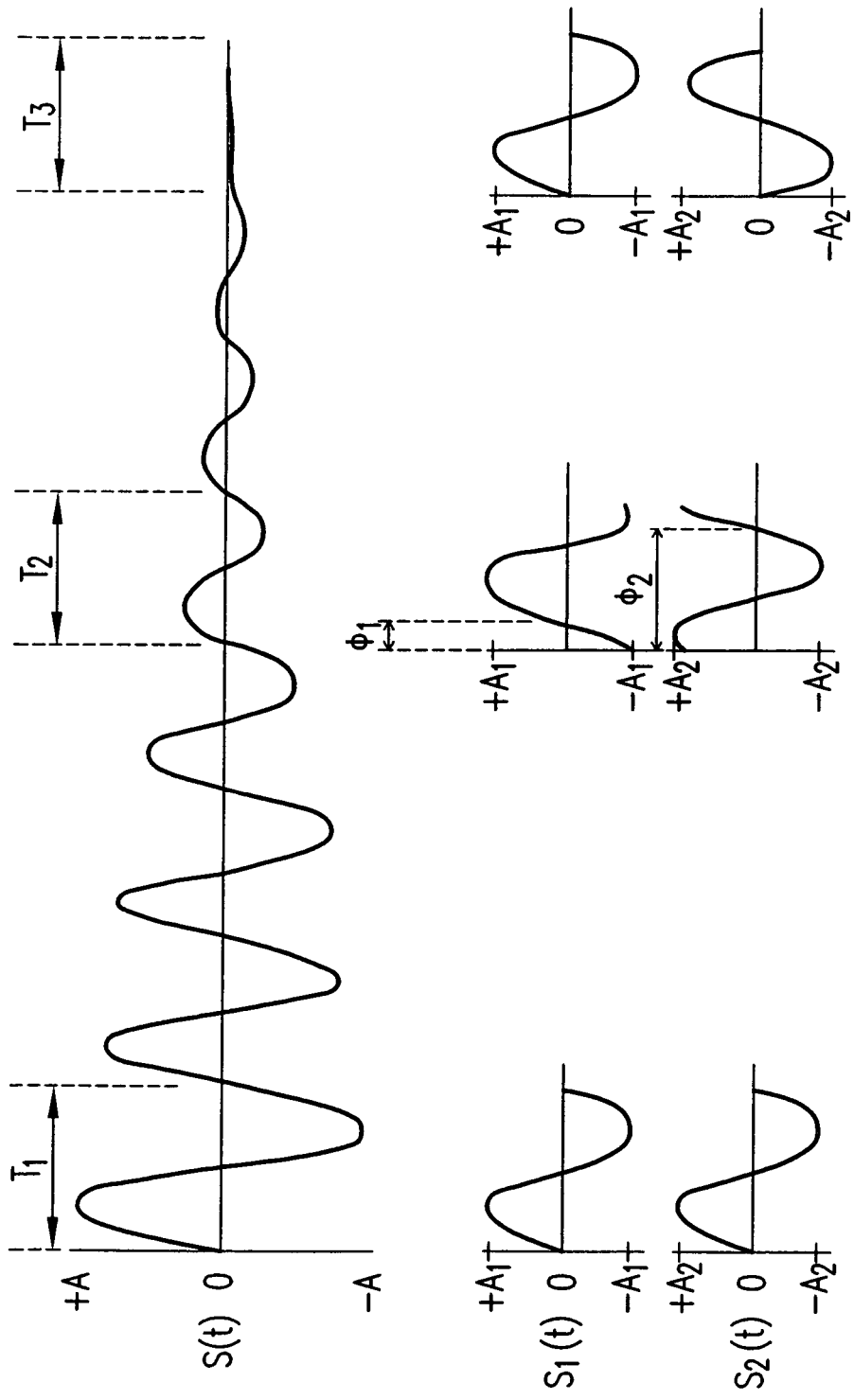
FIG. 3D is an example that illustrates constant envelope decomposition of a time-varying envelope signal.

FIG. 3D illustrates a view of an example time-varying envelope and phase signal S(t). For ease of illustration, signal S(t) is assumed to be a sinusoidal signal having a maximum envelope magnitude A. FIG. 3D further shows an example of how signal S(t) can be obtained, at any instant of time, by the sum of two constant envelope signals $S_1(t)$ and $S_2(t)$. Generally, $S_1(t)=A_1 \sin(\omega t+\phi_1(t))$ and $S_1(t)=A_2 \sin(\omega t+\phi_2(t))$.

For the purpose of illustration, three views are provided in FIG. 3D that illustrate how by appropriately phasing signals $S_1(t)$ and $S_2(t)$ relative to S(t), signals $S_1(t)$ and $S_2(t)$ can be summed so that $S(t)=K(S_1(t)+S_2(t))$ where K is a constant. In other words, signal S(t) can be decomposed, at any time instant, into two or more signals. From FIG. 3D, over period $T_1$, $S_1(t)$ and $S_2(t)$ are both in-phase relative to signal S(t), and thus sum to the maximum envelope magnitude A of signal S(t). Over period $T_3$, however, signals $S_1(t)$ and $S_2(t)$ are 180 degree out-of-phase relative to each other, and thus sum to a minimum envelope magnitude of signal S(t).

The example of FIG. 3D illustrates the case of sinusoidal signals. A person skilled in the art, however, will understand that any time-varying envelope, which modulates a carrier signal that can be represented by a Fourier series or Fourier transform, can be similarly decomposed into two or more substantially constant envelope signals. Thus, by controlling the phase of a plurality of substantially constant envelope signals, any time-varying complex envelope signal can be generated.

3. VECTOR POWER AMPLIFICATION METHODS AND SYSTEMS

Vector power amplification methods and systems according to embodiments of the present invention rely on the ability to decompose any time-varying envelope signal into two or more substantially constant envelope constituent signals or to receive or generate such constituent signals, amplify the constituent signals, and then sum the amplified signals to generate an amplified version of the time-varying complex envelope signal.

In sections 3.1-3.3, vector power amplification (VPA) embodiments of the present invention are provided, including 4-branch and 2-branch embodiments. In the description, each VPA embodiment is first presented conceptually using a mathematical derivation of underlying concepts of the embodiment. An embodiment of a method of operation of the VPA embodiment is then presented, followed by various system level embodiments of the VPA embodiment.

Section 3.4 presents various embodiments of control modules according to embodiments of the present invention. Control modules according to embodiments of the present invention may be used to enable certain VPA embodiments of the present invention. In some embodiments, the control modules are intermediary between an input stage of the VPA embodiment and a subsequent vector modulation stage of the VPA embodiment.

Section 3.5 describes VPA output stage embodiments according to embodiments of the present invention. Output stage embodiments are directed to generating the output signal of a VPA embodiment.

Section 3.6 is directed to harmonic control according to embodiments of the present invention. Harmonic control may be implemented in certain embodiments of the present invention to manipulate the real and imaginary power in the harmonics of the VPA embodiment, thus increasing the power present in the fundamental frequency at the output.

Section 3.7 is directed to power control according to embodiments of the present invention. Power control may be implemented in certain embodiments of the present invention in order to satisfy power level requirements of applications where VPA embodiments of the present invention may be employed.

3.1) Cartesian 4-Branch Vector Power Amplifier

According to one embodiment of the invention, herein called the Cartesian 4-Branch VPA embodiment for ease of illustration and not limitation, a time-varying complex envelope signal is decomposed into 4 substantially constant envelope constituent signals. The constituent signals are equally or substantially equally amplified individually, and then summed to construct an amplified version of the original time-varying complex envelope signal.

It is noted that 4 branches are employed in this embodiment for purposes of illustration, and not limitation. The scope of the invention covers use of other numbers of branches, and implementation of such variations will be apparent to persons skilled in the art based on the teachings contained herein.

In one embodiment, a time-varying complex envelope signal is first decomposed into its in-phase and quadrature vector components. In phasor representation, the in-phase and quadrature vector components correspond to the signal's real part and imaginary part phasors, respectively.

As described above, magnitudes of the in-phase and quadrature vector components of a signal vary proportionally to the signal's magnitude, and are thus not constant envelope when the signal is a time-varying envelope signal. Accordingly, the 4-Branch VPA embodiment further decomposes each of the in-phase and quadrature vector components of the signal into four substantially constant envelope components, two for the in-phase and two for the quadrature signal components. This concept is illustrated in FIG. 4 using a phasor signal representation.

In the example of FIG. 4, phasors $\vec{I}_1$ and $\vec{I}_2$ correspond to the real part phasors of an exemplary time-varying complex envelope signal at two instants of time t1 and t2, respectively. It is noted that phasors $\vec{I}_1$ and $\vec{I}_2$ have different magnitudes.

Still referring to FIG. 4, at instant t1, phasor $\vec{I}_1$ can be obtained by the sum of upper and lower phasors $\vec{I}_{U_1}$ and $\vec{I}_{L_1}$. Similarly, at instant t2, phasor $\vec{I}_2$ can be obtained by the sum of upper and lower phasors $\vec{I}_{U_2}$ and $\vec{I}_{L_2}$. Note that phasors $\vec{I}_{U_1}$ and $\vec{I}_{U_2}$ have equal or substantially equal magnitude. Similarly, phasors $\vec{I}_{L_1}$ and $\vec{I}_{L_2}$ have substantially equal magnitude. Accordingly, the real part phasor of the time-varying envelope signal can be obtained at any time instant by the sum of at least two substantially constant envelope components.

The phase shifts of phasors $\vec{I}_{U_1}$ and $\vec{I}_{L_1}$ relative to $\vec{I}_1$, as well as the phase shifts of phasors $\vec{I}_{U_2}$ and $\vec{I}_{L_2}$ relative to $\vec{I}_2$ are set according to the desired magnitude of phasors $\vec{I}_1$ and $\vec{I}_2$, respectively. In one case, when the upper and lower phasors are selected to have equal magnitude, the upper and lower phasors are symmetrically shifted in phase relative to the phasor. This is illustrated in the example of FIG. 4, and corresponds to $\vec{I}_{U_1}, \vec{I}_{L_1}, \vec{I}_{U_2},$ and $\vec{I}_{L_2}$ all having equal magnitude. In a second case, the phase shift of the upper and lower phasors are substantially symmetrically shifted in phase relative to the phasor. Based on the description herein, anyone skilled in the art will understand that the magnitude and phase shift of the upper and lower phasors do not have to be exactly equal in value As an example, it can be further verified that, for the case illustrated in FIG. 4, the relative phase shifts, illustrated as $$\frac{\phi_1}{2} \text{ and } \frac{\phi_2}{2}$$

in FIG. 4, are related to the magnitudes of normalized phasors $\vec{I}_1$ and $\vec{I}_2$ as follows:

$$\frac{\phi_1}{2} = \cot^{-1}\left(\frac{I_1}{2\sqrt{1-\frac{I_1^2}{4}}}\right); \text{ and} \quad (2)$$

$$\frac{\phi_2}{2} = \cot^{-1}\left(\frac{I_2}{2\sqrt{1-\frac{I_2^2}{4}}}\right), \quad (3)$$

wherein $I_1$ and $I_2$ represent the normalized magnitudes of phasors $\vec{I}_1$ and $\vec{I}_2$, respectively, and wherein the domains of $I_1$ and $I_2$ are restricted appropriately according to the domain over which equation (2) and (3) are valid. It is noted that equations (2) and (3) are one representation for relating the relative phase shifts to the normalized magnitudes. Other, solutions, equivalent representations, and/or simplified representations of equations (2) and (3) may also be employed. Look up tables relating relative phase shifts to normalized magnitudes may also be used.

The concept describe above can be similarly applied to the imaginary phasor or the quadrature component part of a signal r(t) as illustrated in FIG. 4. Accordingly, at any time instant t, imaginary phasor part $\vec{Q}$ of signal r(t) can be obtained by summing upper and lower phasor components $\vec{Q}_U$ and $\vec{Q}_L$ of substantially equal and constant magnitude. In this example, $\vec{Q}_U$ and $\vec{Q}_L$ are symmetrically shifted in phase relative to $\vec{Q}$ by an angle set according to the magnitude of $\vec{Q}$ at time t. The relationship of $\vec{Q}_U$ and $\vec{Q}_L$ to the desired phasor $\vec{Q}$ are related as defined in equations 2 and 3 by substituting $Q_1$ and $Q_2$ for $I_1$ and $I_2$ respectively.

It follows from the above discussion that, in phasor representation, any phasor $\vec{R}$ of variable magnitude and phase can be constructed by the sum of four substantially constant magnitude phasor components:

$$\vec{R} = \vec{I}_U + \vec{I}_L + \vec{Q}_U + \vec{Q}_L;$$

$$\vec{I}_U + \vec{I}_L = \vec{I};$$

$$\vec{Q}_U + \vec{Q}_L = \vec{Q};$$

$$I_U = I_L = \text{constant};$$

$$Q_U = Q_L = \text{constant}; \quad (4)$$

where $I_U$, $I_L$, $Q_U$, and $Q_L$ represent the magnitudes of phasors $\vec{I}_U$, $\vec{I}_L$, $\vec{Q}_U$, and $\vec{Q}_L$, respectively.

Correspondingly, in the time domain, a time-varying complex envelope sinusoidal signal $r(t) = R(t)\cos(\omega t + \phi)$ is constructed by the sum of four constant envelope signals as follows:

$$r(t) = I_U(t) + I_L(t) + Q_U(t) + Q_L(t); \quad (5)$$

$$I_U(t) = \text{sgn}(\vec{I}) \times I_U \times \cos\left(\frac{\phi_1}{2}\right) \times \cos(\omega t) + I_U \times \sin\left(\frac{\phi_1}{2}\right) \times \sin(\omega t);$$

$$I_L(t) = \text{sgn}(\vec{I}) \times I_L \times \cos\left(\frac{\phi_1}{2}\right) \times \cos(\omega t) - I_L \times \sin\left(\frac{\phi_1}{2}\right) \times \sin(\omega t);$$

$$Q_U(t) = -\text{sgn}(\vec{Q}) \times Q_U \times \cos\left(\frac{\phi_Q}{2}\right) \times \sin(\omega t) + Q_U \times \sin\left(\frac{\phi_Q}{2}\right) \times \cos(\omega t);$$

$$Q_L(t) = -\text{sgn}(\vec{Q}) \times Q_L \times \cos\left(\frac{\phi_Q}{2}\right) \times \sin(\omega t) - Q_L \times \sin\left(\frac{\phi_Q}{2}\right) \times \cos(\omega t).$$

where $\text{sgn}(\vec{I}) = \pm 1$ depending on whether $\vec{I}$ is in-phase or 180° degrees out-of-phase with the positive real axis. Similarly, $\text{sgn}(\vec{Q}) = \pm 1$ depending on whether $\vec{Q}$ is in-phase or 180° degrees out-of-phase with the imaginary axis.

$$\frac{\phi_I}{2}$$

corresponds to the phase shift of $\vec{I}_U$ and $\vec{I}_L$ relative to the real axis. Similarly, $$\frac{\phi_Q}{2}$$

corresponds to the phase shift of $\vec{Q}_U$ and $\vec{Q}_L$ relative to the imaginary axis.

$$\frac{\phi_I}{2} \text{ and } \frac{\phi_Q}{2}$$

can be calculated using the equations given in (2) and (3).

Equations (5) can be further simplified as:

$$r(t) = I_U(t) + I_L(t) + Q_U(t) + Q_L(t); \quad (6)$$

$$I_U(t) = \text{sgn}(\vec{I}) \times I_{UX} \times \cos(\omega t) + I_{UY} \times \sin(\omega t);$$

$$I_L(t) = \text{sgn}(\vec{I}) \times I_{UX} \times \cos(\omega t) - I_{UY} \times \sin(\omega t);$$

$$Q_U(t) = -Q_{UX} \times \cos(\omega t) + \text{sgn}(\vec{Q}) \times Q_{UY} \times \sin(\omega t);$$

-continued $$Q_L(t) = Q_{UY} \times \cos(\omega t) - \text{sgn}(\vec{Q}) \times Q_{UY} \times \sin(\omega t).$$

$$I_{UX} = I_U \times \cos\left(\frac{\phi_I}{2}\right) = I_L \times \cos\left(\frac{\phi_I}{2}\right),$$

where $$I_{UY} = I_U \times \sin\left(\frac{\phi_I}{2}\right) = I_L \times \sin\left(\frac{\phi_I}{2}\right),$$

$$Q_{UX} = Q_U \times \sin\left(\frac{\phi_Q}{2}\right) = Q_L \times \sin\left(\frac{\phi_Q}{2}\right),$$

and $$Q_{UY} = Q_U \times \cos\left(\frac{\phi_Q}{2}\right) = Q_L \times \cos\left(\frac{\phi_Q}{2}\right).$$

It can be understood by a person skilled in the art that, whereas the time domain representations in equations (5) and (6) have been provided for the case of a sinusoidal waveform, equivalent representations can be developed for non-sinusoidal waveforms using appropriate basis functions. Further, as understood by a person skilled in the art based on the teachings herein, the above-describe two-dimensional decomposition into substantially constant envelope signals can be extended appropriately into a multi-dimensional decomposition.

Figure 5:
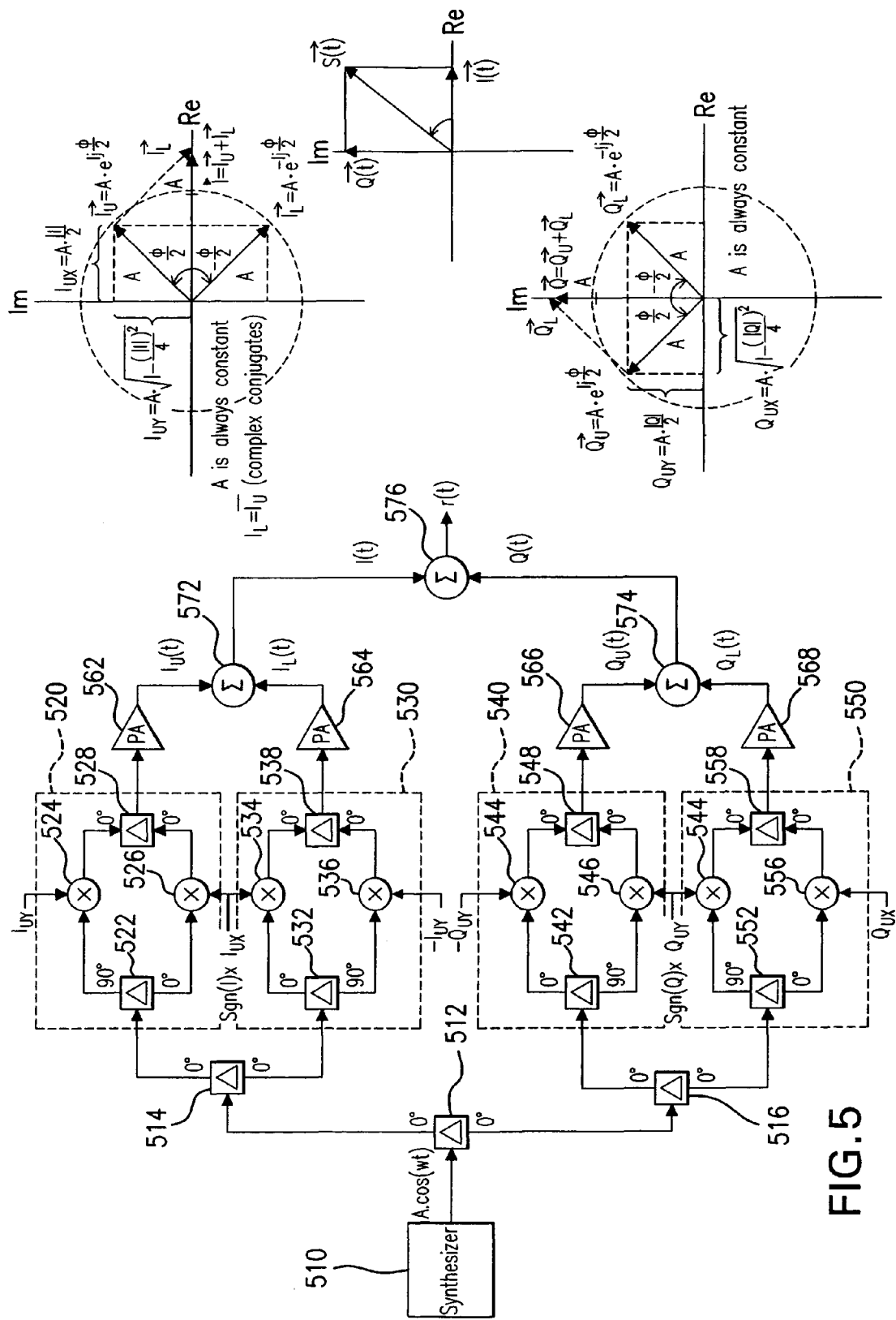
FIG. 5 is a block diagram that illustrates an exemplary embodiment of the Cartesian 4-Branch VPA method.

FIG. 5 is an example block diagram of the Cartesian 4-Branch VPA embodiment. An output signal r(t) 578 of desired power level and frequency characteristics is generated from baseband in-phase and quadrature components according to the Cartesian 4-Branch VPA embodiment.

In the example of FIG. 5, a frequency generator such as a synthesizer 510 generates a reference signal A*cos(ωt) 511 having the same frequency as that of output signal r(t) 578. It can be understood by a person skilled in the art that the choice of the reference signal is made according to the desired output signal. For example, if the desired frequency of the desired output signal is 2.4 GHz, then the frequency of the reference signal is set to be 2.4 GHz. In this manner, embodiments of the invention achieve frequency up-conversion.

Referring to FIG. 5, one or more phase splitters are used to generate signals 521, 531, 541, and 551 based on the reference signal 511. In the example of FIG. 5, this is done using phase splitters 512, 514, and 516 and by applying 0° phase shifts at each of the phase splitters. A person skilled in the art will appreciate, however, that various techniques may be used for generating signals 521, 531, 541, and 551 of the reference signal 511. For example, a 1:4 phase splitter may be used to generate the four replicas 521, 531, 541, and 551 in a single step or in the example embodiment of FIG. 5, signal 511 can be directly coupled to signals 521, 531, 541, 551 Depending on the embodiment, a variety of phase shifts may also be applied to result in the desired signals 521, 531, 541, and 551.

Still referring to FIG. 5, the signals 521, 531, 541, and 551 are each provided to a corresponding vector modulator 520, 530, 540, and 550, respectively. Vector modulators 520, 530, 540, and 550, in conjunction with their appropriate input signals, generate four constant envelope constituents of signal r(t) according to the equations provided in (6). In the example embodiment of FIG. 5, vector modulators 520 and 530 generate the $I_U(t)$ and $I_L(t)$ components, respectively, of signal r(t). Similarly, vector modulators 540 and 550 generate the $Q_U(t)$ and $Q_L(t)$ components, respectively, of signal r(t).

The actual implementation of each of vector modulators 520, 530, 540, and 550 may vary. It will be understood by a person skilled in the art, for example, that various techniques exist for generating the constant envelope constituents according to the equations in (6).

In the example embodiment of FIG. 5, each of vector modulators 520, 530, 540, 550 includes an input phase splitter 522, 532, 542, 552 for phasing the signals 522, 531, 541, 551. Accordingly, input phase splitters 522, 532, 542, 552 are used to generate an in-phase and a quadrature components or their respective input signals.

In each vector modulator 520, 530, 540, 550, the in-phase and quadrature components are multiplied with amplitude information. In FIG. 5, for example, multiplier 524 multiplies the quadrature component of signal 521 with the quadrature amplitude information $I_{UY}$ of $I_U(t)$. In parallel, multiplier 526 multiplies the in-phase replica signal with the in-phase amplitude information sgn(I)×$I_{UX}$ of $I_U(t)$.

To generate the $I_U(t)$ constant envelope constituent signals 525 and 527 are summed using phase splitter 528 or alternate summing techniques. The resulting signal 529 corresponds to the IU(t) component of signal r(t).

In similar fashion as described above, vector modulators 530, 540, and 550, respectively, generate the $I_L(t)$, $Q_U(t)$, and $Q_L(t)$ components of signal r(t). $I_L(t)$, $Q_U(t)$, and $Q_L(t)$, respectively, correspond to signals 539, 549, and 559 in FIG. 5.

Further, as described above, signals 529, 539, 549, and 559 are characterized by having substantially equal and constant magnitude envelopes. Accordingly, when signals 529, 539, 549, and 559 are input into corresponding power amplifiers (PA) 562, 564, 566, and 568, corresponding amplified signals 563, 565, 567, and 569 are substantially constant envelope signals.

Power amplifiers 562, 564, 566, and 568 amplify each of the signals 529, 539, 549, 559, respectively. In an embodiment, substantially equal power amplification is applied to each of the signals 529, 539, 549, and 559. In an embodiment, the power amplification level of PAs 562, 564, 566, and 568 is set according to the desired power level of output signal r(t).

Still referring to FIG. 5, amplified signals 563 and 565 are summed using summer 572 to generate an amplified version 573 of the in-phase component $\vec{I}(t)$ of signal r(t). Similarly, amplified signals 567 and 569 are summed using summer 574 to generate an amplified version 575 of the quadrature component $\vec{Q}(t)$ of signal r(t).

Signals 573 and 575 are summed using summer 576, as shown in FIG. 5, with the resulting signal corresponding to desired output signal r(t).

It must be noted that, in the example of FIG. 5, summers 572, 574, and 576 are being used for the purpose of illustration only. Various techniques may be used to sum amplified signals 563, 565, 567, and 569. For example, amplified signals 563, 565, 567, and 569 may be summed all in one step to result in signal 578. In fact, according to various VPA embodiments of the present invention, it suffices that the summing is done after amplification. Certain VPA embodiments of the present invention, as will be further described below, use minimally lossy summing techniques such as direct coupling via wire. Alternatively, certain VPA embodiments use conventional power combining techniques. In other embodiments, as will be further described below, power amplifiers 562, 564, 566, and 568 can be implemented as a multiple-input single-output power amplifier.

Operation of the Cartesian 4-Branch VPA embodiment shall now be further described with reference to the process flowchart of FIG. 6. The process begins at step 610, which includes receiving the baseband representation of the desired output signal. In an embodiment, this involves receiving in-phase (I) and quadrature (Q) components of the desired output signal. In another embodiment, this involves receiving magnitude and phase of the desired output signal. In an embodiment of the Cartesian 4-Branch VPA embodiment, the I and Q are baseband components. In another embodiment, the I and Q are RF components and are down-converted to baseband.

Step 620 includes receiving a clock signal set according to a desired output signal frequency of the desired output signal. In the example of FIG. 5, step 620 is achieved by receiving reference signal 511.

Step 630 includes processing the I component to generate first and second signals having the output signal frequency. The first and second signals have substantially constant and equal magnitude envelopes and a sum equal to the I component. The first and second signals correspond to the $I_U(t)$ and $I_L(t)$ constant envelope constituents described above. In the example of FIG. 5, step 630 is achieved by vector modulators 520 and 530, in conjunction with their appropriate input signals.

Step 640 includes processing the Q component to generate third and fourth signals having the output signal frequency. The third and fourth signals have substantially constant and equal magnitude envelopes and a sum equal to the Q component. The third and fourth signals correspond to the $Q_U(t)$ and $Q_L(t)$ constant envelope constituents described above. In the example of FIG. 5, step 630 is achieved by vector modulators 540 and 550, in conjunction with their appropriate input signals.

Step 650 includes individually amplifying each of the first, second, third, and fourth signals, and summing the amplified signals to generate the desired output signal. In an embodiment, the amplification of the first, second, third, and fourth signals is substantially equal and according to a desired power level of the desired output signal. In the example of FIG. 5, step 650 is achieved by power amplifiers 562, 564, 566, and 568 amplifying respective signals 529, 539, 549, and 559, and by summers 572, 574, and 576 summing amplified signals 563, 565, 567, and 569 to generate output signal 578.

Figure 6:
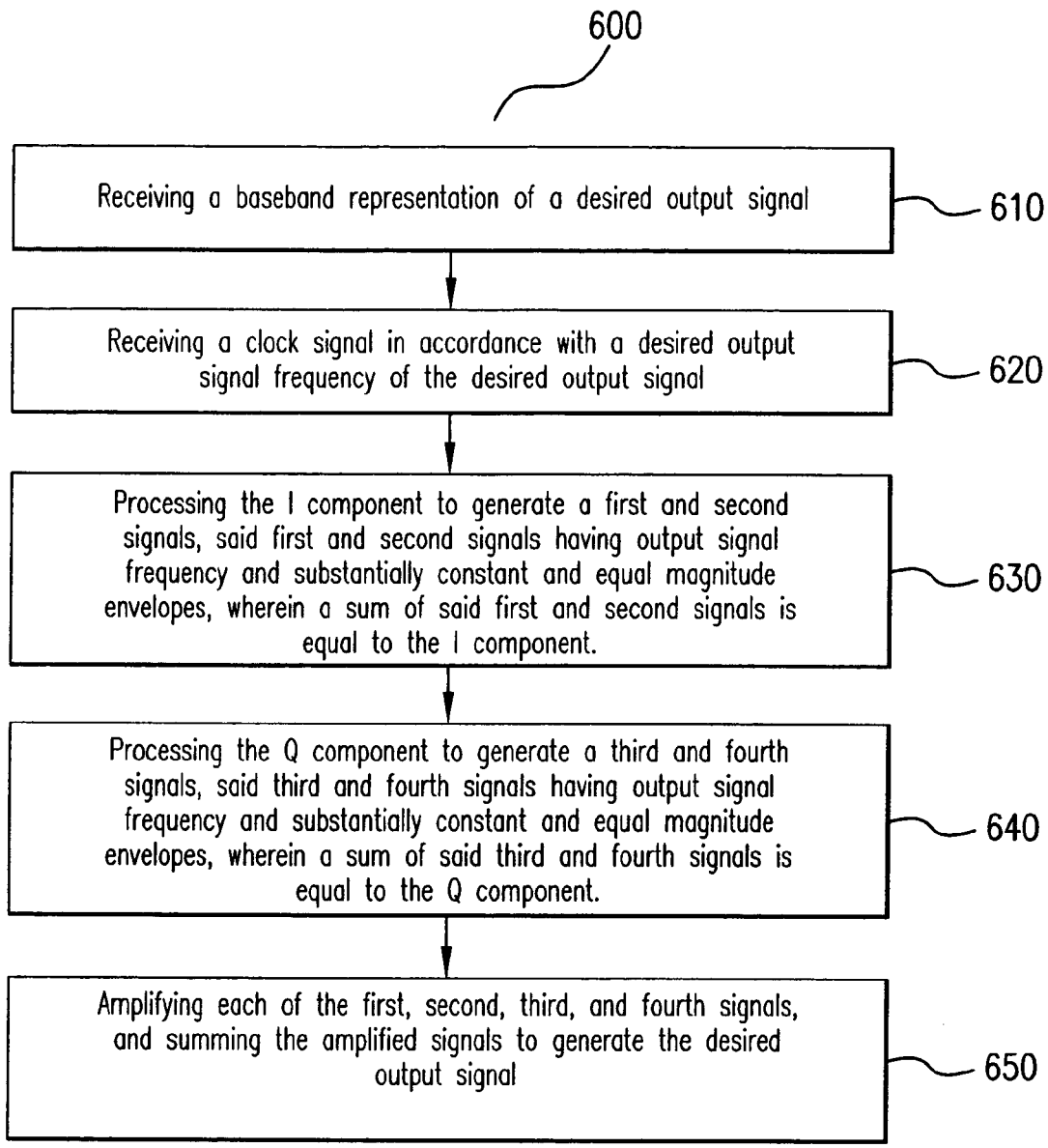
FIG. 6 is a process flowchart embodiment for power amplification according to the Cartesian 4-Branch VPA method.
Figure 7A:
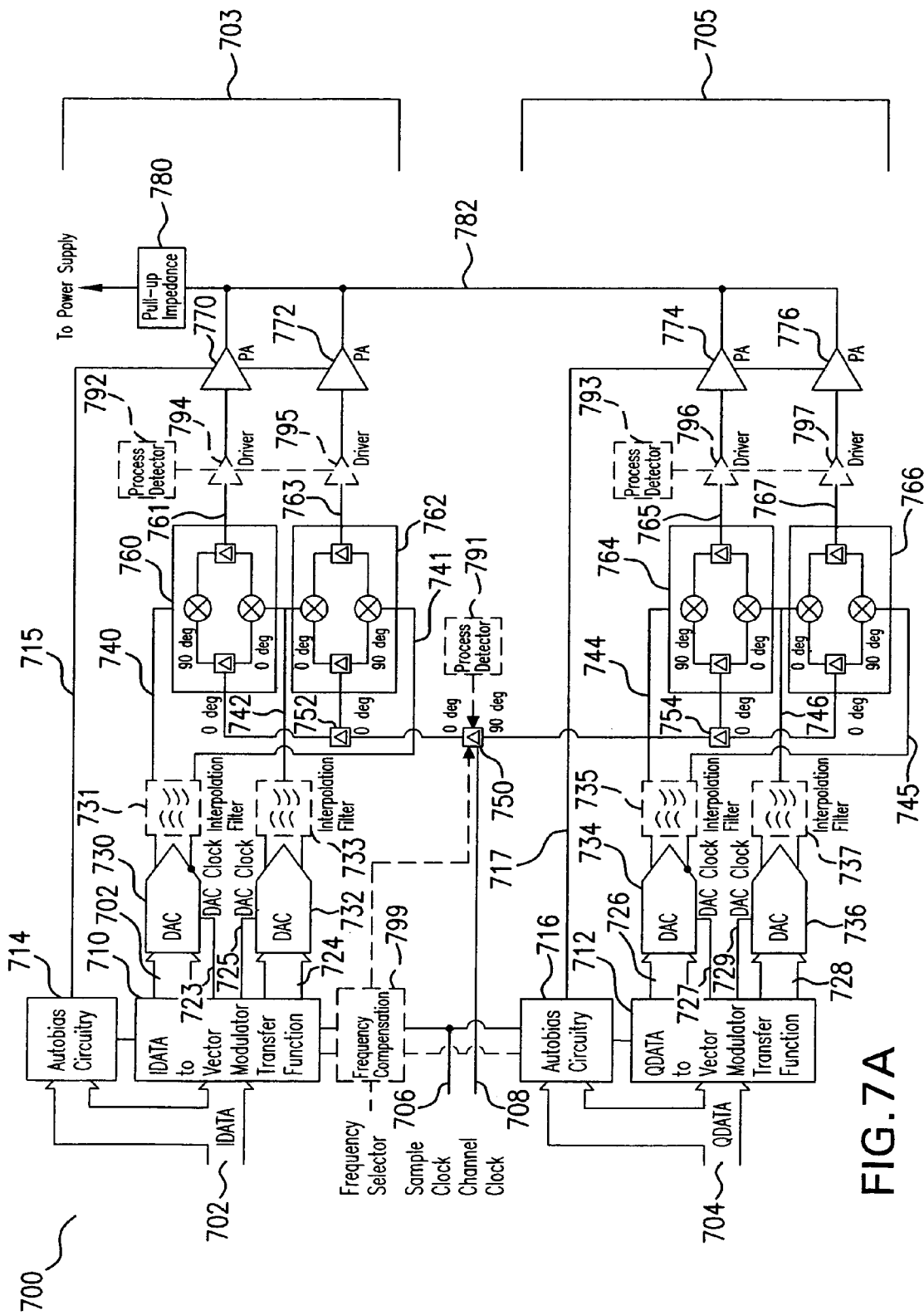
FIG. 7A is a block diagram that illustrates an exemplary embodiment of a vector power amplifier for implementing the Cartesian 4-Branch VPA method.

FIG. 7A is a block diagram that illustrates an exemplary embodiment of a vector power amplifier 700 implementing the process flowchart 600 of FIG. 6. In the example of FIG. 7A, optional components are illustrated with dashed lines. In other embodiments, additional components may be optional.

Vector power amplifier 700 includes an in-phase (I) branch 703 and a quadrature (Q) branch 705. Each of the I and Q branches further comprises a first branch and a second branch.

In-phase (I) information signal 702 is received by an I Data Transfer Function module 710. In an embodiment, I information signal 702 includes a digital baseband signal. In an embodiment, I Data Transfer Function module 710 samples I information signal 702 according to a sample clock 706. In another embodiment, I information signal 702 includes an analog baseband signal, which is converted to digital using an analog-to-digital converter (ADC) (not shown in FIG. 7A) before being input into I Data Transfer Function module 710. In another embodiment, I information signal 702 includes an analog baseband signal which input in analog form into I Data Transfer Function module 710, which also includes analog circuitry. In another embodiment, I information signal 702 includes a RF signal which is down-converted to baseband before being input into I Data Transfer Function module 710 using any of the above described embodiments.

I Data Transfer Function module 710 processes I information signal 702, and determines in-phase and quadrature amplitude information of at least two constant envelope constituent signals of I information signal 702. As described above with reference to FIG. 5, the in-phase and quadrature vector modulator input amplitude information corresponds to $\text{sgn}(I) \times I_{UX}$ and $I_{UY}$, respectively. The operation of I Data Transfer Function module 710 is further described below in section 3.4.

I Data Transfer Function module 710 outputs information signals 722 and 724 used to control the in-phase and quadrature amplitude components of vector modulators 760 and 762. In an embodiment, signals 722 and 724 are digital signals. Accordingly, each of signals 722 and 724 is fed into a corresponding digital-to-analog converter (DAC) 730 and 732, respectively. The resolution and sample rate of DACs 730 and 732 is selected to achieve the desired I component of the output signal 782. DACs 730 and 732 are controlled by DAC clock signals 723 and 725, respectively. DAC clock signals 723 and 725 may be derived from a same clock signal or may be independent.

In another embodiment, signals 722 and 724 are analog signals, and DACs 730 and 732 are not required.

In the exemplary embodiment of FIG. 7A, DACs 730 and 732 convert digital information signals 722 and 724 into corresponding analog signals, and input these analog signals into optional interpolation filters 731 and 733, respectively. Interpolation filters 731 and 733, which also serve as anti-aliasing filters, shape the DACs outputs to produce the desired output waveform. Interpolation filters 731 and 733 generate signals 740 and 742, respectively. Signal 741 represents the inverse of signal 740. Signals 740-742 are input into vector modulators 760 and 762.

Vector modulators 760 and 762 multiply signals 740-742 with appropriately phased clock signals to generate constant envelope constituents of I information signal 702. The clock signals are derived from a channel clock signal 708 having a rate according to a desired output signal frequency. A plurality of phase splitters, such as 750 and 752, for example, and phasors associated with the vector modulator multipliers may be used to generate the appropriately phased clock signals.

In the embodiment of FIG. 7A, for example, vector modulator 760 modulates a 90° shifted channel clock signal with quadrature amplitude information signal 740. In parallel, vector modulator 760 modulates an in-phase channel clock signal with in-phase amplitude information signal 742. Vector modulator 760 combines the two modulated signals to generate a first modulated constant envelope constituent 761 of I information signal 702. Similarly, vector modulator 762 generates a second modulated constant envelope constituent 763 of I information signal 702, using signals 741 and 742. Signals 761 and 763 correspond, respectively, to the $I_U(t)$ and $I_L(t)$ constant envelope components described with reference to FIG. 5.

In parallel and in similar fashion, the Q branch of vector power amplifier 700 generates at least two constant envelope constituent signals of quadrature (Q) information signal 704.

In the embodiment of FIG. 7A, for example, vector modulator 764 generates a first constant envelope constituent 765 of Q information signal 704, using signals 744 and 746. Similarly, vector modulator 766 generates a second constant envelope constituent 767 of Q information signal 704, using signals 745 and 746.

As described above with respect to FIG. 5, constituent signals 761, 763, 765, and 767 have substantially equal and constant magnitude envelopes. In the exemplary embodiment of FIG. 7A, signals 761, 763, 765, and 767 are, respectively, input into corresponding power amplifiers (PAs) 770, 772, 774, and 776. PAs 770, 772, 774, and 776 can be linear or non-linear power amplifiers. In an embodiment, PAs 770, 772, 774, and 776 include switching power amplifiers.

Circuitry 714 and 716 (herein referred to as "autobias circuitry" for ease of reference, and not limitation) and in this embodiment, control the bias of PAs 770, 772, 774, and 776 according to I and Q information signals 702 and 704. In the embodiment of FIG. 7A, autobias circuitry 714 and 716 provide, respectively, bias signals 715 and 717 to PAs 770, 772 and PAs 774, 776. Autobias circuitry 714 and 716 are further described below in section 3.5. Embodiments of PAs 770, 772, 774, and 776 are also discussed below in section 3.5.

In an embodiment, PAs 770, 772, 774, and 776 apply substantially equal power amplification to respective substantially constant envelope signals 761, 763, 765, and 767. In other embodiments, PA drivers are additionally employed to provide additional power amplification. In the embodiment of FIG. 7A, PA drivers 794, 795, 796, and 797 are optionally added between respective vector modulators 760, 762, 764 766 and respective PAs 770, 772, 774, and 776, in each branch of vector power amplifier 700.

The outputs of PAs 770, 772, 774, and 776 are coupled together to generate output signal 782 of vector power amplifier 700. In an embodiment, the outputs of PAs 770, 772, 774, and 776 are directly coupled together using a wire. Direct coupling in this manner means that there is minimal or no resistive, inductive, or capacitive isolation between the outputs of PAs 770, 772, 774, and 776. In other words, outputs of PAs 770, 772, 774, and 776, are coupled together without intervening components. Alternatively, in an embodiment, the outputs of PAs 770, 772, 774, and 776 are coupled together indirectly through inductances and/or capacitances that result in low or minimal impedance connections, and/or connections that result in minimal isolation and minimal power loss. Alternatively, outputs of PAs 770, 772, 774, and 776 are coupled using well known combining techniques, such as Wilkinson, hybrid, transformers, or known active combiners. In an embodiment, the PAs 770, 772, 774, and 776 provide integrated amplification and power combining in a single operation. In an embodiment, one or more of the power amplifiers and/or drivers described herein are implemented using multiple input, single output power amplification techniques, examples of which are shown in FIGS. 7B, and 51A-H.

Output signal 782 includes the I and Q characteristics of I and Q information signals 702 and 704. Further, output signal 782 is of the same frequency as that of its constituents, and thus is of the desired up-converted output frequency. In embodiments of vector power amplifier 700, a pull-up impedance 780 is coupled between the output of vector amplifier 700 and a power supply. Output stage embodiments according to power amplification methods and systems of the present invention will be further described below in section 3.5.

In other embodiments of vector power amplifier 700, process detectors are employed to compensate for any process variations in circuitry of the amplifier. In the embodiment of FIG. 7A for example, process detectors 791-793 are optionally added to monitor variations in PA drivers 794-797 and phase splitter 750. In further embodiments, frequency compensation circuitry 799 may be employed to compensate for frequency variations.

Figure 7B:
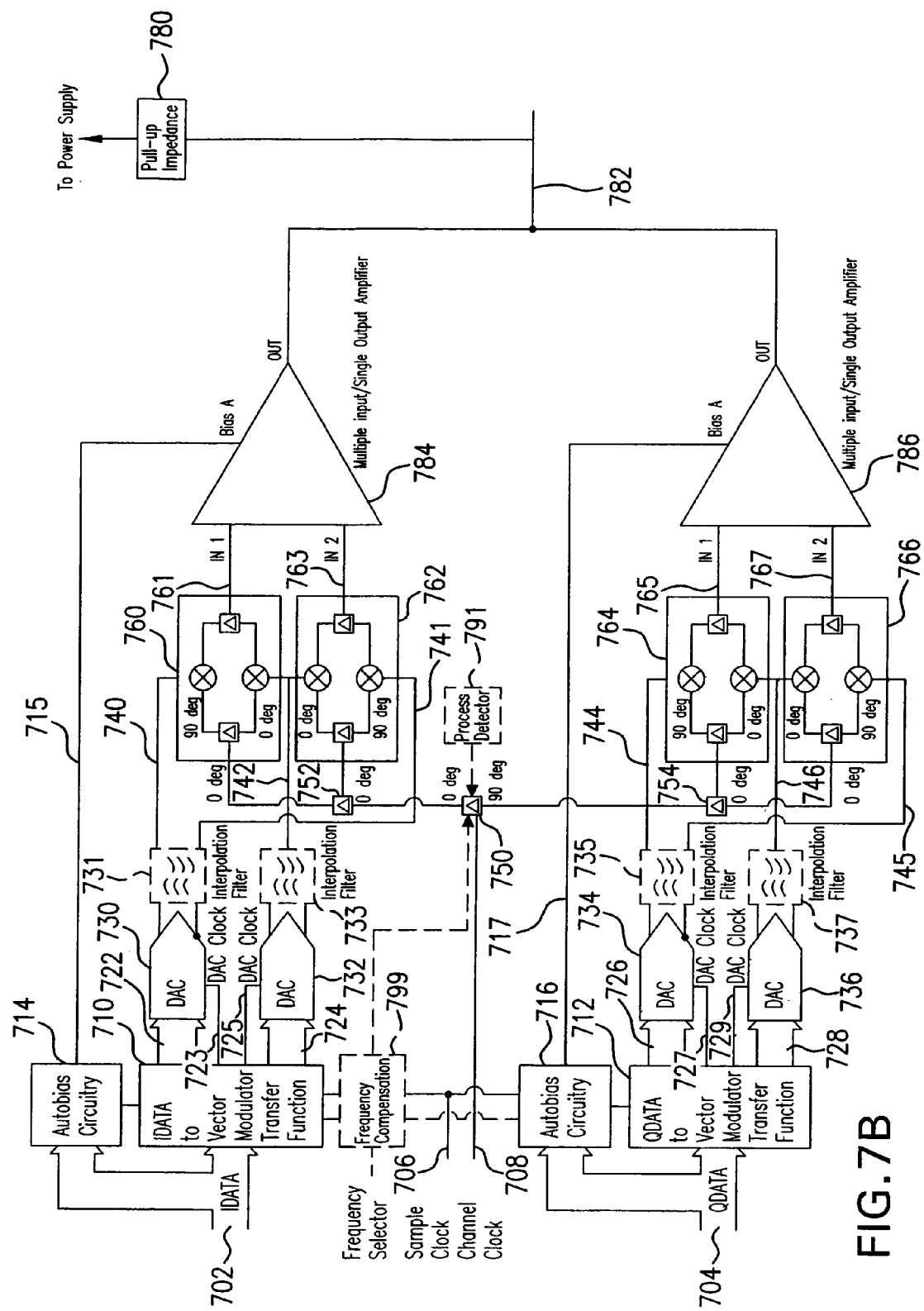
FIG. 7B is a block diagram that illustrates another exemplary embodiment of a vector power amplifier for implementing the Cartesian 4-Branch VPA method.

FIG. 7B is a block diagram that illustrates another exemplary embodiment of vector power amplifier 700. Optional components are illustrated with dashed lines, although other embodiments may have more or less optional components.

The embodiment illustrates a multiple-input single-output (MISO) implementation of the amplifier of FIG. 7A. In the embodiment of FIG. 7B, constant envelope signals 761, 763, 765 and 767, output from vector modulators 760, 762, 764, and 766, are input into MISO PAs 784 and 786. MISO PAs 784 and 786 are two-input single-output power amplifiers. In an embodiment, MISO PAs 784 and 786 include elements 770, 772, 774, 776, 794-797 as shown in the embodiment of FIG. 7A or functional equivalence thereof. In another embodiment, MISO PAs 784 and 786 may include other elements, such as optional pre-drivers and optional process detection circuitry. Further, MISO PAs 784 and 786 are not limited to being two-input PAs as shown in FIG. 7B. In other embodiments as will be described further below with reference to FIGS. 51A-H, PAs 784 and 786 can have any number of inputs and outputs.

Figure 8A:
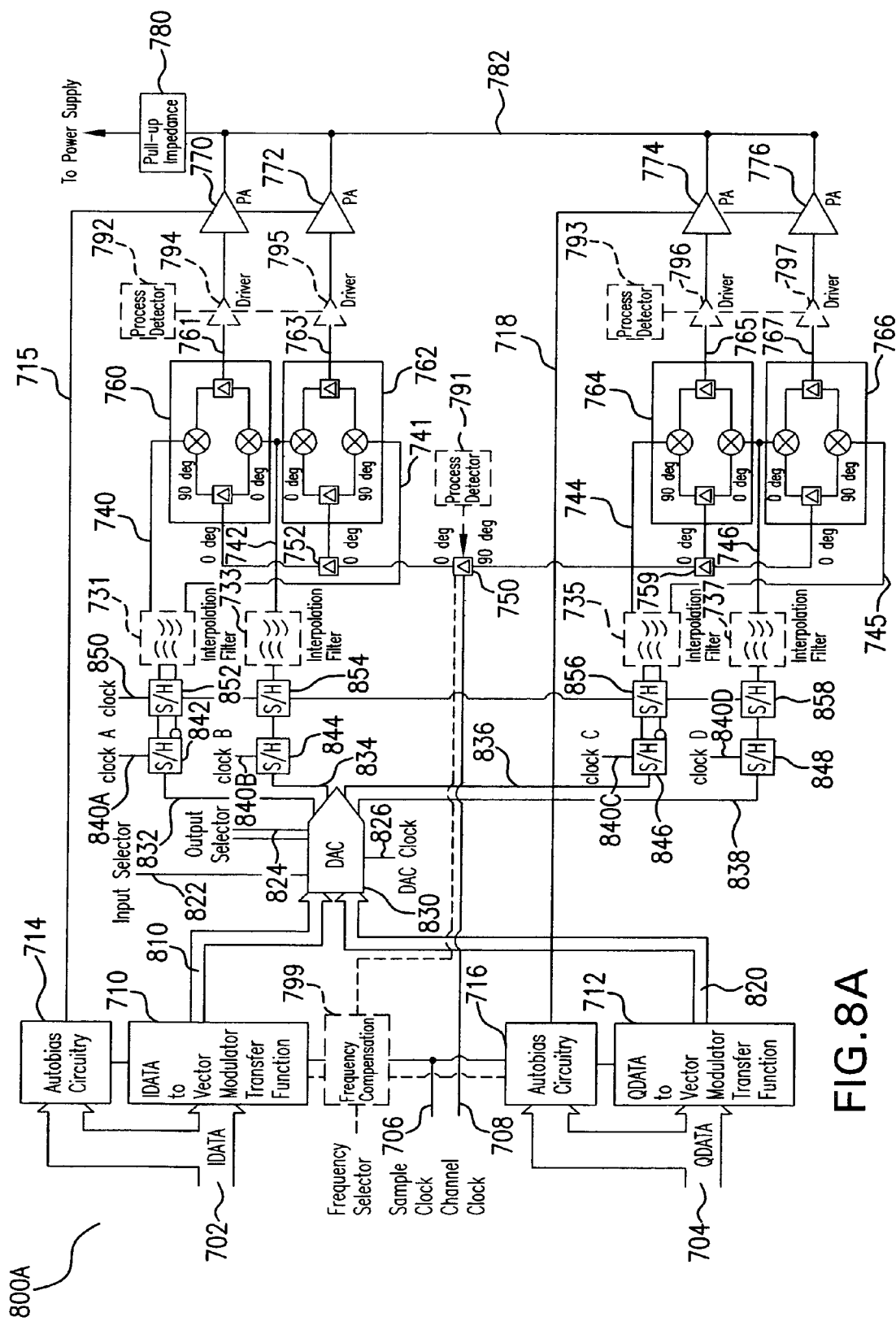
FIG. 8A is a block diagram that illustrates another exemplary embodiment of a vector power amplifier according to the Cartesian 4-Branch VPA method.

FIG. 8A is a block diagram that illustrates another exemplary embodiment 800A of a vector power amplifier according to the Cartesian 4-Branch VPA method shown in FIG. 6. Optional components are illustrated with dashed lines, although other embodiments may have more or less optional components.

In the embodiment of FIG. 8A, a DAC 830 of sufficient resolution and sample rate replaces DACs 730, 732, 734, and 736 of the embodiment of FIG. 7A. DAC 830's sample rate is controlled by a DAC clock signal 826.

DAC 830 receives in-phase and quadrature information signals 810 and 820 from I Data Transfer Function module 710 and Q Data Transfer Function module 712, respectively, as described above. In an embodiment, a input selector 822 selects the order of signals 810 and 820 being input into DAC 830.

DAC 830 may output a single analog signal at a time. In an embodiment, a sample and hold architecture may be used to ensure proper signal timing to the four branches of the amplifier, as shown in FIG. 8A.

DAC 830 sequentially outputs analog signals 832, 834, 836, 838 to a first set of sample-and-hold circuits 842, 844, 846, and 848. In an embodiment, DAC 830 is clocked at a sufficient rate to emulate the operation of DACs 730, 732, 734, and 736 of the embodiment of FIG. 7A. An output selector 824 determines which of output signals 832, 834, 836, and 838 should be selected for output.

DAC 830's DAC clock signal 826, output selector signal 824, input selector 822, and sample-and-hold clocks 840A-D, and 850 are controlled by a control module that can be independent or integrated into transfer function modules 710 and/or 712.

In an embodiment, sample-and-hold circuits (S/H) 842, 844, 846, and 848 sample and hold the received analog values from DAC 830 according to a clock signals 840A-D. Sample-and-hold circuits 852, 854, 856, and 858 sample and hold the analog values from sample and hold circuits 842, 844, 846, and 848 respectively. In turn, sample-and-hold circuits 852, 854, 856, and 858 hold the received analog values, and simultaneously release the values to vector modulators 760, 762, 764, and 766 according to a common clock signal 850. In another embodiment, sample-and-hold circuits 852, 854, 856, and 858 release the values to optional interpolation filters 731, 733, 735, and 737 which are also anti-aliasing filters. In an embodiment, a common clock signal 850 is used in order to ensure that the outputs of S/H 852, 854, 856, and 858 are time-aligned.

Other aspects of vector power amplifier 800A substantially correspond to those described above with respect to vector power amplifier 700.

Figure 8B:
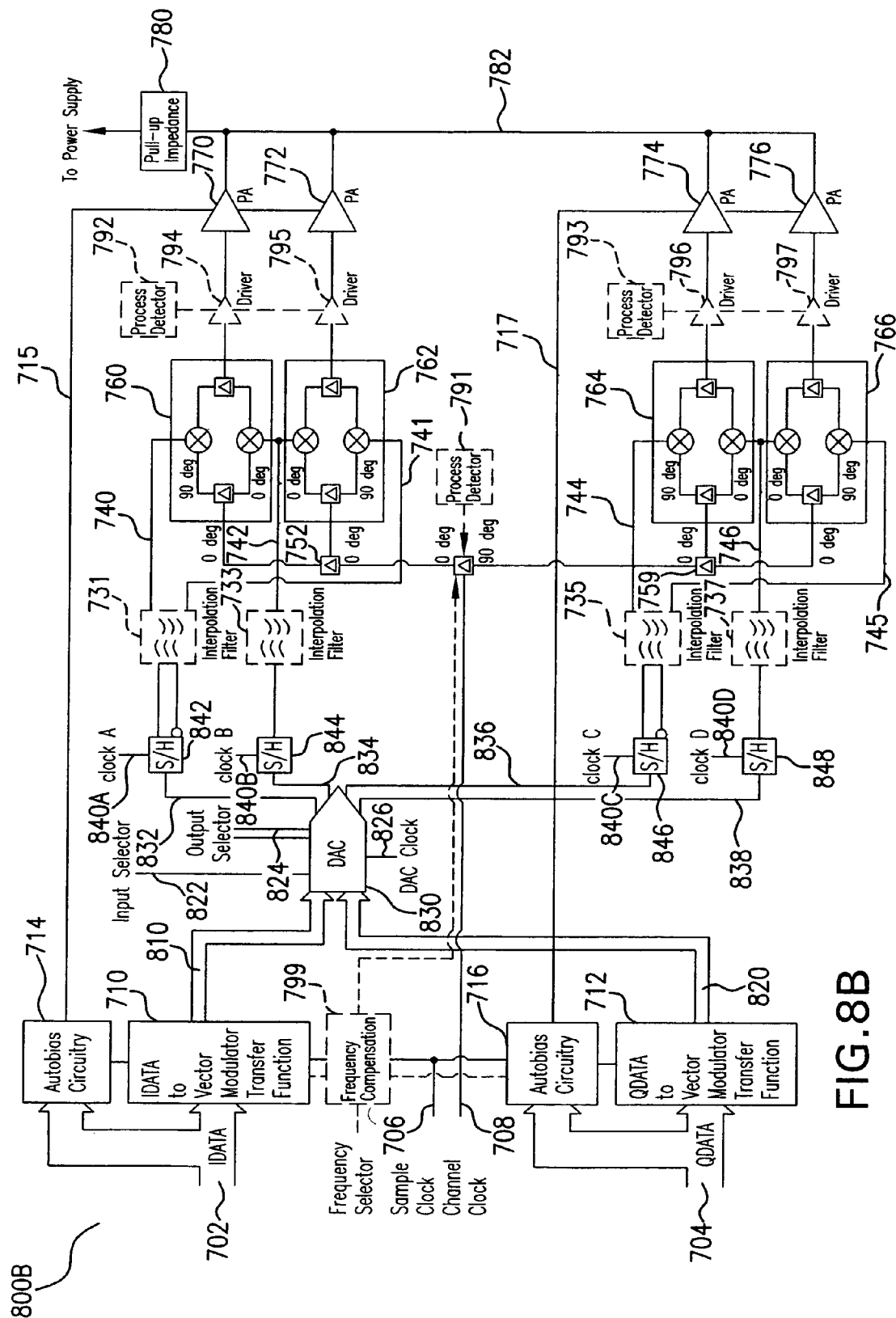
FIG. 8B is a block diagram that illustrates another exemplary embodiment of a vector power amplifier according to the Cartesian 4-Branch VPA method.

FIG. 8B is a block diagram that illustrates another exemplary embodiment 800B of a vector power amplifier according to the Cartesian 4-Branch VPA method shown in FIG. 6. Optional components are illustrated with dashed lines, although other embodiments may have more or less optional components.

Embodiment 800B illustrates another single DAC implementation of the vector power amplifier. However, in contrast to the embodiment of FIG. 8A, the sample and hold architecture includes a single set of sample-and-hold (S/H) circuits. As shown in FIG. 8B, S/H 842, 844, 846, and 848 receive analog values from DAC 830, illustrated as signals 832, 834, 836, and 838. Each of S/H circuits 842, 844, 846 and 848 release its received value according to a different clock 840A-D as shown. The time difference between analog samples used for to generate signals 740, 741, 742, 744, 745, and 746 can be compensated for in transfer functions 710 and 712. According to the embodiment of FIG. 8B, one level of S/H circuitry can be eliminated relative to the embodiment of FIG. 8A, thereby reducing the size and the complexity of the amplifier.

Other aspects of vector power amplifier 800B substantially correspond to those described above with respect to vector power amplifiers 700 and 800A.

Figure 8C:
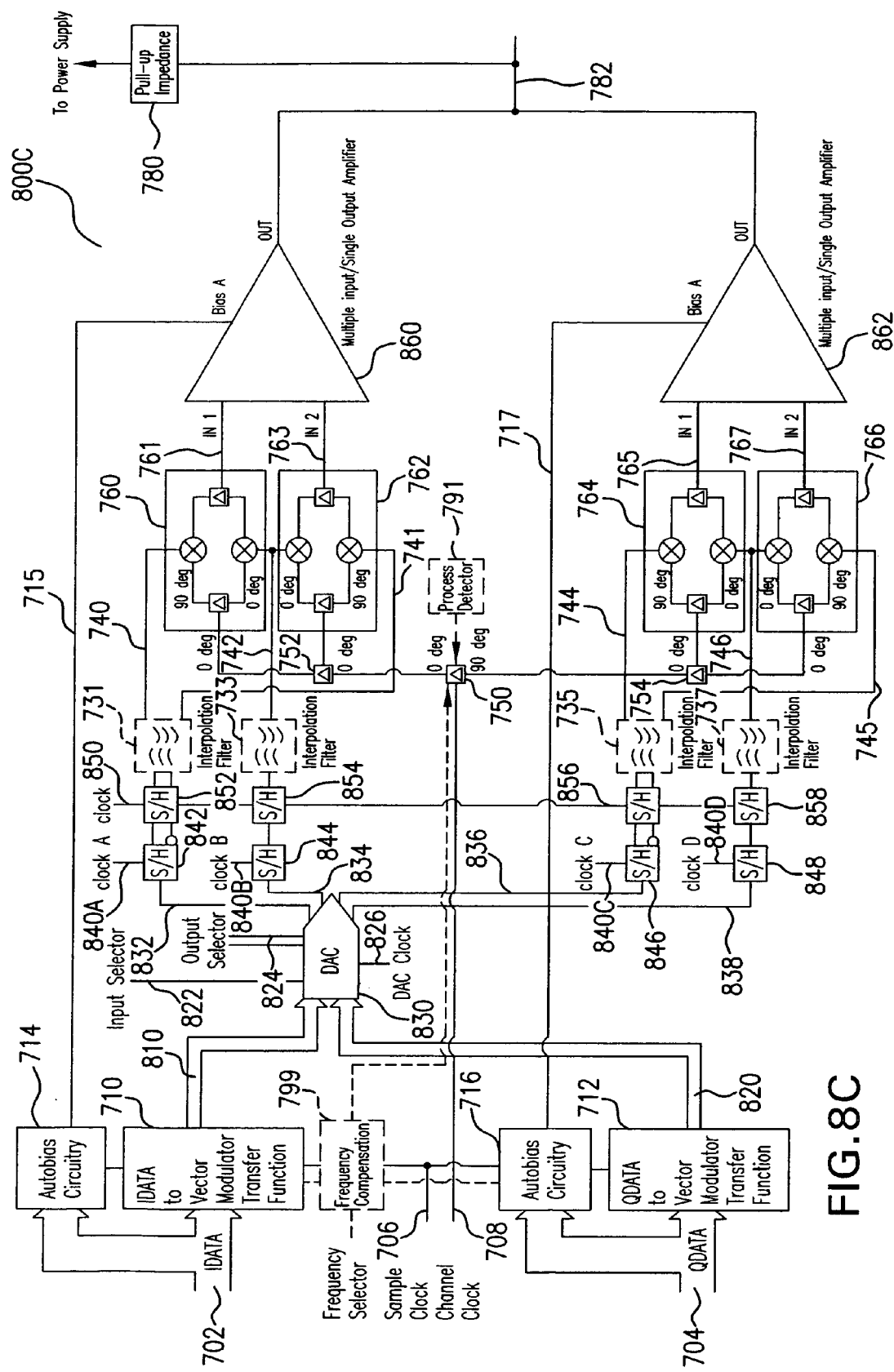
FIG. 8C is a block diagram that illustrates another exemplary embodiment of a vector power amplifier according to the Cartesian 4-Branch VPA method.

FIG. 8C is a block diagram that illustrates another exemplary embodiment 800C of vector power amplifier 700. Optional components are illustrated with dashed lines, although other embodiments may have more or less optional components. The embodiment of FIG. 8C illustrates a multiple-input single-output (MISO) implementation of the amplifier of FIG. 8A. In the embodiment of FIG. 8C, constant envelope signals 761, 763, 765 and 767, output from vector modulators 760, 762, 764, and 766, are input into MISO PAs 860 and 862. MISO PAs 860 and 862 are two-input single-output power amplifiers. In an embodiment, MISO PAs 860 and 862 include elements 770, 772, 774, 776, 794-797 as shown in the embodiment of FIG. 7A or functional equivalence thereof. In another embodiment, MISO PAs 860 and 862 may include other elements, such as optional pre-drivers and optional process detection circuitry. In another embodiment, MISO PAs 860 and 862 may include other elements, such as pre-drivers, not shown in the embodiment of FIG. 7A. Further, MISO PAs 860 and 862 are not limited to being two-input PAs as shown in FIG. 8C. In other embodiments as will be described further below with reference to FIGS. 51A-H, PAs 860 and 862 can have any number of inputs and outputs.

Other aspects of vector power amplifier 800C substantially correspond to those described above with respect to vector power amplifiers 700 and 800A.

Figure 8D:
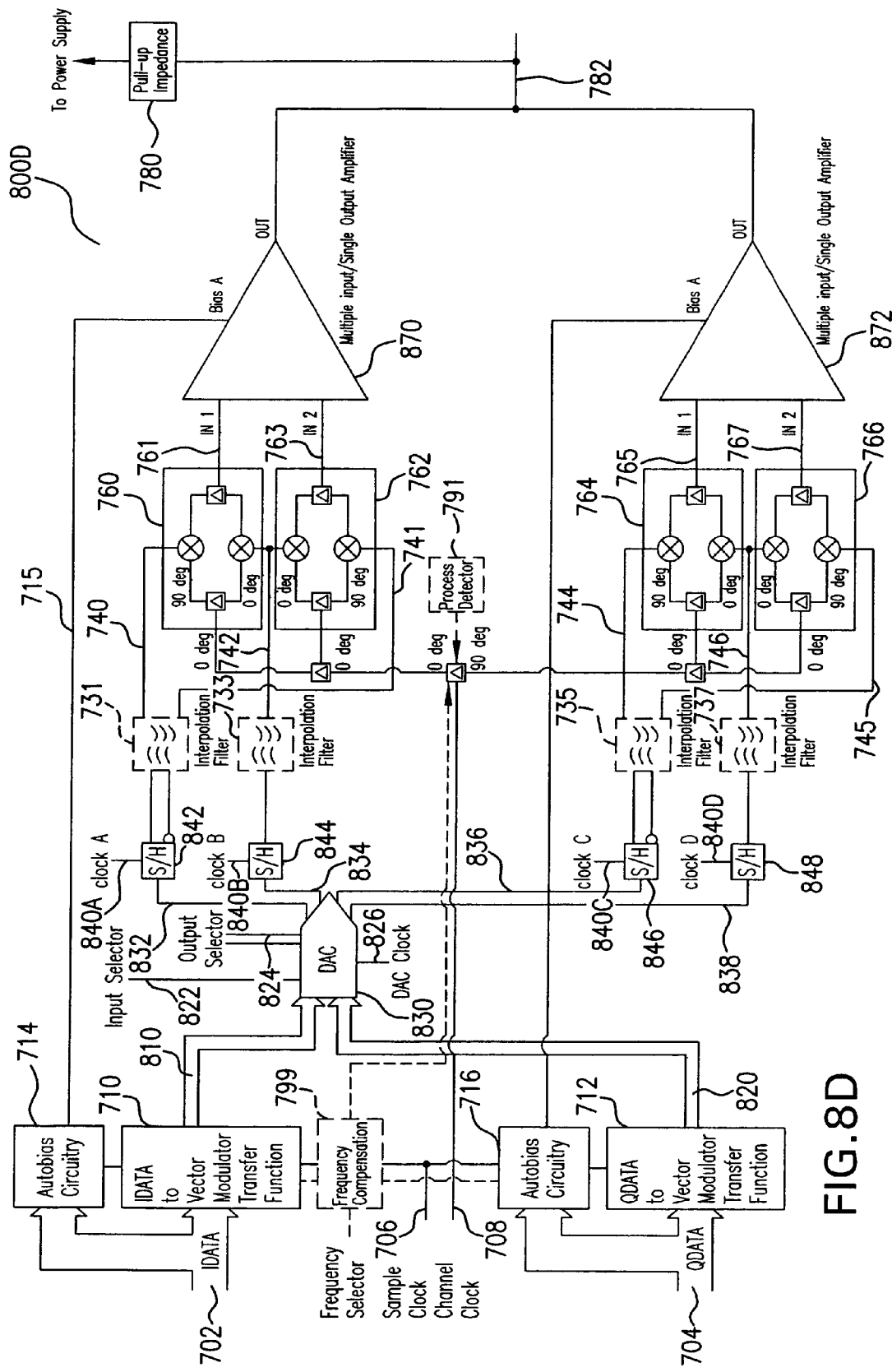
FIG. 8D is a block diagram that illustrates another exemplary embodiment of a vector power amplifier according to the Cartesian 4-Branch VPA method.

FIG. 8D is a block diagram that illustrates another exemplary embodiment 800D of vector power amplifier 700. Optional components are illustrated with dashed lines, although other embodiments may have more or less optional components. The embodiment of FIG. 8D illustrates a multiple-input single-output (MISO) implementation of the amplifier of FIG. 8B. In the embodiment of FIG. 8D, constant envelope signals 761, 763, 765 and 767, output from vector modulators 760, 762, 764, and 766, are input into MISO PAs 870 and 872. MISO PAs 870 and 872 are two-input single-output power amplifiers. In an embodiment, MISO PAs 870 and 872 include elements 770, 772, 774, 776, 794-797 as shown in the embodiment of FIG. 7A or functional equivalence thereof. In another embodiment, MISO PAs 870 and 872 may include other elements, such as optional pre-drivers and optional process detection circuitry. In another embodiment, MISO PAs 870 and 872 may include other elements, such as pre-drivers, not shown in the embodiment of FIG. 7A. Further, MISO PAs 870 and 872 are not limited to being two-input PAs as shown in FIG. 8D. In other embodiments as will be described further below with reference to FIGS. 51A-H, PAs 870 and 872 can have any number of inputs and outputs.

Other aspects of vector power amplifier 800D substantially correspond to those described above with respect to vector power amplifiers 700 and 800B.

3.2) Cartesian-Polar-Cartesian-Polar 2-Branch Vector Power Amplifier

A Cartesian-Polar-Cartesian-Polar (CPCP) 2-Branch VPA embodiment shall now be described (The name of this embodiment is provided for ease of reference, and is not limiting).

According to the Cartesian-Polar-Cartesian-Polar (CPCP) 2-Branch VPA method, a time-varying complex envelope signal is decomposed into 2 substantially constant envelope constituent signals. The constituent signals are individually amplified, and then summed to construct an amplified version of the original time-varying complex envelope signal. In addition, the phase angle of the time-varying complex envelope signal is determined and the resulting summation of the constituent signals are phase shifted by the appropriate angle.

In one embodiment of the CPCP 2-Branch VPA method, a magnitude and a phase angle of a time-varying complex envelope signal are calculated from in-phase and quadrature components of a signal. Given the magnitude information, two substantially constant envelope constituents are calculated from a normalized version of the desired time-varying envelope signal, wherein the normalization includes implementation specific manipulation of phase and/or amplitude. The two substantially constant envelope constituents are then phase shifted by an appropriate angle related to the phase shift of the desired time-varying envelope signal. The substantially constant envelope constituents are then individually amplified substantially equally, and summed to generate an amplified version of the original desired time-varying envelope signal.

Figure 9A:
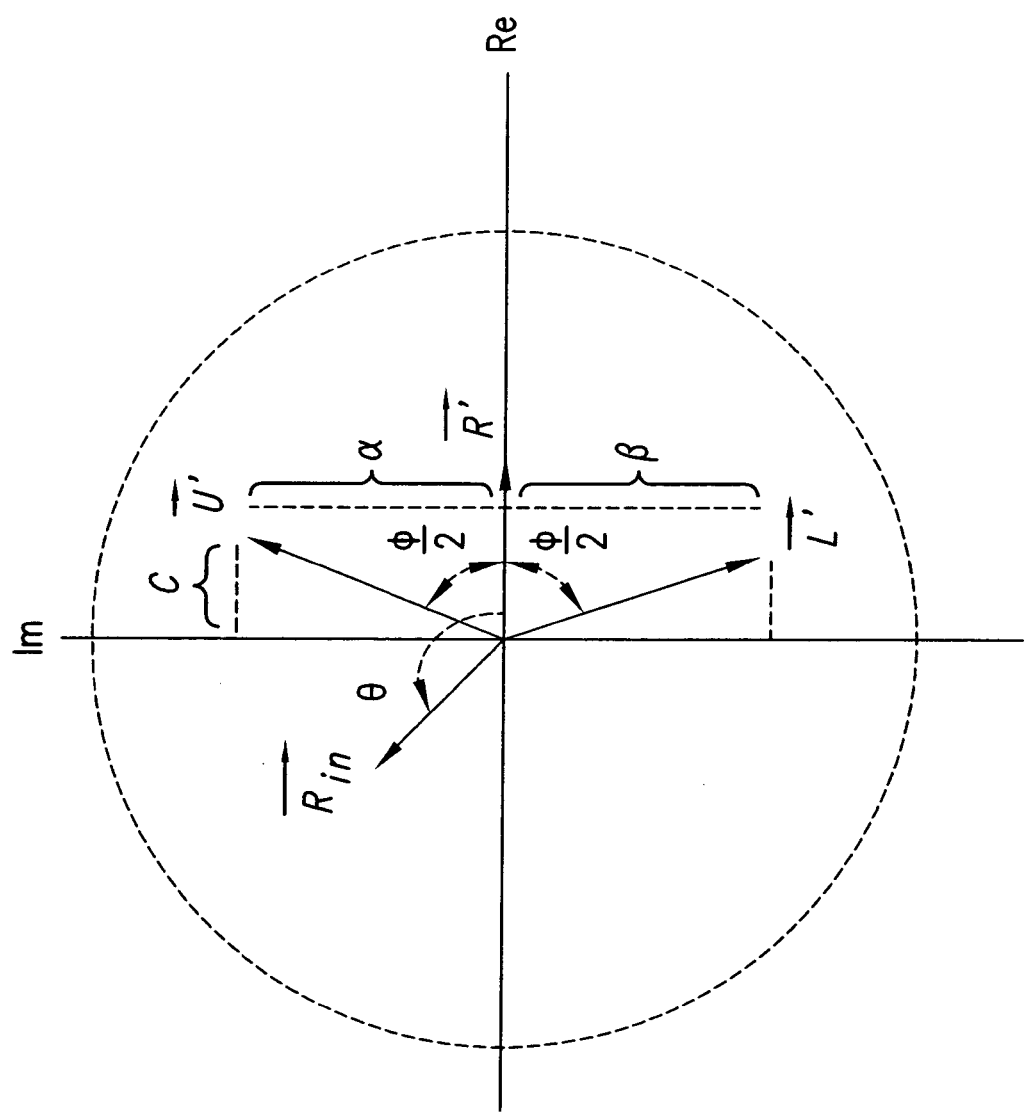
FIGS. 9A-9B are phasor diagrams that illustrate a Cartesian-Polar-Cartesian-Polar (CPCP) 2-Branch Vector Power Amplification (VPA) method of an embodiment of the present invention.
Figure 9B:
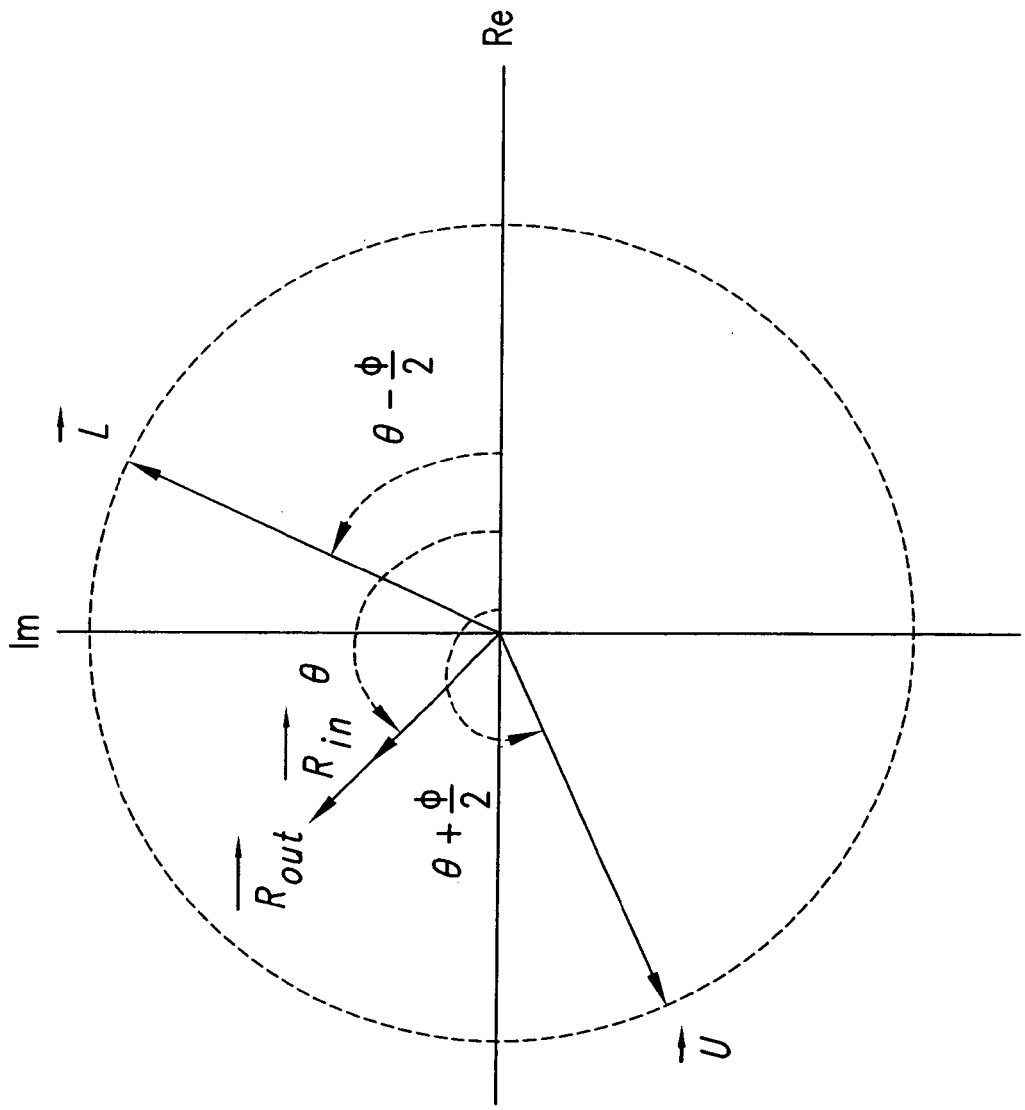

FIGS. 9A and 9B conceptually illustrate the CPCP 2-Branch VPA embodiment using a phasor signal representation. In FIG. 9A, phasor $\vec{R}_{in}$ represents a time-varying complex envelope input signal r(t). At any instant of time, $\vec{R}_{in}$ reflects a magnitude and a phase shift angle of signal r(t). In the example shown in FIG. 9A, $\vec{R}_{in}$ is characterized by a magnitude R and a phase shift angle θ. As described above, the phase shift angle is measured relative to a reference signal.

Referring to FIG. 9A, $\vec{R}'$ represents the relative amplitude component of $\vec{R}_{in}$ generated by $\vec{U}'$ and $\vec{L}'$.

Still referring to FIG. 9A, it is noted that, at any time instant, $\vec{R}'$ can be obtained by the sum of an upper phasor $\vec{U}'$ and a lower phasor $\vec{L}'$. Further, $\vec{U}'$ and $\vec{L}'$ can be maintained to have substantially constant magnitude. The phasors, $\vec{U}'$ and $\vec{L}'$, accordingly, represent two substantially constant envelope signals. r'(t) can thus be obtained, at any time instant, by the sum of two substantially constant envelope signals that correspond to phasors $\vec{U}'$ and $\vec{L}'$.

The phase shifts of phasors $\vec{U'}$ and $\vec{L'}$ relative to $\vec{R'}$ are set according to the desired magnitude R of $\vec{R'}$. In the simplest case, when upper and lower phasors $\vec{U'}$ and $\vec{L'}$ are selected to have equal magnitude, upper and lower phasors $\vec{U'}$ and $\vec{L'}$ are substantially symmetrically shifted in phase relative to $\vec{R'}$. This is illustrated in the example of FIG. 9A. It is noted that terms and phrases indicating or suggesting orientation, such as but not limited to "upper and lower" are used herein for ease of reference and are not functionally or structurally limiting.

It can be verified that, for the case illustrated in FIG. 9A, the phase shift of $\vec{U'}$ and $\vec{L'}$ relative to $\vec{R'}$, illustrated as angle $$\frac{\phi}{2}$$

in FIG. 9A, is related to the magnitude of $\vec{R'}$ as follows:

$$\frac{\phi}{2} = \cot^{-1}\left(\frac{R}{2\sqrt{1-\frac{R^2}{4}}}\right) \quad (7)$$

where R represents a normalized magnitude of phasor $\vec{R'}$.
Equation (7) can further be reduced to $$\frac{\phi}{2} = \cos^{-1}\left(\frac{R}{2}\right) \quad (7.10)$$

where R represents a normalized magnitude of phasor $\vec{R'}$.

Alternatively, any substantially equivalent mathematical equations or other substantially equivalent mathematical techniques such as look up tables can be used.

It follows from the above discussion that, in phasor representation, any phasor $\vec{R'}$ of variable magnitude and phase can be constructed by the sum of two constant magnitude phasor components:

$$\vec{R'}=\vec{U'}+\vec{L'} \quad (8)$$

$$|\vec{U}|=|\vec{L}|=A=\text{constant}$$

Correspondingly, in the time domain, a time-varying envelope sinusoidal signal $r'(t)=R(t)\times\cos(\omega t)$ is constructed by the sum of two constant envelope signals as follows:

$$r'(t) = U'(t) + L'(t); \quad (9)$$

$$U'(t) = A \times \cos\left(\omega t + \frac{\phi}{2}\right);$$

$$L'(t) = A \times \cos\left(\omega t - \frac{\phi}{2}\right);$$

where A is a constant and $$\frac{\phi}{2}$$

is as shown in equation (7).

From FIG. 9A, it can be further verified that equations (9) can be rewritten as:

$$r'(t)=U'(t)+L'(t);$$

$$U'(t)=C\cos(\omega t)+\alpha\sin(\omega t);$$

$$L'(t)=C\cos(\omega t)-\beta\sin(\omega t); \quad (10)$$

where C denotes the real part component of phasors $\vec{U'}$ and $\vec{L'}$ and is equal to $$A \times \cos\left(\frac{\phi}{2}\right).$$

Note that C is a common component of $\vec{U'}$ and $\vec{L'}$. $\alpha$ and $\beta$ denote the imaginary part components of phasors $\vec{U'}$ and $\vec{L'}$, respectively.

$$\alpha = \beta = A \times \sin\left(\frac{\phi}{2}\right).$$

Accordingly, from equations (12), $$r'(t) = 2C \times \cos(\omega t) = 2A \times \cos\left(\frac{\phi}{2}\right) \times \cos(\omega t).$$

As understood by a person skilled in the art based on the teachings herein, other equivalent and/or simplified representations of the above representations of the quantities A, B, and C may also be used, including look up tables, for example.

Note that $\vec{R}_{in}$ is shifted by θ degrees relative to $\vec{R'}$. Accordingly, using equations (8), it can be deduced that:

$$\vec{R}_{in}=\vec{R'}e^{j\theta}=(\vec{U'}+\vec{L'})e^{j\theta}=\vec{U'}e^{j\theta}+\vec{L'}e^{j\theta} \quad (11)$$

Equations (11) imply that a representation of $\vec{R}_{in}$ can be obtained by summing phasors $\vec{U'}$ and $\vec{L'}$ described above, shifted by θ degrees. Further, an amplified output version, $\vec{R}_{out}$, of $\vec{R}_{in}$ can be obtained by separately amplifying substantially equally each of the θ degrees shifted versions of phasors $\vec{U'}$ and $\vec{L'}$, and summing them. FIG. 9B illustrates this concept. In FIG. 9B, phasors $\vec{U}$ and $\vec{L}$ represent θ degrees shifted and amplified versions of phasors $\vec{U'}$ and $\vec{L'}$. Note that, since $\vec{U'}$ and $\vec{L'}$ are constant magnitude phasors, $\vec{U}$ and $\vec{L}$ are also constant magnitude phasors. Phasors $\vec{U}$ and $\vec{L}$ sum, as shown FIG. 9B, to phasor $\vec{R}_{out}$, which is a power amplified version of input signal $\vec{R}_{in}$.

Equivalently, in the time domain, it can be shown that:

$$r_{out}(t)=U(t)+L(t);$$

$$U(t)=K[C\cos(\omega t+\theta)+\alpha\sin(\omega t+\theta)];$$

$$L(t)=K[C\cos(\omega t+\theta)-\beta\sin(\omega t+\theta)] \quad (12).$$

where $r_{out}(t)$ corresponds to the time domain signal represented by phasor $\vec{R}_{out}$, U(t) and L(t) correspond to the time domain signals represents by phasors $\vec{U}$ and $\vec{L}$, and K is the power amplification factor.

A person skilled in the art will appreciate that, whereas the time domain representations in equations (9) and (10) have been provided for the case of a sinusoidal waveform, equivalent representations can be developed for non-sinusoidal waveforms using appropriate basis functions.

Figure 10:
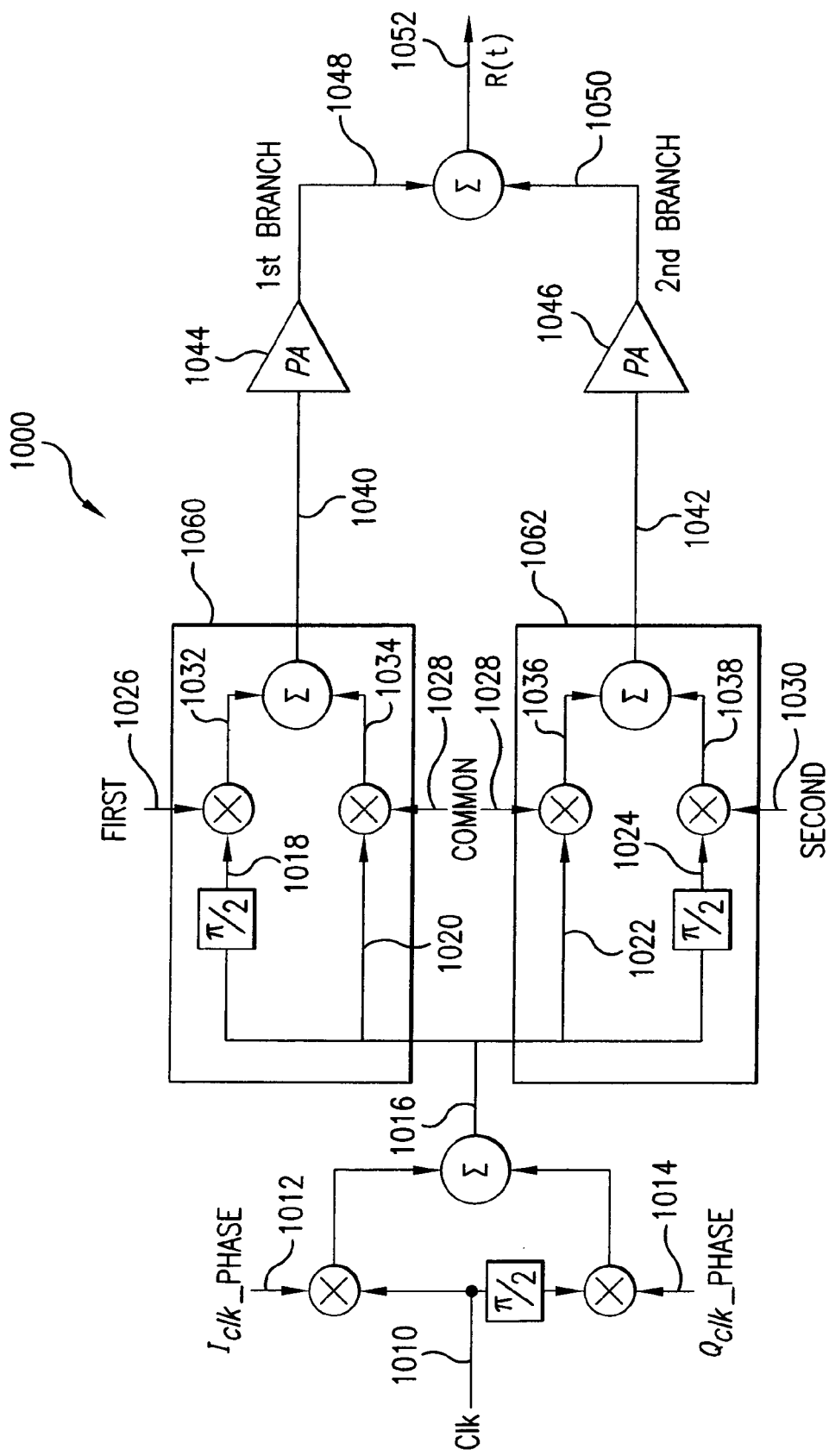
FIG. 10 is a block diagram that illustrates an exemplary embodiment of the CPCP 2-Branch VPA method.

FIG. 10 is a block diagram that conceptually illustrates an exemplary embodiment 1000 of the CPCP 2-Branch VPA embodiment. An output signal r(t) of desired power level and frequency characteristics is generated from in-phase and quadrature components according to the CPCP 2-Branch VPA embodiment.

In the example of FIG. 10, a clock signal 1010 represents a reference signal for generating output signal r(t). Clock signal 1010 is of the same frequency as that of desired output signal r(t).

Referring to FIG. 10, an Iclk_phase signal 1012 and a Qclk_phase signal 1014 represent amplitude analog values that are multiplied by the in-phase and quadrature components of Clk signal 1010 and are calculated from the baseband I and Q signals.

Still referring to FIG. 10, clock signal 1010 is multiplied with Iclk_phase signal 1012. In parallel, a 90° degrees shifted version of clock signal 1010 is multiplied with Qclk_phase signal 1014. The two multiplied signals are combined to generate Rclk signal 1016. Rclk signal 1016 is of the same frequency as clock signal 1010. Further, Rclk signal 1016 is characterized by a phase shift angle according to the ratio of Q(t) and I(t). The magnitude of Rclk signal 1016 is such that $R^2clk=I^2clk\_phase+Q^2clk\_phase$. Accordingly, Rclk signal 1016 represents a substantially constant envelope signal having the phase characteristics of the desired output signal r(t).

Still referring to FIG. 10, Rclk signal 1016 is input, in parallel, into two vector modulators 1060 and 1062. Vector modulators 1060 and 1062 generate the U(t) and L(t) substantially constant envelope constituents, respectively, of the desired output signal r(t) as described in (12). In vector modulator 1060, an in-phase Rclk signal 1020, multiplied with Common signal 1028, is combined with a 90° degree shifted version 1018 of Rclk signal, multiplied with first signal 1026. In parallel, in vector modulator 1062, an in-phase Rclk signal 1022, multiplied with Common signal 1028, is combined with a 90° degrees shifted version 1024 of Rclk signal, multiplied with second signal 1030. Common signal 1028, first signal 1026, and second signal 1030 correspond, respectively, to the real part C and the imaginary parts α and β described in equation (12).

Output signals 1040 and 1042 of respective vector modulators 1060 and 1062 correspond, respectively, to the U(t) and L(t) constant envelope constituents of input signal r(t).

As described above, signals 1040 and 1042 are characterized by having substantially equal and constant magnitude envelopes. Accordingly, when signals 1040 and 1042 are input into corresponding power amplifiers (PA) 1044 and 1046, corresponding amplified signals 1048 and 1050 are substantially constant envelope signals.

Power amplifiers 1044 and 1046 apply substantially equal power amplification to signals 1040 and 1042, respectively. In an embodiment, the power amplification level of PAs 1044 and 1046 is set according to the desired power level of output signal r(t). Further, amplified signals 1048 and 1050 are in-phase relative to each other. Accordingly, when summed together, as shown in FIG. 10, resulting signal 1052 corresponds to the desired output signal r(t).

Figure 10A:
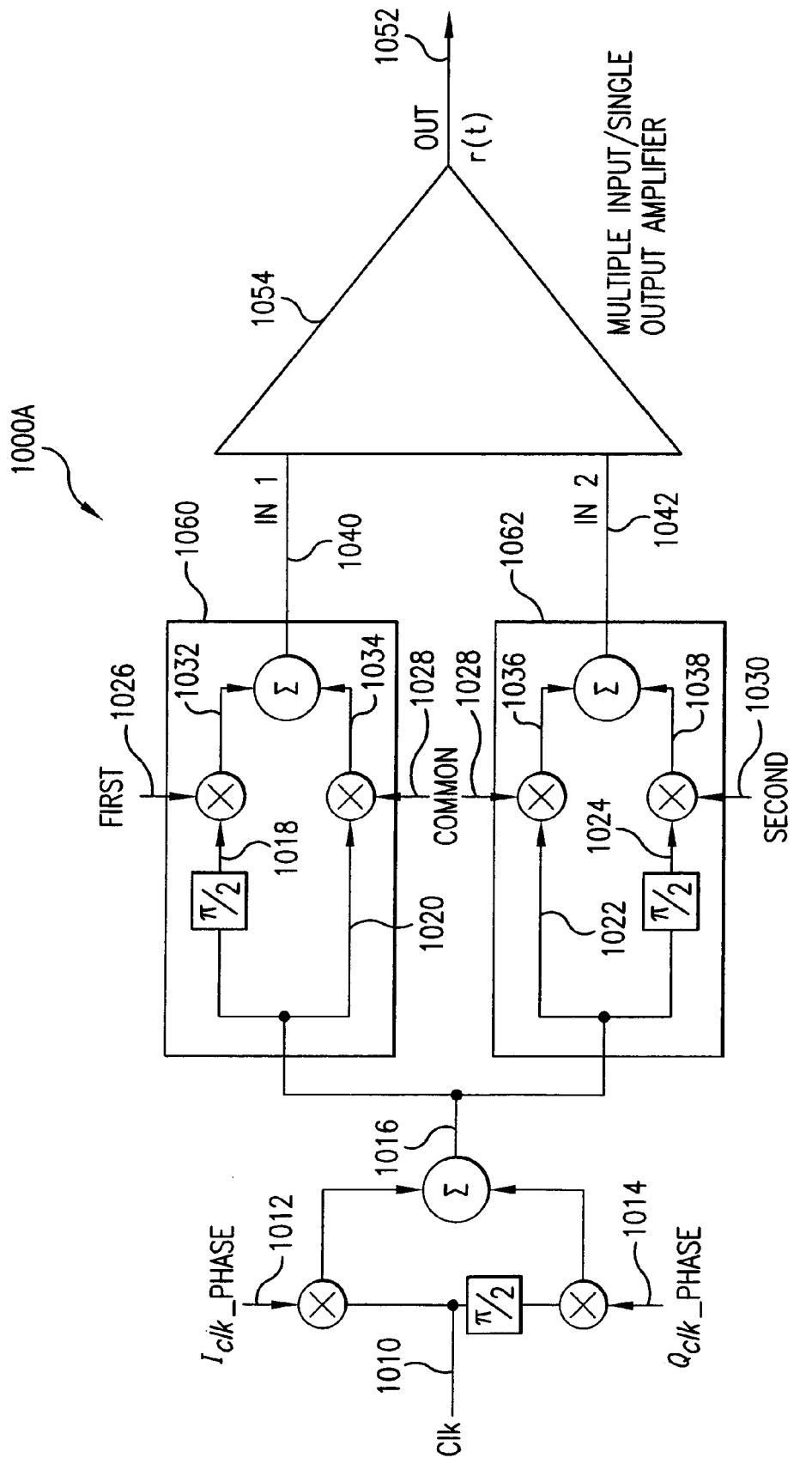
FIG. 10A is a block diagram that illustrates another exemplary embodiment of the CPCP 2-Branch VPA method.

FIG. 10A is another exemplary embodiment 1000A of the CPCP 2-Branch VPA embodiment. Embodiment 1000A represents a Multiple Input Single Output (MISO) implementation of embodiment 1000 of FIG. 10.

In embodiment 1000A, constant envelope signals 1040 and 1042, output from vector modulators 1060 and 1062, are input into MISO PA 1054. MISO PA 1054 is a two-input single-output power amplifier. In an embodiment, MISO PA 1054 may include various elements, such as pre-drivers, drivers, power amplifiers, and process detectors (not shown in FIG. 10A), for example. Further, MISO PA 1054 is not limited to being a two-input PA as shown in FIG. 10A. In other embodiments, as will be described further below with reference to FIGS. 51A-H, PA 1054 can have any number of inputs.

Figure 11:
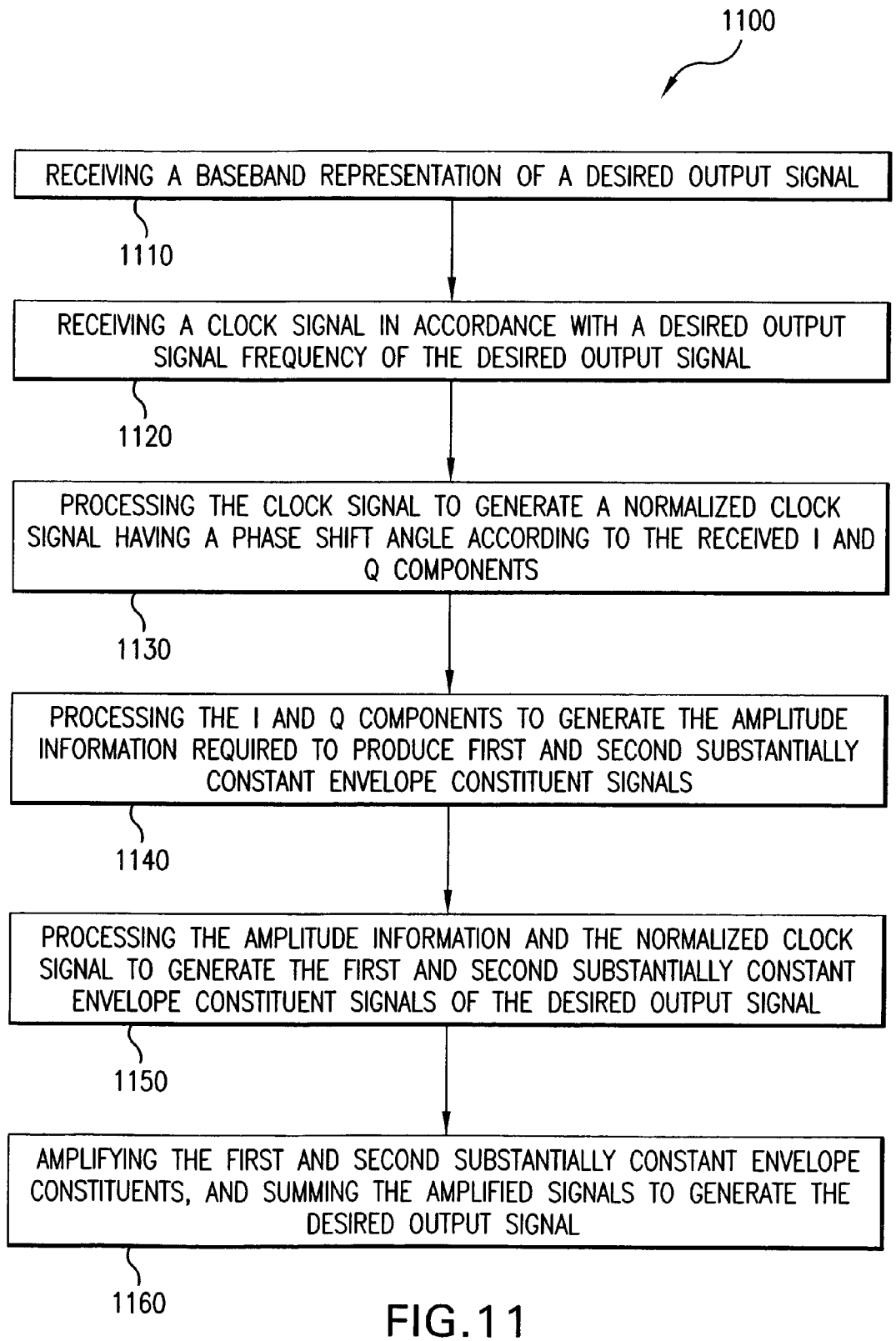
FIG. 11 is a process flowchart embodiment for power amplification according to the CPCP 2-Branch VPA method.

Operation of the CPCP 2-Branch VPA embodiment is depicted in the process flowchart 1100 of FIG. 11.

The process begins at step 1110, which includes receiving a baseband representation of the desired output signal. In an embodiment, this involves receiving in-phase (I) and quadrature (Q) components of the desired output signal. In another embodiment, this involves receiving magnitude and phase of the desired output signal.

Step 1120 includes receiving a clock signal set according to a desired output signal frequency of the desired output signal. In the example of FIG. 10, step 1120 is achieved by receiving clock signal 1010.

Step 1130 includes processing the clock signal to generate a normalized clock signal having a phase shift angle according to the received I and Q components. In an embodiment, the normalized clock signal is a constant envelope signal having a phase shift angle according to a ratio of the I and Q components. The phase shift angle of the normalized clock is relative to the original clock signal. In the example of FIG. 10, step 1130 is achieved by multiplying clock signal 1010's in-phase and quadrature components with Iclk_phase 1012 and Qclk_phase 1014 signals, and then summing the multiplied signal to generate Rclk signal 1016.

Step 1140 includes the processing of the I and Q components to generate the amplitude information required to produce first and second substantially constant envelope constituent signals.

Step 1150 includes processing the amplitude information of step 1140 and the normalized clock signal Rclk to generate the first and second constant envelope constituents of the desired output signal. In an embodiment, step 1150 involves phase shifting the first and second constant envelope constituents of the desired output signal by the phase shift angle of the normalized clock signal. In the example of FIG. 10, step 1150 is achieved by vector modulators 1060 and 1062 modulating Rclk signal 1016 with first signal 1026, second signal 1030, and common signal 1028 to generate signals 1040 and 1042.

Step 1160 includes individually amplifying the first and second constant envelope constituents, and summing the amplified signals to generate the desired output signal. In an embodiment, the amplification of the first and second constant envelope constituents is substantially equal and according to a desired power level of the desired output signal. In the example of FIG. 10, step 1160 is achieved by PAs 1044 and 1046 amplifying signals 1040 and 1042 to generate amplified signals 1048 and 1050.

Figure 12:
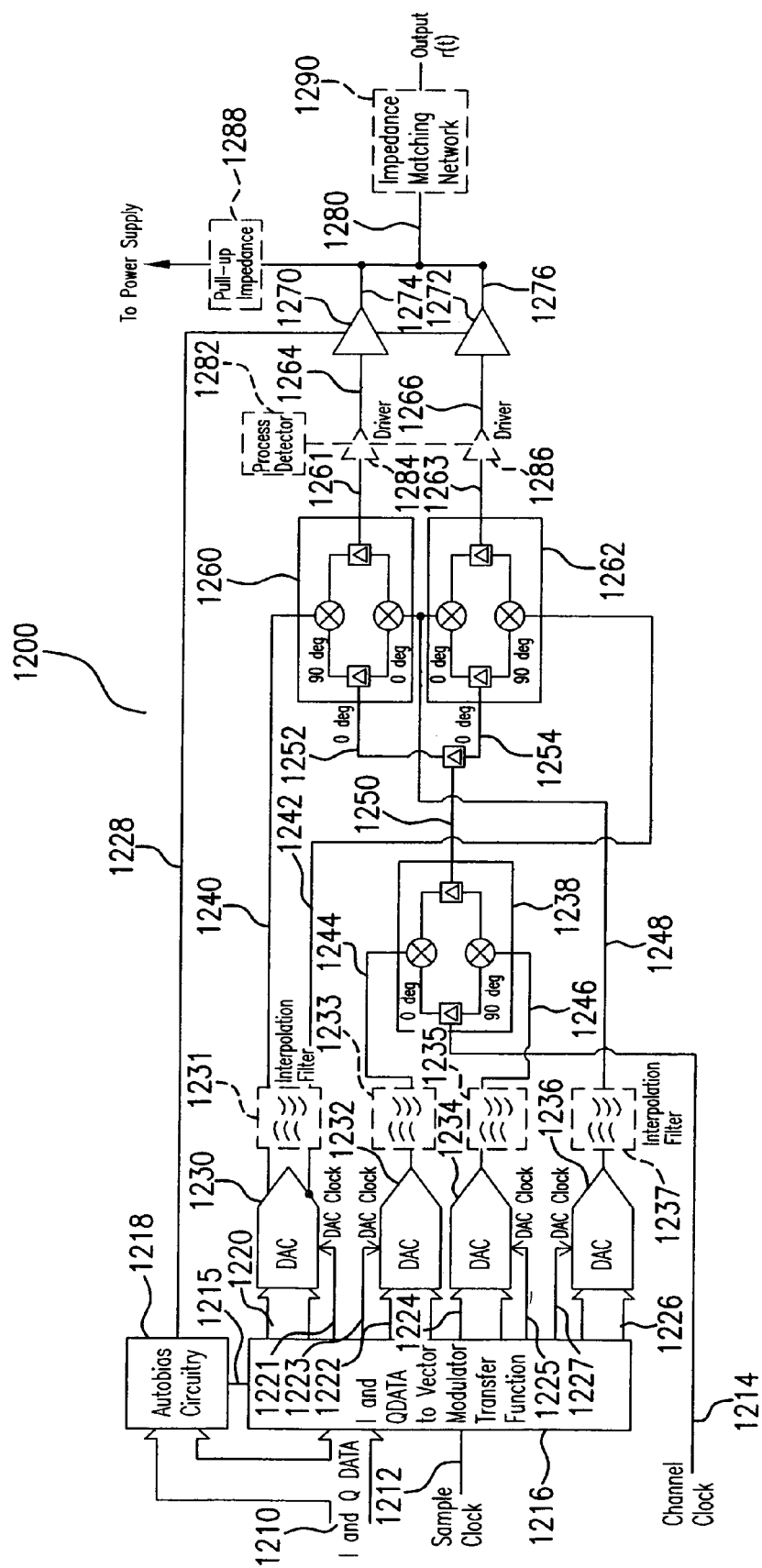
FIG. 12 is a block diagram that illustrates an exemplary embodiment of a vector power amplifier for implementing the CPCP 2-Branch VPA method.

FIG. 12 is a block diagram that illustrates an exemplary embodiment of a vector power amplifier 1200 implementing the process flowchart 1100. Optional components are illustrated with dashed lines, although in other embodiments more or less components may be optional.

Referring to FIG. 12, in-phase (I) and quadrature (Q) information signal 1210 is received by an I and Q Data Transfer Function module 1216. In an embodiment, I and Q Data Transfer Function 1216 samples signal 1210 according to a sample clock 1212. I and Q information signal 1210 includes baseband I and Q information of a desired output signal r(t).

In an embodiment, I and Q Data Transfer Function module 1216 processes information signal 1210 to generate information signals 1220, 1222, 1224, and 1226. The operation of I and Q Data Transfer Function module 1216 is further described below in section 3.4.

Referring to FIG. 12, information signal 1220 includes quadrature amplitude information of first and second constant envelope constituents of a baseband version of desired output signal r(t). With reference to FIG. 9A, for example, information signal 1220 includes the α and β quadrature components. Referring again to FIG. 12, information signal 1226 includes in-phase amplitude information of the first and second constant envelope constituents of the baseband version of signal r(t). With reference to FIG. 9A, for example, information signal 1226 includes the common C in-phase component.

Still referring to FIG. 12, information signals 1222 and 1224 include normalized in-phase Iclk_phase and quadrature Qclk_phase signals, respectively. Iclk_phase and Qclk_phase are normalized versions of the I and Q information signals included in signal 1210. In an embodiment, Iclk_phase and Qclk_phase are normalized such that that (I²clk_phase+ Q²clk_phase=constant). It is noted that the phase of signal 1250 corresponds to the phase of the desired output signal and is created from Iclk_phase and Qclk_phase. Referring to FIG. 9B, Iclk_phase and Qclk_phase are related to I and Q as follows:

$$\theta = \tan^{-1}\left(\frac{Q}{I}\right) = \tan^{-1}\left(\frac{Q_{clk\_phase}}{I_{clk\_phase}}\right)$$

where θ represents the phase of the desired output signal, represented b phasor $\vec{R}_{out}$ in FIG. 9B. The sign information of the baseband I and Q information must be taken into account to calculate θ for all four quadrants.

In the exemplary embodiment of FIG. 12, information signals 1220, 1222, 1224, and 1226 are digital signals. Accordingly, each of signals 1220, 1222, 1224, and 1226 is fed into a corresponding digital-to-analog converter (DAC) 1230, 1232, 1234, and 1236. The resolution and sample rate of DACs 1230, 1232, 1234, and 1236 is selected according to specific signaling schemes. DACs 1230, 1232, 1234, and 1236 are controlled by DAC clock signals 1221, 1223, 1225, and 1227, respectively. DAC clock signals 1221, 1223, 1225, and 1227 may be derived from a same clock signal or may be independent.

In other embodiments, information signals 1220, 1222, 1224, and 1226 are generated in analog format and no DACs are required.

Referring to FIG. 12, DACs 1230, 1232, 1234, and 1236 convert digital information signals 1220, 1222, 1224, and 1226 into corresponding analog signals, and input these analog signal into optional interpolation filters 1231, 1233, 1235, and 1237, respectively. Interpolation filters 1231, 1233, 1235, and 1237, which also serve as anti-aliasing filters, shape the DACs output signals to produce the desired output waveform. Interpolation filters 1231, 1233, 1235, and 1237 generate signals 1240, 1244, 1246, and 1248, respectively. Signal 1242 represents the inverse of signal 1240.

Still referring to FIG. 12, signals 1244 and 1246, which include Iclk_phase and Qclk_phase information, are input into a vector modulator 1238. Vector modulator 1238 multiplies signal 1244 with a channel clock signal 1214. Channel clock signal 1214 is selected according to a desired output signal frequency. In parallel, vector modulator 1238 multiplies signal 1246 with a 90° shifted version of channel clock signal 1214. In other words, vector modulator 1238 generates an in-phase component having amplitude of Iclk_phase and a quadrature component having amplitude of Qclk_phase.

Vector modulator 1238 combines the two modulated signals to generate Rclk signal 1250. Rclk signal 1250 is a substantially constant envelope signal having the desired output frequency and a phase shift angle according to the I and Q data included in signal 1210.

Still referring to FIG. 12, signals 1240, 1242, and 1248 include the U, L, and Common C amplitude components, respectively, of the complex envelope of signal r(t). Signals 1240, 1242, and 1248 along with Rclk signal 1250 are input into vector modulators 1260 and 1262.

Vector modulator 1260 combines signal 1240, multiplied with a 90° shifted version of Rclk signal 1250, and signal 1248, multiplied with a 0° shifted version of Rclk signal 1250, to generate output signal 1264. In parallel, vector modulator 1262 combines signal 1242, multiplied with a 900 shifted version of Rclk signal 1250, and signal 1248, modulated with a 0° shifted version of Rclk signal 1250, to generate output signal 1266.

Output signals 1264 and 1266 represent substantially constant envelope signals. Further, phase shifts of output signals 1264 and 1266 relative to Rclk signal 1250 are determined by the angle relationships associated with the ratios α/C and β/C, respectively. In an embodiment, α=β and therefore output signals 1264 and 1266 are symmetrically phased relative to Rclk signal 1250. With reference to FIG. 9B, for example, output signals 1264 and 1266 correspond, respectively, to the $\vec{U}$ and $\vec{L}$ constant magnitude phasors.

A sum of output signals 1264 and 1266 results in a channel-clock-modulated signal having the I and Q characteristics of baseband signal r(t). To achieve a desired power level at the output of vector power amplifier 1200, however, signals 1264 and 1266 are amplified to generate an amplified output signal. In the embodiment of FIG. 12, signals 1264 and 1266 are, respectively, input into power amplifiers (PAs) 1270 and 1272 and amplified. In an embodiment, PAs 1270 and 1272 include switching power amplifiers. Autobias circuitry 1218 controls the bias of PAs 1270 and 1272 as further described below in section 3.5.2. In the embodiment of FIG. 12, for example, autobias circuitry 1218 provides a bias voltage 1228 to PAs 1270 and 1272.

In an embodiment, PAs 1270 and 1272 apply substantially equal power amplification to respective constant envelope signals 1264-1266. In an embodiment, the power amplification is set according to the desired output power level. In other embodiments of vector power amplifier 1200, PA drivers and/or pre-drivers are additionally employed to provide additional power amplification capability to the amplifier. In the embodiment of FIG. 12, for example, PA drivers 1284 and 1286 are optionally added, respectively, between vector modulators 1260 and 1262 and subsequent PAs 1270 and 1272.

Respective output signals 1274 and 1276 of PAs 1270 and 1272 are substantially constant envelope signals. Further, when output signals 1274 and 1276 are summed, the resulting signal has minimal non-linear distortion. In the embodiment of FIG. 12, output signals 1274 and 1276 are coupled together to generate output signal 1280 of vector power amplifier 1200. In an embodiment, no isolation is used in coupling the outputs of PAs 1270 and 1272. Accordingly, minimal power loss is incurred by the coupling. In an embodiment, the outputs of PAs 1270 and 1272 are directly coupled together using a wire. Direct coupling in this manner means that there is minimal or no resistive, inductive, or capacitive isolation between the outputs of PAs 1270 and 1272. In other words, outputs of PAs 1270 and 1272 are coupled together without intervening components. Alternatively, in an embodiment, the outputs of PAs 1270 and 1272 are coupled together indirectly through inductances and/or capacitances that result in low or minimal impedance connections, and/or connections that result in minimal isolation and minimal power loss. Alternatively, outputs of PAs 1270 and 1272 are coupled using well known combining techniques, such as Wilkinson, hybrid combiners, transformers, or known active combiners. In an embodiment, the PAs 1270 and 1272 provide integrated amplification and power combining in a single operation. In an embodiment, one or more of the power amplifiers and/or drivers described herein are implemented using multiple input, single output power amplification techniques, examples of which are shown in FIGS. 12A, 12B, and 51A-H.

Output signal 1280 represents a signal having the I and Q characteristics of baseband signal r(t) and the desired output power level and frequency. In embodiments of vector power amplifier 1200, a pull-up impedance 1288 is coupled between the output of vector power amplifier 1200 and a power supply. In other embodiments, an impedance matching network 1290 is coupled at the output of vector power amplifier 1200. Output stage embodiments according to power amplification methods and systems of the present invention will be further described below in section 3.5.

In other embodiments of vector power amplifier 1200, process detectors are employed to compensate for any process variations in circuitry of the amplifier. In the exemplary embodiment of FIG. 12, for example, process detector 1282 is optionally added to monitor variations in PA drivers 1284 and 1286.

Figure 12A:
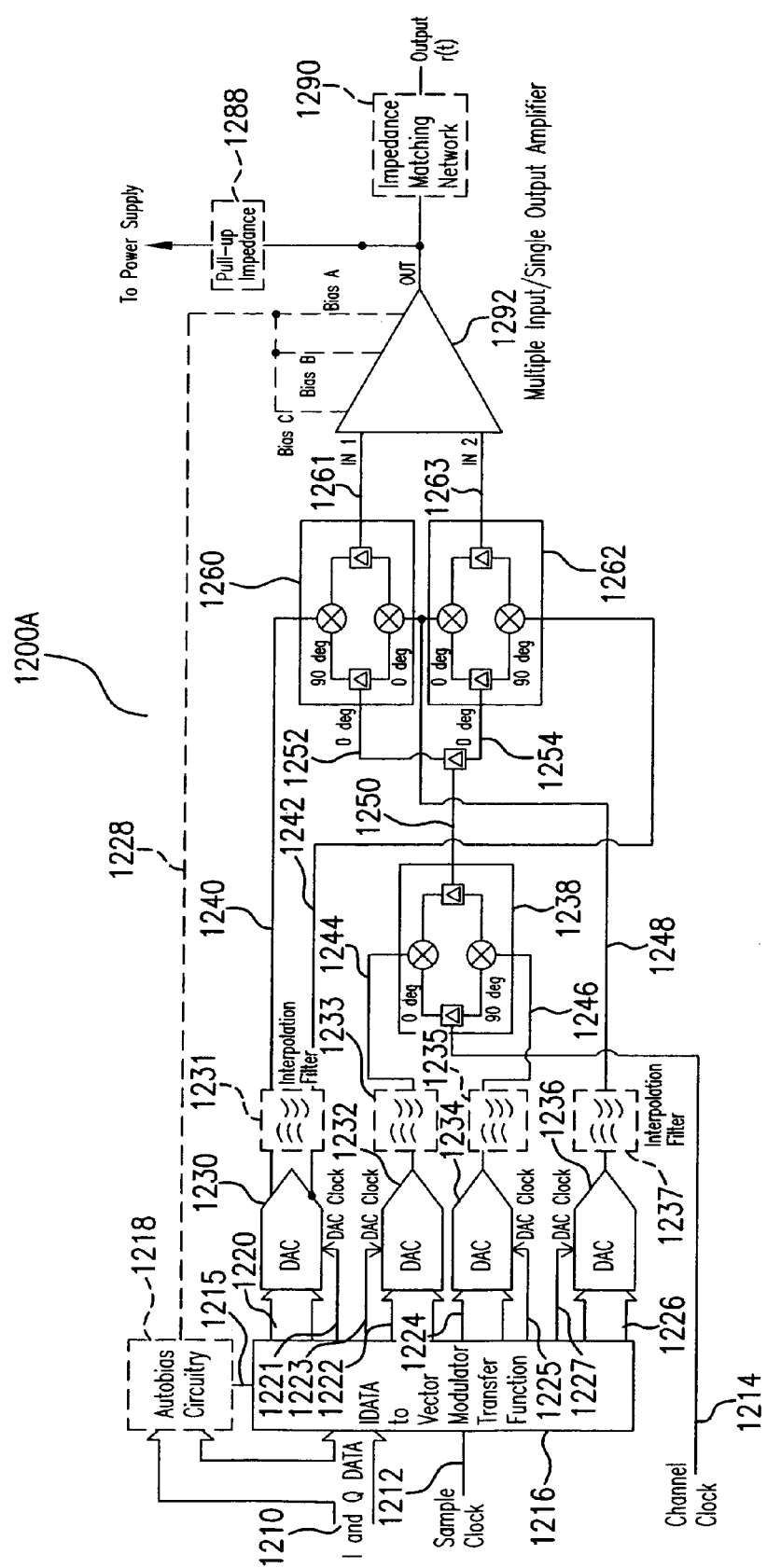
FIG. 12A is a block diagram that illustrates another exemplary embodiment of a vector power amplifier for implementing the CPCP 2-Branch VPA method.

FIG. 12A is a block diagram that illustrates another exemplary embodiment of a vector power amplifier 1200A implementing the process flowchart 1100. Optional components are illustrated with dashed lines, although in other embodiments more or less components may be optional.

Embodiment 1200A illustrates a multiple-input single-output (MISO) implementation of embodiment 1200. In embodiment 1200A, constant envelope signals 1261 and 1263, output from vector modulators 1260 and 1262, are input into MISO PA 1292. MISO PA 1292 is a two-input single-output power amplifier. In an embodiment, MISO PA 1292 includes elements 1270, 1272, 1282, 1284, and 1286 as shown in the embodiment of FIG. 12. In another embodiment, MISO PA 1292 may include other elements, such as pre-drivers, not shown in the embodiment of FIG. 12. Further, MISO PA 1292 is not limited to being a two-input PA as shown in FIG. 12A. In other embodiments as will be described further below with reference to FIGS. 51A-H, PA 1292 can have any number of inputs and outputs.

Still referring to FIG. 12A, embodiment 1200A illustrates one implementation for delivering autobias signals to MISO PA 1292. In the embodiment of FIG. 12A, Autobias signal 1228 generated by Autobias circuitry 1218, has one or more signals derived from it to bias different stages of MISO PA 1292. As shown in the example of FIG. 12A, three bias control signals Bias A, Bias B, and Bias C are derived from Autobias signal 1228, and then input at different stages of MISO PA 1292. For example, Bias C may be the bias signal to the pre-driver stage of MISO PA 1292. Similarly, Bias B and Bias A may be the bias signals to the driver and PA stages of MISO PA 1292.

Figure 12B:
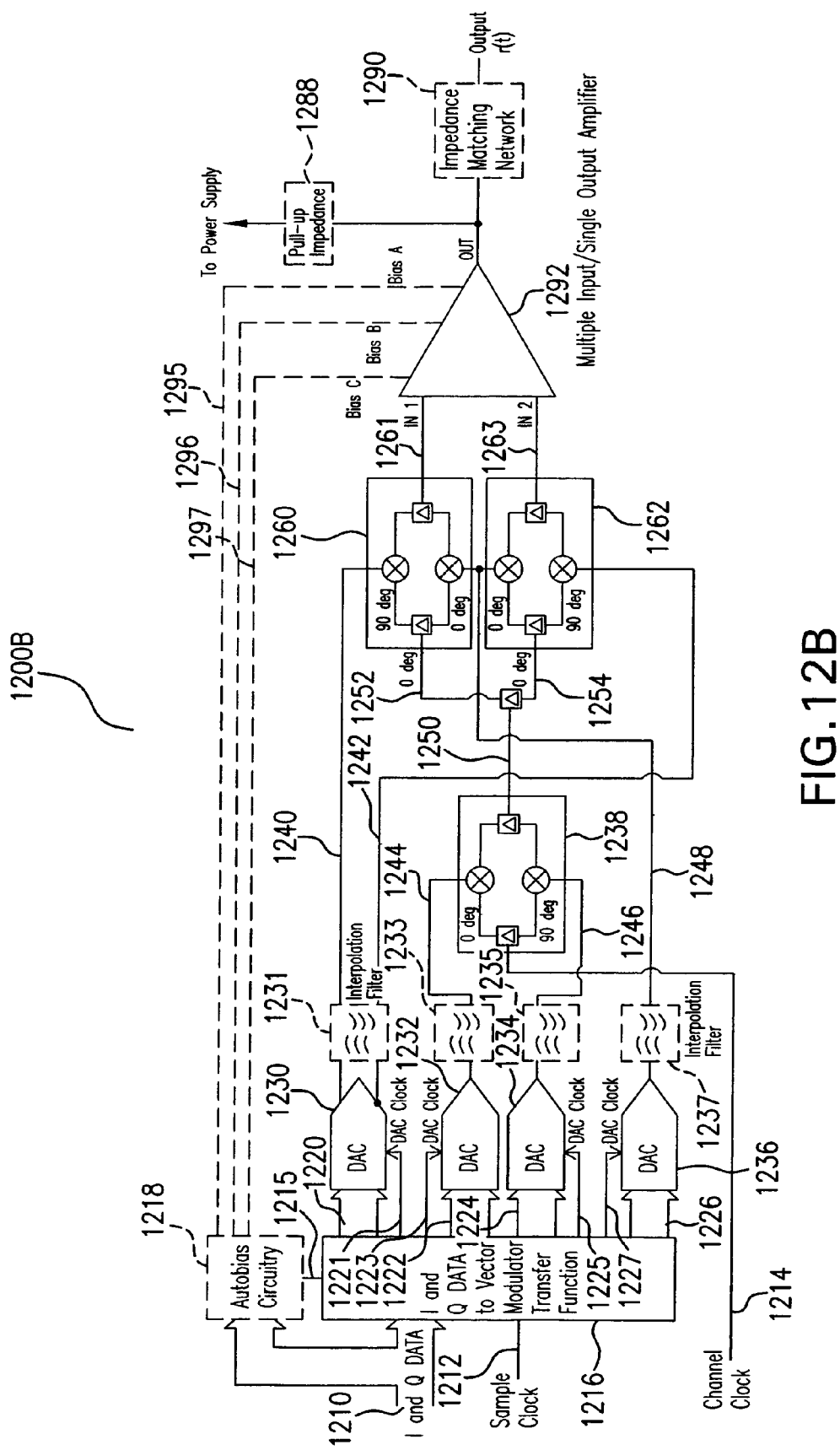
FIG. 12B is a block diagram that illustrates another exemplary embodiment of a vector power amplifier for implementing the CPCP 2-Branch VPA method.

In another implementation, shown in embodiment 1200B of FIG. 12B, Autobias circuitry 1218 generates separate Autobias signals 1295, 1296, and 1295, corresponding to Bias A, Bias B, and Bias C, respectively. Signals 1295, 1296, and 1297 may or may not be generated separately within Autobias circuitry 1218, but are output separately as shown. Further, signals 1295, 1296, and 1297 may or may not be related as determined by the biasing of the different stages of MISO PA 1294.

Other aspects of vector power amplifiers 1200A and 1200B substantially correspond to those described above with respect to vector power amplifier 1200.

Figure 13:
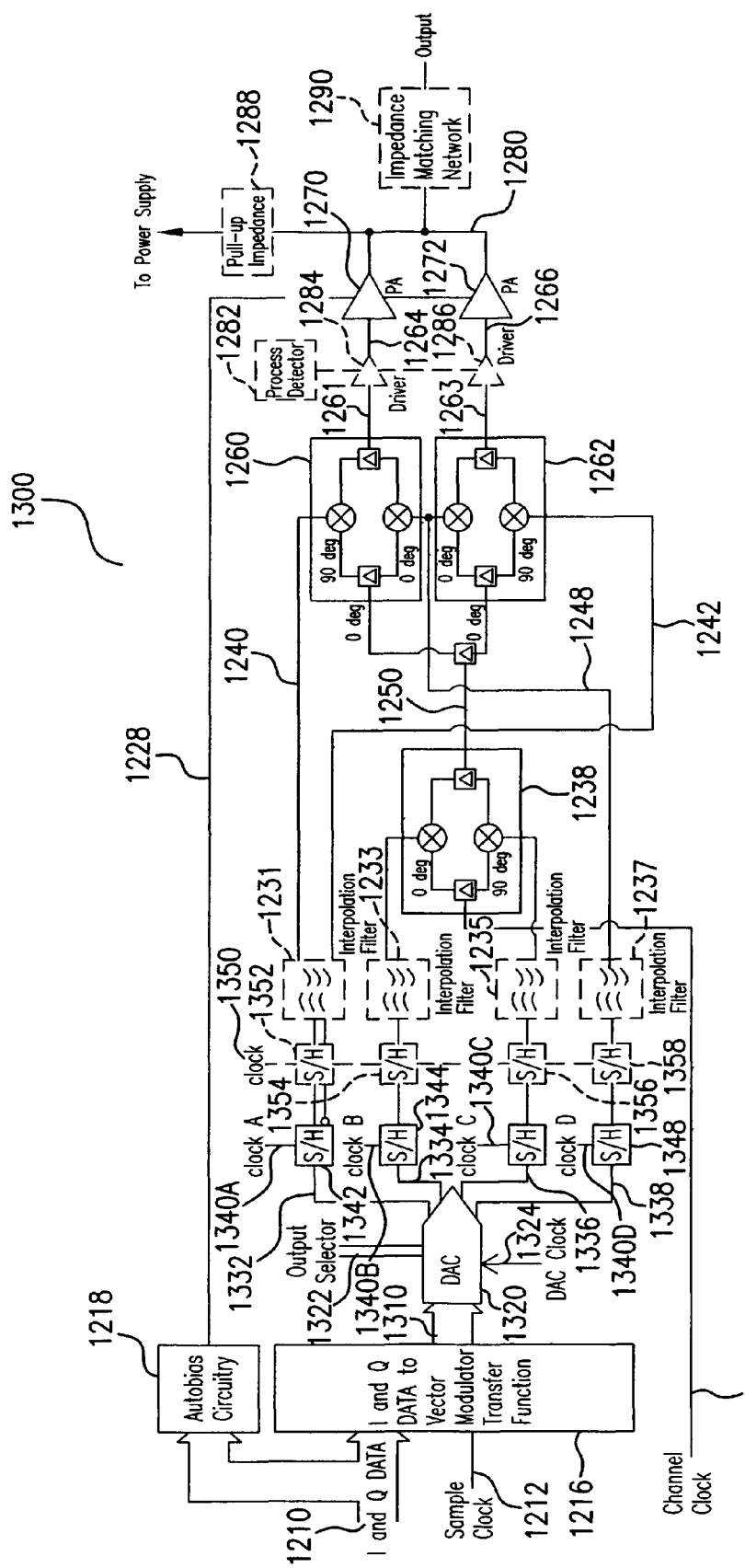
FIG. 13 is a block diagram that illustrates another exemplary embodiment of a vector power amplifier for implementing the CPCP 2-Branch VPA method.

FIG. 13 is a block diagram that illustrates another exemplary embodiment 1300 of a vector power amplifier according to the CPCP 2-Branch VPA embodiment. Optional components are illustrated with dashed lines, although in other embodiments more or less components may be optional.

In the exemplary embodiment of FIG. 13, a DAC of sufficient resolution and sample rate 1320 replaces DACs 1230, 1232, 1234 and 1236 of the embodiment of FIG. 12. DAC 1320 is controlled by a DAC clock 1324.

DAC 1320 receives information signal 1310 from I and Q Data Transfer Function module 1216. Information signal 1310 includes identical information content to signals 1220, 1222, 1224 and 1226 in the embodiment of FIG. 12.

DAC 1320 may output a single analog signal at a time. Accordingly, a sample-and-hold architecture may be used as shown in FIG. 13.

DAC 1320 sequentially outputs analog signals 1332, 1334, 1336, 1336 to a first set of sample-and-hold circuits 1342, 1344, 1346, and 1348. In an embodiment, DAC 1230 is clocked at a sufficient rate to replace DACs 1230, 1232, 1234, and 1236 of the embodiment of FIG. 12. An output selector 1322 determines which of output signals 1332, 1334, 1336, and 1338 should be selected for output.

DAC 1320's DAC clock signal 1324, output selector signal 1322, and sample-and-hold clocks 1340A-D and 1350 are controlled by a control module that can be independent or integrated into transfer function module 1216.

In an embodiment, sample-and-hold circuits (S/H) 1342, 1344, 1346, and 1348 hold the received analog values and, according to a clock signal 1340A-D, release the values to a second set of sample-and-hold circuits 1352, 1354, 1356, and 1358. For example, S/H 1342 release its value to S/H 1352 according to a received clock signal 1340A. In turn, sample-and-hold circuits 1352, 1354, 1356, and 1358 hold the received analog values, and simultaneously release the values to interpolation filters 1231, 1233, 1235, and 1237 according to a common clock signal 1350. A common clock signal 1350 is used in order to ensure that the outputs of S/H 1352, 1354, 1356, and 1358 are time-aligned.

In another embodiment, a single layer of S/H circuitry that includes S/H 1342, 1344, 1346, and 1348 can be employed. Accordingly, S/H circuits 1342, 1344, 1346, and 1348 receive analog values from DAC 1320, and each releases its received value according to a clock independent of the others. For example, S/H 1342 is controlled by clock 1340A, which may not be synchronized with clock 1340B that controls S/H 1344. To ensure that outputs of S/H circuits 1342, 1344, 1346, and 1348 are time-aligned, delays between clocks 1340A-D are pre-compensated for in prior stages of the amplifier. For example, DAC 1320 outputs signal 1332, 1334, 1336, and 1338 with appropriately selected delays to S/H circuits 1342, 1344, 1346, and 1348 in order to compensate for the time differences between clocks 1340A-D.

Other aspects of vector power amplifier 1300 are substantially equivalent to those described above with respect to vector power amplifier 1200.

Figure 13A:
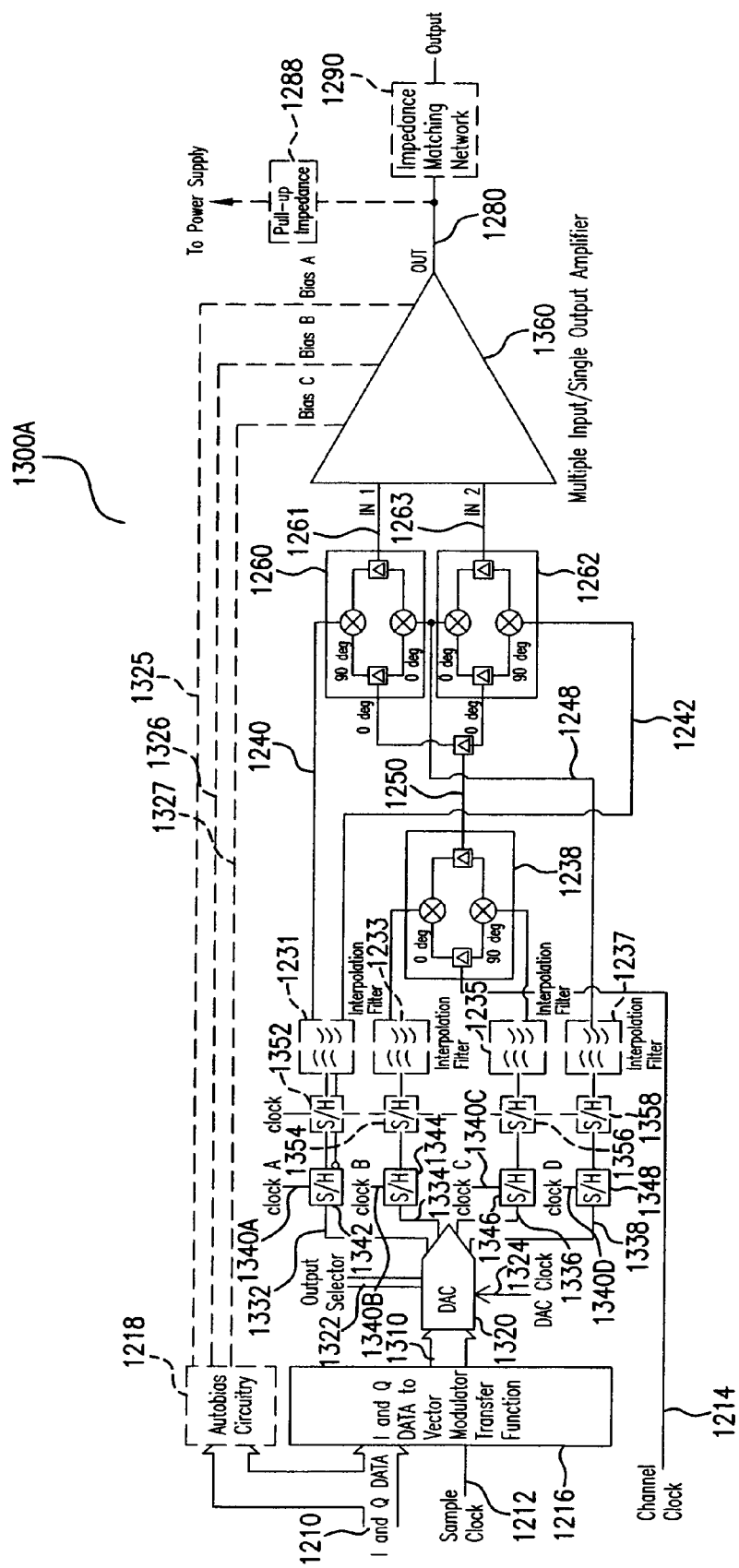
FIG. 13A is a block diagram that illustrates another exemplary embodiment of a vector power amplifier for implementing the CPCP 2-Branch VPA method.

FIG. 13A is a block diagram that illustrates another exemplary embodiment 1300A of a vector power amplifier according to the CPCP 2-Branch VPA embodiment. Optional components are illustrated with dashed lines, although in other embodiments more or less components may be optional. Embodiment 1300A is a MISO implementation of embodiment 1300 of FIG. 13.

In the embodiment of FIG. 13A, constant envelope signals 1261 and 1263 output from vector modulators 1260 and 1262 are input into MISO PA 1360. MISO PA 1360 is a two-input single-output power amplifier. In an embodiment, MISO PA 1360 includes elements 1270, 1272, 1282, 1284, and 1286 as shown in the embodiment of FIG. 13. In another embodiment, MISO PA 1360 may include other elements, such as pre-drivers, not shown in the embodiment of FIG. 13, or functional equivalents thereof. Further, MISO PA 1360 is not limited to being a two-input PA as shown in FIG. 13A. In other embodiments as will be described further below with reference to FIGS. 51A-H, PA 1360 can have any number of inputs.

The embodiment of FIG. 13A further illustrates two different sample and hold architectures with a single or two levels of S/H circuitry as shown. The two implementations have been described above with respect to FIG. 13.

Embodiment 1300A also illustrates optional bias control circuitry 1218 and associated bias control signal 1325, 1326, and 1327. Signals 1325, 1326, and 1327 may be used to bias different stages of MISO PA 1360 in certain embodiments.

Other aspects of vector power amplifier 1300A are equivalent to those described above with respect to vector power amplifiers 1200 and 1300.

3.3) Direct Cartesian 2-Branch Vector Power Amplifier

A Direct Cartesian 2-Branch VPA embodiment shall now be described. This name is used herein for reference purposes, and is not functionally or structurally limiting.

According to the Direct Cartesian 2-Branch VPA embodiment, a time-varying envelope signal is decomposed into two constant envelope constituent signals. The constituent signals are individually amplified equally or substantially equally, and then summed to construct an amplified version of the original time-varying envelope signal.

In one embodiment of the Direct Cartesian 2-Branch VPA embodiment, a magnitude and a phase angle of a time-varying envelope signal are calculated from in-phase and quadrature components of an input signal. Using the magnitude and phase information, in-phase and quadrature amplitude components are calculated for two constant envelope constituents of the time-varying envelope signal. The two constant envelope constituents are then generated, amplified equally or substantially equally, and summed to generate an amplified version of the original time-varying envelope signal $R_{in}$.

The concept of the Direct Cartesian 2-Branch VPA will now be described with reference to FIGS. 9A and 14.

As described and verified above with respect to FIG. 9A, the phasor $\vec{R'}$ can be obtained by the sum of an upper phasor $\vec{U'}$ and a lower phasor $\vec{L'}$ appropriately phased to produce $\vec{R'}$. $\vec{R'}$ is calculated to be proportional to the magnitude $R_{in}$. Further, $\vec{U'}$ and $\vec{L'}$ can be maintained to have substantially constant magnitude. In the time domain, $\vec{U'}$ and $\vec{L'}$ represent two substantially constant envelope signals. The time domain equivalent r'(t) of $\vec{R'}$ can thus be obtained, at any time instant, by the sum of two substantially constant envelope signals.

For the case illustrated in FIG. 9A, the phase shift of $\vec{U'}$ and $\vec{L'}$ relative to $\vec{R'}$, illustrated as angle $$\frac{\phi}{2}$$

in FIG. 9A, is related to the magnitude of $\vec{R'}$ as follows:

$$\frac{\phi}{2} = \cot^{-1}\left(\frac{R}{\sqrt[2]{1 - \frac{R^2}{4}}}\right) \quad (13)$$

where R represents the normalized magnitude of phasor $\vec{R'}$.

In the time domain, it was shown that a time-varying envelope signal, r'(t)=R(t)cos(ωt) for example, can be constructed by the sum of two constant envelope signals as follows:

$$r'(t)=U'(t)+L'(t);$$

$$U'(t)=C\times\cos(\omega t)+\alpha\times\sin(\omega t);$$

$$L'(t)=C\times\cos(\omega t)-\beta\times\sin(\omega t) \quad (14).$$

where C denotes the in-phase amplitude component of phasors $\vec{U'}$ and $\vec{L'}$ and is equal or substantially equal to $$A \times \cos\left(\frac{\phi}{2}\right)$$

(A being a constant). α and β denote the quadrature amplitude components of phasors $\vec{U'}$ and $\vec{L'}$, respectively.

$$\alpha = \beta = A \times \sin\left(\frac{\phi}{2}\right).$$

Note that equations (14) can be modified for non-sinusoidal signals by changing the basis function from sinusoidal to the desired function.

Figure 14:
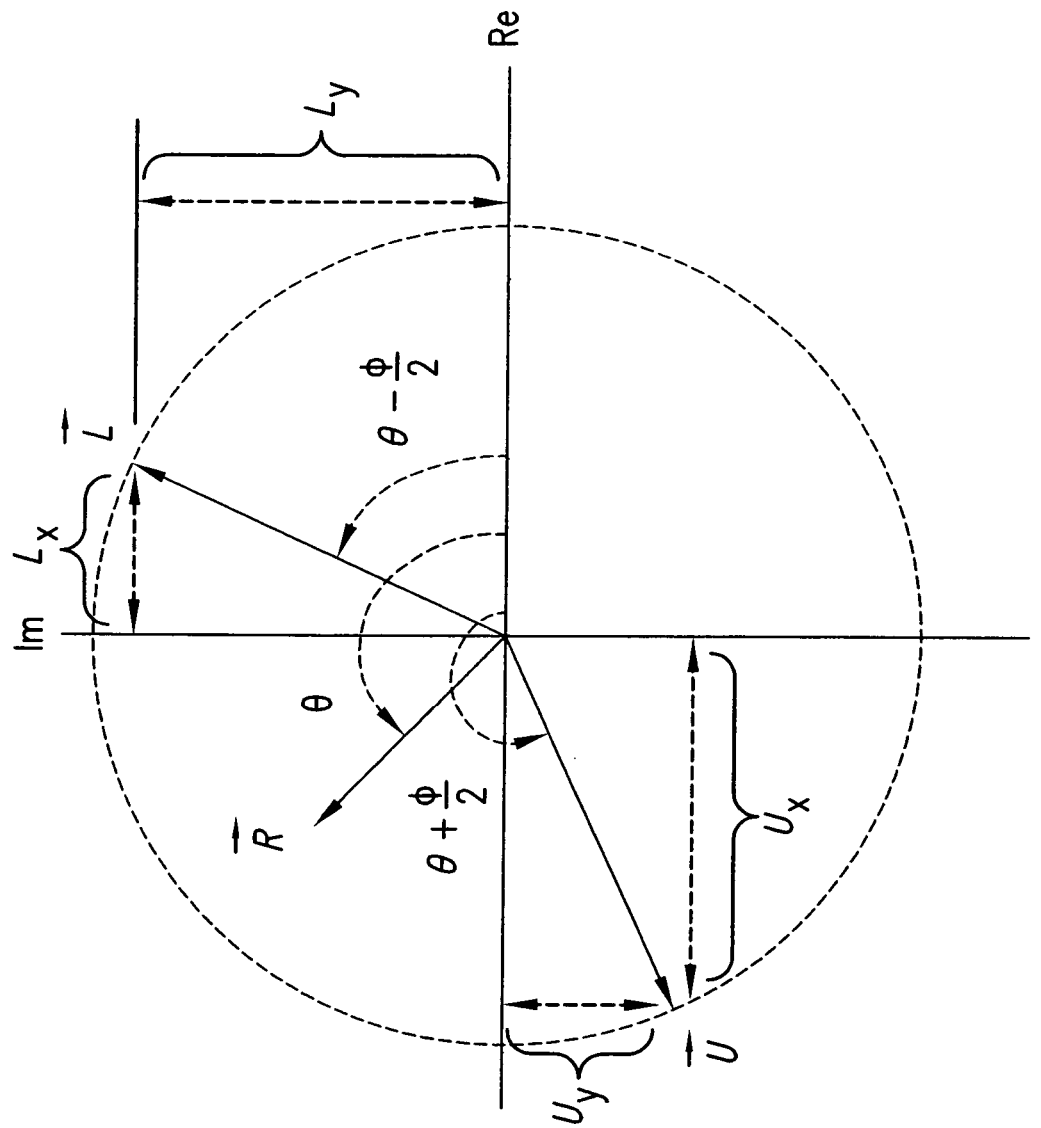
FIG. 14 is a phasor diagram that illustrates a Direct Cartesian 2-Branch Vector Power Amplification (VPA) method of an embodiment of the present invention.

FIG. 14 illustrates phasor $\vec{R}$ and its two constant magnitude constituent phasors $\vec{U}$ and $\vec{L}$. $\vec{R}$ is shifted by θ degrees relative to $\vec{R'}$ in FIG. 9A. Accordingly, it can be verified that:

$$\vec{R} = \vec{R'} \times e^{j\theta} = (\vec{U'} + \vec{L'}) \times e^{j\theta} = \vec{U} + \vec{L};$$

$$\vec{U} = \vec{U'} \times e^{j\theta};$$

$$\vec{L} = \vec{L'} \times e^{j\theta}. \quad (15)$$

From equations (15), it can be further shown that:

$$\vec{U} = \vec{U}' \times e^{j\Theta} = (C + j\alpha) \times e^{j\Theta};$$

$$\Rightarrow \vec{U} = (C+j\alpha)(\cos\Theta + j\sin\Theta) = (C\cos\Theta - \alpha\sin\Theta) + j(C\sin\Theta + \alpha\cos\Theta). \quad (16)$$

Similarly, it can be shown that:

$$\vec{L} = \vec{L}' \times e^{j\Theta} = (C + j\beta) \times e^{j\Theta};$$

$$\Rightarrow \vec{L} = (C+j\beta)(\cos\Theta + j\sin\Theta) = (C\cos\Theta - \beta\sin\Theta) + j(C\sin\Theta + \beta\cos\Theta). \quad (17)$$

Equations (16) and (17) can be re-written as:

$$\vec{U} = (C\cos\Theta - \alpha\sin\Theta) + j(C\sin\Theta + \alpha\cos\Theta) = U_x + jU_y;$$

$$\vec{L} = (C\cos\Theta - \beta\sin\Theta) + j(C\sin\Theta + \beta\cos\Theta) = L_x + jL_y. \quad (18)$$

Equivalently, in the time domain:

$$U(t) = U_x \phi_1(t) + U_y \phi_2(t);$$

$$L(t) = L_x \phi_1(t) + L_y \phi_2(t); \quad (19)$$

where $\phi_1(t)$ and $\phi_2(t)$ represent an appropriately selected orthogonal basis functions.

From equations (18) and (19), it is noted that it is sufficient to calculate the values of $\alpha$, $\beta$, C and $\sin(\Theta)$ and $\cos(\Theta)$ in order to determine the two constant envelope constituents of a time-varying envelope signal r(t). Further, $\alpha$, $\beta$, and C can be entirely determined from magnitude and phase information, equivalently I and Q components, of signal r(t).

Figure 15:
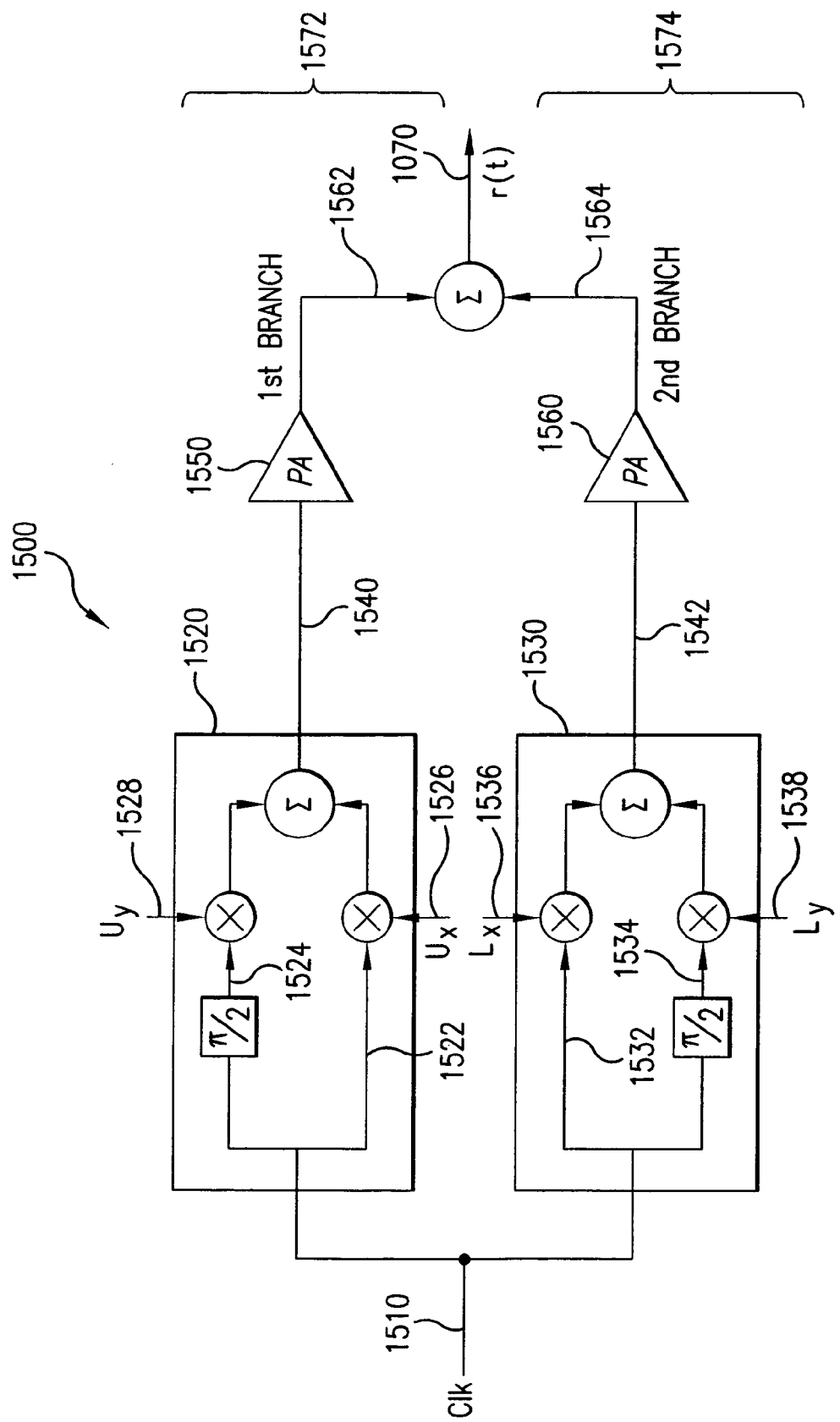
FIG. 15 is a block diagram that illustrates an exemplary embodiment of the Direct Cartesian 2-Branch VPA method.

FIG. 15 is a block diagram that conceptually illustrates an exemplary embodiment 1500 of the Direct Cartesian 2-Branch VPA embodiment. An output signal r(t) of desired power level and frequency characteristics is generated from in-phase and quadrature components according to the Direct Cartesian 2-Branch VPA embodiment.

In the example of FIG. 15, a clock signal 1510 represents a reference signal for generating output signal r(t). Clock signal 1510 is of the same frequency as that of desired output signal r(t).

Referring to FIG. 15, exemplary embodiment 1500 includes a first branch 1572 and a second branch 1574. The first branch 1572 includes a vector modulator 1520 and a power amplifier (PA) 1550. Similarly, the second branch 1574 includes a vector modulator 1530 and a power amplifier (PA) 1560.

Still referring to FIG. 15, clock signal 1510 is input, in parallel, into vector modulators 1520 and 1530. In vector modulator 1520, an in-phase version 1522 of clock signal 1510, multiplied with $U_x$ signal 1526, is summed with a 90° degrees shifted version 1524 of clock signal 1510, multiplied with $U_y$ signal 1528. In parallel, in vector modulator 1530, an in-phase version 1532 of clock signal 1510, multiplied with Lx signal 1536, is summed with a 90° degrees shifted version 1534 of clock signal 1510, multiplied with Ly signal 1538. $U_x$ signal 1526 and $U_y$ signal 1528 correspond, respectively, to the in-phase and quadrature amplitude components of the U(t) constant envelope constituent of signal r(t) provided in equation (19). Similarly, $L_x$ signal 1536, and $L_y$ signal 1538 correspond, respectively, to the in-phase and quadrature amplitude components of the L(t) constant envelope constituent of signal r(t) provided in equation (19).

Accordingly, respective output signals 1540 and 1542 of vector modulators 1520 and 1530 correspond, respectively, to the U(t) and L(t) constant envelope constituents of signal r(t) as described above in equations (19). As described above, signals 1540 and 1542 are characterized by having equal and constant or substantially equal and constant magnitude envelopes.

Referring to FIG. 15, to generate the desired power level of output signal r(t), signals 1540 and 1542 are input into corresponding power amplifiers 1550 and 1560.

In an embodiment, power amplifiers 1550 and 1560 apply equal or substantially equal power amplification to signals 1540 and 1542, respectively. In an embodiment, the power amplification level of PAs 1550 and 1560 is set according to the desired power level of output signal r(t).

Amplified output signals 1562 and 1564 are substantially constant envelope signals. Accordingly, when summed together, as shown in FIG. 15, resulting signal 1570 corresponds to the desired output signal r(t).

Figure 15A:
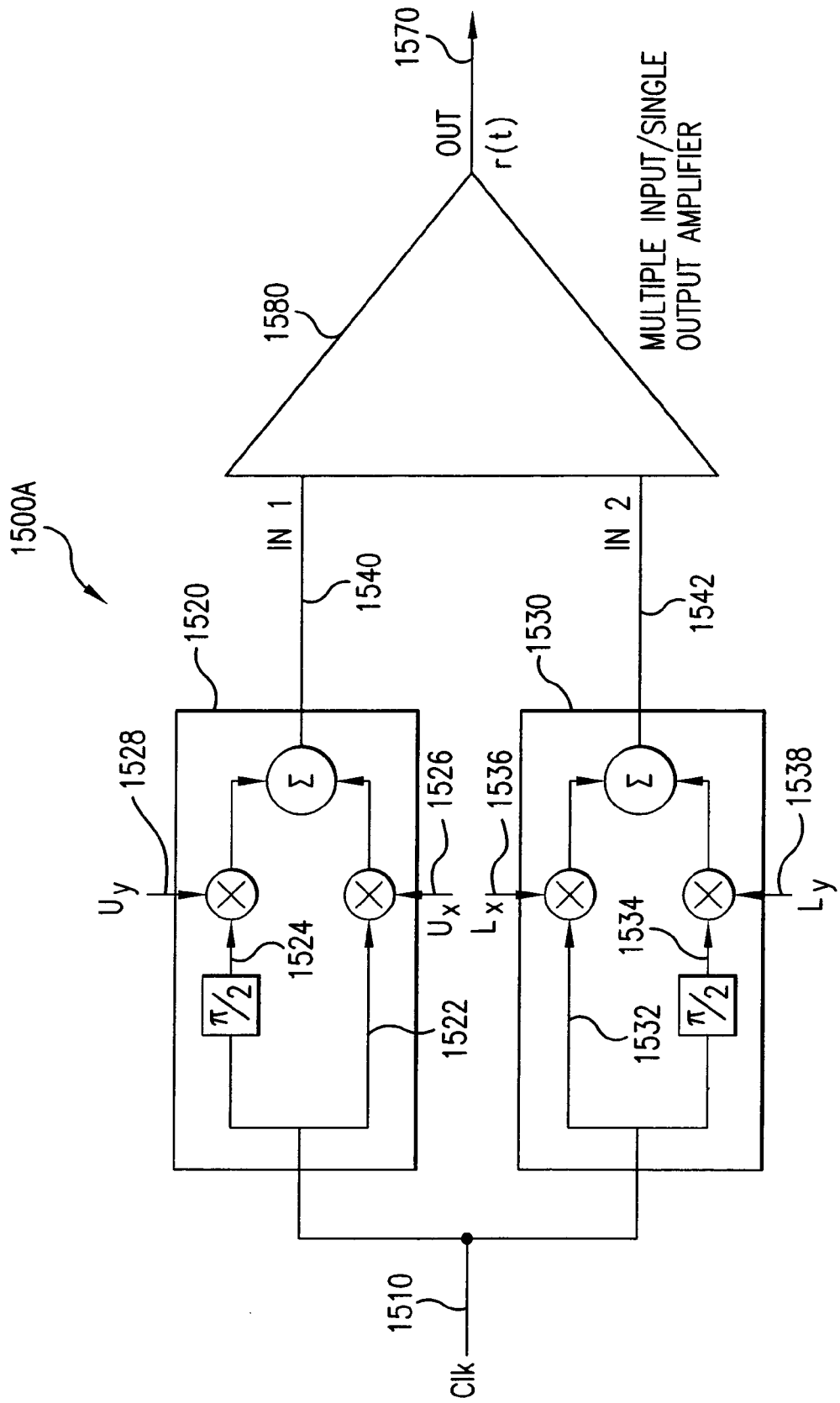
FIG. 15A is a block diagram that illustrates another exemplary embodiment of the Direct Cartesian 2-Branch VPA method.

FIG. 15A is another exemplary embodiment 1500A of the Direct Cartesian 2-Branch VPA embodiment. Embodiment 1500A represents a Multiple Input Signal Output (MISO) implementation of embodiment 1500 of FIG. 15.

In embodiment 1500A, constant envelope signals 1540 and 1542, output from vector modulators 1520 and 1530, are input into MISO PA 1580. MISO PA 1580 is a two-input single-output power amplifier. In an embodiment, MISO PA 1580 may include various elements, such as pre-drivers, drivers, power amplifiers, and process detectors (not shown in FIG. 15A), for example. Further, MISO PA 1580 is not limited to being a two-input PA as shown in FIG. 15A. In other embodiments, as will be described further below with reference to FIGS. 51A-H, PA 1580 can have any number of inputs.

Figure 16:
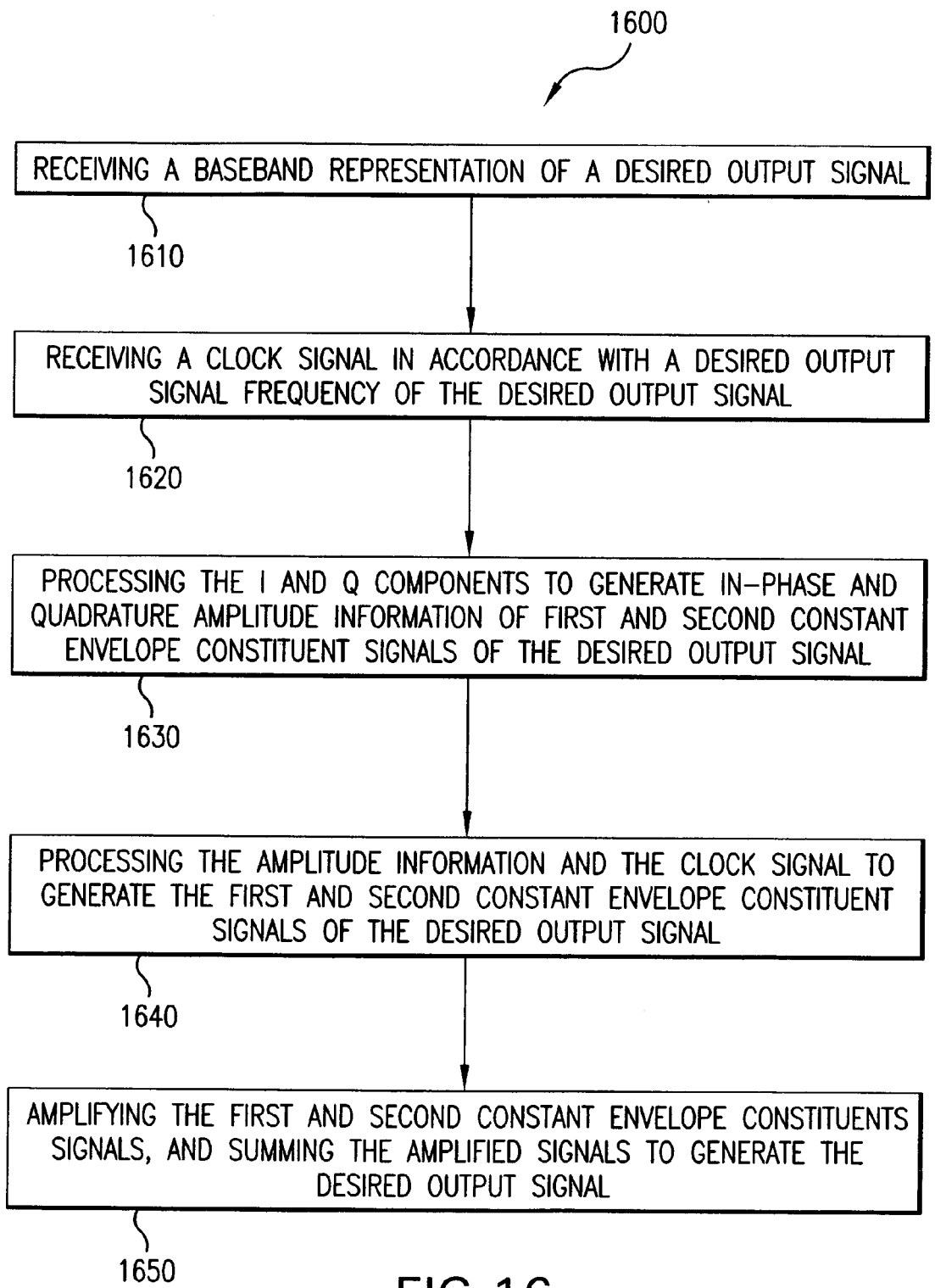
FIG. 16 is a process flowchart embodiment for power amplification according to the Direct Cartesian 2-Branch VPA method.

Operation of the Direct Cartesian 2-Branch VPA embodiment is depicted in the process flowchart 1600 of FIG. 16. The process begins at step 1610, which includes receiving a baseband representation of a desired output signal. In an embodiment, the baseband representation includes I and Q components. In another embodiment, the I and Q components are RF components that are down-converted to baseband.

Step 1620 includes receiving a clock signal set according to a desired output signal frequency of the desired output signal. In the example of FIG. 15, step 1620 is achieved by receiving clock signal 1510.

Step 1630 includes processing the I and Q components to generate in-phase and quadrature amplitude information of first and second constant envelope constituent signals of the desired output signal. In the example of FIG. 15, the in-phase and quadrature amplitude information is illustrated by $U_x$, $U_y$, $L_x$, and $L_y$.

Step 1640 includes processing the amplitude information and the clock signal to generate the first and second constant envelope constituent signals of the desired output signal. In an embodiment, the first and second constant envelope constituent signals are modulated according to the desired output signal frequency. In the example of FIG. 15, step 1640 is achieved by vector modulators 1520 and 1530, clock signal 1510, and amplitude information signals 1526, 1528, 1536, and 1538 to generate signals 1540 and 1542.

Step 1650 includes amplifying the first and second constant envelope constituents, and summing the amplified signals to generate the desired output signal. In an embodiment, the amplification of the first and second constant envelope constituents is according to a desired power level of the desired output signal. In the example of FIG. 15, step 1650 is achieved by PAs 1550 and 1560 amplifying respective signals 1540 and 1542 and, subsequently, by the summing of amplified signals 1562 and 1564 to generate output signal 1574.

Figure 17:
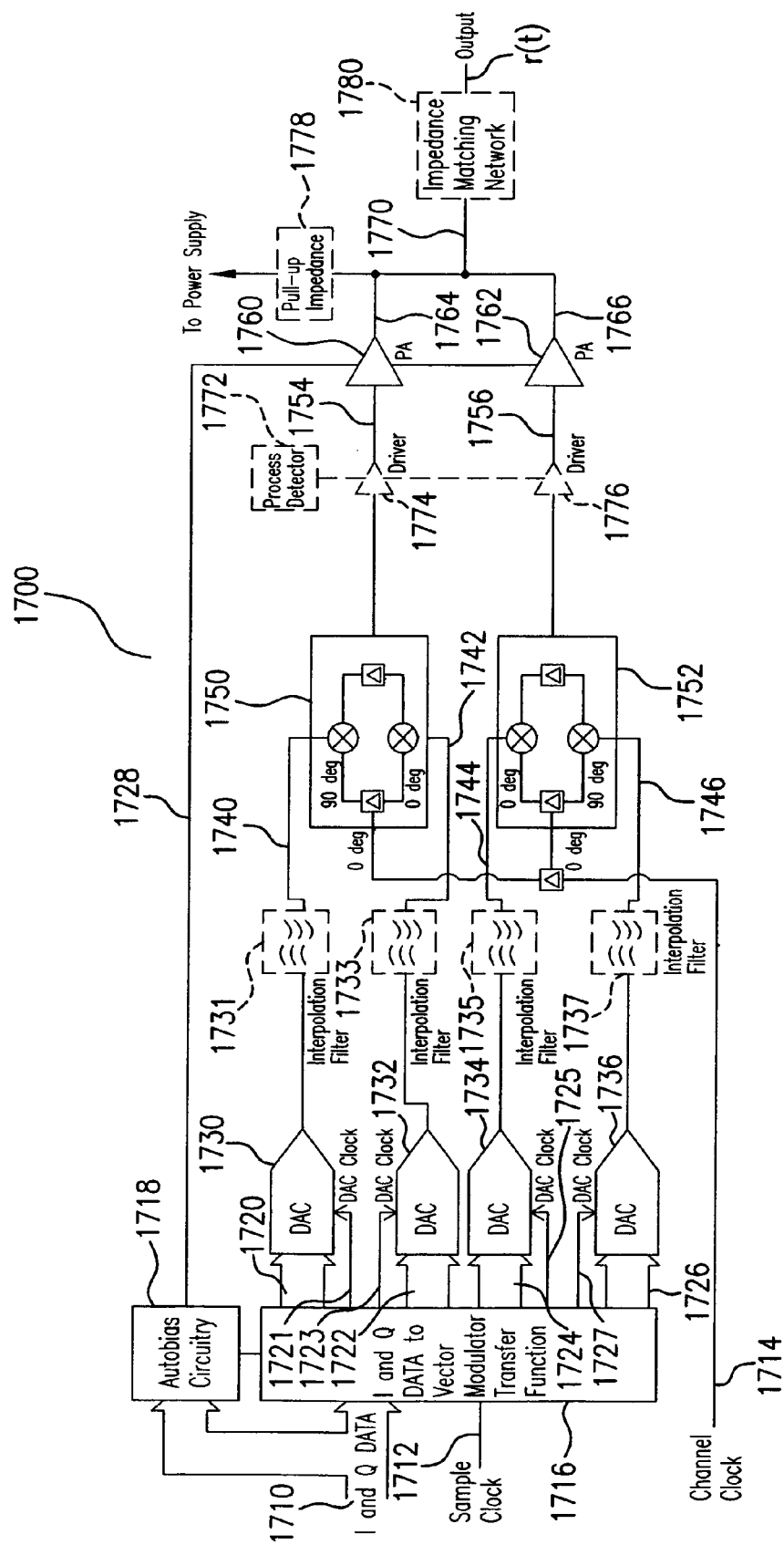
FIG. 17 is a block diagram that illustrates an exemplary embodiment of a vector power amplifier for implementing the Direct Cartesian 2-Branch VPA method.

FIG. 17 is a block diagram that illustrates an exemplary embodiment of a vector power amplifier 1700 implementing the process flowchart 1600. Optional components are illustrated with dashed lines, although other embodiments may have more or less optional components.

Referring to FIG. 17, in-phase (I) and quadrature (Q) information signal 1710 is received by an I and Q Data Transfer Function module 1716. In an embodiment, I and Q Data Transfer Function module 1716 samples signal 1710 according to a sample clock 1212. I and Q information signal 1710 includes baseband I and Q information.

In an embodiment, I and Q Data Transfer Function module 1716 processes information signal 1710 to generate information signals 1720, 1722, 1724, and 1726. The operation of I and Q Data Transfer Function module 1716 is further described below in section 3.4.

Referring to FIG. 17, information signal 1720 includes vector modulator 1750 quadrature amplitude information that is processed through DAC 1730 to generate signal 1740. Information signal 1722 includes vector modulator 1750 in-phase amplitude information that is processed through DAC 1732 to generate signal 1742. Signals 1740 and 1742 are calculated to generate a substantially constant envelope signal 1754. With reference to FIG. 14, for example, information signals 1720 and 1722 include the upper quadrature and in-phase components $U_y$ and $U_x$, respectively.

Still referring to FIG. 17, information signal 1726 includes vector modulator 1752 quadrature amplitude information that is processed through DAC 1736 to generate signal 1746. Information signal 1724 includes vector modulator 1752 in-phase amplitude information that is processed through DAC 1734 to generate signal 1744. Signals 1744 and 1746 are calculated to generate a substantially constant envelope signal 1756. With reference to FIG. 14, for example, information signals 1724 and 1726 include the lower in-phase and quadrature components $L_x$ and $L_y$, respectively.

In the exemplary embodiment of FIG. 17, information signals 1720, 1722, 1724 and 1726 are digital signals. Accordingly, each of signals 1720, 1722, 1724 and 1726 is fed into a corresponding digital-to-analog converter (DAC) 1730, 1732, 1734, and 1736. The resolution and sample rates of DACs 1730, 1732, 1734, and 1736 are selected according to the specific desired signaling schemes. DACs 1730, 1732, 1734, and 1736 are controlled by DAC clock signals 1721, 1723, 1725, and 1727, respectively. DAC clock signals 1721, 1723, 1725, and 1727 may be derived from a same clock or may be independent of each other.

In other embodiments, information signals 1720, 1722, 1724 and 1726 are generated in analog format and no DACs are required.

Referring to FIG. 17, DACs 1730, 1732, 1734, and 1736 convert digital information signals 1720, 1722, 1724, and 1726 into corresponding analog signals, and input these analog signals into optional interpolation filters 1731, 1733, 1735, and 1737, respectively. Interpolation filters 1731, 1733, 1735, and 1737, which also serve as anti-aliasing filters, shape the DACs output signals to produce the desired output waveform. Interpolation filters 1731, 1733, 1735, and 1737 generate signals 1740, 1.742, 1744, and 1746, respectively.

Still referring to FIG. 17, signals 1740, 1742, 1744, and 1746 are input into vector modulators 1750 and 1752. Vector modulators 1750 and 1752 generate first and second constant envelope constituents. In the embodiment of FIG. 17, channel clock 1714 is set according to a desired output signal frequency to thereby establish the frequency of the output signal 1770.

Referring to FIG. 17, vector modulator 1750 combines signal 1740, multiplied with a 90° shifted version of channel clock signal 1714, and signal 1742, multiplied with a 0° shifted version of channel clock signal 1714, to generate output signal 1754. In parallel, vector modulator 1752 combines signal 1746, multiplied with a 90° shifted version of channel clock signal 1714, and signal 1744, multiplied with a 0° shifted version of channel clock signal 1714, to generate output signal 1756.

Output signals 1754 and 1756 represent constant envelope signals. A sum of output signals 1754 and 1756 results in a carrier signal having the I and Q characteristics of the original baseband signal. In embodiments, to generate a desired power level at the output of vector power amplifier 1700, signals 1754 and 1756 are amplified and then summed. In the embodiment of FIG. 17, for example, signals 1754 and 1756 are, respectively, input into corresponding power amplifiers (PAs) 1760 and 1762. In an embodiment, PAs 1760 and 1762 include switching power amplifiers. Autobias circuitry 1718 controls the bias of PAs 1760 and 1762. In the embodiment of FIG. 17, for example, autobias circuitry 1718 provides a bias voltage 1728 to PAs 1760 and 1762.

In an embodiment, PAs 1760 and 1762 apply equal or substantially equal power amplification to respective constant envelope signals 1754 and 1756. In an embodiment, the power amplification is set according to the desired output power level. In other embodiments of vector power amplifier 1700, PA drivers are additionally employed to provide additional power amplification capability to the amplifier. In the embodiment of FIG. 17, for example, PA drivers 1774 and 1776 are optionally added, respectively, between vector modulators 1750 and 1752 and subsequent PAs 1760 and 1762.

Respective output signals 1764 and 1766 of PAs 1760 and 1762 are substantially constant envelope signals. In the embodiment of FIG. 17, output signals 1764 and 1766 are coupled together to generate output signal 1770 of vector power amplifier 1700. In embodiments, it is noted that the outputs of PAs 1760 and 1762 are directly coupled. Direct coupling in this manner means that there is minimal or no resistive, inductive, or capacitive isolation between the outputs of PAs 1760 and 1762. In other words, outputs of PAs 1760 and 1762 are coupled together without intervening components. Alternatively, in an embodiment, the outputs of PAs 1760 and 1762 are coupled together indirectly through inductances and/or capacitances that result in low or minimal impedance connections, and/or connections that result in minimal isolation and minimal power loss. Alternatively, outputs of PAs 1760 and 1762 are coupled using well known combining techniques, such as Wilkinson, hybrid couplers, transformers, or known active combiners. In an embodiment, the PAs 1760 and 1762 provide integrated amplification and power combining in a single operation. In an embodiment, one or more of the power amplifiers and/or drivers described herein are implemented using multiple input, single output (MISO) power amplification techniques, examples of which are shown in FIGS. 17A, 17B, and 51A-H.

Output signal 1770 represents a signal having the desired I and Q characteristics of the baseband signal and the desired output power level and frequency. In embodiments of vector power amplifier 1700, a pull-up impedance 1778 is coupled between the output of vector power amplifier 1700 and a power supply. In other embodiments, an impedance matching network 1780 is coupled at the output of vector power amplifier 1700. Output stage embodiments according to power amplification methods and systems of the present invention will be further described below in section 3.5.

In other embodiments of vector power amplifier 1700, process detectors are employed to compensate for any process and/or temperature variations in circuitry of the amplifier. In the exemplary embodiment of FIG. 17, for example, process detector 1772 is optionally added to monitor variations in PA drivers 1774 and 1776.

Figure 17A:
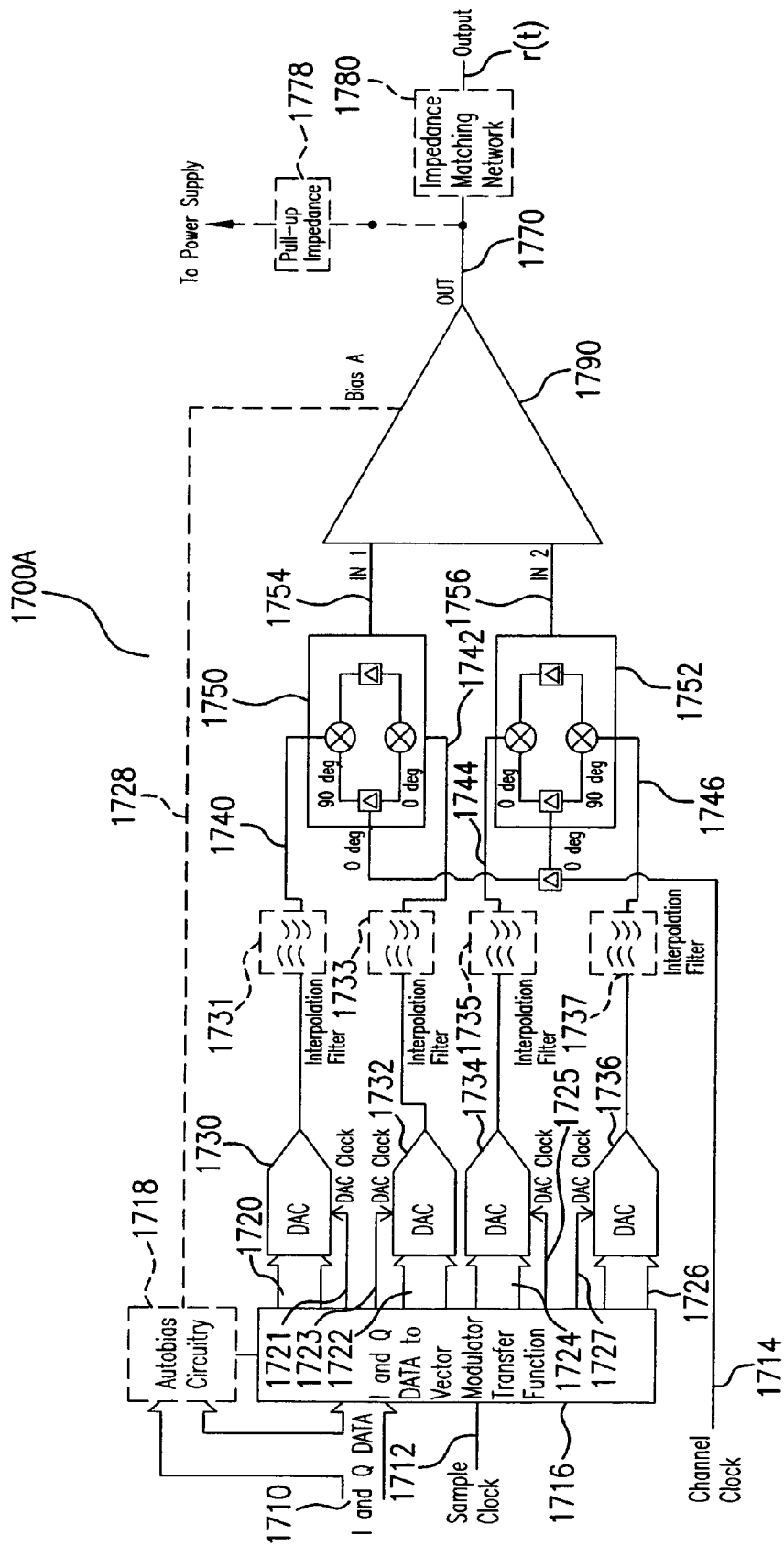
FIG. 17A is a block diagram that illustrates another exemplary embodiment of a vector power amplifier for implementing the Direct Cartesian 2-Branch VPA method.

FIG. 17A is a block diagram that illustrates another exemplary embodiment 1700A of a vector power amplifier implementing process flowchart 1600. Optional components are illustrated with dashed lines, although other embodiments may have more or less optional components. Embodiment 1700A illustrates a multiple-input single-output (MISO) implementation of the amplifier of FIG. 17. In the embodiment of FIG. 17A, constant envelope signals 1754 and 1756, output from vector modulators 1750 and 1760, are input into MISO PA 1790. MISO PA 1790 is a two-input single-output power amplifier. In an embodiment, MISO PA 1790 include elements 1760, 1762, 1772, 1774, and 1776 as shown in the embodiment of FIG. 17, or functional equivalents thereof. In another embodiment, MISO PA 1790 may include other elements, such as pre-drivers, not shown in the embodiment of FIG. 17. Further, MISO PA 1790 is not limited to being a two-input PA as shown in FIG. 17A. In other embodiments, as will be described further below with reference to FIGS. 51A-H, PA 1790 can have any number of inputs.

Figure 17B:
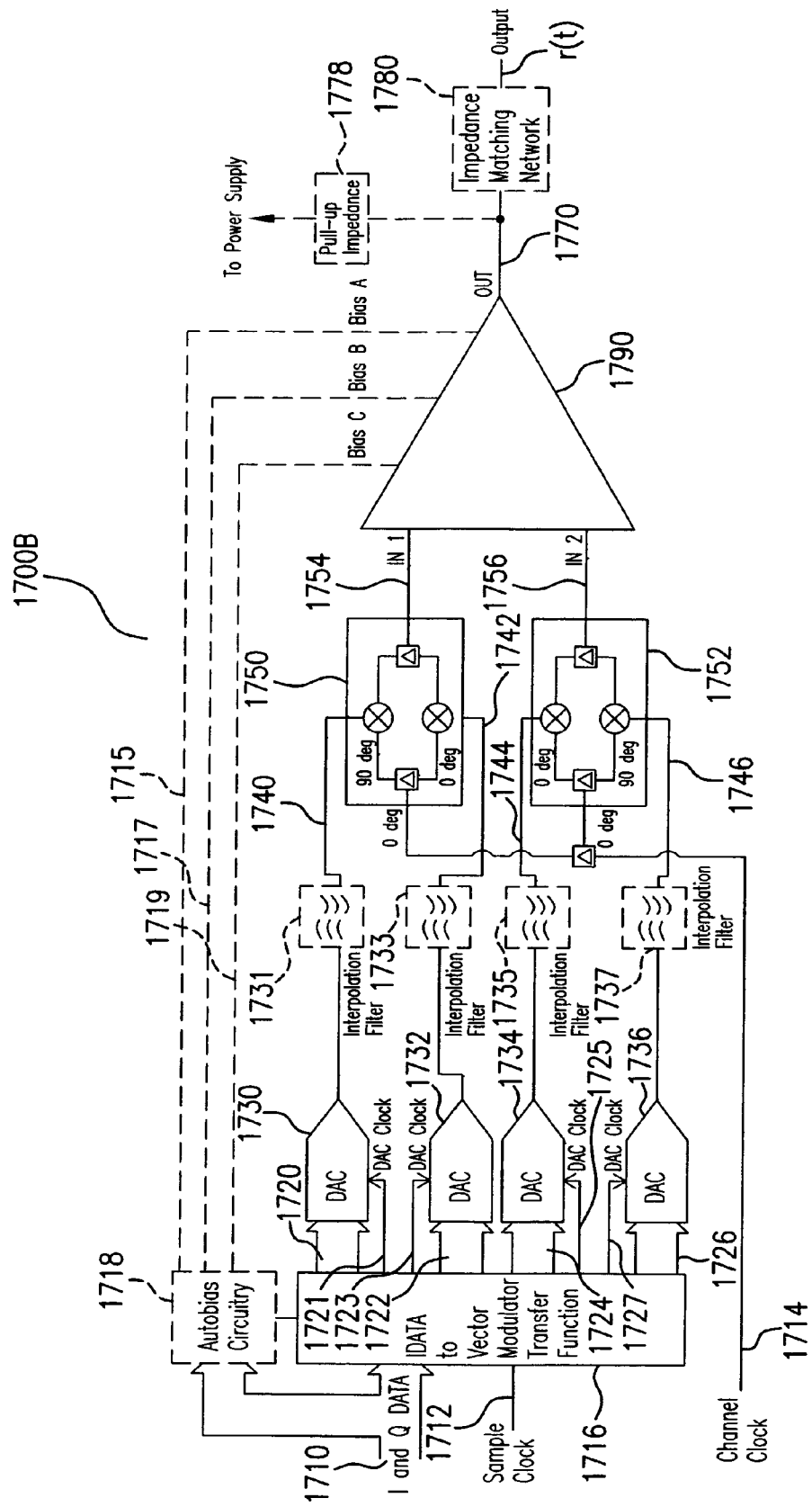
FIG. 17B is a block diagram that illustrates another exemplary embodiment of a vector power amplifier for implementing the Direct Cartesian 2-Branch VPA method.

In another embodiment of embodiment 1700, shown as embodiment 1700B of FIG. 17B, optional Autobias circuitry 1218 generates separate bias control signals 1715, 1717, and 1719, corresponding to Bias A, Bias B, and Bias C, respectively. Signals 1715, 1717, and 1719 may or may not be generated separately within Autobias circuitry 1718, but are output separately as shown. Further, signals 1715, 1717, and 1719 may or may not be related as determined by the biasing required for the different stages of MISO PA 1790.

Figure 18:
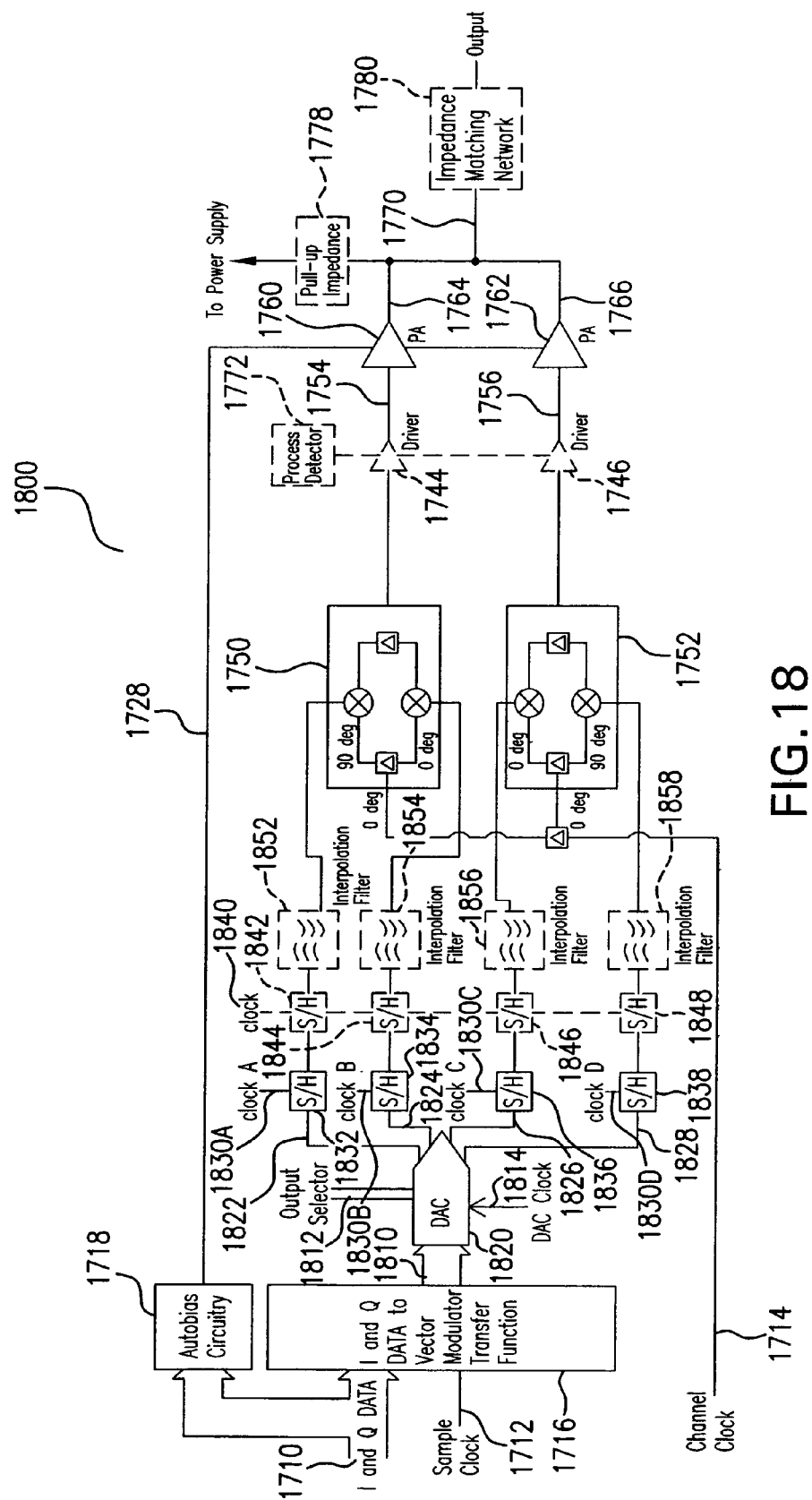
FIG. 18 is a block diagram that illustrates another exemplary embodiment of a vector power amplifier for implementing the Direct Cartesian 2-Branch VPA method.

FIG. 18 is a block diagram that illustrates another exemplary embodiment 1800 of a vector power amplifier according to the Direct Cartesian 2-Branch VPA embodiment of FIG. 16. Optional components are illustrated with dashed lines, although other embodiments may have more or less optional components.

In the exemplary embodiment of FIG. 18, a DAC 1820 of sufficient resolution and sample rate replaces DACs 1730, 1732, 1734, and 1736 of the embodiment of FIG. 17. DAC 1820 is controlled by a DAC clock 1814.

DAC 1820 receives information signal 1810 from I and Q Data Transfer Function module 1716. Information signal 1810 includes identical information content to signals 1720, 1722, 1724, and 1726 in the embodiment of FIG. 17.

DAC 1820 may output a single analog signal at a time. Accordingly, a sample-and-hold architecture may be used as shown in FIG. 18.

In the embodiment of FIG. 18, DAC 1820 sequentially outputs analog signals 1822, 1824, 1826, and 1828 to sample-and-hold circuits 1832, 1834, 1836, and 1838, respectively. In an embodiment, DAC 1820 is of sufficient resolution and sample rate to replace DACs 1720, 1722, 1724, and 1726 of the embodiment of FIG. 17. An output selector 1812 determines which of output signals 1822, 1824, 1826, and 1828 are selected for output.

DAC 1820's DAC clock signal 1814, output selector signal 1812, and sample-and-hold clocks 1830A-D, and 1840 are controlled by a control module that can be independent or integrated into transfer function module 1716.

In an embodiment, sample-and-hold circuits 1832, 1834, 1836, and 1838 sample and hold their respective values and, according to a clock signal 1830A-D, release the values to a second set of sample-and-hold circuits 1842, 1844, 1846, and 1848. For example, S/H 1832 release's its value to S/H 1842 according to a received clock signal 1830A. In turn, sample-and-hold circuits 1842, 1844, 1846, and 1848 hold the received analog values, and simultaneously release the values to interpolation filters 1852, 1854, 1856, and 1858 according to a common clock signal 1840.

In another embodiment, a single set of S/H circuitry that includes S/H 1832, 1834, 1836, and 1838 can be employed. Accordingly, S/H circuits 1832, 1834, 1836, and 1838 receive analog values from DAC 1820, and each samples and holds its received value according to independent clocks 1830A-D. For example, S/H 1832 is controlled by clock 1830A, which may not be synchronized with clock 1830B that controls S/H 1834. For example, DAC 1820 outputs signals 1822, 1824, 1826, and 1828 with appropriately selected analog values calculated by transfer function module 1716 to S/H circuits 1832, 1834, 1836, and 1838 in order to compensate for the time differences between clocks 1830A-D.

Other aspects of vector power amplifier 1800 correspond substantially to those described above with respect to vector power amplifier 1700.

Figure 18A:
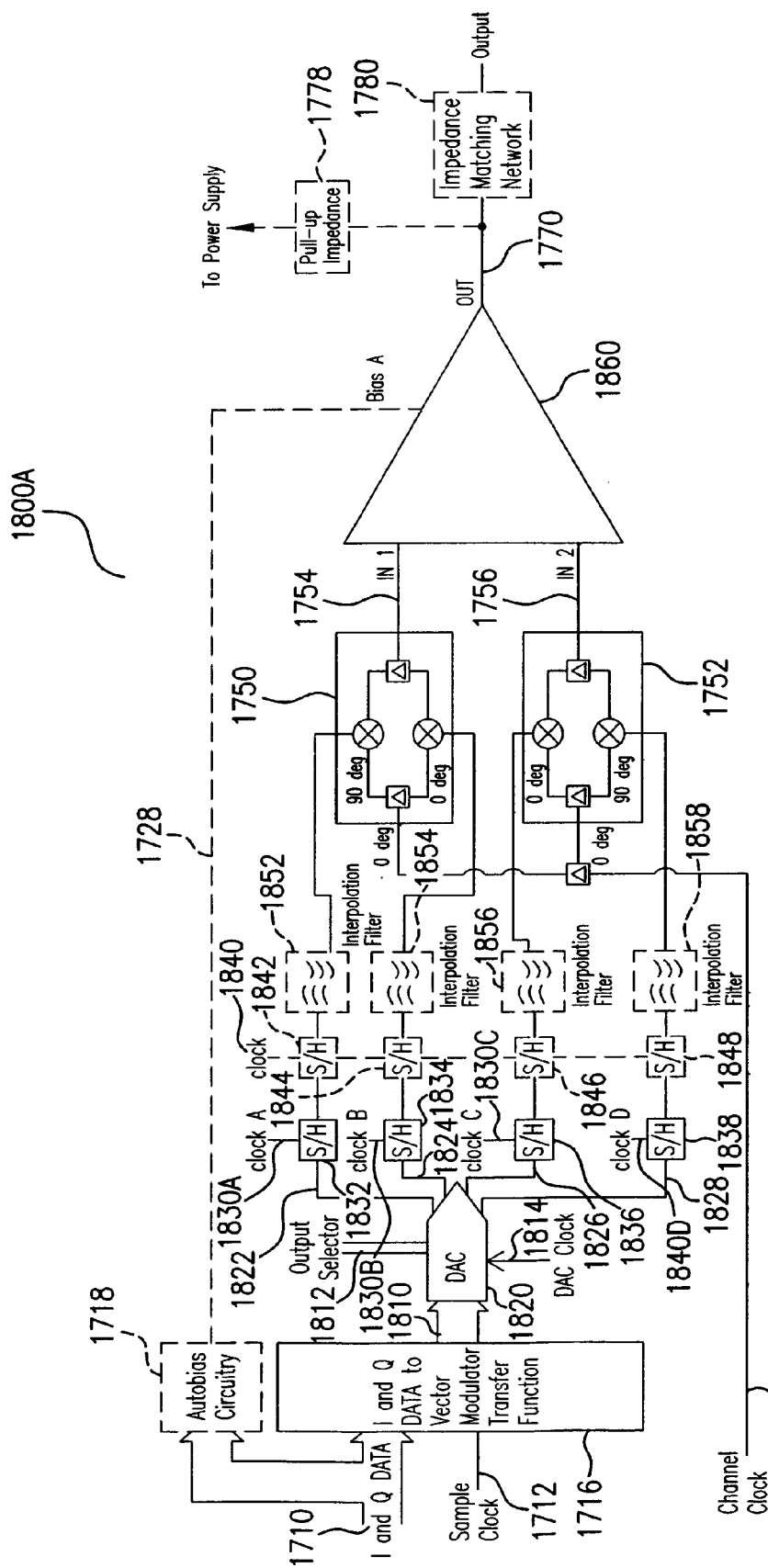
FIG. 18A is a block diagram that illustrates another exemplary embodiment of a vector power amplifier for implementing the Direct Cartesian 2-Branch VPA method.

FIG. 18A is a block diagram that illustrates another exemplary embodiment 1800A of a vector power amplifier according to the Direct Cartesian 2-Branch VPA embodiment. Optional components are illustrated with dashed lines, although in other embodiments more or less components may be optional. Embodiment 1800A is a Multiple Input Single Output (MISO) implementation of embodiment 1800 of FIG. 18.

In the embodiment of FIG. 18A, constant envelope signals 1754 and 1756, output from vector modulators 1750 and 1752, are input into MISO PA 1860. MISO PA 1860 is a two-input single-output power amplifier. In an embodiment, MISO PA 1860 includes elements 1744, 1746, 1760, 1762, and 1772 as shown in the embodiment of FIG. 18, or functional equivalents thereof. In another embodiment, MISO PA 1860 may include other elements, such as pre-drivers, not shown in the embodiment of FIG. 17. Further, MISO PA 1860 is not limited to being a two-input PA as shown in FIG. 18A. In other embodiments as will be described further below with reference to FIGS. 51A-H, PA 1860 can have any number of inputs.

The embodiment of FIG. 18A further illustrates two different sample and hold architectures with a single or two levels of S/H circuitry as shown. The two implementations have been described above with respect to FIG. 18.

Other aspects of vector power amplifier 1800A are substantially equivalent to those described above with respect to vector power amplifiers 1700 and 1800.

3.4) I and Q Data to Vector Modulator Transfer Functions

In some of the above described embodiments, I and Q data transfer functions are provided to transform received I and Q data into amplitude information inputs for subsequent stages of vector modulation and amplification. For example, in the embodiment of FIG. 17, I and Q Data Transfer Function module 1716 processes I and Q information signal 1710 to generate in-phase and quadrature amplitude information signals 1720, 1722, 1724, and 1726 of first and second constant envelope constituents 1754 and 1756 of signal r(t). Subsequently, vector modulators 1750 and 1752 utilize the generated amplitude information signals 1720, 1722, 1724, and 1726 to create the first and second constant envelope constituent signals 1754 and 1756. Other examples include modules 710, 712, and 1216 in FIGS. 7, 8, 12, and 13. These modules implement transfer functions to transform I and/or Q data into amplitude information inputs for subsequent stages of vector modulation and amplification.

According to the present invention, I and Q Data Transfer Function modules may be implemented using digital circuitry, analog circuitry, software, firmware or any combination thereof.

Several factors affect the actual implementation of a transfer function according to the present invention, and vary from embodiment to embodiment. In one aspect, the selected VPA embodiment governs the amplitude information output of the transfer function and associated module. It is apparent, for example, that I and Q Data Transfer Function module 1216 of the CPCP 2-Branch VPA embodiment 1200 differs in output than I and Q Data Transfer Function module 1716 of the Direct Cartesian 2-Branch VPA embodiment 1700.

In another aspect, the complexity of the transfer function varies according to the desired modulation scheme(s) that need to be supported by the VPA implementation. For example, the sample clock, the DAC sample rate, and the DAC resolution are selected in accordance with the appropriate transfer function to construct the desired output waveform(s).

According to the present invention, transfer function embodiments may be designed to support one or more VPA embodiments with the ability to switch between the supported embodiments as desired. Further, transfer function embodiments and associated modules can be designed to accommodate a plurality of modulation schemes. A person skilled in the art will appreciate, for example, that embodiments of the present invention may be designed to support a plurality of modulation schemes (individually or in combination) including, but not limited to, BPSK, QPSK, OQPSK, DPSK, CDMA, WCDMA, W-CDMA, GSM, EDGE, MPSK, MQAM, MSK, CPSK, PM, FM, OFDM, and multi-tone signals. In an embodiment, the modulation scheme(s) may be configurable and/or programmable via the transfer function module.

3.4.1) Cartesian 4-Branch VPA Transfer Function

Figure 19:
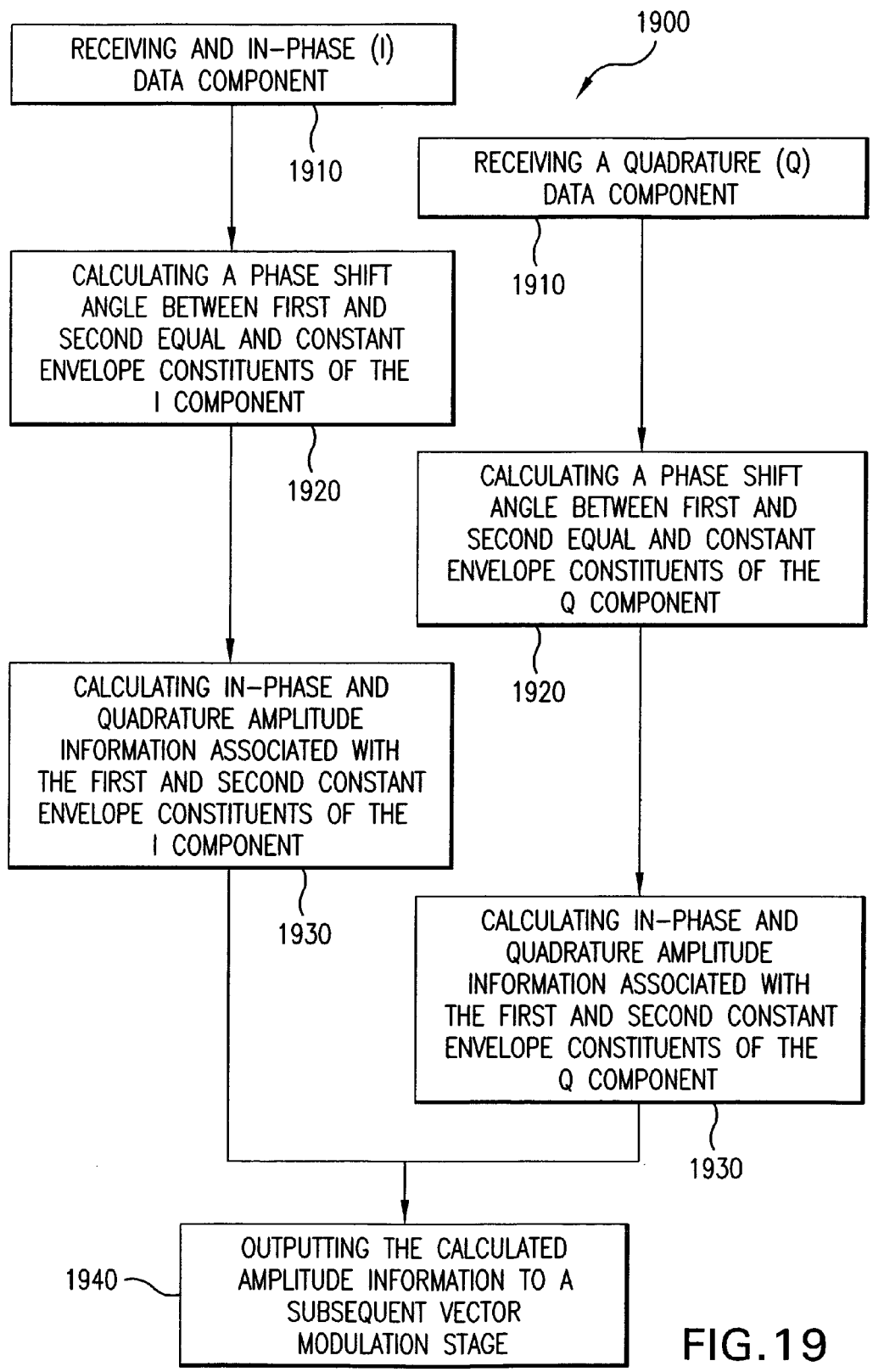
FIG. 19 is a process flowchart that illustrates an I and Q transfer function embodiment according to the Cartesian 4-Branch VPA method.

FIG. 19 is a process flowchart 1900 that illustrates an example I and Q transfer function embodiment according to the Cartesian 4-Branch VPA embodiment. The process begins at step 1910, which includes receiving an in-phase data component and a quadrature data component. In the Cartesian 4-Branch VPA embodiment of FIG. 7A, for example, this is illustrated by I Data Transfer Function module 710 receiving I information signal 702, and Q Data Transfer Function module 712 receiving Q information signal 704. It is noted that, in the embodiment of FIG. 7A, I and Q Data Transfer Function modules 710 and 712 are illustrated as separate components. In implementation, however, I and Q Data Transfer Function modules 710 and 712 may be separate or combined into a single module.

Step 1920 includes calculating a phase shift angle between first and second substantially equal and constant envelope constituents of the I component. In parallel, step 1920 also includes calculating a phase shift angle between first and second substantially equal and constant envelope constituents of the Q component. As described above, the first and second constant envelope constituents of the I components are appropriately phased relative to the I component. Similarly, the first and second constant envelope constituents of the Q components are appropriately phased relative to the Q component. In the embodiment of FIG. 7A, for example, step 1920 is performed by I and Q Data Transfer Function modules 710 and 712.

Step 1930 includes calculating in-phase and quadrature amplitude information associated with the first and second constant envelope constituents of the I component. In parallel, step 1930 includes calculating in-phase and quadrature amplitude information associated with the first and second constant envelope constituents of the Q component. In the embodiment of FIG. 7A, for example, step 1930 is performed by and I and Q Data Transfer Function modules 710 and 712.

Step 1940 includes outputting the calculated amplitude information to a subsequent vector modulation stage. In the embodiment of FIG. 7A, for example, I and Q Transfer Function modules 710 and 712 output amplitude information signals 722, 724, 726, and 728 to vector modulators 760, 762, 764, and 766 through DACs 730, 732, 734, and 736.

Figure 20:
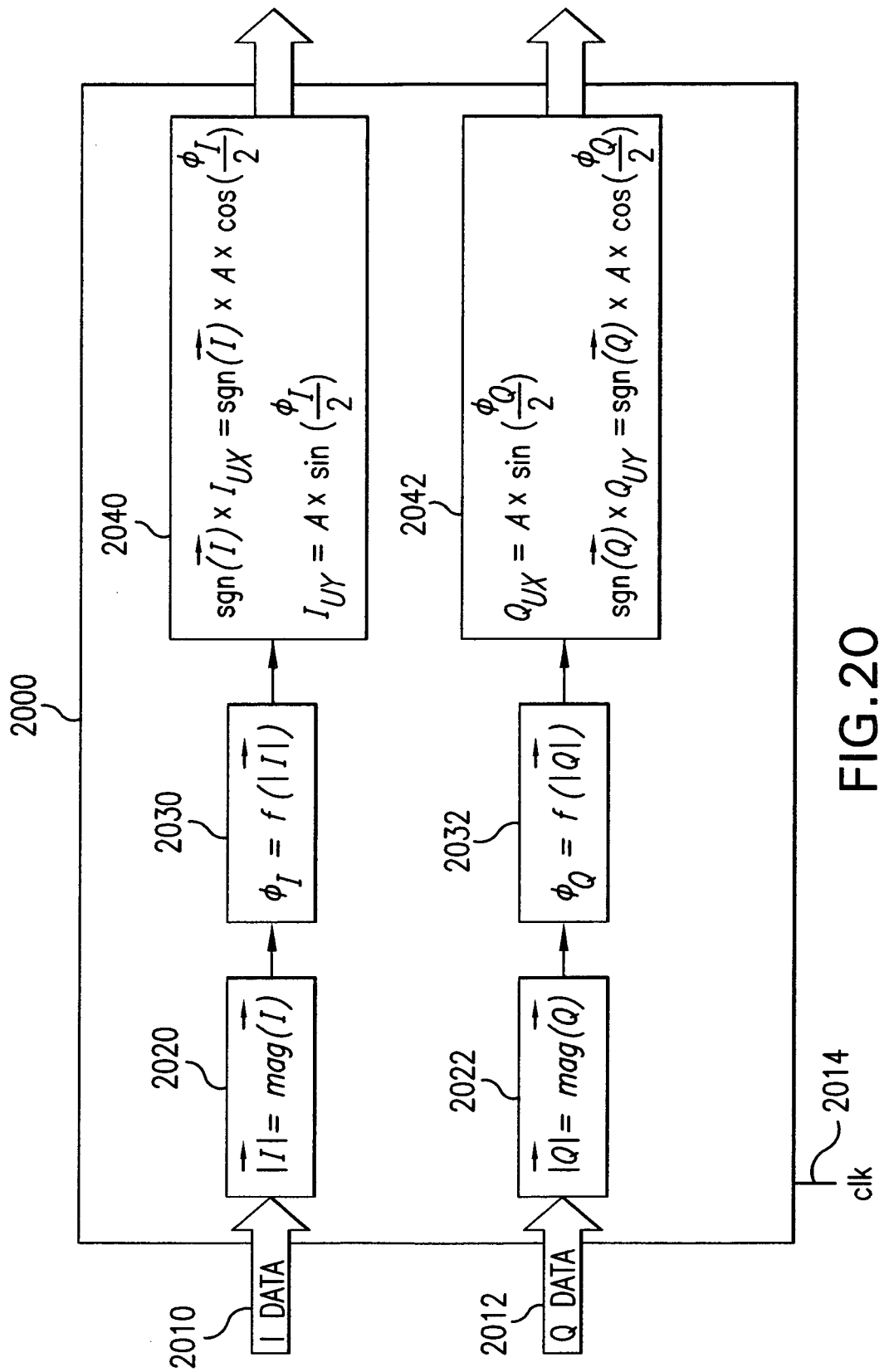
FIG. 20 is a block diagram that illustrates an exemplary embodiment of an I and Q transfer function according to the Cartesian 4-Branch VPA method.

FIG. 20 is a block diagram that illustrates an exemplary embodiment 2000 of a transfer function module, such as transfer function modules 710 and 712 of FIG. 7A, implementing the process flowchart 1900. In the example of FIG. 20, transfer function module 2000 receives I and Q data signals 2010 and 2012. In an embodiment, I and Q data signals 2010 and 2012 represent I and Q data components of a baseband signal, such as signals 702 and 704 in FIG. 7A.

Referring to FIG. 20, in an embodiment, transfer function module 2000 samples I and Q data signals 2010 and 2012 according to a sampling clock 2014. Sampled I and Q data signals are received by components 2020 and 2022, respectively, of transfer function module 2000. Components 2020 and 2022 measure, respectively, the magnitudes of the sampled I and Q data signals. In an embodiment, components 2020 and 2022 are magnitude detectors.

Components 2020 and 2022 output the measured I and Q magnitude information to components 2030 and 2032, respectively, of transfer function module 2000. In an embodiment, the measured I and Q magnitude information is in the form of digital signals. Based on the I magnitude information, component 2030 calculates a phase shift angle $\phi_I$ between first and second equal and constant or substantially equal and constant envelope constituents of the sampled I signal. Similarly, based on the Q magnitude information, component 2032 calculates phase shift angle $\phi_Q$ between a first and second equal and constant or substantially equal and constant envelope constituents of the sampled Q signal; This operation shall now be further described.

In the embodiment of FIG. 20, $\phi_I$ and $\phi_Q$ are illustrated as functions $f(|\vec{I}|)$ and $f(|\vec{Q}|)$ of the I and Q magnitude signals. In embodiments, functions $f(|\vec{I}|)$ and $f(|\vec{Q}|)$ are set according to the relative magnitudes of the baseband I and Q signals respectively. $f(|\vec{I}|)$ and $f(|\vec{Q}|)$ according to embodiments of the present invention will be further described below in section 3.4.4.

Referring to FIG. 20, components 2030 and 2032 output the calculated phase shift information to components 2040 and 2042, respectively. Based on phase shift angle $\phi_I$, component 2040 calculates in-phase and quadrature amplitude information of the first and second constant envelope constituents of the sampled I signal. Similarly, based on phase shift angle $\phi_Q$, component 2042 calculates in-phase and quadrature amplitude information of the first and second constant envelope constituents of the sampled Q signal. Due to symmetry, in embodiments of the invention, calculation is required for 4 values only. In the example of FIG. 20, the values are illustrated as sgn(I)×$I_{UX}$, $I_{UY}$, $Q_{UX}$, and sgn(Q)× $Q_{UY}$, as provided in FIG. 5.

Components 2040 and 2042 output the calculated amplitude information to subsequent stages of the vector power amplifier. In embodiments, each of the four calculated values is output separately to a digital-to-analog converter. As shown in the embodiment of FIG. 7A for example, signals 722, 724, 726, and 728 are output separately to DACs 730, 732, 734, and 736, respectively. In other embodiments, signals 722, 724, 726, and 728 are output into a single DAC as shown in FIGS. 800A and 800B.

3.4.2) CPCP 2-Branch VPA Transfer Function

Figure 21:
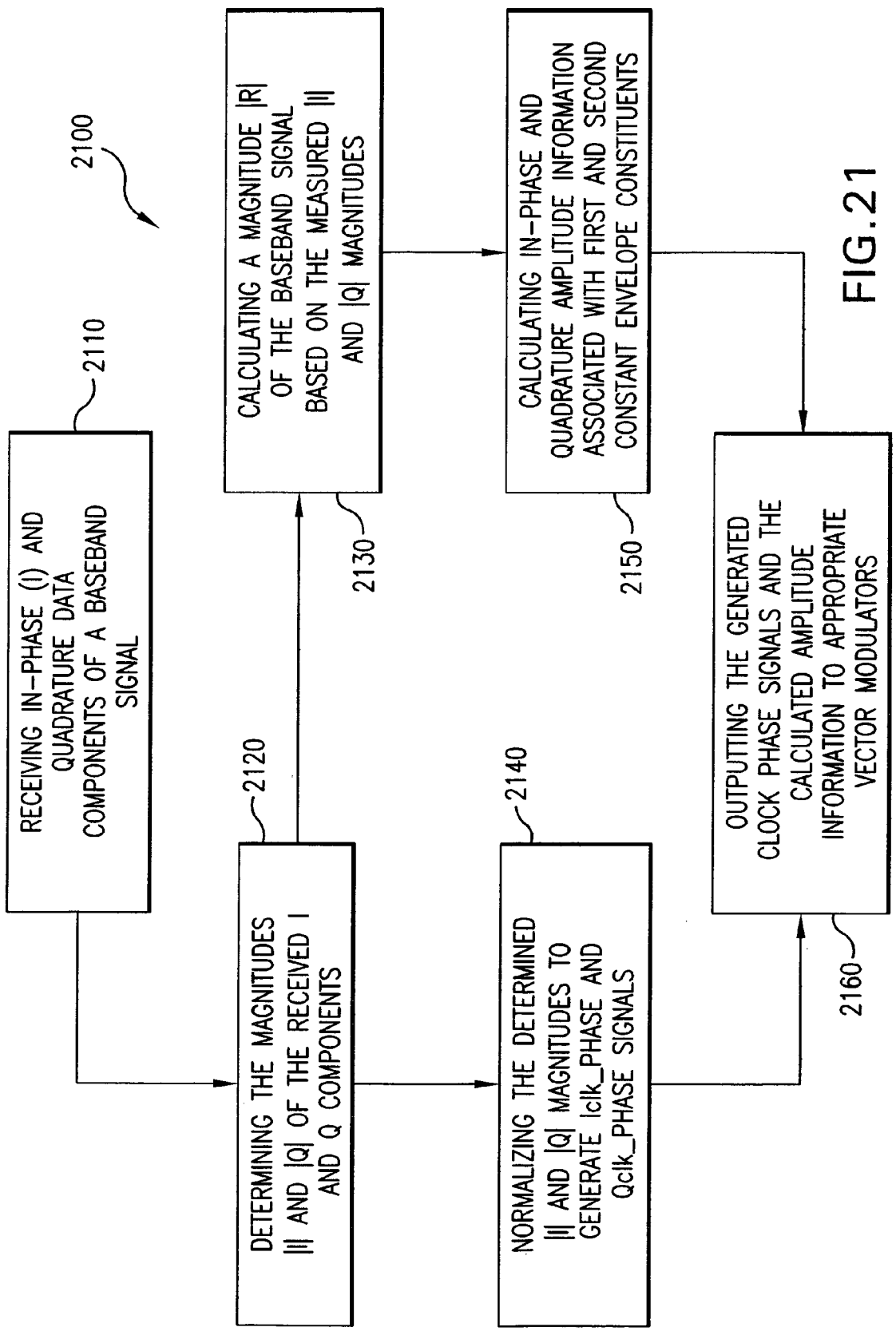
FIG. 21 is a process flowchart that illustrates an I and Q transfer function embodiment according to the CPCP 2-Branch VPA method.

FIG. 21 is a process flowchart 2100 that illustrates an example I and Q transfer function embodiment according to the CPCP 2-Branch VPA embodiment. The process begins at step 2110, which includes receiving in-phase (I) and quadrature (Q) data components of a baseband signal. In the CPCP 2-Branch VPA embodiment of FIG. 12, for example, this is illustrated by I and Q Data Transfer Function module 1216 receiving I and Q information signal 1210.

Step 2120 includes determining the magnitudes |I| and |Q| of the received I and Q data components.

Step 2130 includes calculating a magnitude |R| of the baseband signal based on the measured |I| and |Q| magnitudes. In an embodiment, |R| is such that $|R|^2=|I|^2+|Q|^2$. In the embodiment of FIG. 12, for example, steps 2120 and 2130 are performed by I and Q Data Transfer Function module 1216 based on received information signal 1210.

Step 2140 includes normalizing the measured |I| and |Q| magnitudes. In an embodiment, |I| and |Q| are normalized to generate an Iclk_phase and Qclk_phase signals (as shown in FIG. 10) such that $|I_{clk\_phase}|^2+|Q_{clk\_phase}|^2$=constant. In the embodiment of FIG. 12, for example, step 2140 is performed by I and Q Data Transfer Function module 1216 based on received information signal 1210.

Step 2150 includes calculating in-phase and quadrature amplitude information associated with first and second constant envelope constituents. In the embodiment of FIG. 12, for example, step 2150 is performed by I and Q Data Transfer Function module 1216 based on the envelope magnitude |R|.

Step 2160 includes outputting the generated Iclk_phase and Qclk_phase (from step 2140) and the calculated amplitude information (from step 2150) to appropriate vector modulators. In the embodiment of FIG. 12, for example, I and Q Data Transfer Function module 1216 output information signals 1220, 1222, 1224, and 1226 to vector modulators 1238, 1260, and 1262 through DACs 1230, 1232, 1234, and 1236.

Figure 22:
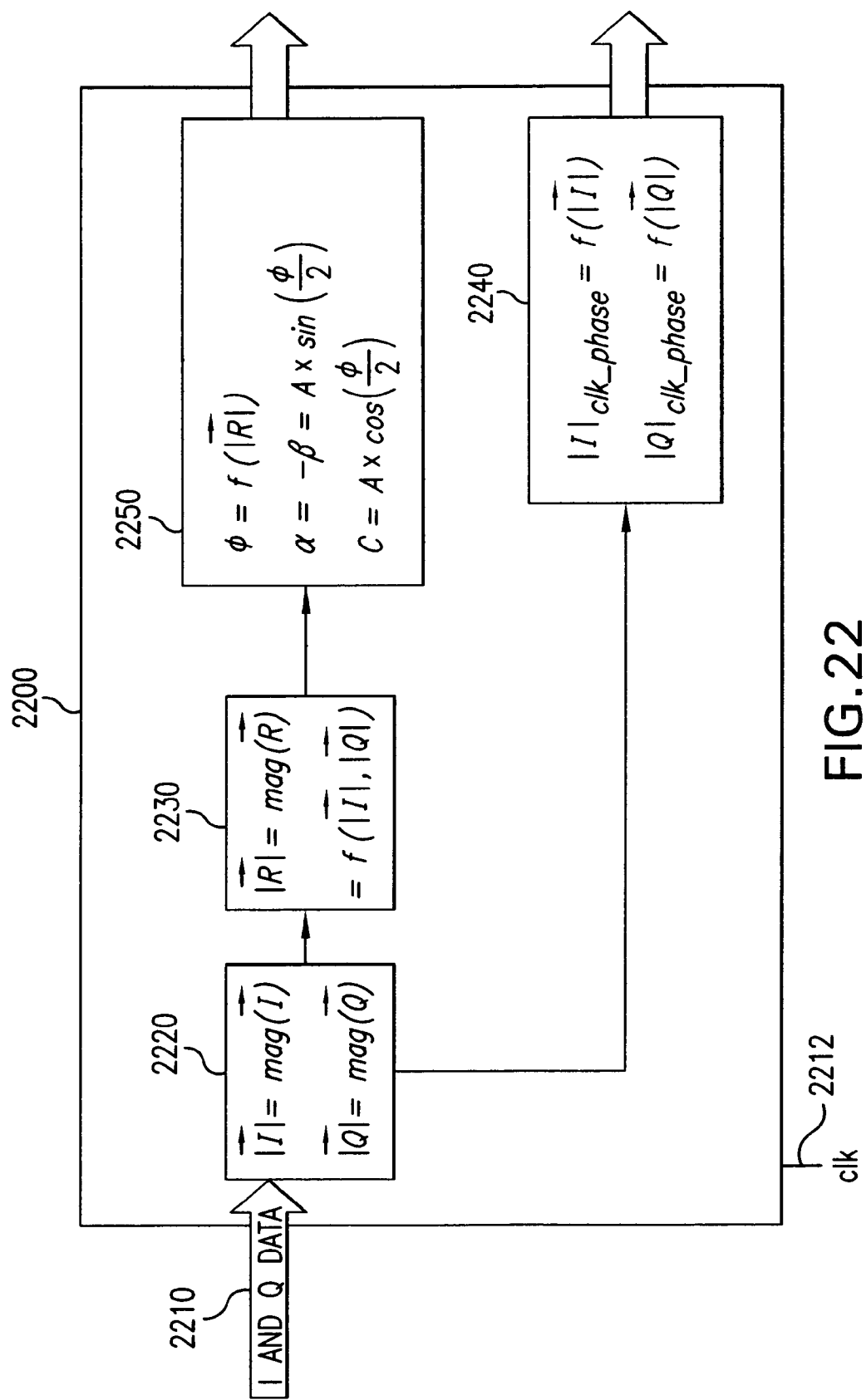
FIG. 22 is a block diagram that illustrates an exemplary embodiment of an I and Q transfer function according to the CPCP 2-Branch VPA method.

FIG. 22 is a block diagram that illustrates an exemplary embodiment 2200 of a transfer function module (such as module 1216 of FIG. 12) implementing the process flowchart 2100. In the example of FIG. 22, transfer function module 2200 receives I and Q data signal 2210. In an embodiment, I and Q data signal 2210 includes I and Q components of a baseband signal, such as signal 1210 in the embodiment of FIG. 12, for example.

In an embodiment, transfer function module 2200 samples I and Q data signal 2210 according to a sampling clock 2212. Sampled I and Q data signals are received by component 2220 of transfer function module 2200. Component 2220 measures the magnitudes $|\vec{I}|$ and $|\vec{Q}|$ of the sampled I and Q data signals.

Based on the measured $|\vec{I}|$ and $|\vec{Q}|$ magnitudes, component 2230 calculates the magnitude |R| of the baseband signal. In an embodiment, |R| is such that $|\vec{R}|^2=|\vec{I}|^2+|\vec{Q}|^2$.

In parallel, component 2240 normalizes the measured $|\vec{I}|$ and $|\vec{Q}|$ magnitudes. In an embodiment, $|\vec{I}|$ and $|\vec{Q}|$ are normalized to generate Iclk_phase and Qclk_phase signals such that $|Iclk\_phase|^2+|Qclk\_phase|^2$=constant, where |Iclk_phase| and |Qclk_phase| represent normalized magnitudes of $|\vec{I}|$ and $|\vec{Q}|$. Typically, given that the constant has a value A, the measured $|\vec{I}|$ and $|\vec{I}|$ magnitudes are both divided by the quantity $$\frac{A}{\sqrt{|\vec{I}|^2+|\vec{Q}|^2}}$$

Component 2250 receives the calculated $|\vec{R}|$ magnitude from component 2230, and based on it calculates a phase shift angle φ between first and second constant envelope constituents. Using the calculated phase shift angle φ, component 2050 then calculates in-phase and quadrature amplitude information associated with the first and second constant envelope constituents.

In the embodiment of FIG. 22, the phase shift angle φ is illustrated as a function $f(|\vec{R}|)$ of the calculated magnitude $|\vec{R}|$.

Referring to FIG. 22, components 2240 and 2250 output the normalized |Iclk_phase| and |Qclk_phase| magnitude information and the calculated amplitude information to DAC's for input into the appropriate vector modulators. In embodiments, the output values are separately output to digital-to-analog converters. As shown in the embodiment of FIG. 12, for example, signals 1220, 1222, 1224, and 1226 are output separately to DACs 1230, 1232, 1234, and 1236, respectively. In other embodiments, signals 1220, 1222, 1224, and 1226 are output into a single DAC as shown in FIGS. 13 and 13A.

3.4.3) Direct Cartesian 2-Branch Transfer Function

Figure 23:
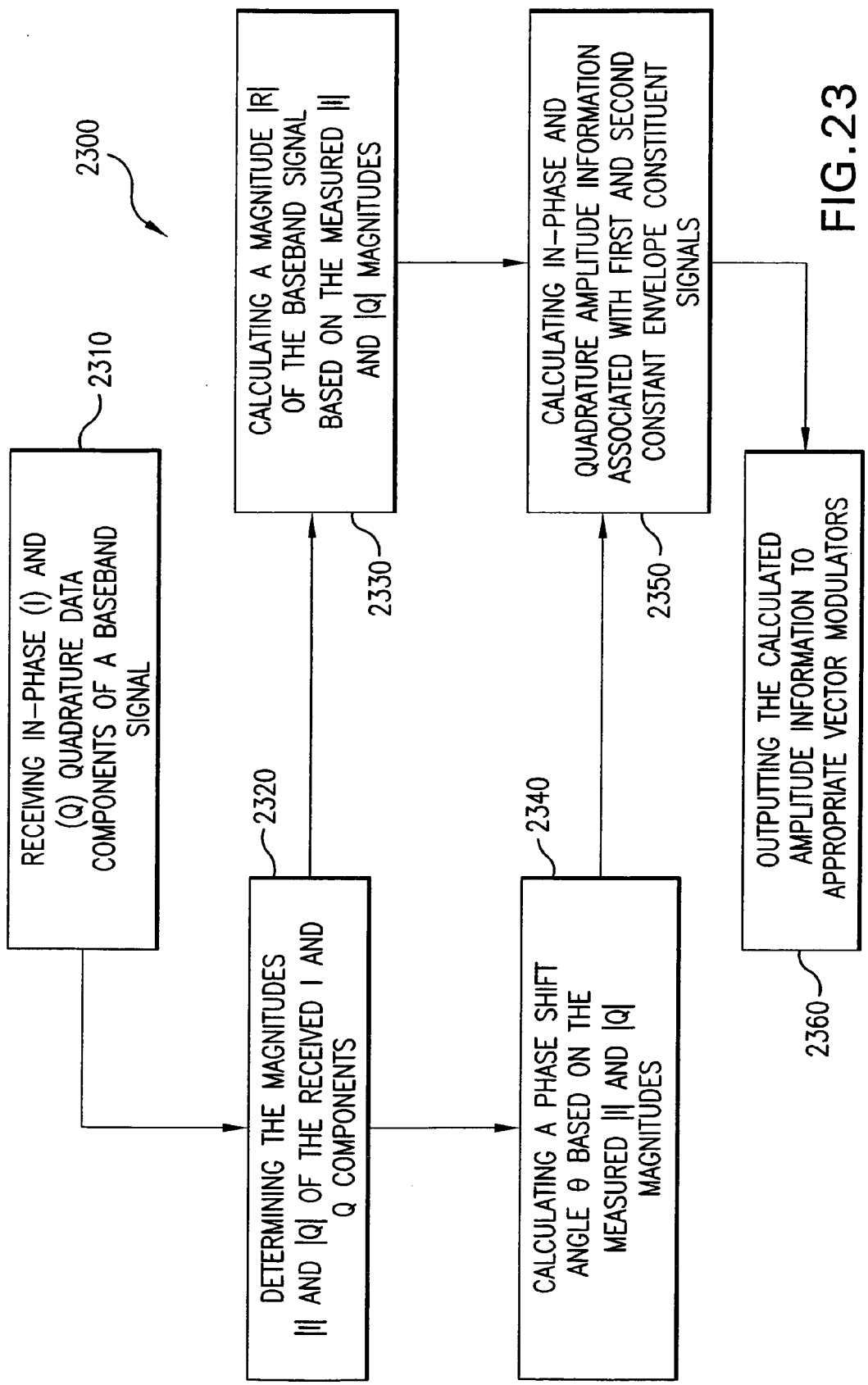
FIG. 23 is a process flowchart that illustrates an I and Q transfer function embodiment according to the Direct Cartesian 2-Branch VPA method.

FIG. 23 is a process flowchart 2300 that illustrates an example I and Q transfer function embodiment according to the Direct Cartesian 2-Branch VPA embodiment. The process begins at step 2310, which includes receiving in-phase (I) and quadrature (Q) data components of a baseband signal. In the Direct Cartesian 2-Branch VPA embodiment of FIG. 17, for example, this is illustrated by I and Q Data Transfer Function module 1716 receiving I and Q information signal 1710.

Step 2320 includes determining the magnitudes |I| and |Q| of the received I and Q data components.

Step 2330 includes calculating a magnitude |R| of the baseband signal based on the measured |I| and |Q| magnitudes. In an embodiment, |R| is such that $|R|^2=|I|^2+|Q|^2$. In the embodiment of FIG. 17, for example, steps 2320 and 2330 are performed by I and Q Data Transfer Function module 1716 based on received information signal 1710.

Step 2340 includes calculating a phase shift angle θ of the baseband signal based on the measured |I| and |Q| magnitudes. In an embodiment, θ is such that $$\theta = \tan^{-1}\left(\frac{|Q|}{|I|}\right),$$

and wherein the sign of I and Q determine the quadrant of θ. In the embodiment of FIG. 17, for example, step 2340 is performed by I and Q Data Transfer Function module 1216 based on I and Q data components received in information signal 1210.

Step 2350 includes calculating in-phase and quadrature amplitude information associated with a first and second constant envelope constituents of the baseband signal. In the embodiment of FIG. 17, for example, step 2350 is performed by I and Q Data Transfer Function module 1716 based on previously calculated magnitude |R| and phase shift angle θ.

Step 2360 includes outputting the calculated amplitude information to DAC's for input into the appropriate vector modulators. In the embodiment of FIG. 17, for example, I and Q Data Transfer Function module 1716 output information signals 1720, 1722, 1724, and 1726 to vector modulators 1750 and 1752 through DACs 1730, 1732, 1734, and 1736. In other embodiments, signals 1720, 1722, 1724, and 1726 are output into a single DAC as shown in FIGS. 18 and 18A.

Figure 24:
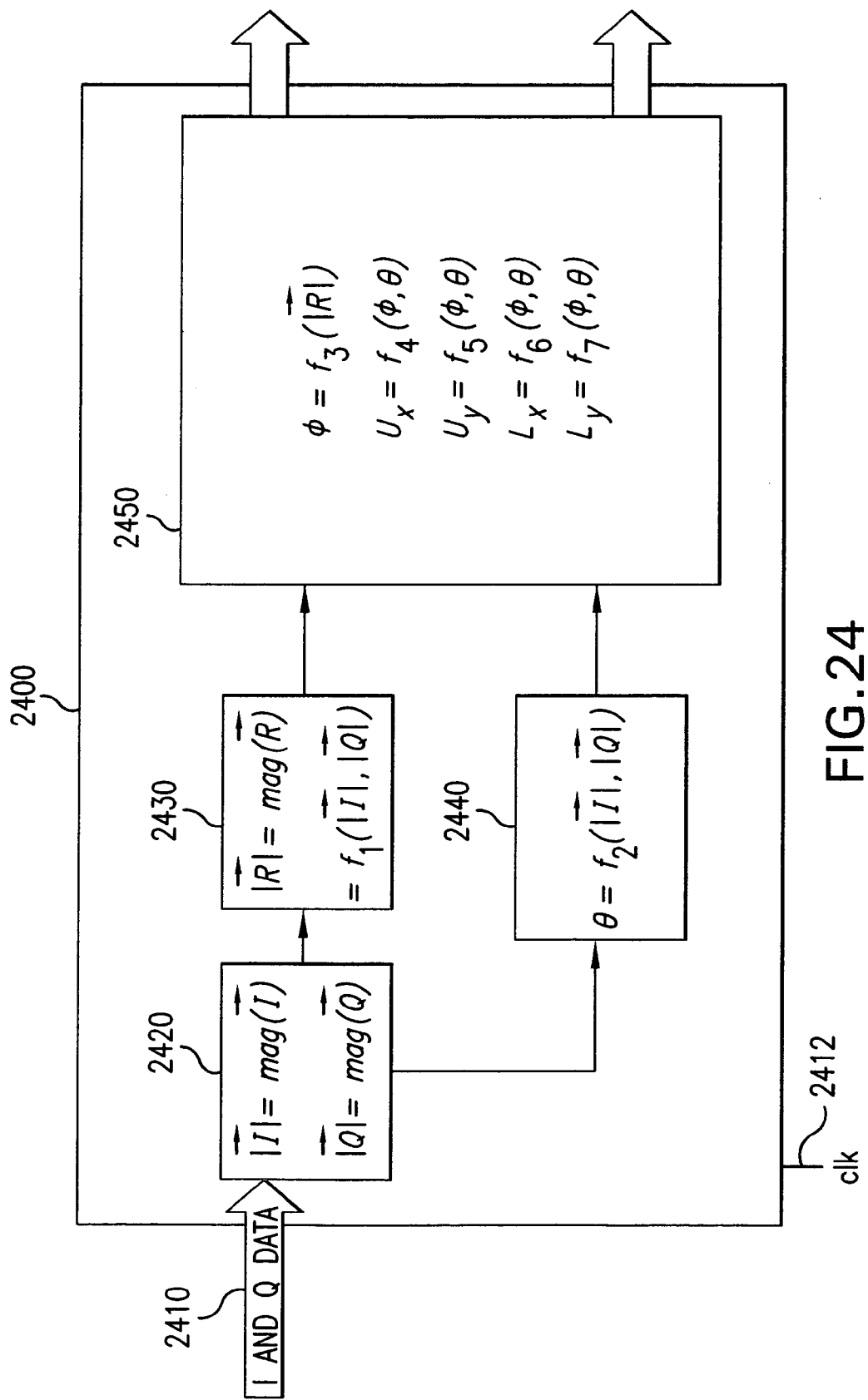
FIG. 24 is a block diagram that illustrates an exemplary embodiment of an I and Q transfer function according to the Direct Cartesian 2-Branch VPA method.

FIG. 24 is a block diagram that illustrates an exemplary embodiment 2400 of a transfer function module implementing the process flowchart 2300. In the example of FIG. 24, transfer function module 2400 (such as transfer function module 1716) receives I and Q data signal 2410, such as signal 1710 in FIG. 17. In an embodiment, I and Q data signal 2410 includes I and Q data components of a baseband signal.

In an embodiment, transfer function module 2400 samples I and Q data signal 2410 according to a sampling clock 2412. Sampled I and Q data signals are received by component 2420 of transfer function module 2200. Component 2420 measures the magnitudes $|\vec{I}|$ and $|\vec{Q}|$ of the sampled I and Q data signals.

Based on the measured $|\vec{I}|$ and $|\vec{Q}|$ magnitudes, component 2430 calculates the magnitude $|\vec{R}|$. In an embodiment, $|\vec{R}|$ is such that $|\vec{R}|^2 = |\vec{I}|^2 + |\vec{Q}|^2$.

In parallel, component 2240 calculates the phase shift angle θ of the baseband signal. In an embodiment, θ is such that $$\theta = \tan^{-1}\left(\frac{|\vec{Q}|}{|\vec{I}|}\right),$$

where the sign of I and Q determine the quadrant of θ.

Component 2450 receives the calculated $|\vec{R}|$ magnitude from component 2430, and based on it calculates a phase shift angle φ between first and second constant envelope constituent signals. In the embodiment of FIG. 24, the phase shift angle φ is illustrated as a function $f_3(|\vec{R}|)$ of the calculated magnitude $|\vec{R}|$. This is further described in section 3.4.4.

In parallel, component 2450 receives the calculated phase shift angle θ from component 2440. As functions of φ and θ, component 2450 then calculates in-phase and quadrature amplitude information for the vector modulator inputs that generate the first and second constant envelope constituents. In an embodiment, the in-phase and quadrature amplitude information supplied to the vector modulators are according to the equations provided in (18).

Component 2450 outputs the calculated amplitude information to subsequent stages of the vector power amplifier. In embodiments, the output values are separately output to digital-to-analog converters. As shown in the embodiment of FIG. 17, for example, signals 1720, 1722, 1724, and 1726 are output separately to DACs 1730, 1732, 1734, and 1736, respectively. In other embodiments, signals 1720, 1722, 1724, and 1726 are output into a single DAC as shown in FIGS. 18 and 18A.

3.4.4) Magnitude to Phase Shift Transform

Embodiments of f(|I|), f(|Q|) of FIG. 20 and f(|R|) of FIGS. 22 and 24 shall now be further described.

According to the present invention, any periodic waveform that can be represented by a Fourier series and a Fourier transform can be decomposed into two or more constant envelope signals.

Below are provided two examples for sinusoidal and square waveforms.

3.4.4.1) Magnitude to Phase Shift Transform for Sinusoidal Signals

Consider a time-varying complex envelope sinusoidal signal r(t). In the time domain, it can be represented as:

$$r(t) = R(t)\sin(\omega t + \delta(t)) \quad (20)$$

where R(t) represents the signal's envelope magnitude at time t, δ(t) represents the signal's phase shift angle at time t, and ω represents the signal's frequency in radians per second.

It can be verified that, at any time instant t, signal r(t) can be obtained by the sum of two appropriately phased equal and constant or substantially equal and constant envelope signals. In other words, it can be shown that:

$$R(t)\sin(\omega t + \delta(t)) = A\sin(\omega t) + A\sin(\omega t + \phi(t)) \quad (21)$$

for an appropriately chosen phase shift angle φ(t) between the two constant envelope signals. The phase shift angle φ(t) will be derived as a function of R(t) in the description below. This is equivalent to the magnitude to phase shift transform for sinusoidal signals.

Using a sine trigonometric identity, equation (21) can be re-written as:

$$R(t)\sin(\omega t + \delta(t)) = A\sin(\omega t) + A\sin(\omega t)\cos\phi(t) + A\sin(\phi(t))\cos\omega t;$$

$$\Rightarrow R(t)\sin(\omega t + \delta(t)) = A\sin(\phi t)\cos\omega t + A(1+\cos\phi(t))\sin\omega t. \quad (22)$$

Note, from equation (22), that signal r(t) is written as a sum of an in-phase component and a quadrature component. Accordingly, the envelope magnitude R(t) can be written as:

$$R(t) = \sqrt{(A\sin(\phi(t)))^2 + (A(1+\cos(\phi(t))))^2};$$

$$\Rightarrow R(t) = \sqrt{2A(A+\cos(\phi(t)))}. \quad (23)$$

Equation (23) relates the envelope magnitude R(t) of signal r(t) to the phase shift angle φ(t) between two constant envelope constituents of signal r(t). The constant envelope constituents have equal or substantially equal envelope magnitude A, which is typically normalized to 1.

Inversely, from equation (23), the phase shift angle φ(t) can be written as a function of R(t) as follows:

$$\phi(t) = \arccos\left(\frac{R(t)^2}{2A^2} - 1\right). \quad (24)$$

Figure 26:
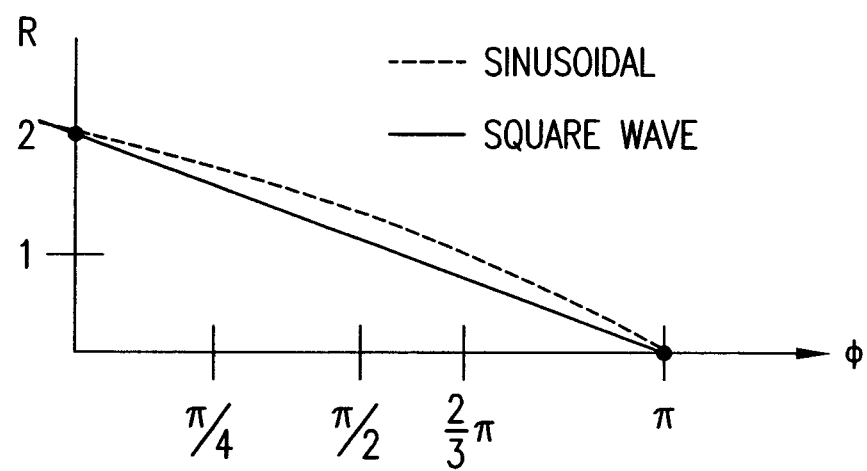
FIG. 26 illustrates magnitude to phase transform functions according to an embodiment of the present invention.

Equation (24) represents the magnitude to phase shift transform for the case of sinusoidal signals, and is illustrated in FIG. 26.

3.4.4.2) Magnitude to Phase Shift Transform for Square Wave Signals

Figure 28:
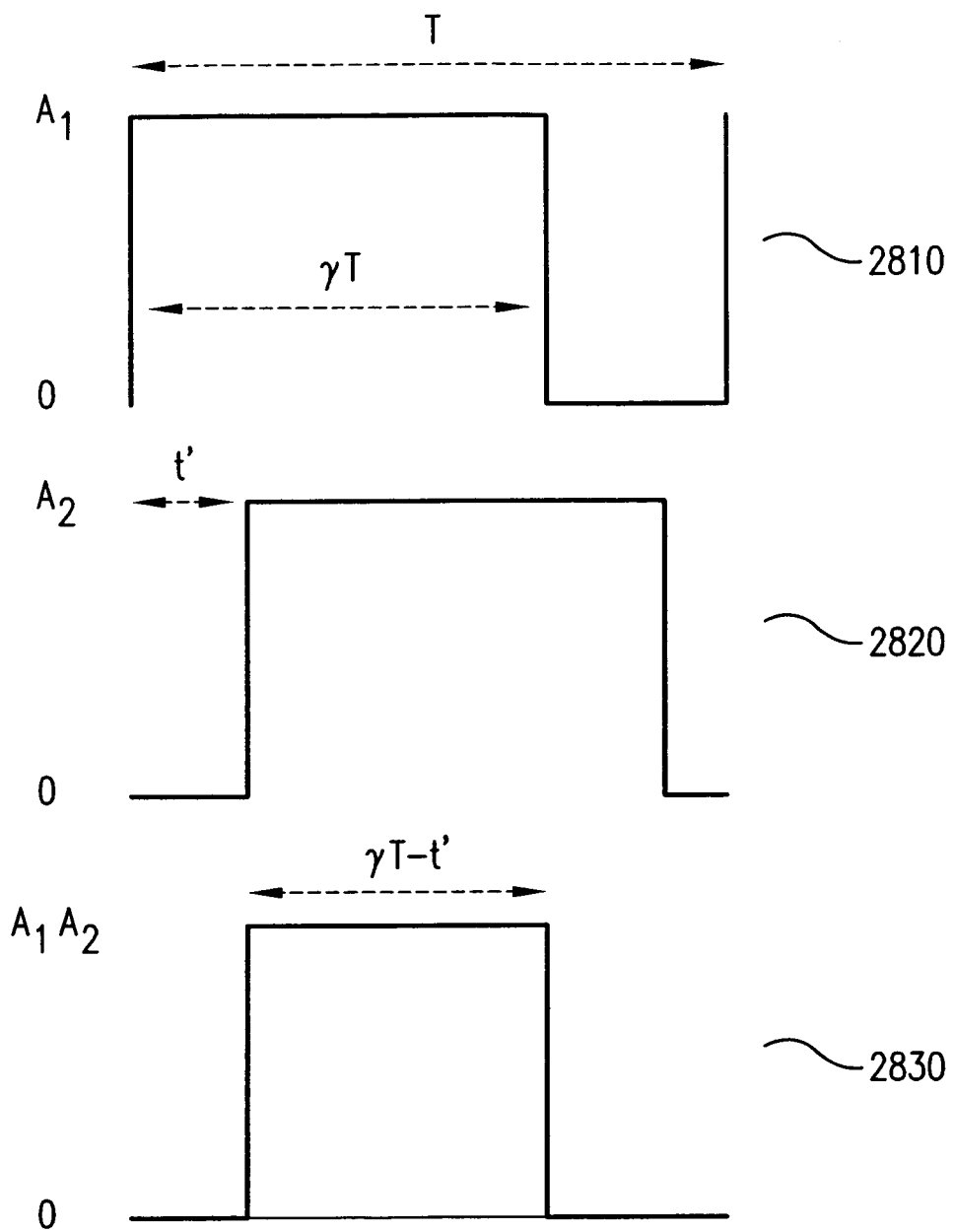
FIG. 28 illustrates a method of combining constant envelope signals according to an embodiment the present invention.

FIG. 28 illustrates a combination of two constant envelope square wave signals according to embodiments of the present invention. In FIG. 28, signals 2810 and 2820 are constant envelope signals having a period T, a duty cycle γT(0<γ<1), and envelope magnitudes A1 and A2, respectively.

Signal 2830 results from combining signals 2810 and 2820. According to embodiments of the present invention, signal 2830 will have a magnitude equal or substantially equal to a product of signals 2810 and 2820. In other words, signal 2830 will have a magnitude of zero whenever either of signals 2810 or 2820 has a magnitude of zero, and a non-zero magnitude when both signals 2810 and 2820 have non-zero magnitudes.

Further, signal 2830 represents a pulse-width-modulated signal. In other words, the envelope magnitude of signal 2830 is determined according to the pulse width of signal 2830 over one period of the signal. More specifically, the envelope magnitude of signal 2830 is equal or substantially to the area under the curve of signal 2830.

Referring to FIG. 28, signals 2810 and 2820 are shown time-shifted relative to each other by a time shift t'. Equivalently, signals 2810 and 2820 are phase-shifted relative to each other by a phase shift angle $$\phi = \left(\frac{t'}{T}\right) \times 2\pi$$

radians.

Still referring to FIG. 28, note that the envelope magnitude R of signal 2830, in FIG. 28, is given by:

$$R = A_1 \times A_2 \times (\gamma T - t) \quad (25)$$

Accordingly, it can be deduced that φ is related to R according to:

$$\phi = \left[\gamma - \frac{R}{T(A_1 A_2)}\right] \times (2\pi). \quad (26)$$

Note, from equation (26), that R is at a maximum of γA1A2 when φ=0. In other words, the envelope magnitude is at a maximum when the two constant envelope signals are in-phase with each other.

In typical implementations, signals 2810 and 2820 are normalized and have equal or substantially equal envelope magnitude of 1. Further, signals 2810 and 2820 typically have a duty cycle of 0.5. Accordingly, equation (28) reduces to:

$$\phi = \left[0.5 - \frac{R}{T}\right] \times (2\pi). \quad (27)$$

Equation (27) illustrates the magnitude to phase shift transform for the case of normalized and equal or substantially equal envelope magnitude square wave signals. Equation (27) is illustrated in FIG. 26.

3.4.5) Waveform Distortion Compensation

In certain embodiments, magnitude to phase shift transforms may not be implemented exactly as theoretically or practically derived. In fact, several factors may exist that require adjustment or tuning of the derived transform for optimal operation. Waveform distortion compensation is one factor that may require adjustment or tuning of the magnitude to phase shift transform. Waveform distortion compensation is now described below.

Figure 25:
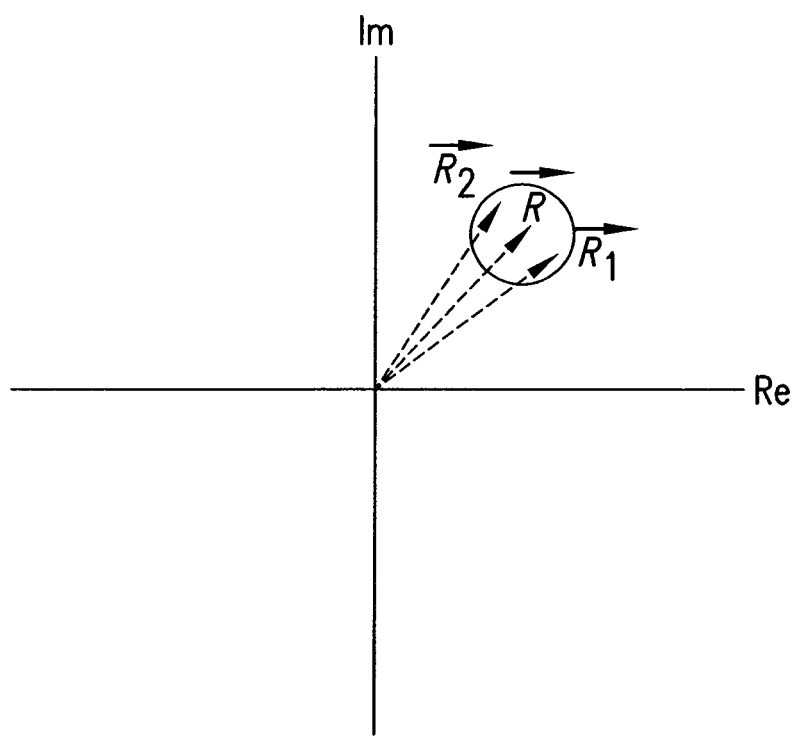
FIG. 25 is a phasor diagram that illustrates the effect of waveform distortion on a representation of a signal phasor.

In practice, several factors may cause waveform distortion of constant envelope constituents of a desired output signal r(t). Furthermore, it is expected that waveform distortion in the constituents translates into waveform distortion in the desired output signal when the constituents are combined. FIG. 25 illustrates the effect of waveform distortion on a signal using phasor signal representation. In FIG. 25, $\vec{R}$ represents a phasor representation of a desired signal r(t). In reality, waveform distortion can cause the actual phasor representation of r(t) to fall anywhere within a maximum error vector magnitude from $\vec{R}$. In the example of FIG. 25, this is illustrated using a circle centered at $\vec{R}$ and having a radius equal or substantially equal to the maximum error vector magnitude. Phasors $\vec{R}_1$ and $\vec{R}_2$ represent examples of actual phasor representations of the desired signal r(t).

According to embodiments of the present invention, expected waveform distortion to a desired output signal can be estimated. In some embodiments, the expected waveform distortion is compensated for at the vector modulation stage of the power amplifier. In other embodiments, the expected waveform distortion is compensated for at the transfer function stage of the power amplifier.

In the former approach, compensation is achieved by applying appropriate magnitude and phase shift tuning at the vector modulation stage outputs. Accordingly, waveform distortion is removed by waveshaping of the constituent signals of the desired output signal.

In the latter approach, the transfer function is designed to factor in and cancel or at least reduce the effects of the expected waveform distortion. As can be understood from the above description of transfer functions, waveform distortion compensation can be introduced at different positions within a transfer function stage. In some embodiments, compensation is applied at the output stage of the transfer function. For example, referring to FIG. 17, transfer function module outputs 1720, 1722, 1274 and 1726 may be tuned prior to being input into DACs 1730, 1732, 1734, and 1736. In other embodiments, compensation is applied at the magnitude to phase shift transform stage of the transfer function. Referring to FIG. 24, for example, magnitude to phase shift transform φ=f(|R|) may be adjusted appropriately to compensate for the expected waveform distortion.

3.5) Output Stage

An aspect of embodiments of the present invention lies in summing constituent signals at the output stage of a vector power amplifier (VPA). This is shown, for example, in FIG. 7 where the outputs of PAs 770, 772, 774, and 776 are summed. This is similarly shown in FIGS. 8, 12, 13, 17, and 18, for example. Various embodiments for combining the outputs of VPAs are described herein. While the following is described in the context of VPAs, it should be understood that the following teachings generally apply to coupling or summing the outputs of any active devices in any application.

Figure 29:
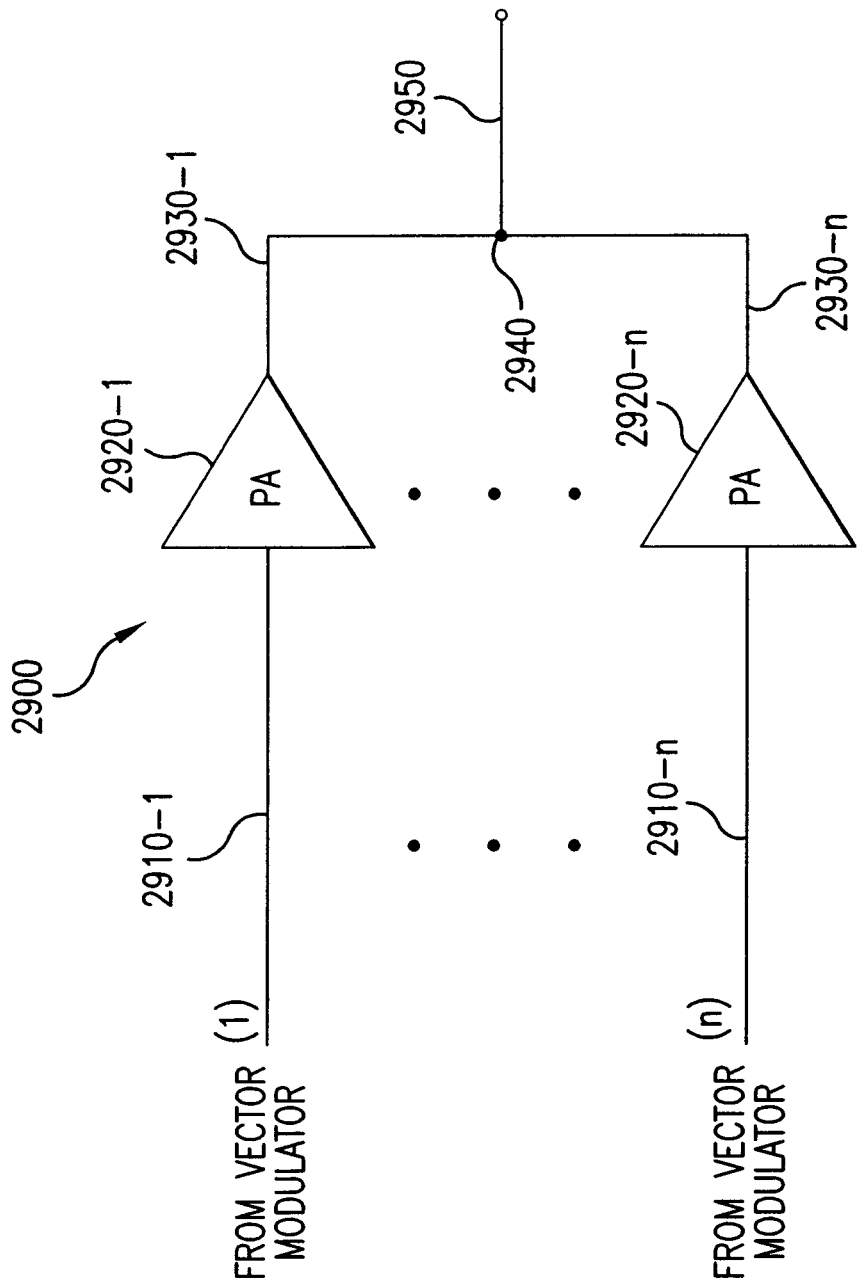
FIG. 29 illustrates a vector power amplifier output stage embodiment according to the present invention.

FIG. 29 illustrates a vector power amplifier output stage embodiment 2900 according to an embodiment of the present invention. Output stage 2900 includes a plurality of vector modulator signals 2910-{1, . . . , n} being input into a plurality of corresponding power amplifiers (PAs) 2920-{1, . . . , n}. As described above, signals 2910-{1, . . . , n} represent constituent signals of a desired output signal of the vector power amplifier.

In the example of FIG. 29, PAs 2910-{1, . . . , n} equally amplify or substantially equally amplify input signals 2910-

{1, ..., n} to generate amplified output signals 2930-{1, ..., n}. Amplified output signals 2930-{1, ..., n} are coupled together directly at summing node 2940. According to this example embodiment of the present invention, summing node 2940 includes no coupling or isolating element, such as a power combiner, for example. In the embodiment of FIG. 29, summing node 2940 is a zero-impedance (or near-zero impedance) conducting wire. Accordingly, unlike in conventional systems that employ combining elements, the combining of output signals according to this embodiment of the present invention incurs minimal power loss.

In another aspect, output stage embodiments of the present invention can be implemented using multiple-input single-output (MISO) power amplifiers.

In another aspect, output stage embodiments of the present invention can be controlled to increase the power efficiency of the amplifier by controlling the output stage current according to the desired output power level.

In what follows, various output stage embodiments according to VPA embodiments of the present invention are provided in section 3.5.1. In section 3.5.2, embodiments of output stage current shaping functions, for increasing the power efficiency of certain VPA embodiments of the present invention, are presented. Section 3.5.3 describes embodiments of output stage protection techniques that may be utilized for certain output stage embodiments of the present invention.

3.5.1) Output Stage Embodiments

Figure 30:
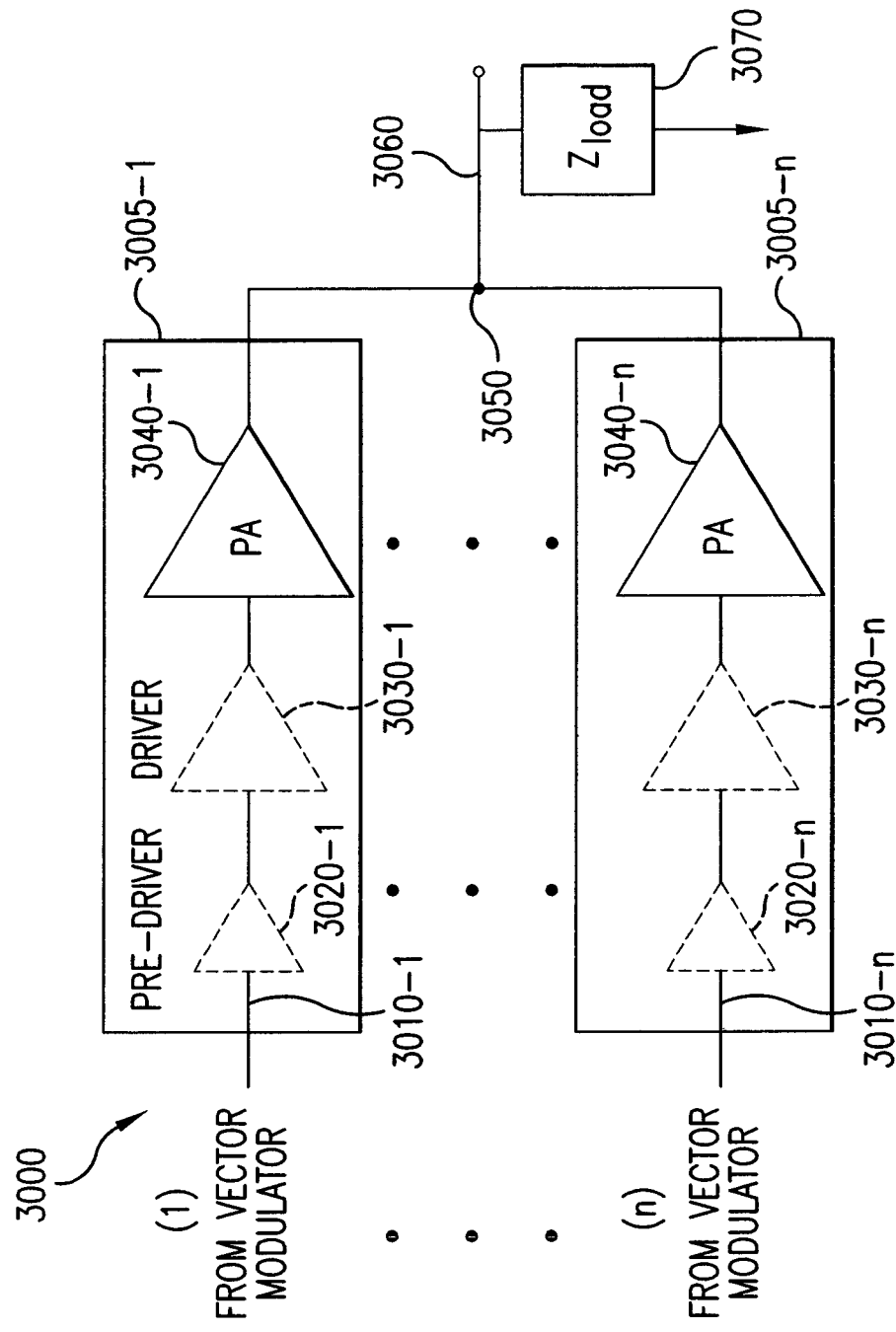
FIG. 30 is a block diagram of a power amplifier (PA) output stage embodiment.

FIG. 30 is a block diagram that illustrates a power amplifier (PA) output stage embodiment 3000 according to an embodiment of the present invention. Output stage embodiment 3000 includes a plurality of PA branches 3005-{1, ..., n}. Signals 3010-{1, ..., n} incoming from respective vector modulators represent inputs for output stage 3000. According to this embodiment of the present invention, signals 3010-{1, ..., n} represent equal and constant or substantially equal and constant envelope constituent signals of a desired output signal of the power amplifier.

PA branches 3005-{1, ..., n} apply equal or substantially equal power amplification to respective signals 3010-{1, ..., n}. In an embodiment, the power amplification level through PA branches 3005-{1, ..., n} is set according to a power level requirement of the desired output signal.

In the embodiment of FIG. 30, PA branches 3005-{1, ..., n} each includes a power amplifier 3040-{1, ..., n}. In other embodiments, drivers 3030-{1, ..., n} and pre-drivers 3020-{1, ..., n}, as illustrated in FIG. 30, may also be added in a PA branch prior to the power amplifier element. In embodiments, drivers and pre-drivers are employed whenever a required output power level may not be achieved in a single amplifying stage.

To generate the desired output signal, outputs of PA branches 3005-{1, ..., n} are coupled directly at summing node 3050. Summing node 3050 provides little or no isolation between the coupled outputs. Further, summing node 3050 represents a relatively lossless summing node. Accordingly, minimal power loss is incurred in summing the outputs of PAs 3040-{1, ..., n}.

Output signal 3060 represents the desired output signal of output stage 3000. In the embodiment of FIG. 30, output signal 3060 is measured across a load impedance 3070.

Figure 31:
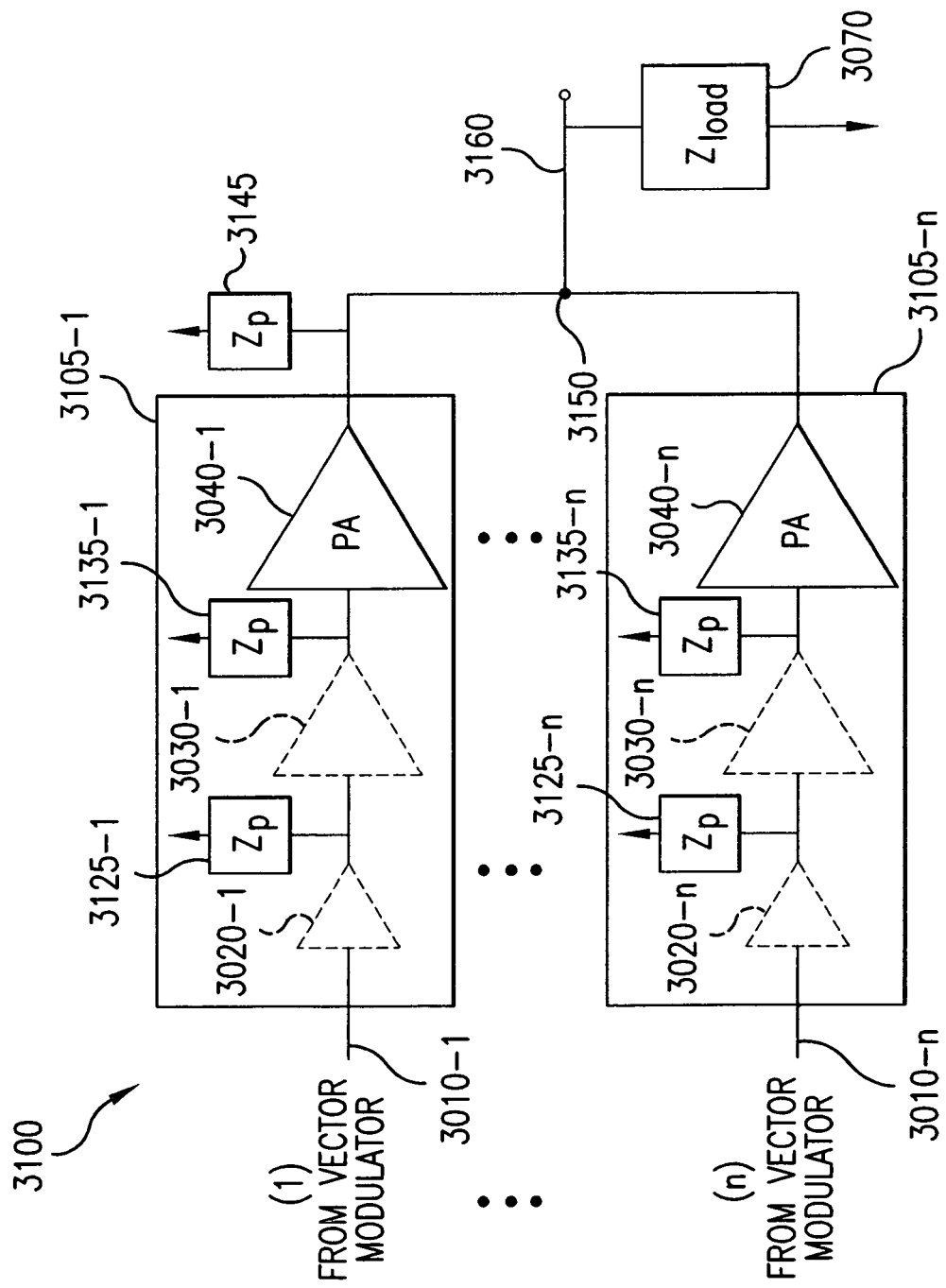
FIG. 31 is a block diagram of another power amplifier (PA) output stage embodiment.

FIG. 31 is a block diagram that illustrates another power amplifier (PA) output stage embodiment 3100 according to the present invention. Similar to the embodiment of FIG. 30, output stage 3100 includes a plurality of PA branches 3105-{1, ..., n}. Each of PA branches 3105-{1, ..., n} may include multiple power amplification stages represented by a pre-driver 3020-{1, ..., n}, driver 3030-{1, ..., n}, and power amplifier 3040-{1, ..., n}. Output stage embodiment 3100 further includes pull-up impedances coupled at the output of each power amplification stage to provide biasing of that stage. For example, pull-up impedances 3125-{1, ..., n} and 3135-{1, ..., n}, respectively, couple the pre-driver and driver stage outputs to power supply or independent bias power supplies. Similarly, pull-up impedance 3145 couples the PA stage outputs to the power supply or an independent bias power supply. According to this embodiment of the present invention, pull-up impedances represent optional components that may affect the efficiency but not necessarily the operation of the output stage embodiment.

Figure 32:
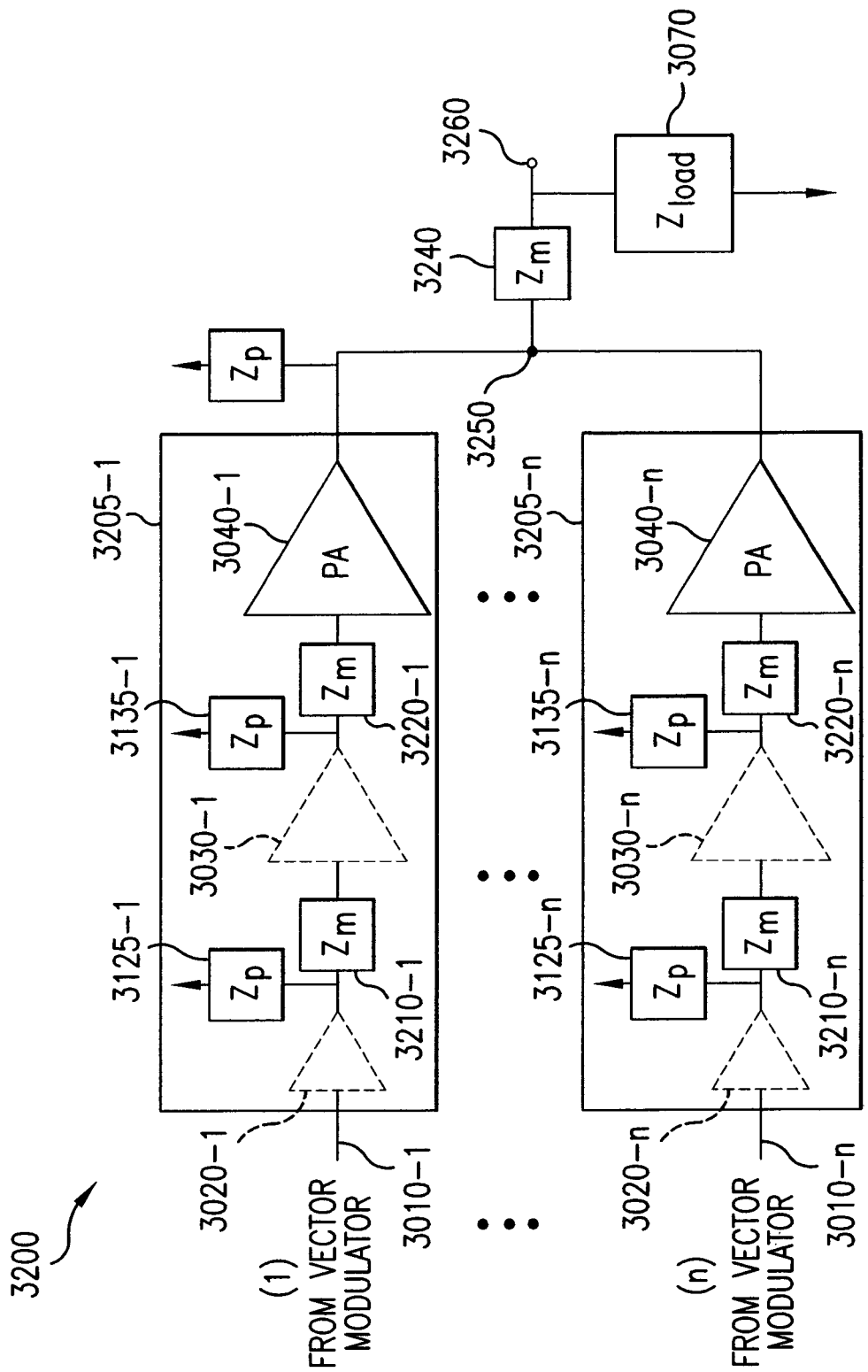
FIG. 32 is a block diagram of another power amplifier (PA) output stage embodiment.

FIG. 32 is a block diagram that illustrates another power amplifier (PA) output stage embodiment 3200 according to the present invention. Similar to the embodiment of FIG. 30, output stage 3200 includes a plurality of PA branches 3205-{1, ..., n}. Each of PA branches 3205-{1, ..., n} may include multiple power amplification stages represented by a pre-driver 3020-{1, ..., n}, driver 3030-{1, ..., n}, and power amplifier 3040-{1, ..., n}. Output stage embodiment 3200 also includes pull-up impedances coupled at the output of each power amplification stage to achieve a proper biasing of that stage. Further, output stage embodiment 3200 includes matching impedances coupled at the outputs of each power amplification stage to maximize power transfer from that stage. For example, matching impedances 3210-{1, ..., n} and 3220-{1, ..., n}, are respectively coupled to the pre-driver and driver stage outputs. Similarly, matching impedance 3240 is coupled at the PA stage output. Note that matching impedance 3240 is coupled to the PA output stage subsequent to summing node 3250.

In the above-described embodiments of FIGS. 30-32, the PA stage outputs are combined by direct coupling at a summing node. For example, in the embodiment of FIG. 30, outputs of PA branches 3005-{1, ..., n} are coupled together at summing node 3050. Summing node 3050 is a near zero-impedance conducting wire that provides minimal isolation between the coupled outputs. Similar output stage coupling is shown in FIGS. 31 and 32. It is noted that in certain embodiments of the present invention, output coupling, as shown in the embodiments of FIGS. 30-32 or embodiments subsequently described below, may utilize certain output stage protection measures. These protection measures may be implemented at different stages of the PA branch. Further, the type of protection measures needed may be PA implementation-specific. A further discussion of output stage protection according to an embodiment of the present invention is provided in section 3.5.3.

Figure 33:
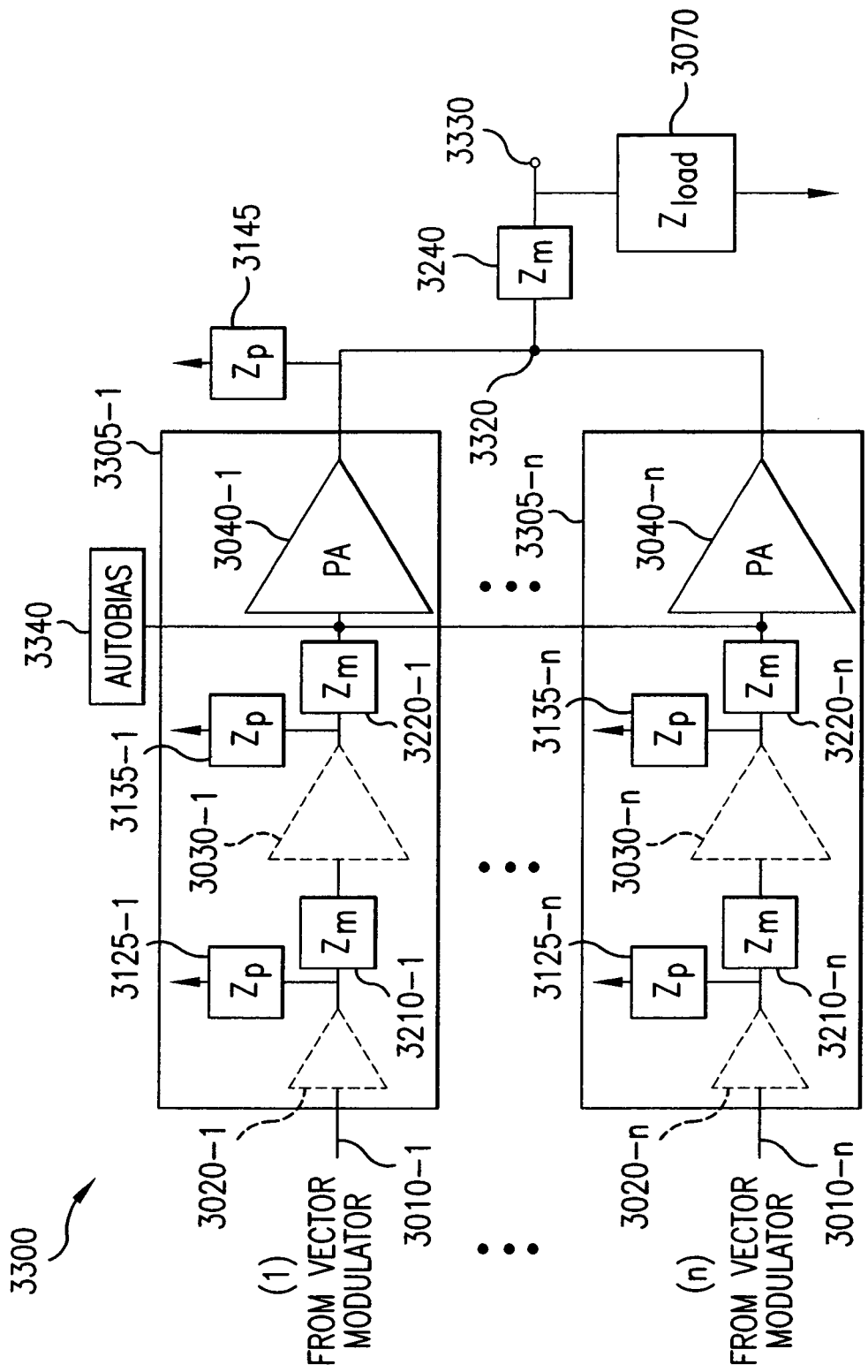
FIG. 33 is a block diagram of another power amplifier (PA) output stage embodiment according to the present invention.

FIG. 33 is a block diagram that illustrates another power amplifier (PA) output stage embodiment 3300 according to the present invention. Similar to the embodiment of FIG. 30, output stage 3300 includes a plurality of PA branches 3305-{1, ..., n}. Each of PA branches 3305-{1, ..., n} may include multiple power amplification stages represented by a pre-driver 3020-{1, ..., n}, driver 3030-{1, ..., n}, and power amplifier 3040-{1, ..., n}. Output stage embodiment 3300 may also include pull-up impedances 3125-{1, ..., n}, 3135-{1, ..., n}, and 3145 coupled at the output of each power amplification stage to achieve a proper biasing of that stage. Additionally, output stage embodiment 3300 may include matching impedances 3210-{1, ..., n}, 3220-{1, ..., n}, and 3240 coupled at the output of each power amplification stage to maximize power transfer from that stage. Further, output stage embodiment 3300 receives an autobias signal 3310, from an Autobias module 3340, coupled at the PA stage input of each PA branch 3305-{1, ..., n}. Autobias module 3340 controls the bias of PAs 3040-{1, ..., n}. In an embodiment, autobias signal 3340 controls the amount of current flow through the PA stage according to a desired output power level and signal envelope of the output waveform. A further description of the operation of autobias signal and the autobias module is provided below in section 3.5.2.

Figure 34:
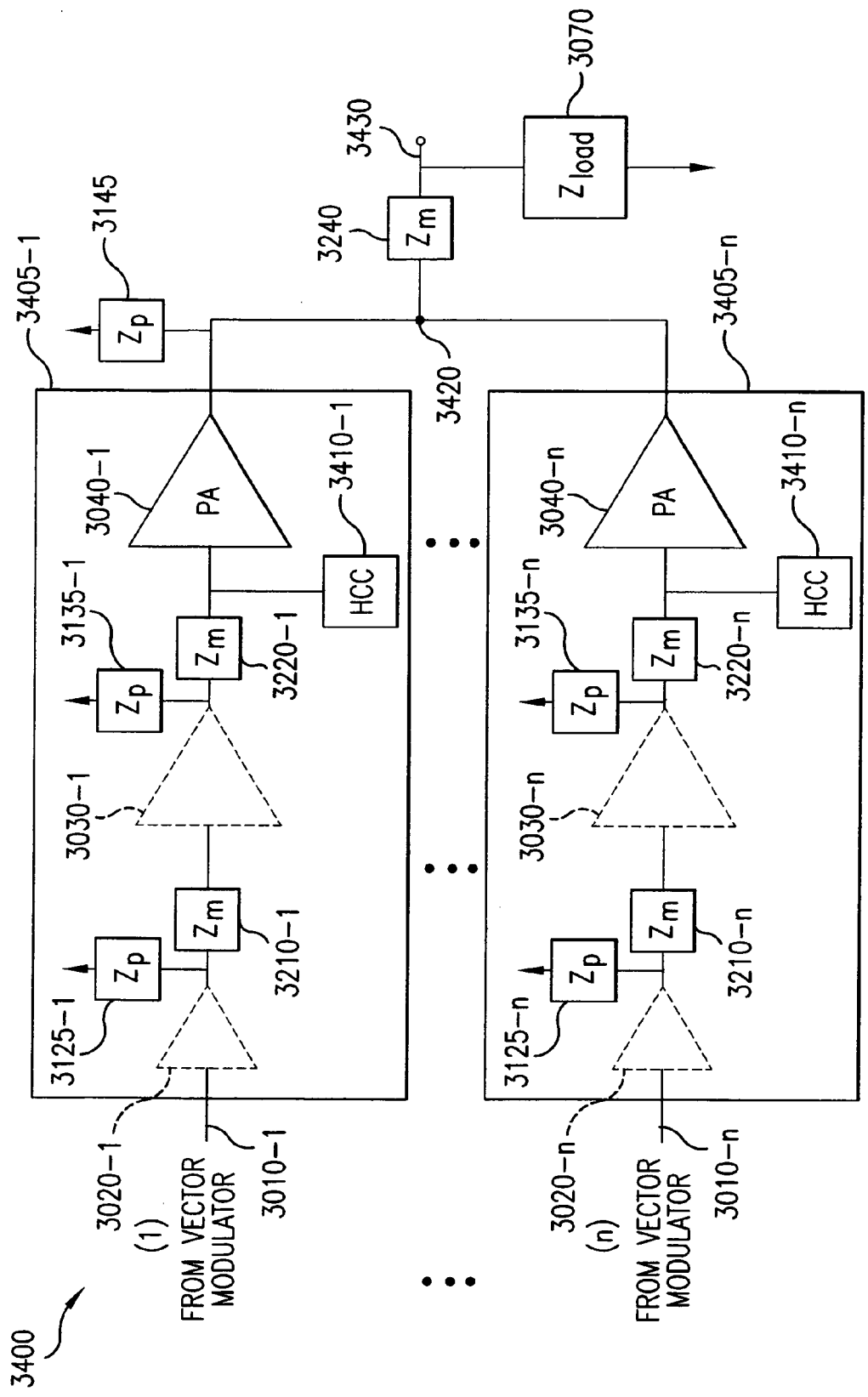
FIG. 34 is a block diagram of another power amplifier (PA) output stage embodiment according to the present invention.

FIG. 34 is a block diagram that illustrates another power amplifier (PA) output stage embodiment 3400 according to the present invention. Similar to the embodiment of FIG. 30, output stage 3400 includes a plurality of PA branches 3405-{1, ..., n}. Each of PA branches 3405-{1, ..., n} may include multiple power amplification stages represented by a pre-driver 3020-{1, ..., n}, driver 3030-{1, ..., n}, and power amplifier 3040-{1, ..., n}. Output stage embodiment 3400 may also include pull-impedances 3125-{1, ..., n}, 3135-{1, ..., n}, and 3145 coupled at the output of each power amplification stage to achieve desired biasing of that stage. Additionally, output stage embodiment 3400 may include matching impedances 3210-{1, ..., n}, 3220-{1, ..., n}, and 3240 coupled at the output of each power amplification stage to maximize power transfer from that stage. Further, output stage embodiment 3400 includes a plurality of harmonic control circuit networks 3410-{1, ..., n} coupled at the PA stage input of each PA branch {1, ..., n}. Harmonic control circuit networks 3410-{1, ..., n} may include a plurality of resistance, capacitance, and/or inductive elements and/or active devices coupled in series or in parallel. According to an embodiment of the present invention, harmonic control circuit networks 3410-{1, ..., n} provide harmonic control functions for controlling the output frequency spectrum of the power amplifier. In an embodiment, harmonic control circuit networks 3410-{1, ..., n} are selected such that energy transfer to the fundamental harmonic in the summed output spectrum is increased while the harmonic content of the output waveform is decreased. A further description of harmonic control according to embodiments of the present invention is provided below in section 3.6.

Figure 35:
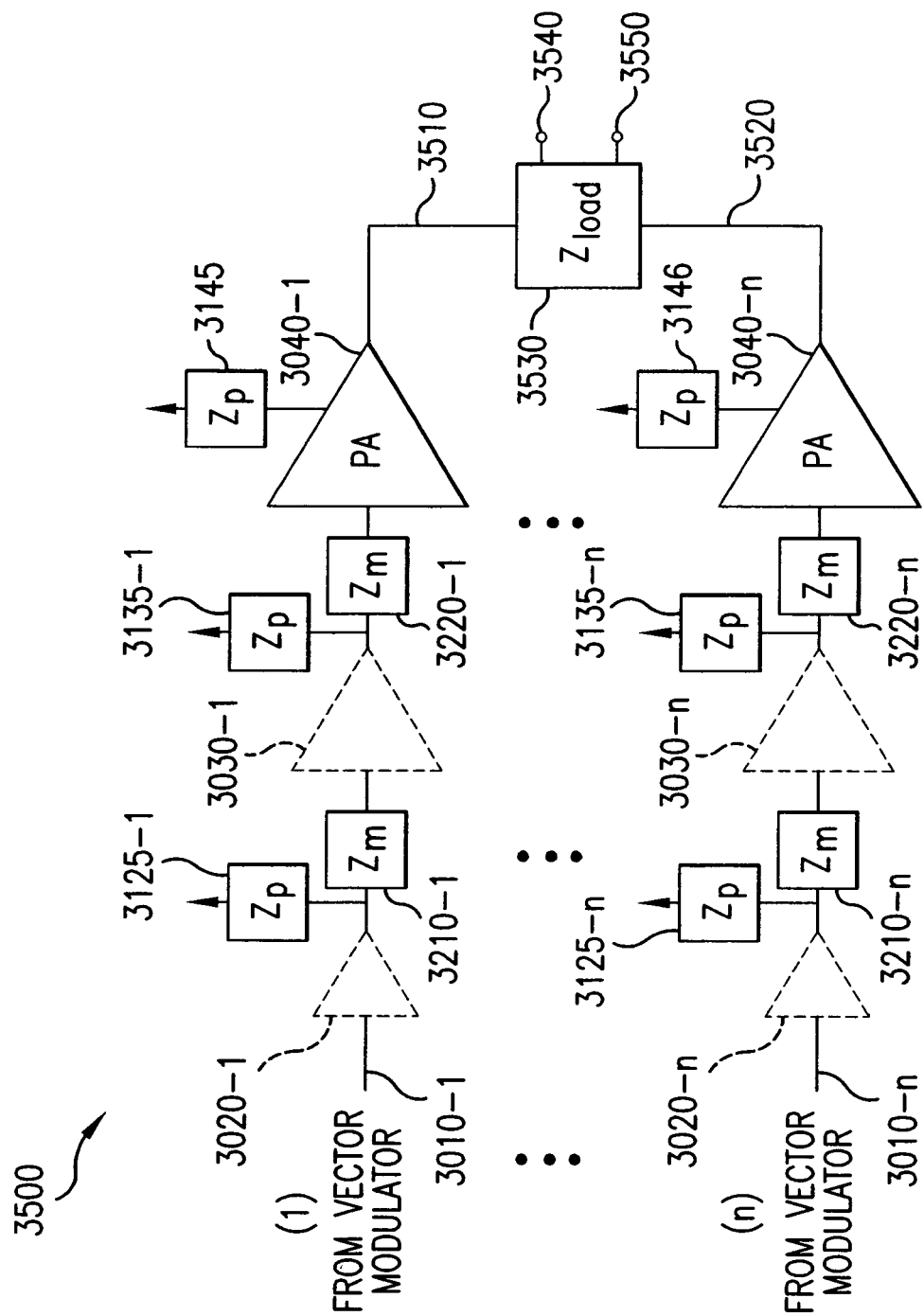
FIG. 35 is a block diagram of another power amplifier (PA) output stage embodiment according to the present invention.

FIG. 35 is a block diagram that illustrates another power amplifier (PA) output stage embodiment 3500 according to the present invention. Output stage embodiment 3500 represents a differential output equivalent of output stage embodiment 3200 of FIG. 32. In embodiment 3500, PA stage outputs 3510-{1, ..., n} are combined successively to result in two aggregate signals. The two aggregate signals are then combined across a loading impedance, thereby having the output of the power amplifier represent the difference between the two aggregate signals. Referring to FIG. 35, aggregate signals 3510 and 3520 are coupled across loading impedance 3530. The output of the power amplifier is measured across the loading impedance 3530 as the voltage difference between nodes 3540 and 3550. According to embodiment 3500, the maximum output of the power amplifier is obtained when the two aggregate signals are 180 degrees out-of-phase relative to each other. Inversely, the minimum output power results when the two aggregate signals are in-phase relative to each other.

Figure 36:
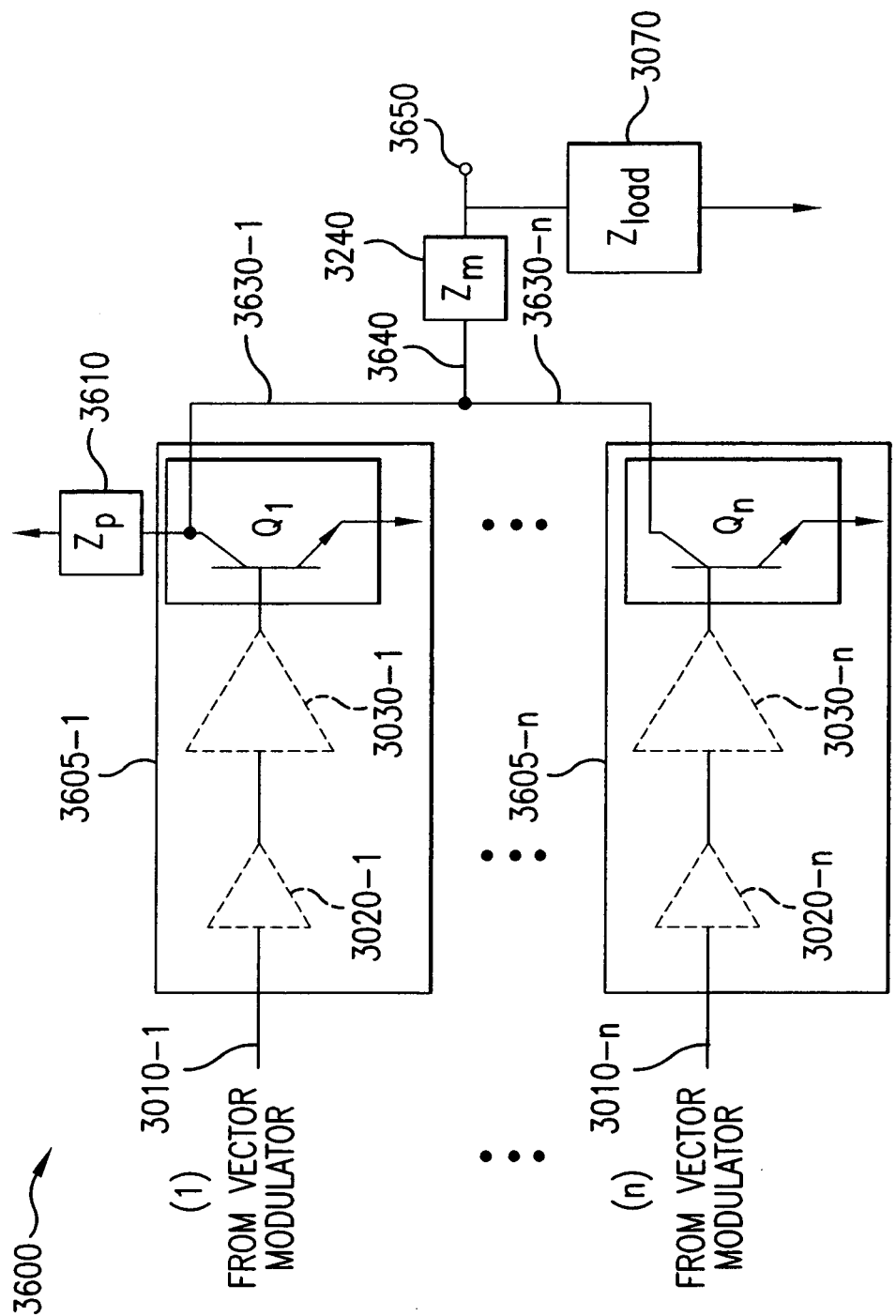
FIG. 36 is a block diagram of another power amplifier (PA) output stage embodiment according to the present invention.

FIG. 36 is a block diagram that illustrates another output stage embodiment 3600 according to the present invention. Similar to the embodiment of FIG. 30, output stage 3600 includes a plurality of PA branches 3605-{1, ..., n}. Each of PA branches {1, ..., n} may include multiple power amplification stages represented by a pre-driver 3020-{1, ..., n}, a driver 3030-{1, ..., n}, and a power amplifier (PA) 3620-{1, ..., n}.

According to embodiment 3600, PA's 3620-{1, ..., n} include switching power amplifiers. In the example of FIG. 36, power amplifiers 3620-{1, ..., n} include npn bipolar junction transistor (BJT) elements Q1, ..., Qn. BJT elements Q1, ..., Qn have common collector nodes. Referring to FIG. 36, collector terminals of BJT elements Q1, ..., Qn are coupled together to provide summing node 3640. Emitter terminals of BJT elements Q1, ..., Qn are coupled to a ground node, while base terminals of BJT elements Q1, ..., Qn provide input terminals into the PA stage.

Figure 37:
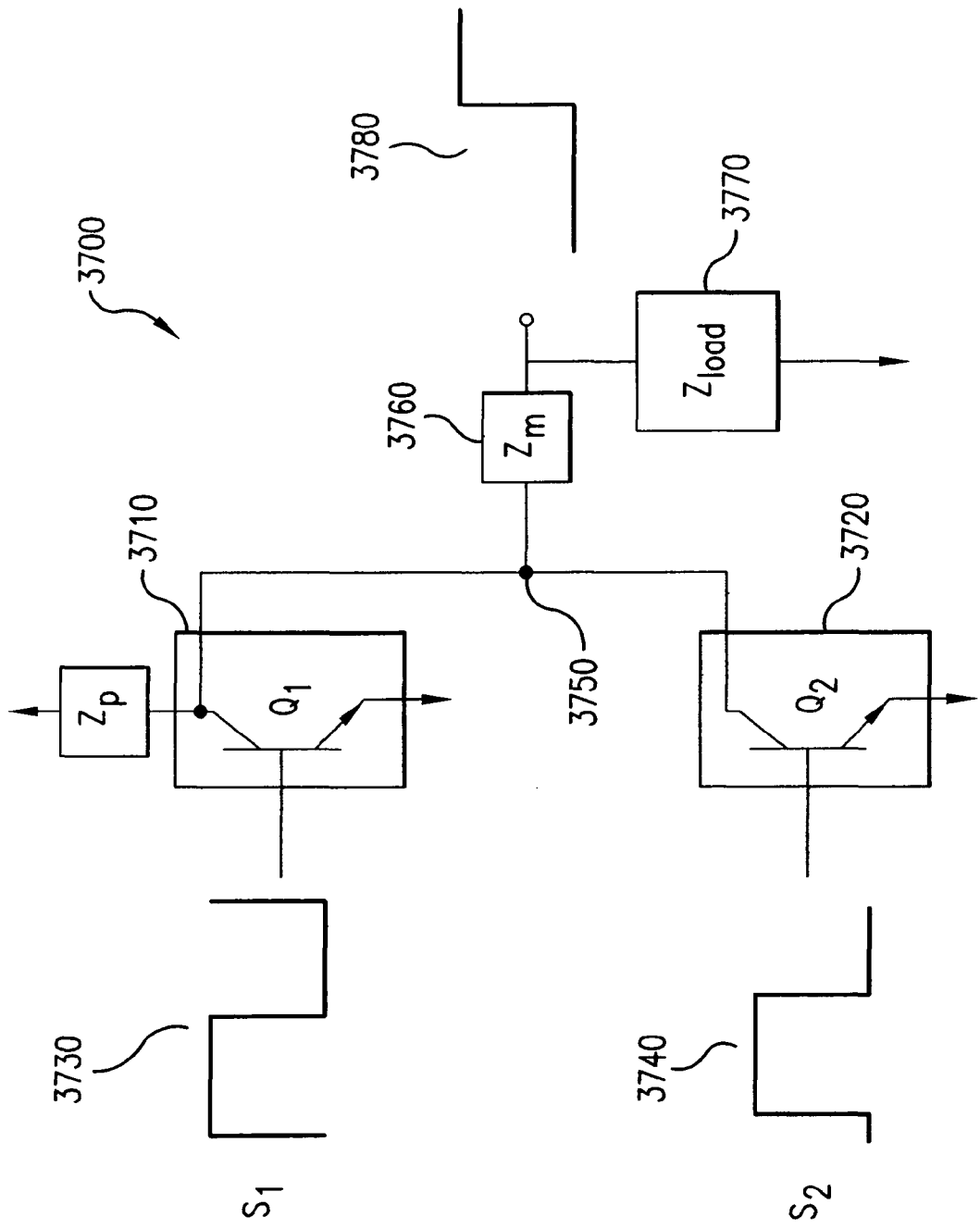
FIG. 37 illustrates an example output signal according to an embodiment of the present invention.

FIG. 37 is an example (related to FIG. 36) that illustrates an output signal of the PA stage of embodiment 3600 in response to square wave input signals. For ease of illustration, a two-branch PA stage is considered. In the example of FIG. 37, square wave signals 3730 and 3740 are input, respectively, into BJT elements 3710 and 3720. Note than when either of BJT elements 3710 or 3720 turns on, summing node 3750 is shorted to ground. Accordingly, when either of input signals 3730 or 3740 is high, output signal 3780 will be zero. Further, output signal 3780 will be high only when both input signals 3730 and 3740 are zero. According to this arrangement, PA stage 3700 performs pulse-width modulation, whereby the magnitude of the output signal is a function of the phase shift angle between the input signals.

Embodiments are not limited to npn BJT implementations as described herein. A person skilled in the art will appreciate, for example, that embodiments of the present invention may be implemented using pnp BJTs, CMOS, NMOS, PMOS, or other type of transistors. Further, embodiments can be implemented using GaAs and/or SiGe transistors with the desired transistor switching speed being a factor to consider.

Referring back to FIG. 36, it is noted that while PAs 3620-{1, ..., n) are each illustrated using a single BJT notation, each PA 3620-{1, ..., n} may include a plurality of series-coupled transistors. In embodiments, the number of transistors included within each PA is set according to a required maximum output power level of the power amplifier. In other embodiments, the number of transistors in the PA is such that the numbers of transistors in the pre-driver, driver, and PA stages conform to a geometric progression.

Figure 38:
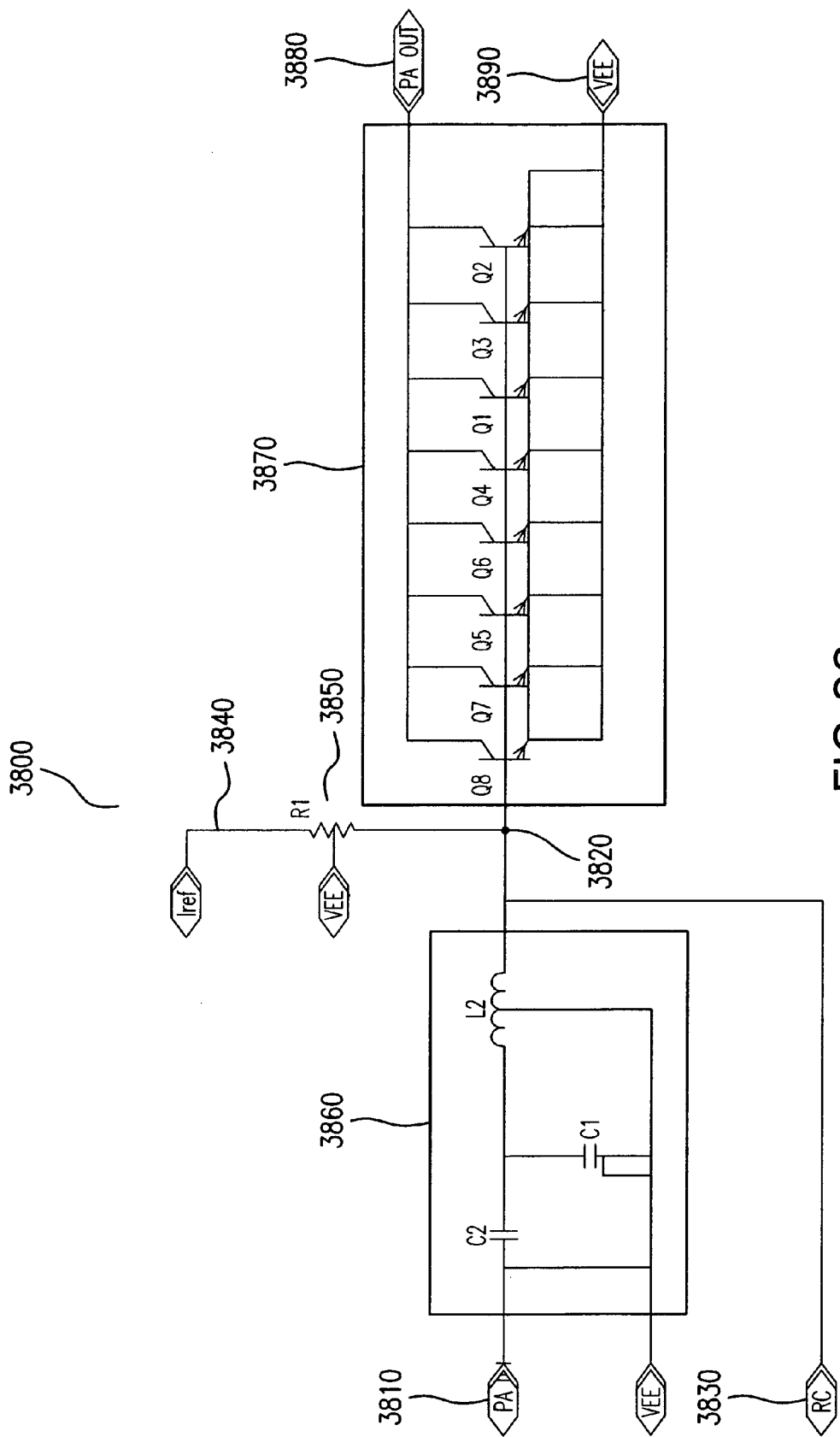
FIG. 38 illustrates an exemplary PA embodiment.

FIG. 38 illustrates an exemplary PA embodiment 3800 according to an embodiment of the present invention. PA embodiment 3800 includes a BJT element 3870, a LC network 3860, and a bias impedance 3850. BJT element 3870 includes a plurality of BJT transistors Q1, ..., Q8 coupled in series. As illustrated in FIG. 38, BJT transistors Q1, ..., Q8 are coupled together at their base, collector, and emitter terminals. Collector terminal 3880 of BJT element 3870 provides an output terminal for PA 3800. Emitter terminal 3890 of BJT element 3870 may be coupled to substrate or to an emitter terminal of a preceding amplifier stage. For example, emitter terminal 3890 is coupled to an emitter terminal of a preceding driver stage.

Referring to FIG. 38, LC network 3860 is coupled between PA input terminal 3810 and input terminal 3820 of BJT element 3870. LC network 3860 includes a plurality of capacitive and inductive elements. Optionally, a Harmonic Control Circuit network 3830 is also coupled at input terminal 3820 of BJT element 3870. As described above, the HCC network 3830 provides a harmonic control function for controlling the output frequency spectrum of the power amplifier.

Still referring to FIG. 38, bias impedance 3850 couples Iref signal 3840 to input terminal 3820 of BJT element 3870. Iref signal 3840 represents an autobias signal that controls the bias of BJT element 3870 according to a desired output power level and signal envelope characteristics.

It is noted that, in the embodiment of FIG. 38, BJT element 3870 is illustrated to include 8 transistors. It can be appreciated by a person skilled in the art, however, that BJT element 3870 may include any number of transistors as required to achieve the desired output power level of the power amplifier.

Figure 51A:
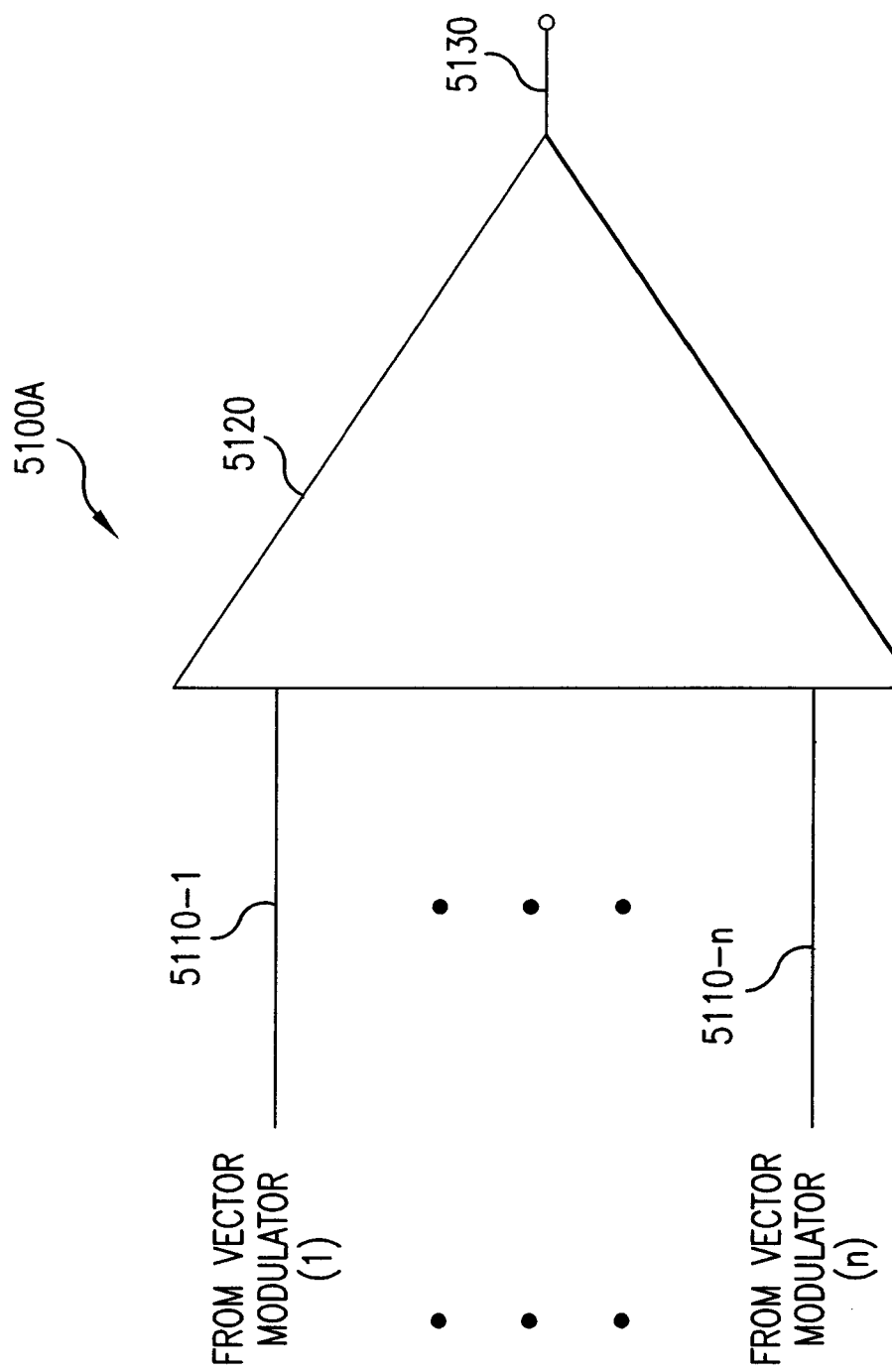

In another aspect, output stage embodiments can be implemented using multiple-input single-output (MISO) power amplifiers. FIG. 51A is a block diagram that illustrates an exemplary MISO output stage embodiment 5100A. Output stage embodiment 5100A includes a plurality of vector modulator signals 5110-$\{1, \ldots, n\}$ that are input into MISO power amplifier (PA) 5120. As described above, signals 5110-$\{1, \ldots, n\}$ represent constant envelope constituents of output signal 5130 of the power amplifier. MISO PA 5120 is a multiple input single output power amplifier. MISO PA 5120 receives and amplifies signals 5110-$\{1, \ldots, n\}$ providing a distributed multi signal amplification process to generate output signal 5130.

It is noted that MISO implementations, similar to the one shown in FIG. 51A, can be similarly extended to any of the output stage embodiments described above. More specifically, any of the output stage embodiments of FIGS. 29-37 can be implemented using a MISO approach. Additional MISO embodiments will now be provided with reference to FIGS. 51B-I. It is noted that any of the embodiments described above can be implemented using any of the MISO embodiments that will now be provided.

Figure 51B:
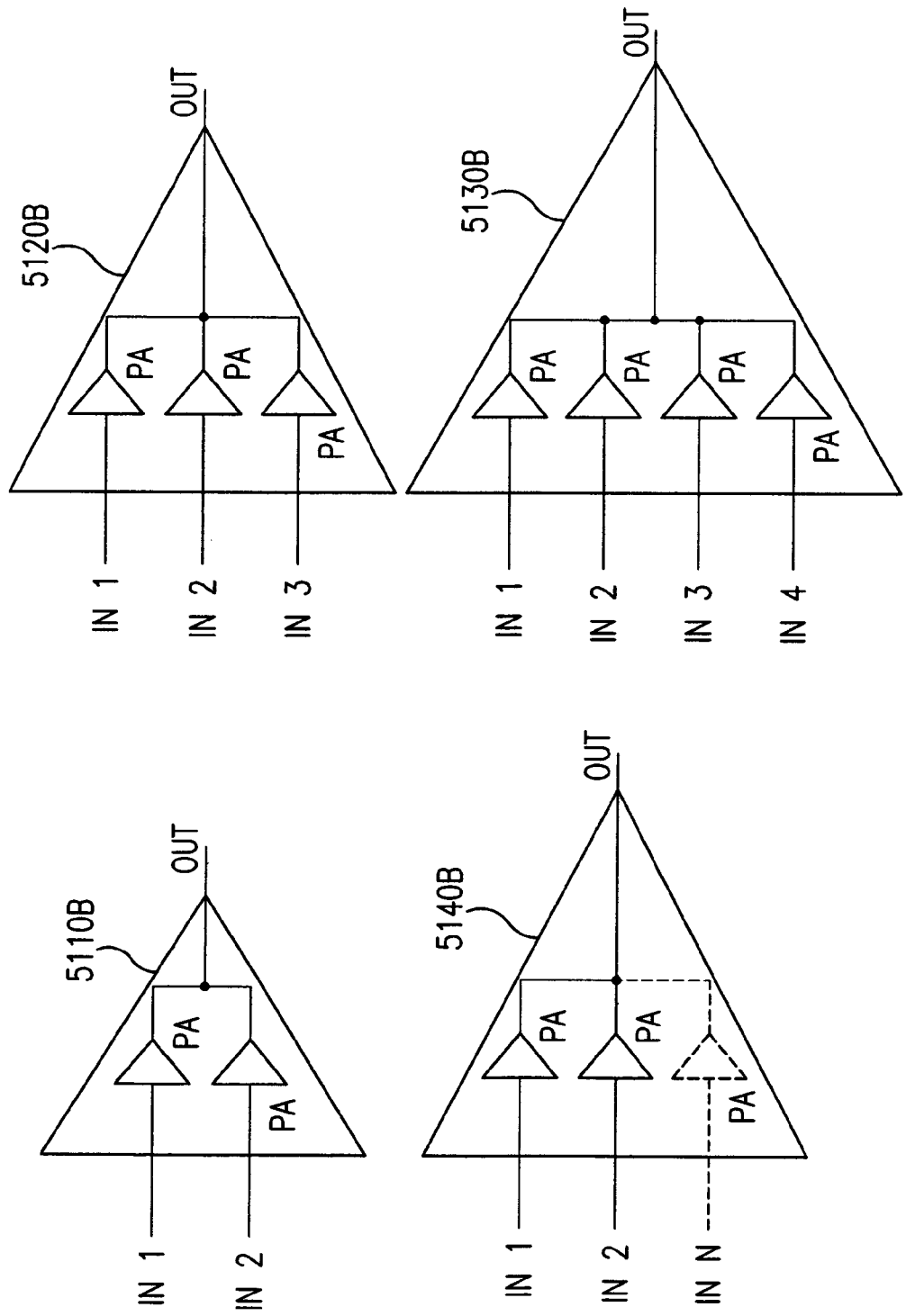

Referring to FIG. 51A, MISO PA 5120 can have any number of inputs as required by the substantially constant envelope decomposition of the complex envelope input signal. For example, in a two-dimensional decomposition, a two-input power amplifier can be used. According to embodiments of the present invention, building blocks for creating MISO PAs for any number of inputs are provided. FIG. 51B illustrates several MISO building blocks according to an embodiment of the present invention. MISO PA 5110B represents a two-input single-output PA block. In an embodiment, MISO PA 5110B includes two PA branches. The PA branches of MISO PA 5110B may be equivalent to any PA branches described above with reference to FIGS. 29-37, for example. MISO PA 5120B represents a three-input single-output PA block. In an embodiment, MISO PA 5120B includes three PA branches. The PA branches of MISO PA 5120B may equivalent to any PA branches described above with reference to FIGS. 29-37, for example.

Still referring to FIG. 51B, MISO PAs 5110B and 5120B represent basic building blocks for any multiple-input single-output power amplifier according to embodiments of the present invention. For example, MISO PA 5130B is a four-input single-output PA, which can be created by coupling together the outputs of two two-input single-output PA blocks, such as MISO PA 5110B, for example. This is illustrated in FIG. 51C. Similarly, it can be verified that MISO PA 5140B, an n-input single-output PA, can be created from the basic building blocks 5110B and 5120B.

Figure 51D:
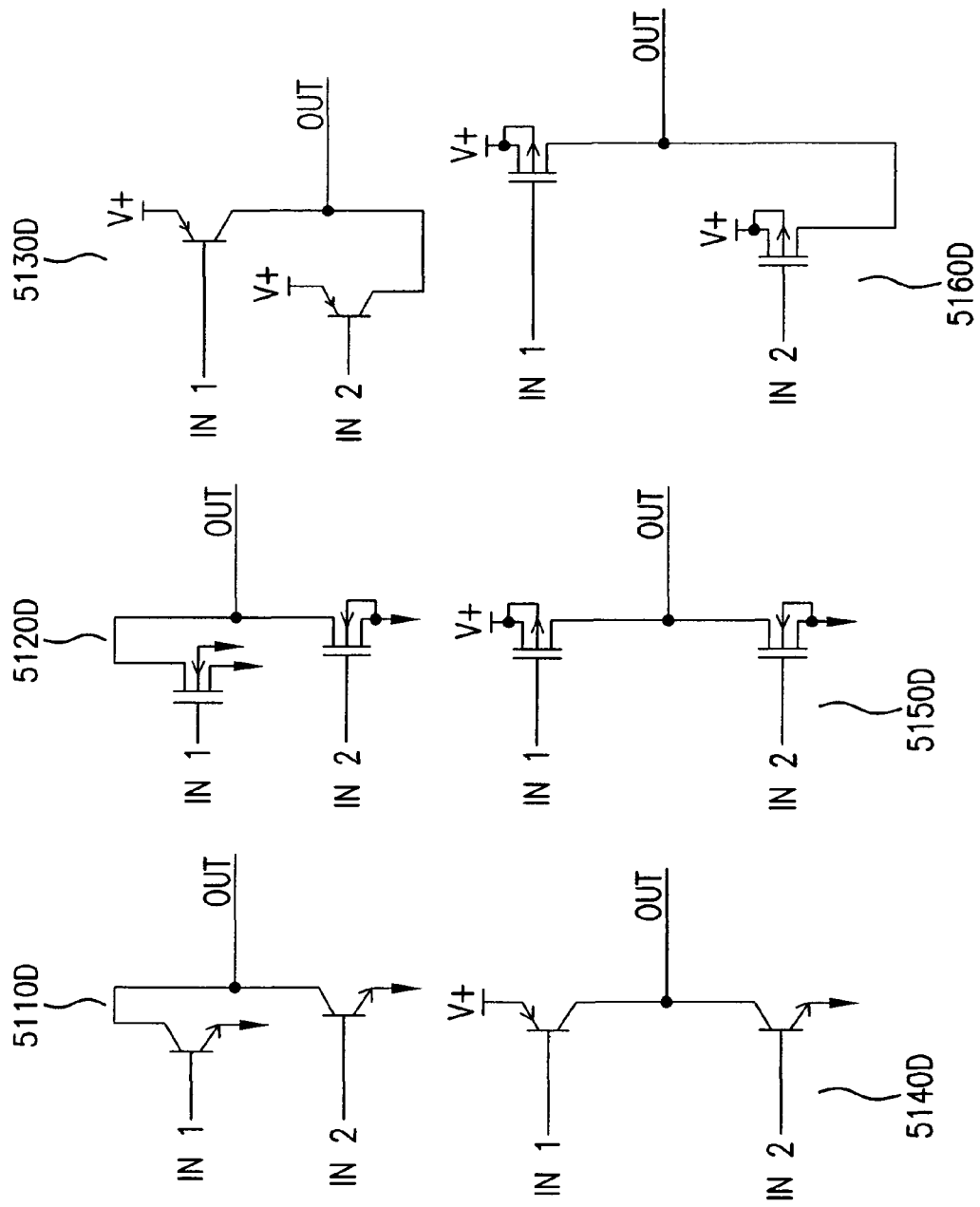

FIG. 51D illustrates various embodiments of the two-input single output PA building block according to embodiments of the present invention.

Embodiment 5110D represents an npn implementation of the two-input single output PA building block. Embodiment 5110D includes two npn transistors coupled together using a common collector node, which provides the output of the PA. A pull-up impedance (not shown) can be coupled between the common collector node and a supply node (not shown).

Embodiment 5130D represents a pnp equivalent of embodiment 5110D. Embodiment 5130D includes two pnp transistors coupled at a common collector node, which provides the output of the PA. A pull-down impedance (not shown) can be coupled between the common collector node and a ground node (not shown).

Embodiment 5140D represents a complementary npn/pnp implementation of the two-input single output PA building block. Embodiment 5140D includes an npn transistor and a pnp transistor coupled at a common collector node, which provides the output of the PA.

Still referring to FIG. 51D, embodiment 5120D represents a NMOS implementation of the two-input single output PA building block. Embodiment 5120D includes two NMOS transistors coupled at a common drain node, which provides the output of the PA.

Embodiment 5160D represents an PMOS equivalent of embodiment 5120D. Embodiment 5120D includes two PMOS transistors coupled at a common drain node, which provides the output of the PA.

Embodiment 5150D represents a complementary MOS implementation of the two-input single-output PA building block. Embodiment 5150D includes a PMOS transistor and an NMOS transistor coupled at common drain node, which provides the output of the PA.

Figure 51E:
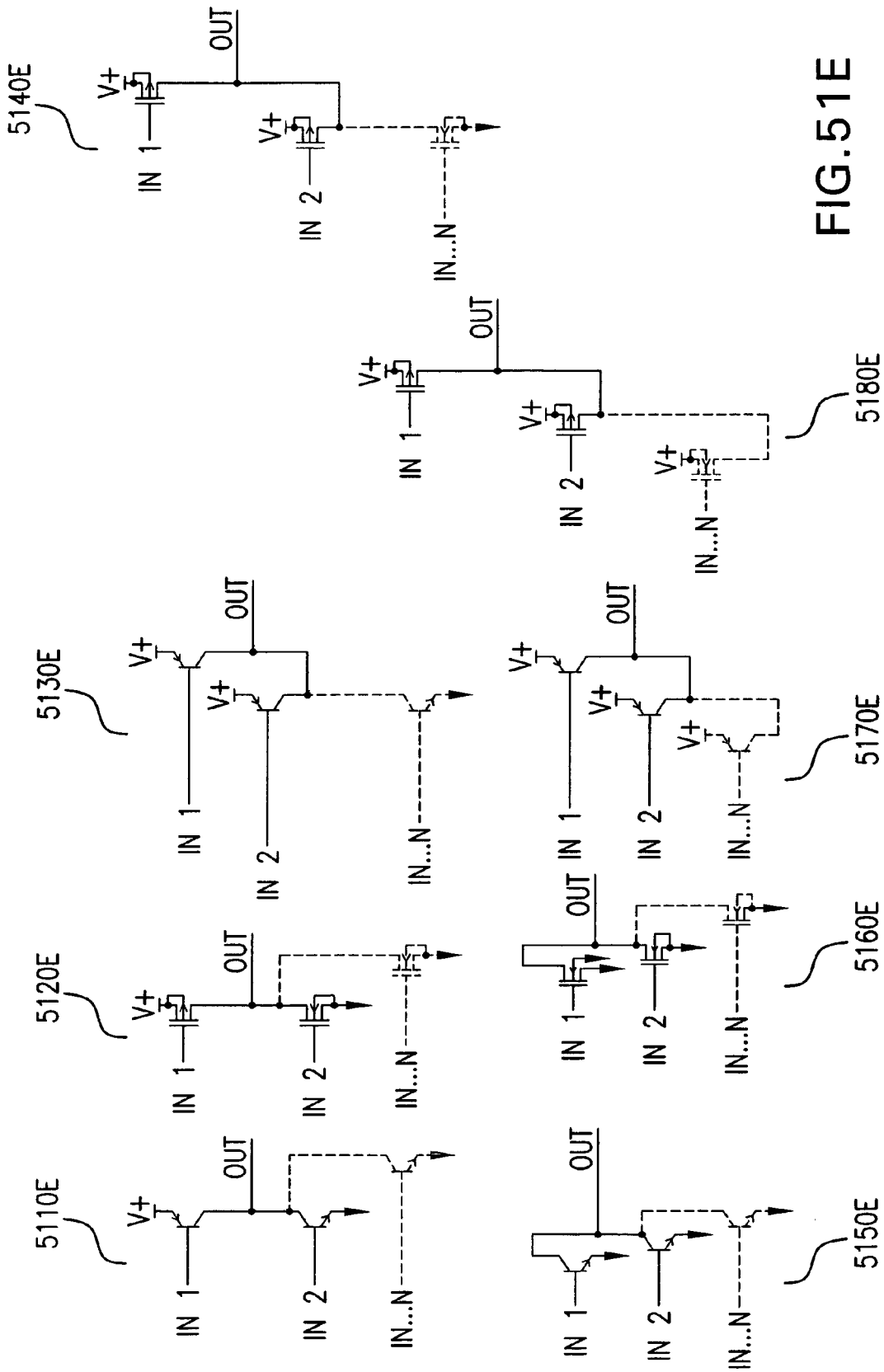

Two-input single-output embodiments of FIG. 51D can be further extended to create multiple-input single-output PA embodiments. FIG. 51E illustrates various embodiments of multiple-input single-output PAs according to embodiments of the present invention.

Embodiment 5150E represents an npn implementation of a multiple-input single-output PA. Embodiment 5150E includes a plurality of npn transistors coupled together using a common collector node, which provides the output of the PA. A pull-up impedance (not shown) can be coupled between the common collector node and a supply voltage (not shown). Note that an n-input single-output PA according to embodiment 5150E can be obtained by coupling additional npn transistors to the two-input single-output PA building block embodiment 5110D.

Embodiment 5170E represents a pnp equivalent of embodiment 5150E. Embodiment 5170E includes a plurality of pnp transistors coupled together using a common collector node, which provides the output of the PA. A pull-down impedance (not shown) may be coupled between the common collector node and a ground node (not shown). Note than an n-input single-output PA according to embodiment 5170E can be obtained by coupling additional pnp transistors to the two-input single-output PA building block embodiment 5130D.

Embodiments 5110E and 5130E represent complementary npn/pnp implementations of a multiple-input single-output PA. Embodiments 5110E and 5130E may include a plurality of npn and/or pnp transistors coupled together using a common collector node, which provides the output of the PA. Note that an n-input single-output PA according to embodiment 5110E can be obtained by coupling additional npn and/or pnp transistors to the two-input single-output PA building block embodiment 5140D. Similarly, an n-input single-output PA according to embodiment 5130E can be obtained by coupling additional npn and/or pnp transistors to the two-input single-output PA building block embodiment 5130D.

Embodiment 5180E represents an PMOS implementation of a multiple-input single-output PA. Embodiment 5180E includes a plurality of PMOS transistors coupled together using a common drain node, which provides the output of the PA. Note that an n-input single-output PA according to embodiment 5180E can be obtained by coupling additional NMOS transistors to the two-input single-output PA building block embodiment 5160D.

Embodiment 5160E represents a NMOS implementation of multiple-input single-output PA. Embodiment 5160E includes a plurality of NMOS transistors coupled together using a common drain node, which provides the output of the PA. Note that an n-input single-output PA according to embodiment 5160E can be obtained by coupling additional PMOS transistors to the two-input single-output PA building block embodiment 5120D.

Embodiments 5120E and 5140E complementary MOS implementations of a multiple-input single-output PA. Embodiments 5120E and 5140E include a plurality of npn and pnp transistors coupled together using a common drain node, which provides the output of the PA. Note that a n-input single-output PA according to embodiment 5120E can be obtained by coupling additional NMOS and/or PMOS transistors to the two-input single-output PA building block 5150D. Similarly, an n-input single-output PA according to embodiment 5140E can be obtained by coupling additional NMOS and/or PMOS transistors to the two-input single-output PA building block 5160D.

Figure 51F:
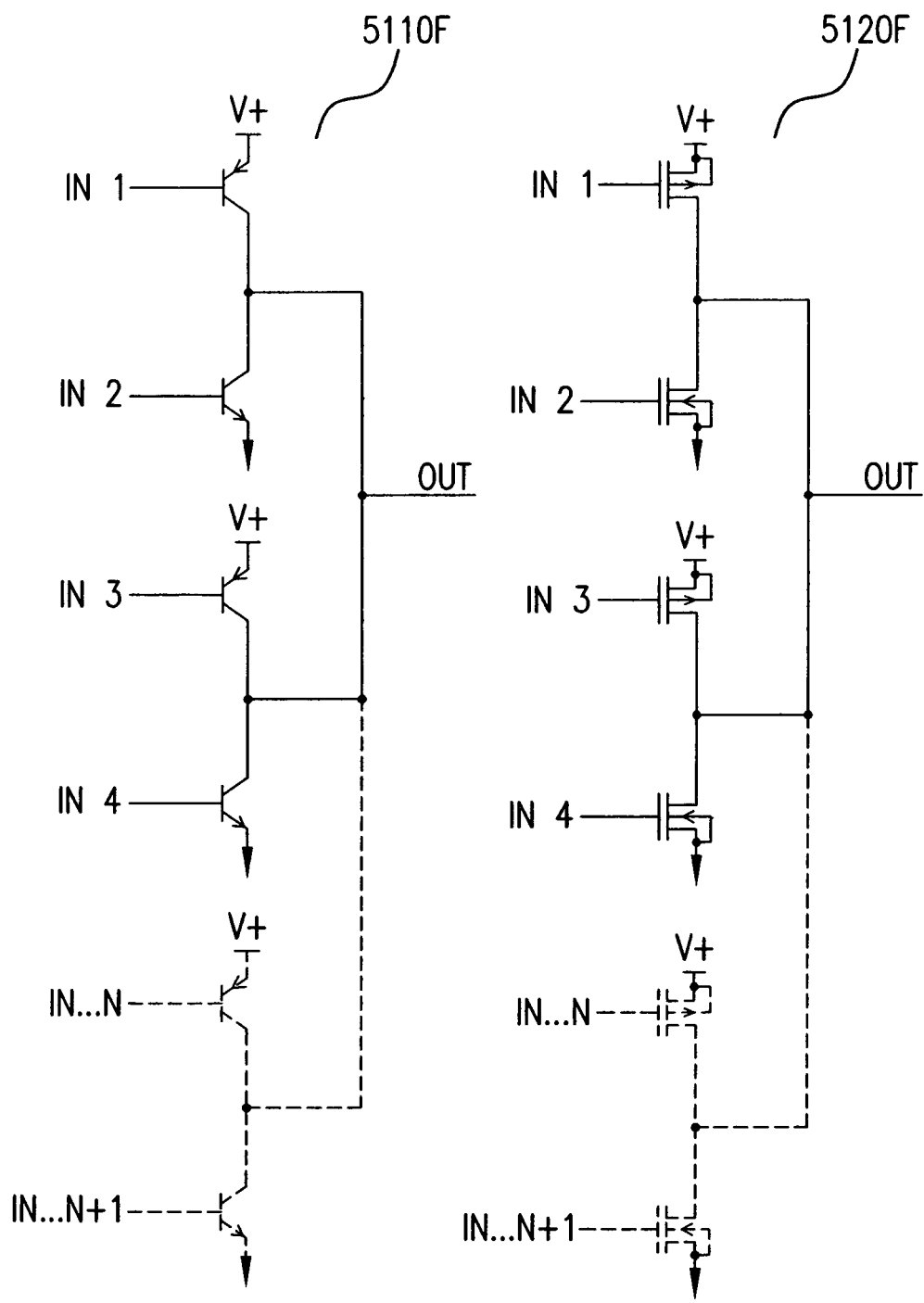

FIG. 51F illustrates further multiple-input single-output PA embodiments according to embodiments of the present invention. Embodiment 5110F represents a complementary npn/pnp implementation of a multiple-input single-output PA. Embodiment 5110F can be obtained by iteratively coupling together embodiments of PA building block 5140D. Similarly, embodiment 5120F represents an equivalent NMOS/PMOS complementary implementation of a multiple-input single-output PA. Embodiment 5120F can be obtained by iteratively coupling together embodiments of PA building block 5150D.

It must be noted that the multiple-input single-output embodiments described above may each correspond to a single or multiple branches of a PA. For example, referring to FIG. 29, any of the multiple-input single-output embodiments may be used to replace a single or multiple PAs 2920-$\{1, \ldots, n\}$. In other words, each of PAs 2920-$\{1, \ldots, n\}$ may be implemented using any of the multiple-input single-output PA embodiments described above or with a single-input single-output PA as shown in FIG. 29.

It is further noted that the transistors shown in the embodiments of FIGS. 51D, 51E, and 51F may each be implemented using a series of transistors as shown in the exemplary embodiment of FIG. 38, for example.

FIG. 51G illustrates further embodiments of the multiple-input single-output PA building blocks. Embodiment 5110G illustrates an embodiment of the two-input single-output PA building block. Embodiment 5110G includes two PA branches that can each be implemented according to single-input single-output or multiple-input single-output PA embodiments as described above. Further, embodiment 5110G illustrates an optional bias control signal 5112G that is coupled to the two branches of the PA embodiment. Bias control signal 5112G is optionally employed in embodiment 5110G based on the specific implementation of the PA branches. In certain implementations, bias control will be required for proper operation of the PA. In other implementations, bias control is not required for proper operation of the PA, but may provide improved PA power efficiency, output circuit protection, or power on current protection.

Still referring to FIG. 51G, embodiment 5120G illustrates an embodiment of the three-input single-output PA building block. Embodiment 5120G includes three PA branches that can each be implemented according to single-input single-output or multiple-input single-output PA embodiments as described above. Further, embodiment 5120G illustrates an optional bias control signal 5114G that is coupled to the branches of the PA embodiment. Bias control signal 5114G is optionally employed in embodiment 5120G based on the specific implementation of the PA branches. In certain implementations, bias control will be required for proper operation of the PA. In other implementations, bias control is not required for proper operation of the PA, but may provide improved PA power efficiency.

Figure 51H:
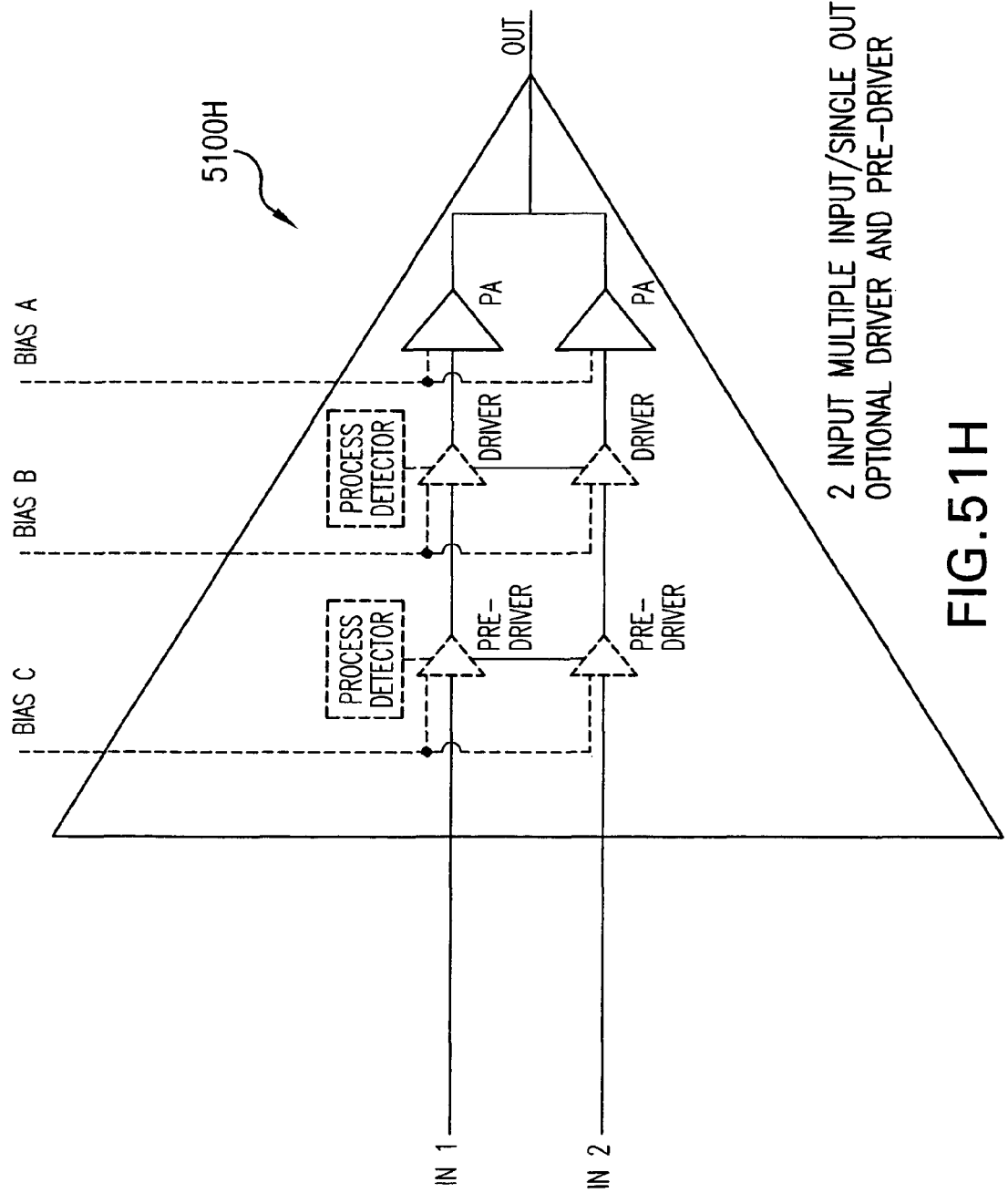

FIG. 51H illustrates a further exemplary embodiment 5100H of the two-input single-output PA building block. Embodiment 5100H includes two PA branches that can each be implemented according to single-input single-output or multiple-input single-output PA embodiments as described above. Embodiment 5100H further includes optional elements, illustrated using dashed lines in FIG. 51H, that can be additionally employed in embodiments of embodiment 5100H. In an embodiment, PA building block 5100H may include a driver stage and/or pre-driver stage in each of the PA branches as shown in FIG. 51H. Process detectors may also be optionally employed to detect process and temperature variations in the driver and/or pre-driver stages of the PA. Further, optional bias control may be provided to each of the pre-driver, driver, and/or PA stages of each branch of the PA embodiment. Bias control may be provided to one or more the stages based on the specific implementation of that stage. Further, bias control may be required for certain implementations, while it can be optionally employed in others.

Figure 51I:
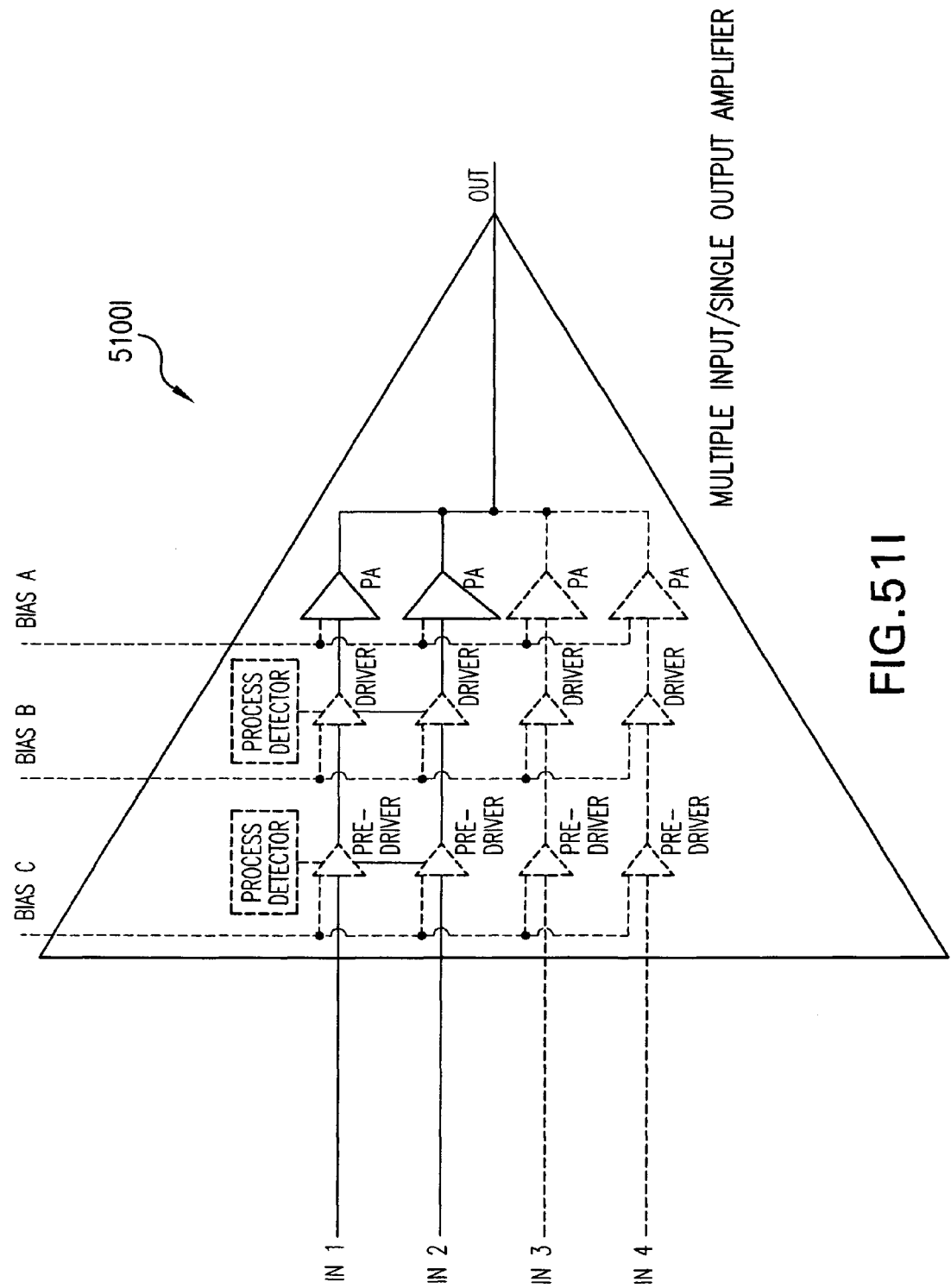

FIG. 51I illustrates a further exemplary embodiment 5100I of a multiple-input single-output PA. Embodiment 5100I includes at least two PA branches that can each be implemented according to single-input single-output or multiple-input single-output PA embodiments as described above. Embodiment 5100I further includes optional elements that can be additionally employed in embodiments of embodiment 5100I. In an embodiment, the PA may include driver and/or pre-driver stages in each of the PA branches as shown in FIG. 51I. Process detectors may also be optionally employed to detect-process and temperature variations in the driver and/or pre-driver stages of the PA. Further, optional bias control may be provided to each of the pre-driver, driver, and/or PA stages of each branch of the PA embodiment. Bias control may be provided to one or more the stages based on the specific implementation of that stage. Further, bias control may be required for certain implementations, while it can be optionally employed in others.

3.5.2) Output Stage Current Control—Autobias Module

Embodiments of the output stage and optional pre-driver and driver stage bias and current control techniques according to embodiments of the present invention are described below. In certain embodiments, output stage current control functions are employed to increase the output stage efficiency of a vector power amplifier (VPA) embodiment In other embodiments, output stage current control is used to provide output stage protection from excessive voltages and currents which is further describe in section 3.5.3. In embodiments, output stage current control functions are performed using the Autobias module described above with reference to FIG. 33. A description of the operation of the Autobias module in performing these current control functions is also presented below according to an embodiment of the present invention.

According to embodiments of the present invention, power efficiency of the output stage of a VPA can be increased by controlling the output stage current of the VPA as a function of the output power and the envelope of the output waveform.

FIG. 37, illustrates a partial schematic of a Multiple Input Single Output amplifier comprised of two NPN transistors with input signals S1 and S2. When S1 and S2 are designed to be substantially similar waveforms and substantially constant envelope signals, any time varying complex-envelope output signal can be created at circuit node 3750 by changing the phase relationship of S1 and S2.

FIG. 39 illustrates an example time varying complex-envelope output signal 3910 and its corresponding envelope signal 3920. Note than signal 3910 undergoes a reversal of phase at an instant of time $t_0$. Correspondingly, envelope signal 3920 undergoes a zero crossing at time $t_0$. Output signal 3910 exemplifies output signals according to typical wireless signaling schemes such as W-CDMA, QPSK, and OFDM, for example.

Figure 40:
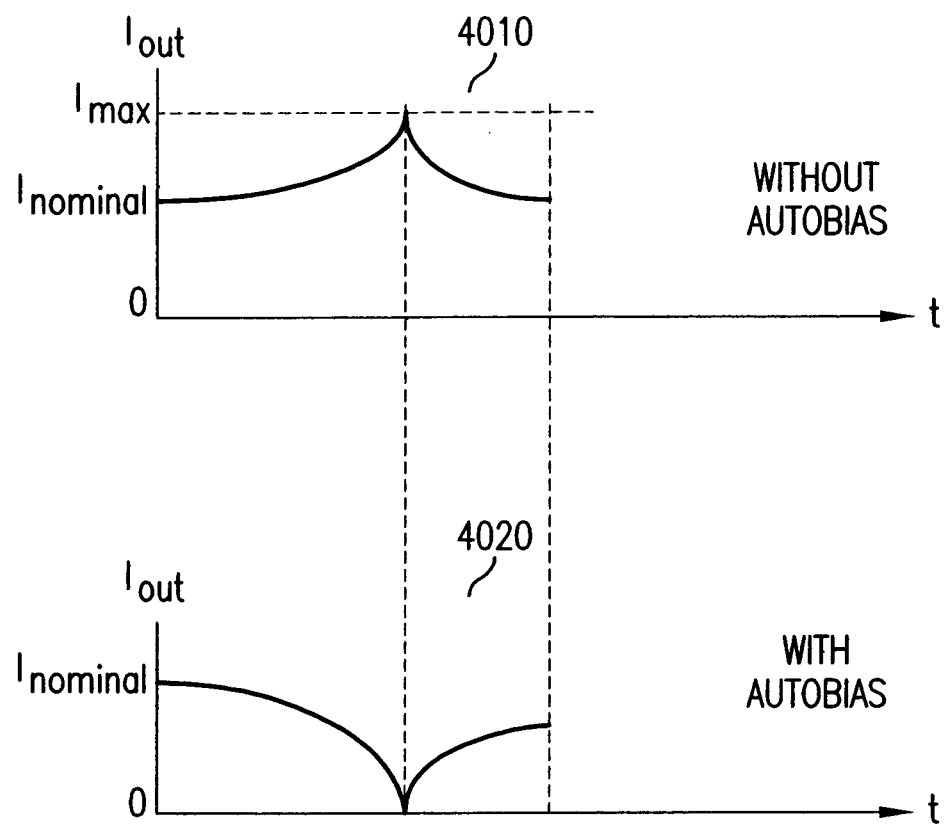
FIG. 40 illustrates example timing diagrams of a PA output stage current.

FIG. 40 illustrates example diagram FIG. 37's output stage current in response to output signal 3910. $I_{out}$ signal 4010 represents output stage current without autobias control, and $I_{out}$ signal 4020 represents output stage current with autobias control. Without autobias control, as the phase shift between S1 and S2 changes from 0 to 180 degrees, the output current $I_{out}$ increases. With autobias control, the output current $I_{out}$ decreases and can be minimized when at or near $t_0$ of FIG. 39.

Note that $I_{out}$ signal 4020 varies as a function of envelope signal 3920. Accordingly, $I_{out}$ signal 4020 is at the maximum when a maximum output power is required, but decreases as the required output power goes down. Particularly, $I_{out}$ signal 4020 approaches zero as the associated output power goes to zero. Accordingly, a person skilled in the art will appreciate that output stage current control, according to embodiments of the present invention, results in significant power savings and increases the power efficiency of the power amplifier.

According to embodiments of the present invention, output stage current control may be implemented according to a variety of functions. In an embodiment, the output stage current can be shaped to correspond to the desired output power of the amplifier. In such an embodiment, the output stage current is a function that is derived from the envelope of the desired output signal, and the power efficiency will increase.

Figure 41:
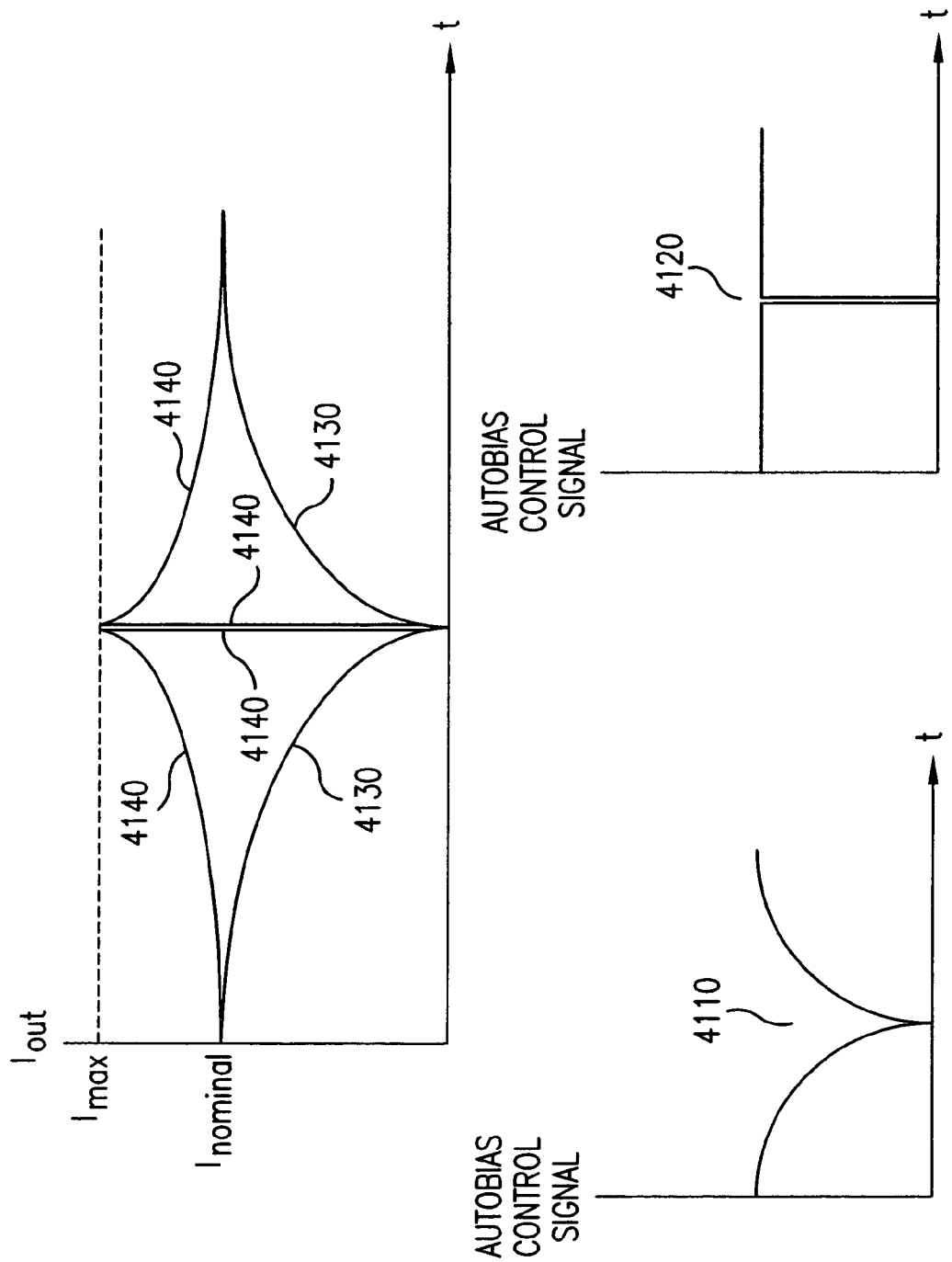
FIG. 41 illustrates exemplary output stage current control functions.

FIG. 41 illustrates exemplary autobias output stage current control functions 4110 and 4120 according to embodiments of the present invention. Function 4110 may represent a function of output power and signal envelope as described above. On the other hand, function 4120 may represent a simple shaping function that goes to a minimum value for a predetermined amount of time when the output power is below a threshold value. Accordingly, functions 4110 and 4120 represent two cases of autobias output stage current control functions with autobias control signal 4110 resulting in $I_{out}$ response 4130 and autobias control signal 4120 resulting in $I_{out}$ response 4140. The invention, however, is not limited to those two exemplary embodiments. According to embodiments of the present invention, output stage autobias current control functions may be designed and implemented to accommodate the efficiency and current consumption requirements of a particular vector power amplifier design.

In implementation, several approaches exist for performing output stage current control. In some embodiments, output stage current shaping is performed using the Autobias module. The Autobias module is illustrated as autobias circuitry 714 and 716 in the embodiments of FIGS. 7 and 8. Similarly, the Autobias module is illustrated as autobias circuitry 1218 in the embodiments of FIGS. 12 and 13, and as autobias circuitry 1718 in the embodiments of FIGS. 17 and 18.

Figure 48:
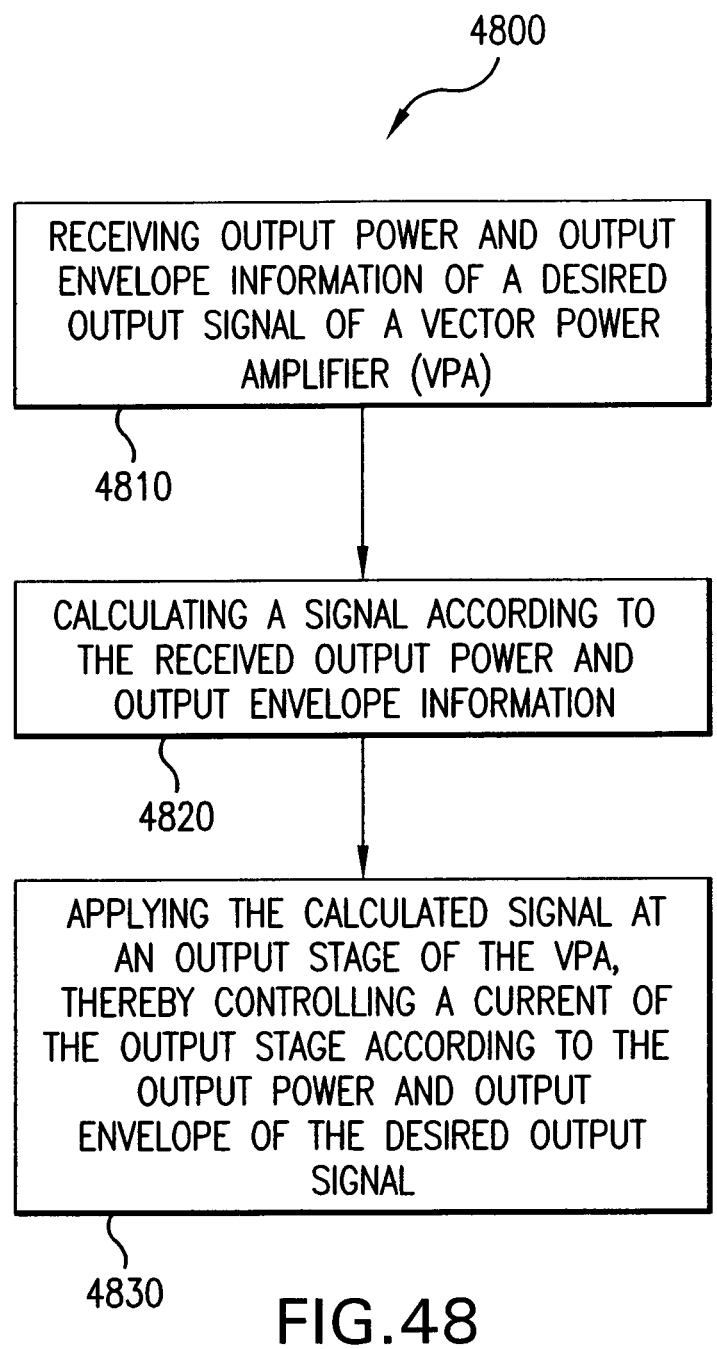
FIG. 48 is a process flowchart for implementing output stage current shaping according to an embodiment of the present invention.

Output stage current control using Autobias is depicted in process flowchart 4800 of the embodiment of FIG. 48. The process begins in step 4810, which includes receiving output power and output signal envelope information of a desired output signal of a vector power amplifier (VPA). In some embodiments, implementing output stage current control using Autobias requires a priori knowledge of the desired output power of the amplifier. Output power information may be in the form of envelope and phase information. For example, in the embodiments of FIGS. 7, 8, 12, 13, 17, and 18, output power information is included in I and Q data components received by the VPA embodiment. In other embodiments, output power information may be received or calculated using other means.

Step 4820 includes calculating a signal according to the output power and output envelope signal information. In embodiments, an Autobias signal is calculated as a function of some measure of the desired output power. For example, the Autobias signal may be calculated as a function of the envelope magnitude of the desired output signal. Referring to the embodiments of FIGS. 7, 8, 12, 13, 17, and 18, for example, it is noted that the Autobias signal (signals 715 and 717 in FIGS. 7 and 8, signal 1228 in FIGS. 12 and 13, and signals 1728 in FIGS. 17 and 18) is calculated according to received I and Q data components of a desired output signal. In certain embodiments, such as the ones described in FIGS. 7, 8, 12, 13, 17, and 18, the Autobias signal is calculated by an Autobias module being provided output power information. In other embodiments, the Autobias signal may be calculated by the I and Q Data Transfer Function module(s) of the VPA. In such embodiments, an Autobias module may not be required in implementation. In embodiments, the I and Q Data Transfer Function module calculates a signal, outputs the signal to a DAC which output signal represents the Autobias signal.

Figure 42:
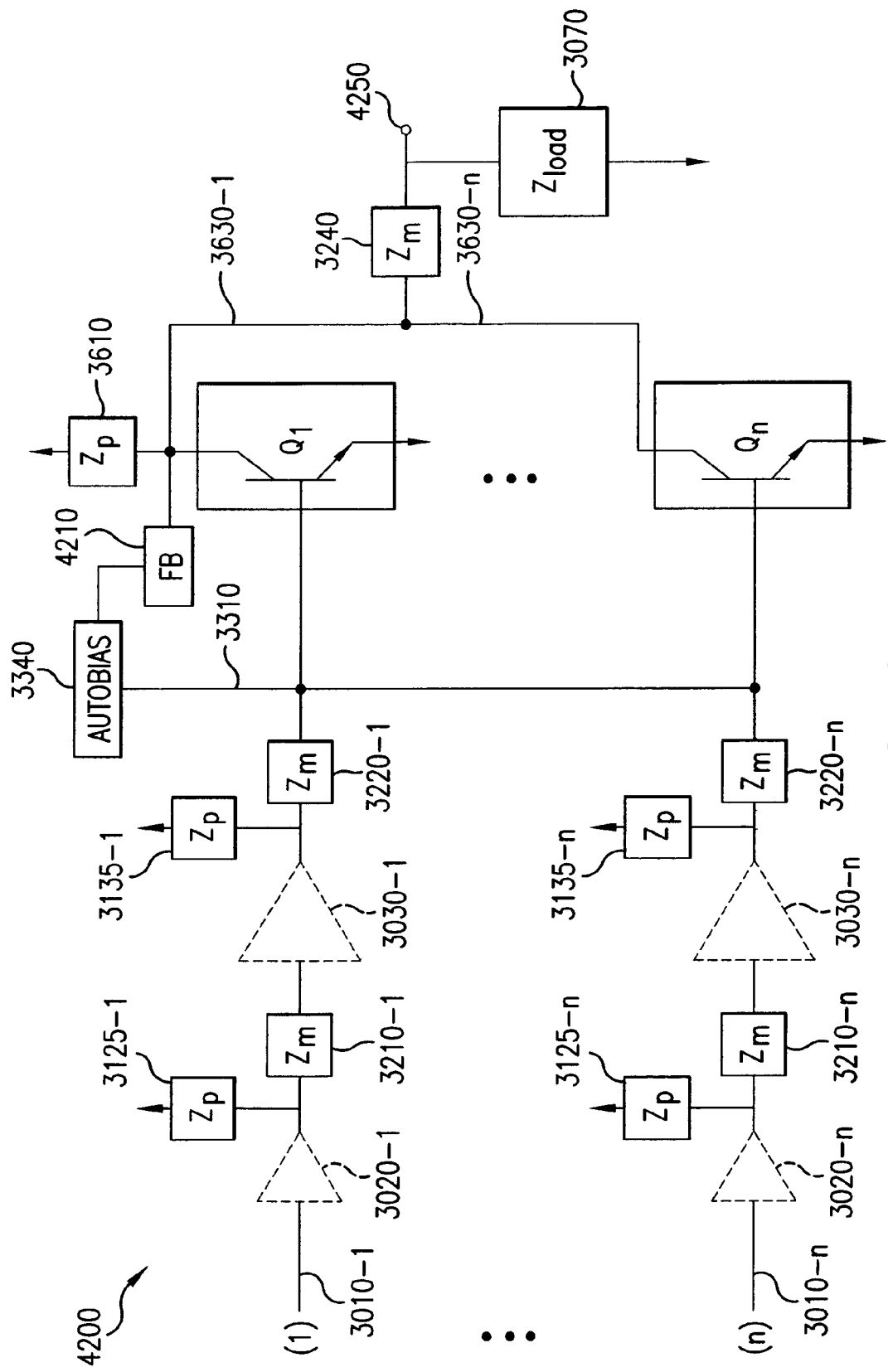
FIG. 42 is a block diagram of another power amplifier (PA) output stage embodiment.

Step 4830 includes applying the calculated signal at an output stage of the VPA, thereby controlling a current of the output stage according to the output power of the desired output signal. In embodiments, step 4830 includes coupling the Autobias signal at the PA stage input of the VPA. This is illustrated, for example, in the embodiments of FIGS. 33 and 42 where Autobias signal 3310 is coupled at the PA stage input of the VPA embodiment. In these embodiments, Autobias signal 3310 controls the bias of the PA stage transistors according to the output power of the desired output signal of the VPA embodiment. For example, Autobias signal 3310 may cause the PA stage transistors to operate in cutoff state when the desired output power is minimal or near zero, thereby drawing little or no output stage current. Similarly, when a maximum output power is desired, Autobias signal 3310 may bias the PA stage transistors to operate in class C, D, E, etc. switching mode, Autobias signal 3310 may also cause the PA stage transistors or FETs to operate in forward or reverse biased states according to the desired output power and signal envelope characteristics.

Figure 43:
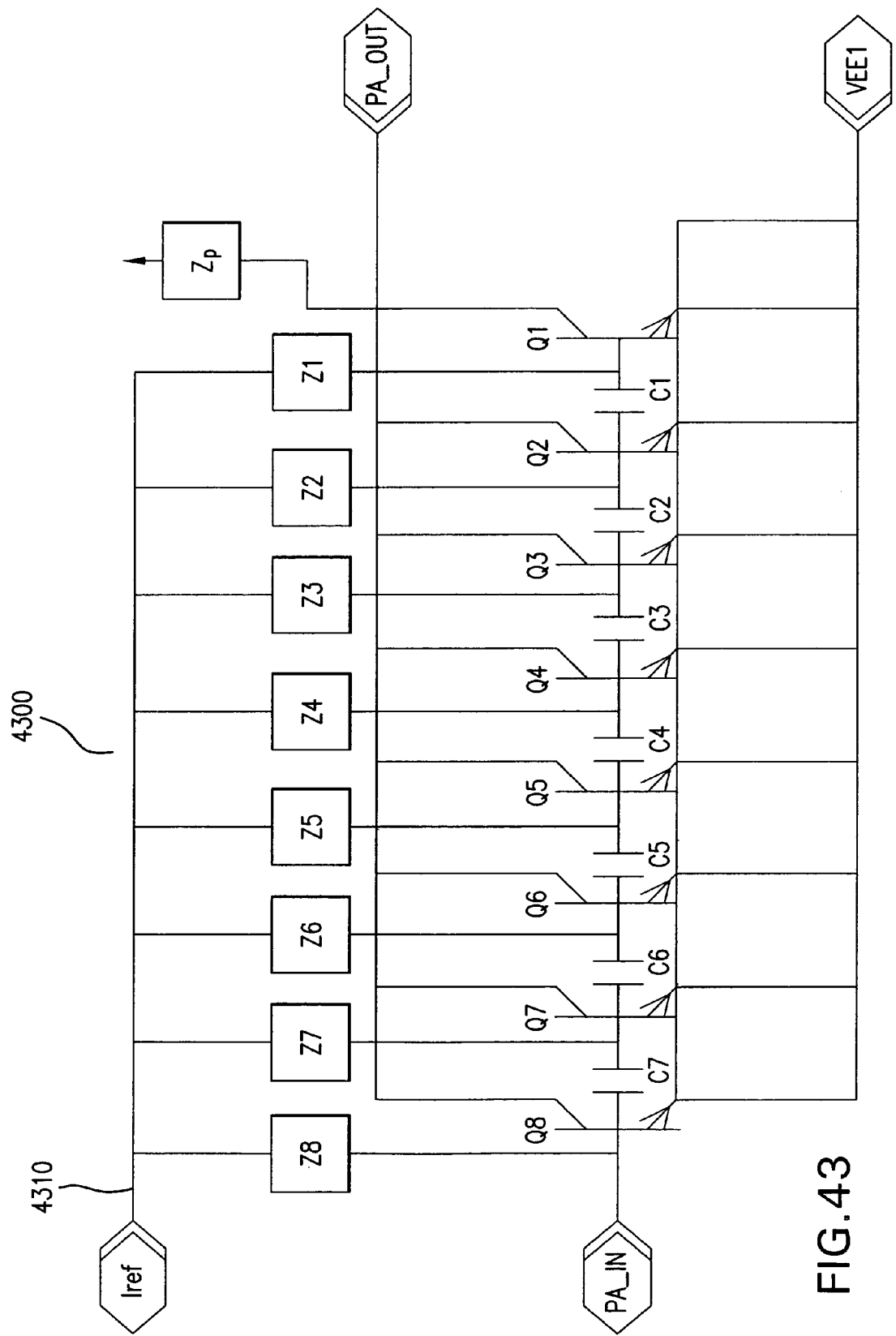
FIG. 43 illustrates an exemplary PA stage embodiment.

In other embodiments, step 4830 includes coupling the Autobias signal using pull-up impedances at the PA stage input and optionally the inputs of the driver and pre-driver stages of the VPA. FIGS. 38 and 43 illustrate such embodiments. For example, in the embodiment of FIG. 38, bias impedance 3850 couples Autobias Iref signal 3840 to input terminal 3820 of BJT element 3870. BJT element 3870 represents the PA stage of one PA branch of an exemplary VPA embodiment. Similarly, in the embodiment of FIG. 43, Autobias signal 4310 is coupled to transistors Q1, . . . , Q8 through corresponding bias impedances Z1, ..., Z8. Transistors Q1, ..., Q8 represent the PA stage of one branch of an exemplary VPA embodiment.

Figure 27:
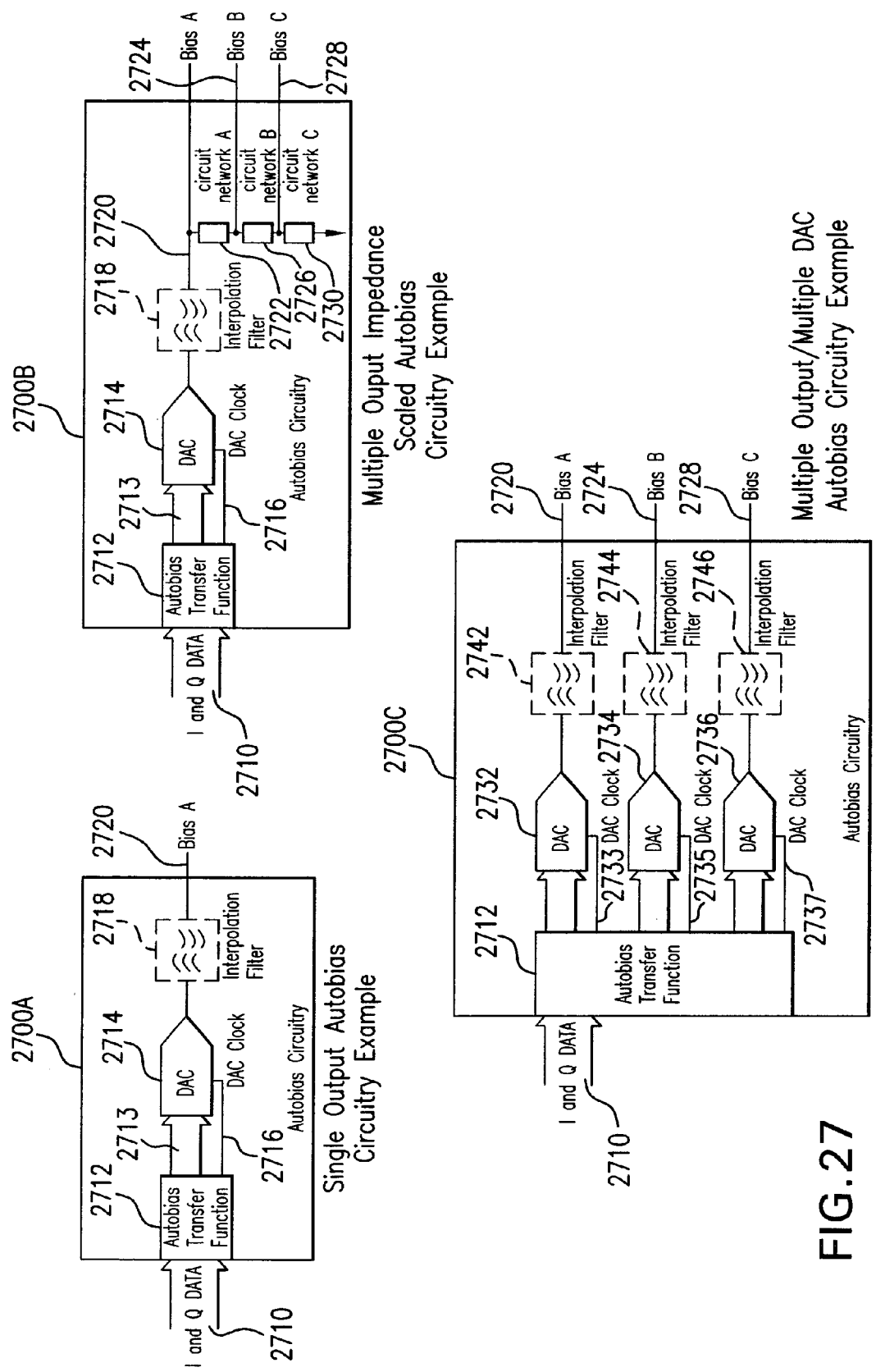
FIG. 27 illustrates exemplary embodiments of biasing circuitry according to embodiments of the present invention.

Embodiments for implementing the Autobias circuitry described above will now be provided. FIG. 27 illustrates three embodiments 2700A, 2700B, and 2700C for implementing the Autobias circuitry. These embodiments are provided for illustrative purposes, and are not limiting. Other embodiments will be apparent to persons skilled in the art(s) based on the teachings contained herein.

In embodiment 2700A, Autobias circuitry 2700A includes an Autobias Transfer Function module 2712, a DAC 2714, and an optional interpolation filter 2718. Autobias circuitry 2700A receives an I and Q Data signal 2710. Autobias Transfer Function module 2712 processes the received I and Q Data signal 2710 to generate an appropriate bias signal 2713. Autobias Transfer Function module 2712 outputs bias signal 2713 to DAC 2714. DAC 2714 is controlled by a DAC clock 2716 which may be generated in Autobias transfer module 2712. DAC 2714 converts bias signal 2713 into an analog signal, and outputs the analog signal to interpolation filter 2718. Interpolation filter 2718, which also serves as an anti-aliasing filter, shapes the DAC's output to generate Autobias signal 2720, illustrated as Bias A in embodiment 5112G. Autobias signal 2720 may be used to bias the PA stage and/or the driver stage, and/or the pre-driver stage of the amplifier. In an embodiment, Autobias signal 2720 may have several other Autobias signals derived therefrom to bias different stages within the PA stage. This can be done using additional circuitry not included in embodiment 2700A.

In contrast, embodiment 2700B illustrates an Autobias circuitry embodiment in which multiple Autobias signals are derived within the Autobias circuitry. As shown in embodiment 2700B, circuit networks 2722, 2726, and 2730, illustrated as circuit networks A, B, and C in embodiment 2700B, are used to derive Autobias signals 2724 and 2728 from Autobias signal 2720. Autobias signals 2720, 2724, and 2728 are used to bias different amplification stages.

Embodiment 2700C illustrates another Autobias circuitry embodiment in which multiple Autobias signals are generated independently within the Autobias Transfer Function module 2712. In embodiment 2700C, Autobias Transfer Function module 2712 generates multiple bias signals according to the received I and Q Data signal 2710. The bias signals may or may not be related. Autobias Transfer Function module 2712 outputs the generated bias signals to subsequent DACs 2732, 2734, and 2736. DACs 2732, 2734, and 2736 are controlled by DAC clock signals 2733, 2735, and 2737, respectively. DACs 2732, 2734, and 2736 convert the received bias signals into analog signals, and output the analog signals to optional interpolation filters 2742, 2744, and 2746. Interpolation filters 2742, 2744, and 2746, which also serve as anti-aliasing filters, shape the DACs outputs to generate Autobias signals 2720, 2724, and 2728. Similar to embodiment 2700B, Autobias signals 2720, 2724, and 2728 are used to bias different amplification stages such as the pre-driver, driver, and PA.

As noted above, Autobias circuitry embodiments according to the present invention are not limited to the ones described in embodiments 2700A, 2700B, and 2700C. A person skilled in the art will appreciate, for example, that Autobias circuitry can be extended to generate any number of bias control signals as required to control the bias of various stages of amplification, and not just three as shown in embodiments 5200B and 5200C, for example.

3.5.3) Output Stage Protection

As described above, output stage embodiments according to embodiments of the present invention are highly power efficient as a result of being able to directly couple outputs at the PA stage using no combining or isolating elements. Certain output stage embodiments in certain circumstances and/or applications, however, may require additional special output stage protection measures in order to withstand such direct coupling approach. This may be the case for example for output stage embodiments such as 5110D, 5120D, 5130D, 5160D, 5150E, 5160E, 5170E, and 5180E illustrated in FIGS. 51D and 51E. Note that, generally, complementary output stage embodiments, such as embodiments 5140D, 5150D, 5110E, 5120E, 5130E, and 5140E of FIGS. 51D and 51E, do not require (but may optionally use) the same output stage protection measures as will be described herein in this section. Output stage protection measures and embodiments to support such measures are now provided.

In one aspect, transistors of distinct branches of a PA stage should generally not simultaneously be in opposite states of operation for extended periods of time. Following a restart or power on with no inputs being supplied to the final PA stages, transients within the PA branches may cause this mode to occur resulting in the PA stage transistors potentially damaging one another or circuit elements connected to the output. Accordingly, embodiments of the present invention further constrain the Autobias module to limit the output current in the PA stage.

In another aspect, it may be desired to ensure that the Autobias module limits the output voltages below the breakdown voltage specification of the PA stage transistors. Accordingly, in embodiments of the present invention, such as the one illustrated in FIG. 42 for example, a feedback element 4210 is coupled between the common collector node of the PA stage and the Autobias module. Feedback element 4210 monitors the collector to base voltage of the PA stage transistors, and may constrain the Autobias signal as necessary to protect the transistors and/or circuit elements.

A person skilled in the art will appreciate that other output stage protection techniques may also be implemented. Furthermore, output stage protection techniques may be implementation specific. For example, depending on the type of PA stage transistors (npn, pnp, NMOS, PMOS, npn/pnp, NMOS/PMOS), different protection functions may be required.

3.6) Harmonic Control

According to embodiments of the present invention, an underlying principle for each branch PA is to maximize the transfer of power to a fundamental harmonic of the output spectrum. Typically, each branch PA may be multi-stage giving rise to a harmonically rich output spectrum. In one aspect, transfer of real power is maximized for the fundamental harmonic. In another aspect, for non-fundamental harmonics, real power transfer is minimized while imaginary power transfer may be tolerated. Harmonic control, according to embodiments of the present invention, may be performed in a variety of ways.

In one embodiment, real power transfer onto the fundamental harmonic is maximized by means of wave-shaping of the PA stage input signals. In practice, several factors play a role in determining the optimal wave shape that results in a maximum real power transfer onto the fundamental harmonic. Embodiment 3400 of the present invention, described above, represents one embodiment that employs waveshaping of PA stage input signals. In embodiment 3400, a plurality of harmonic control circuitry (HCC) networks 3410-{1, ..., n} are coupled at the PA stage input of each PA branch {1, ..., n}. HCC networks 3410-{1, ..., n} have the effect of waveshaping the PA stage inputs, and are typically selected so as to maximize real power transfer to the fundamental harmonic of the summed output spectrum. According to embodiments of the present invention, waveshaping can be used to generate variations of harmonically diverse waveforms. In other embodiments, as can be apparent to a person skilled in the art, waveshaping can be performed at the pre-driver and/or the driver stage.

In another embodiment, harmonic control is achieved by means of waveshaping of the PA stage output. FIG. 43 illustrates an exemplary PA stage embodiment 4300 of the present invention. In embodiment 4300, Autobias signal 4310 is coupled to transistors Q1, . . . , Q8 through corresponding bias impedances Z1, . . . , Z8. Notice that when impedances Z1, . . . , Z8 have different values, transistors Q1, . . . , Q8 have different bias points and can be turned on at different times. This approach of biasing transistors Q1, . . . , Q8 is referred to as staggered bias. Note that using staggered bias, the PA output waveform can be shaped in a variety of ways depending on the values assigned to bias impedances Z1, . . . , Z8.

Figure 49:
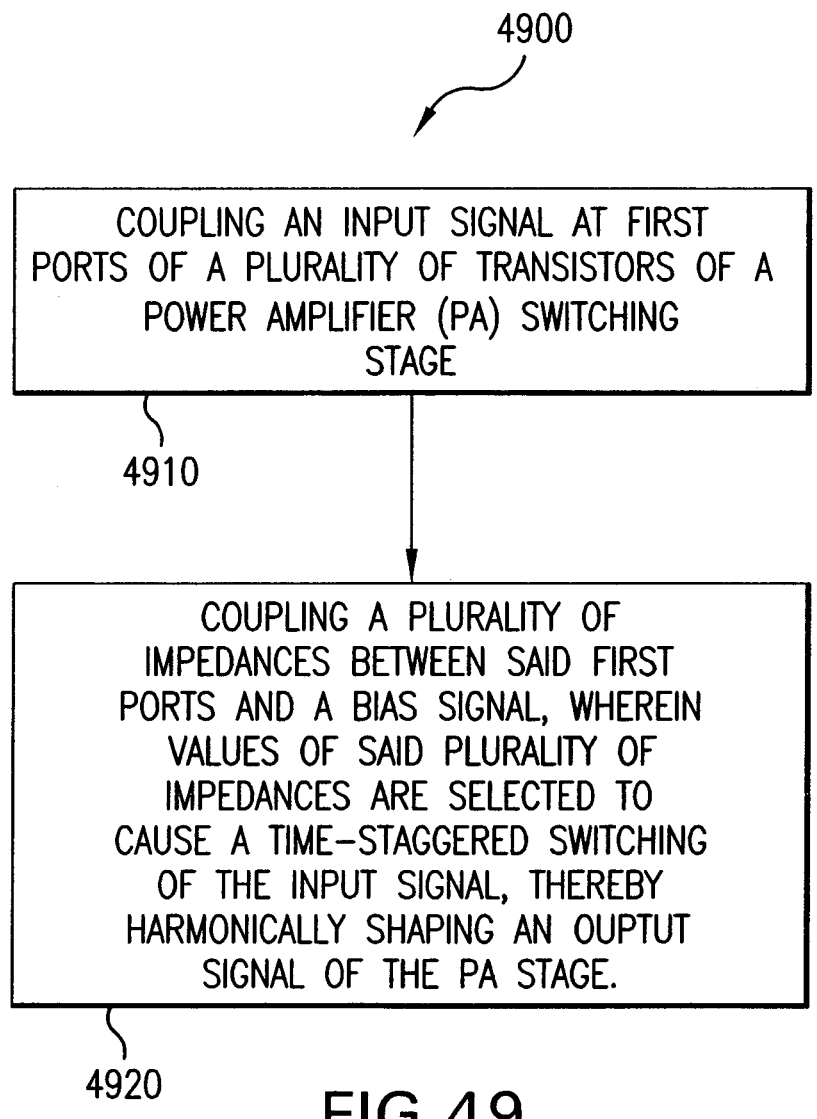
FIG. 49 is a process flowchart for implementing harmonic control according to an embodiment of the present invention.

Harmonic control using staggered bias is depicted in process flowchart 4900 of the embodiment of FIG. 49. The process begins in step 4910, which includes coupling an input signal at first ports of a plurality of transistors of a power amplifier (PA) switching stage. In the example embodiment of FIG. 43, for example, step 4910 corresponds to coupling PA_IN signal 4310 at base terminals of the plurality of transistors Q1, . . . , Q8.

Step 4920 includes coupling a plurality of impedances between the first ports of the plurality of transistors and a bias signal. In the example embodiment of FIG. 43, for example, step 4920 is achieved by coupling impedances Z1, . . . , Z8 between base terminals of respective transistors Q1, . . . , Q8 and Iref signal. In an embodiment, values of the plurality of impedances are selected to cause a time-staggered switching of the input signal, thereby harmonically shaping an output signal of the PA stage. In embodiments, a multi-stage staggered output may be generated by selecting multiple distinct values of the plurality of impedances. In other embodiments, switching is achieved by selecting the plurality of impedances to have equal or substantially equal value.

Figure 44:
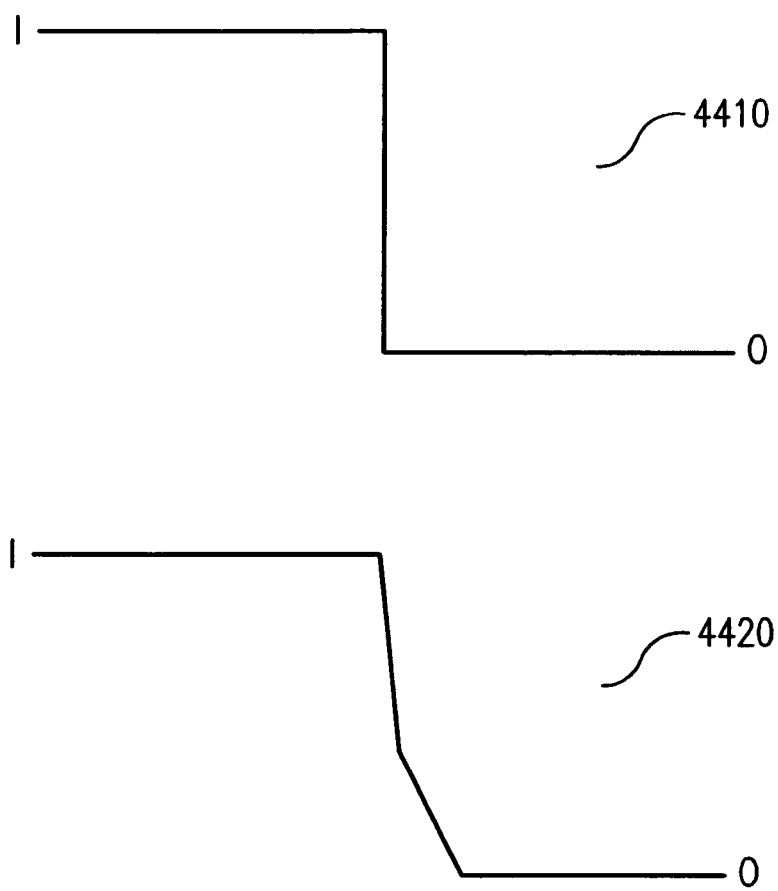
FIG. 44 illustrates an exemplary waved-shaped PA output signal.

FIG. 44 illustrates an exemplary wave-shaped PA output using a two-stage staggered bias approach. In a two-stage staggered bias approach, a first set of the PA transistors is first turned on before a second set is turned on. In other words, the bias impedances take two different values. Waveform 4410 represents an input waveform into the PA stage. Waveform 4420 represents the wave-shaped PA output according to a two-stage staggered bias. Notice that output waveform 4420 slopes twice as it transitions from 1 to 0, which corresponds to the first and second sets of transistors turning on successively.

According to embodiments of the present invention, a variety of multi-stage staggered bias approaches may be designed. Bias impedance values may be fixed or variable. Furthermore, bias impedance values may be equal or substantially equal, distinct, or set according to a variety of permutations. For example, referring to the example of FIG. 43, one exemplary permutation might set Z1=Z2=Z3=Z4 and Z5=Z6=Z7=Z8 resulting in a two-stage staggered bias.

3.7) Power Control

Vector power amplification embodiments of the present invention intrinsically provide a mechanism for performing output power control.

Figure 45:
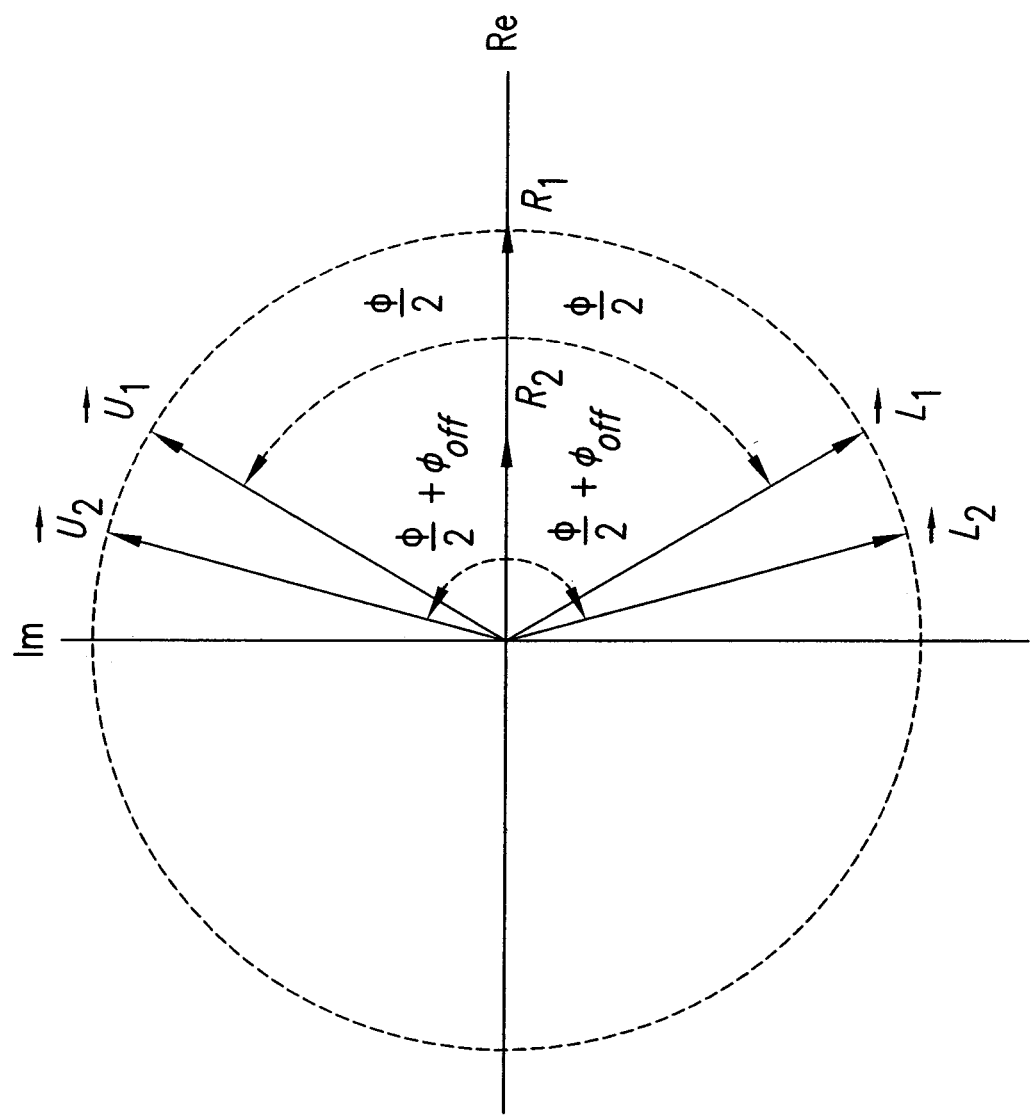
FIG. 45 illustrates a power control method.

FIG. 45 illustrates one approach for performing power control according to an embodiment of the present invention. In FIG. 45, phasors $\vec{U}_1$ and $\vec{L}_1$ represent upper and lower constituents of a first phasor $\vec{R}_1$. $\vec{U}_1$ and $\vec{L}_1$ are constant magnitude and are symmetrically shifted in phase relative to $\vec{R}_1$ by a phase shift angle $$\frac{\phi}{2}.$$

Phasors $\vec{U}_2$ and $\vec{L}_2$ represent upper and lower constituents of a second phasor $\vec{R}_2$. $\vec{U}_2$ and $\vec{L}_2$ are constant magnitude and are symmetrically shifted in phase relative to $\vec{R}_2$ by a phase shift angle $$\frac{\phi}{2} + \phi_{\mathit{off}}.$$

It is noted, from FIG. 45, that $\vec{R}_1$ and $\vec{R}_2$ are in-phase relative to each other but only differ in magnitude. Furthermore, $\vec{U}_2$ and $\vec{L}_2$ are equally or substantially equally phased shifted relative to $\vec{U}_1$ and $\vec{L}_1$, respectively. Accordingly, it can be inferred that, according to the present invention, a signal's magnitude can be manipulated without varying its phase shift angle by equally or substantially equally shifting symmetrically its constituent signals.

According to the above observation, output power control can be performed by imposing constraints on the phase shift angle of the constituent signals of a desired output signal. Referring to FIG. 45, for example, by constraining the range of values that phase shift angle $$\frac{\phi}{2}$$

can take, magnitude constraints can be imposed on phasor $\vec{R}_1$.

According to embodiments of the present invention, a maximum output power level can be achieved by imposing a minimum phase shift angle condition. For example, referring to FIG. 45, by setting a condition such that $$\frac{\phi}{2} \geq \phi_{\mathit{ff}},$$

the magnitude of phasor $\vec{R}_1$ is constrained not to exceed a certain maximum level. Similarly, a maximum phase shift angle condition imposes a minimum magnitude level requirement.

Figure 46:
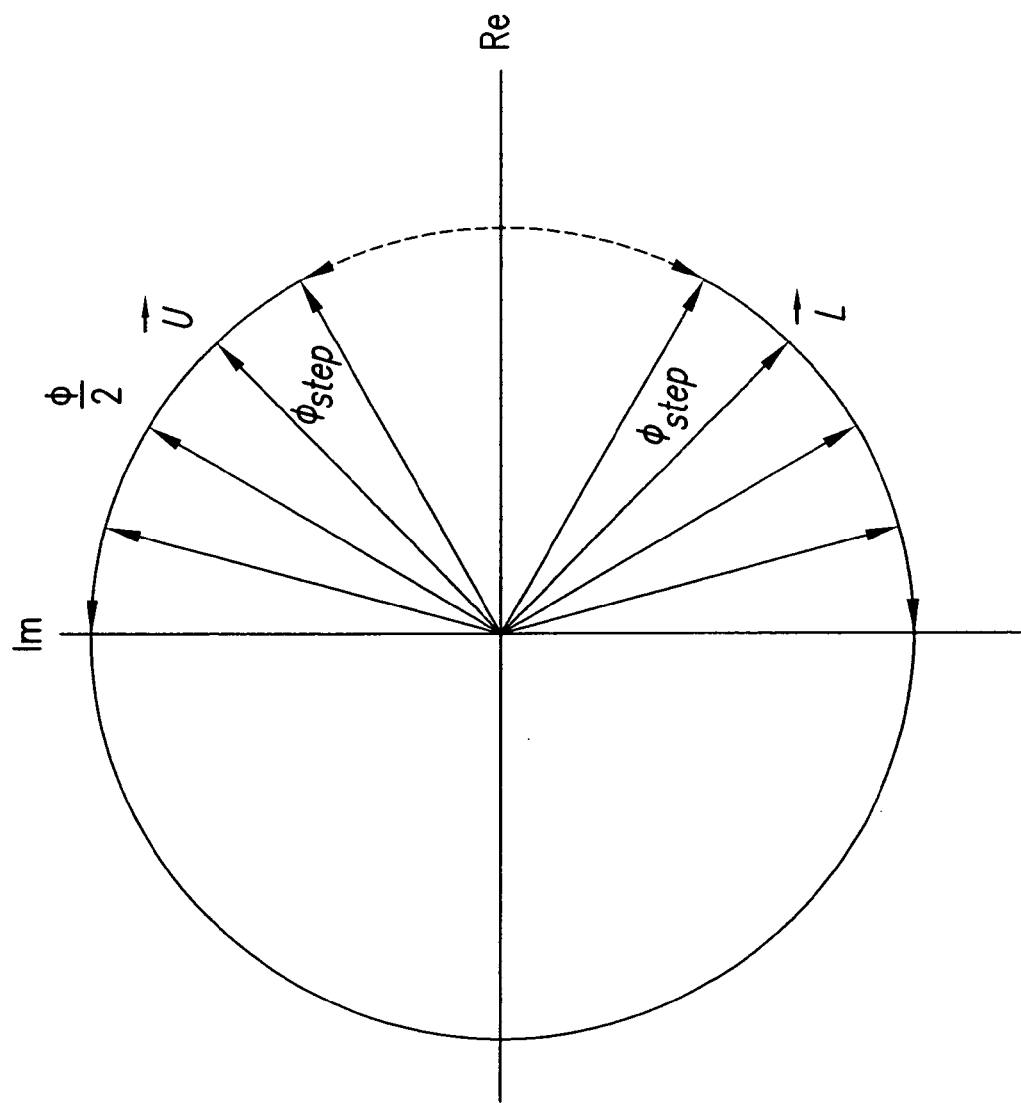
FIG. 46 illustrates another power control method.

In another aspect of power control, output power resolution is defined in terms of a minimum power increment or decrement step size. According to an embodiment of the present invention, output power resolution may be implemented by defining a minimum phase shift angle step size. Accordingly, phase shift angle values are set according to a discrete value range having a pre-determined step size. FIG. 46 illustrates an exemplary phase shift angle spectrum, whereby phase shift angle $$\frac{\phi}{2}$$

is set according to a pre-determined value range having a minimum step $\phi_{step}$.

A person skilled in the art will appreciate that a variety of power control schemes may be implemented in a fashion similar to the techniques described above. In other words, various power control algorithms can be designed, according to the present invention, by setting corresponding constraints on phase shift angle values. It is also apparent, based on the description above of data transfer functions, that power control schemes can be naturally incorporated into a transfer function implementation.

3.8) Exemplary Vector Power Amplifier Embodiment

Figure 47:
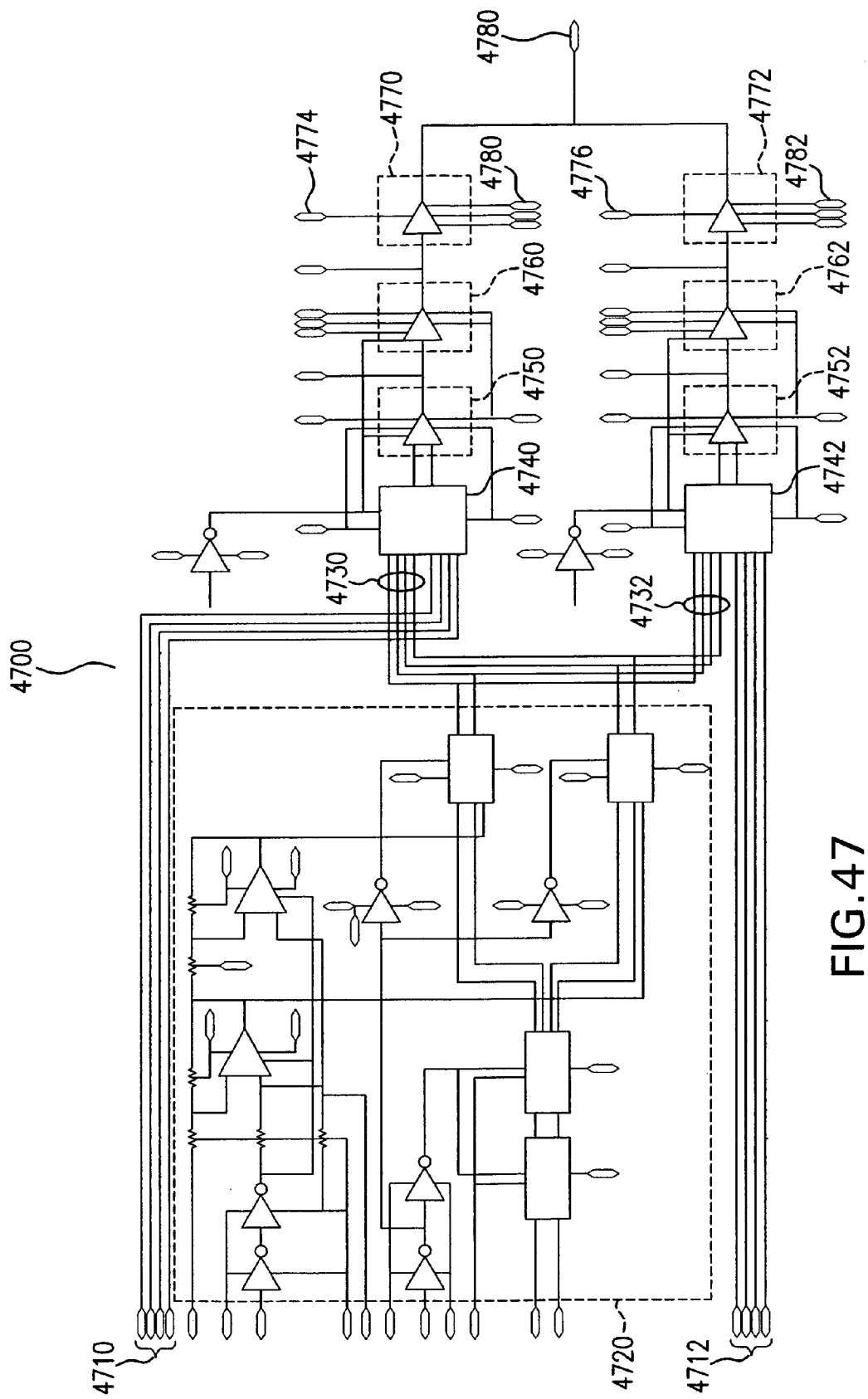
FIG. 47 illustrates an exemplary vector power amplifier embodiment.

FIG. 47 illustrates an exemplary embodiment 4700 of a vector power amplifier according to the present invention. Embodiment 4700 is implemented according to the Direct Cartesian 2-Branch VPA method.

Referring to FIG. 47, signals 4710 and 4712 represent incoming signals from a transfer function stage. The transfer function stage is not shown in FIG. 47. Block 4720 represents a quadrature generator which may be optionally implemented according to an embodiment of the present invention. Quadrature generator 4720 generates clock signals 4730 and 4732 to be used by vector modulators 4740 and 4742, respectively. Similarly, signals 4710 and 4712 are input into vector modulators 4740 and 4742. As described above, vector modulators 4740 and 4742 generate constant envelope constituents that are, subsequently, processed by a PA stage. In embodiment 4700, the PA stage is multi-stage, whereby each PA branch includes a pre-driver stage 4750-4752, a driver stage 4760-4762, and a power amplifier stage 4770-4772.

Further illustrated in FIG. 47 are Autobias signals 4774 and 4776, and terminals 4780 and 4782 for coupling harmonic control circuitry and networks. Terminal node 4780 represents the output terminal of the vector power amplifier, and is obtained by direct coupling of the two PA branches' outputs.

4. SUMMARY

Mathematical basis for a new concept related to processing signals to provide power amplification and up-conversion is provided herein. These new concepts permit arbitrary waveforms to be constructed from sums of waveforms which are substantially constant envelope in nature. Desired output signals and waveforms may be constructed from substantially constant envelope constituent signals which can be created from the knowledge of the complex envelope of the desired output signal. Constituent signals are summed using new, unique, and novel techniques not available commercially, not taught or found in literature or related art. Furthermore, the blend of various techniques and circuits provided in the disclosure provide unique aspects of the invention which permits superior linearity, power added efficiency, monolithic implementation and low cost when compared to current offerings. In addition, embodiments of the invention are inherently less sensitive to process and temperature variations. Certain embodiments include the use of multiple input single output amplifiers described herein.

Embodiments of the invention can be implemented by a blend of hardware, software and firmware. Both digital and analog techniques can be used with or without microprocessors and DSP's.

Embodiments of the invention can be implemented for communications systems and electronics in general. In addition, and without limitation, mechanics, electro mechanics, electro optics, and fluid mechanics can make use of the same principles for efficiently amplifying and transducing signals.

5. CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed. Any such alternate boundaries are thus within the scope and spirit of the claimed invention. One skilled in the art will recognize that these functional building blocks can be implemented by discrete components, application specific integrated circuits, processors executing appropriate software and the like and combinations thereof.

While various embodiments of the present invention have been described above, it should be understood that they have been presented by way of example only, and not limitation. Thus, the breadth and scope of the present invention should not be limited by any of the above-described exemplary embodiments, but should be defined only in accordance with the following claims and their equivalents.

What is claimed is:

1. A method comprising:
receiving an input clock at a frequency that corresponds to a desired output frequency;
receiving information;
generating two or more substantially constant envelope signals derived from the information; and
combining the two or more substantially constant envelope signals, comprising:
providing the two or more substantially constant envelope signals to a multiple input single output (MISO) device, the MISO device comprising two or more circuit branches each having one or more transistors, wherein an output voltage of each of the one or more transistors in the two or more circuit branches of the MISO device is substantially equal to an output voltage of the MISO device for all operational instances of time of the MISO device.

2. The method of claim 1, wherein the MISO device comprises first and second branches, wherein a transistor of the first branch and a transistor of the second branch are bipolar junction transistors (BJTs).

3. The method of claim 2, wherein the transistor of the first branch is coupled to the transistor of the second branch in a common collector node configuration.

4. The method of claim 2, wherein the transistor of the first branch is an npn BJT and the transistor of the second branch is a pnp BJT.

5. The method of claim 1, wherein the MISO device comprises first and second branches, wherein a transistor of the first branch and a transistor of the second branch are MOS transistors.

6. The method of claim 5, wherein the transistor of the first branch is coupled to the transistor of the second branch in a common drain node configuration.

7. The method of claim 5, wherein the transistor of the first branch is a an NMOS transistor and the transistor of the second branch is a PMOS transistor.

8. The method of claim 1, wherein the information comprises an input signal and wherein an output signal of the MISO device is an amplified version of the input signal.

9. The method of claim 1, wherein the MISO device comprises first and second branches, wherein a first transistor of the first branch is connected to a second transistor of the second branch via a collector or drain terminal of each of the first and second transistors.

10. An amplifier comprising:
an input module configured to generate two or more constant envelope signals based on received information and a received input clock frequency having a frequency that corresponds to a desired output frequency; and
a multiple input single output (MISO) device configured to receive the two or more constant envelope signals, wherein the MISO device includes two or more branches each having one or more transistors, wherein an output voltage of each of the one or more transistors in the two or more circuit branches of the MISO device is substantially equal to an output voltage of the MISO device for all operational instances of time of the MISO device.

11. The amplifier of claim 10, wherein the MISO device comprises first and second branches, wherein a transistor of the first branch is coupled to a transistor of the second branch in a common collector node configuration.

12. The amplifier of claim 11, wherein the transistor of the first branch is an npn bipolar junction transistor (BJT) and the transistor of the second branch is a pnp BJT.

13. The amplifier of claim 10, wherein the MISO device comprises first and second branches, wherein a transistor of the first branch and a transistor of the second branch are MOS transistors.

14. The amplifier of claim 13, wherein the transistor of the first branch is coupled to the transistor of the second branch in a common drain node configuration.

15. The amplifier of claim 13, wherein the transistor of the first branch is an NMOS transistor and the transistor of the second branch is a PMOS transistor.

16. The amplifier of claim 10, wherein the information comprises an input signal and wherein an output signal of the MISO device is an amplified version of the input signal.

17. The amplifier of claim 10, wherein the MISO device comprises first and second branches, wherein a first transistor of the first branch is connected to a second transistor of the second branch via a collector or drain terminal of each of the first and second transistors.

18. A device comprising an amplifier, the amplifier comprising:
an input module configured to generate two or more constant envelope signals based on received information and a received input clock frequency having a frequency that corresponds to a desired output frequency; and
a multiple input single output (MISO) device configured to receive the two or more constant envelope signals, wherein the MISO device includes two or more branches each having one or more transistors, wherein an output voltage of each of the one or more transistors in the two or more circuit branches of the MISO device is substantially equal to an output voltage of the MISO device for all operational instances of time of the MISO device.

* * * * *

UNITED STATES PATENT AND TRADEMARK OFFICE
CERTIFICATE OF CORRECTION

| | | |
|---|---|---|
| PATENT NO. | : 8,433,264 B2 | Page 1 of 1 |
| APPLICATION NO. | : 11/599359 | |
| DATED | : April 30, 2013 | |
| INVENTOR(S) | : Sorrells et al. | |

It is certified that error appears in the above-identified patent and that said Letters Patent is hereby corrected as shown below:

In the Claims:

Column 62
In Line 66, replace "is a an NMOS" with --is an NMOS--.

Signed and Sealed this
Eleventh Day of June, 2013

Teresa Stanek Rea
*Acting Director of the United States Patent and Trademark Office*